US011156916B2

(12) United States Patent
Hatakeyama et al.

(10) Patent No.: US 11,156,916 B2
(45) Date of Patent: Oct. 26, 2021

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Takeshi Sasami, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 229 days.

(21) Appl. No.: 16/388,013

(22) Filed: Apr. 18, 2019

(65) Prior Publication Data

US 2019/0324368 A1 Oct. 24, 2019

(30) Foreign Application Priority Data

Apr. 20, 2018 (JP) ............................ JP2018-081515

(51) Int. Cl.

| | |
|---|---|
| ***G03F 7/039*** | (2006.01) |
| ***G03F 7/30*** | (2006.01) |
| ***G03F 7/004*** | (2006.01) |
| ***G03F 7/16*** | (2006.01) |
| ***G03F 7/20*** | (2006.01) |
| ***G03F 7/32*** | (2006.01) |
| ***G03F 7/38*** | (2006.01) |

(52) U.S. Cl.

CPC .......... *G03F 7/0045* (2013.01); *G03F 7/0392* (2013.01); *G03F 7/162* (2013.01); *G03F 7/168* (2013.01); *G03F 7/2004* (2013.01); *G03F 7/2006* (2013.01); *G03F 7/2037* (2013.01); *G03F 7/322* (2013.01); *G03F 7/38* (2013.01); *G03F 7/0397* (2013.01)

(58) Field of Classification Search

CPC ..... G03F 7/0045; G03F 7/0392; G03F 7/0397

See application file for complete search history.

(56) References Cited

U.S. PATENT DOCUMENTS

| | | | | |
|---|---|---|---|---|
| 5,348,838 | A | 9/1994 | Ushirogouchi et al. | |
| 5,654,471 | A * | 8/1997 | Zahn | C07C 67/03 560/109 |
| 5,691,101 | A * | 11/1997 | Ushirogouchi | G03F 7/0045 430/176 |
| 6,251,558 | B1 | 6/2001 | Elian et al. | |
| 2003/0087180 | A1* | 5/2003 | Kudo | G03F 7/0397 430/270.1 |
| 2018/0088463 | A1 | 3/2018 | Hatakeyama et al. | |

FOREIGN PATENT DOCUMENTS

| | | | |
|---|---|---|---|
| JP | 5-313371 | A | 11/1993 |
| JP | H10-301286 | A | 11/1998 |
| JP | 2015-161823 | A | 9/2015 |
| KR | 10-2018-0034266 | A | 4/2018 |
| WO | 2013/024777 | A1 | 2/2013 |

OTHER PUBLICATIONS

Office Action dated Oct. 14, 2020, issued in counterpart KR Application No. 10-2019-0046302, with English Translation. (10 pages).

* cited by examiner

*Primary Examiner* — John S Chu

(74) *Attorney, Agent, or Firm* — Westerman, Hattori, Daniels & Adrian, LLP

(57) ABSTRACT

A resist composition comprising a base polymer and a compound containing an iodized benzene ring and an aromatic ring-containing group having a phenolic hydroxyl group is improved in sensitivity, LWR and CDU.

10 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2018-081515 filed in Japan on Apr. 20, 2018, the entire contents of which are hereby incorporated by reference.

TECHNICAL FIELD

This invention relates to a resist composition and a patterning process using the composition.

BACKGROUND ART

To meet the demand for higher integration density and operating speed of LSIs, the effort to reduce the pattern rule is in rapid progress. The enlargement of the logic memory market in harmony with the wide-spreading of smart phones drives forward the miniaturization technology. As the advanced miniaturization technology, logic devices of 10-nm node are manufactured in a large scale by the double patterning version of ArF immersion lithography. The fabrication of 7-nm node devices of the next generation by the same double patterning process is approaching the mass-scale manufacture stage. EUV lithography is one of the candidates for the fabrication of 5-nm node devices of the next-to-next generation.

Since the wavelength (13.5 nm) of extreme ultraviolet (EUV) is shorter than 1/10 of the wavelength (193 nm) of ArF excimer laser, the EUV lithography achieves a high contrast of image-forming light. Because of an extraordinarily high energy density of EUV, the number of photons sensitive thereto is small. An influence of a variation in number of photons randomly generated in the exposed region is pointed out. Since the size of pattern features resolved by the EUV lithography is less than half of the feature size by the ArF lithography, a dimensional variation (manifesting as CDU or LWR) due to a variation of photon number becomes a serious problem.

For increasing the throughput of EUV lithography, it is desired to endow a photoresist material with a higher sensitivity. However, since the photoresist material having a higher sensitivity produces a smaller number of photons, the dimensional variation becomes more significant. It is thus desired to develop a photoresist material having a high sensitivity while reducing CDU and LWR.

To achieve a high sensitivity, Patent Document 1 discloses a photoresist material comprising a base polymer containing iodine atoms. Also, iodized compounds are proposed as an additive to the photoresist material. Patent Document 2 discloses various iodine compounds. Patent Document 3 proposes to add tetraiodophenolphthalein.

CITATION LIST

Patent Document 1: JP-A 2015-161823
Patent Document 2: WO 2013/024777
Patent Document 3: JP-A H05-313371 (U.S. Pat. No. 5,348,838)

SUMMARY OF INVENTION

The resist materials described in these patent documents, however, are insufficient in sensitivity, CDU and LWR to comply with the EUV lithography. There is a demand for a photoresist material having a high sensitivity and capable forming a line pattern with improved LWR and a hole pattern with improved CDU.

An object of the invention is to provide a resist composition having a high sensitivity, minimal LWR and improved CDU, and a pattern forming process using the same.

The inventors have found that when a compound containing an iodized benzene ring and an aromatic ring-containing group having a phenolic hydroxyl group is added to a base polymer, a resist composition having a high sensitivity, minimal LWR and improved CDU is obtained.

In one aspect, the invention provides a resist composition comprising a base polymer and a compound having the formula (A).

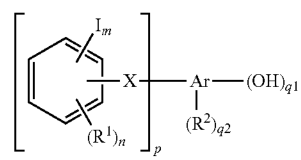

(A)

Herein $R^1$ is each independently a hydroxyl group, carboxyl group, fluorine atom, chlorine atom, bromine atom, $C_1$-$C_{20}$ alkyl group, $C_1$-$C_{20}$ alkoxy group, $C_2$-$C_{20}$ acyloxy group, $C_2$-$C_{20}$ alkoxycarbonyl group, —$NR^{1A}$—C(═O)—$R^{1B}$, or —$NR^{1A}$—C(═O)—O—$R^{1B}$, at least one hydrogen atom in the alkyl, alkoxy, acyloxy or alkoxycarbonyl group may be substituted by fluorine, chlorine, bromine, hydroxy or alkoxy. $R^{1A}$ is hydrogen or a $C_1$-$C_6$ alkyl group, at least one hydrogen atom in the alkyl group may be substituted by halogen, hydroxyl, $C_1$-$C_6$ alkoxy, $C_2$-$C_7$ acyl or $C_2$-$C_7$ acyloxy. $R^{1B}$ is a $C_1$-$C_{16}$ alkyl group, $C_2$-$C_{16}$ alkenyl group or $C_6$-$C_{12}$ aryl group, at least one hydrogen atom in the alkyl, alkenyl or aryl group may be substituted by halogen, hydroxyl, $C_1$-$C_6$ alkoxy, $C_2$-$C_7$ acyl or $C_2$-$C_7$ acyloxy. $R^2$ is a $C_1$-$C_{10}$ alkyl group, $C_1$-$C_{10}$ alkoxy group, $C_2$-$C_{10}$ alkoxycarbonyl group, $C_2$-$C_{10}$ acyl group, $C_2$-$C_{10}$ acyloxy group, cyano group, fluorine atom, chlorine atom, or bromine atom. X is a single bond, ester bond, ether bond, sulfonic acid ester bond, or $C_1$-$C_{10}$ divalent saturated aliphatic hydrocarbon group, some carbon atom in the divalent saturated aliphatic hydrocarbon group may be replaced by an ether bond, thioether bond, ester bond, sulfonic acid ester bond, lactone ring-containing moiety or sultone ring-containing moiety. Ar is a $C_6$-$C_{20}$ aromatic ring-containing group having a valence of p+q1+q2. The subscripts m and n are integers in the range: $1 \le m \le 5$, $0 \le n \le 4$ and $1 \le m+n \le 5$, p is 1 or 2, q1 and q2 are integers in the range: $1 \le q1 \le 5$, $0 \le q2 \le 4$ and $1 \le q1+q2 \le 5$.

The resist composition may further comprise an acid generator capable of generating a sulfonic acid, imide acid or methide acid.

The resist composition may further comprise an organic solvent, dissolution inhibitor, basic compound and/or surfactant.

In a preferred embodiment, the base polymer comprises recurring units having the formula (a1) or recurring units having the formula (a2).

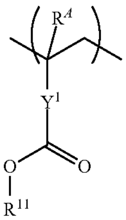

(a1)

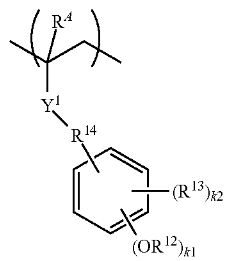

(a2)

Herein $R^A$ is each independently hydrogen or methyl. $Y^1$ is a single bond, phenylene group, naphthylene group, or a $C_1$-$C_{12}$ linking group containing an ester bond, ether bond or lactone ring. $Y^2$ is a single bond, —C(═O)—O— or —C(═O)—NH—. $R^{11}$ and $R^{12}$ are each independently an acid labile group. $R^{13}$ is fluorine, trifluoromethyl, cyano, $C_1$-$C_6$ alkyl, $C_1$-$C_6$ alkoxy, $C_2$-$C_7$ acyl, $C_2$-$C_7$ acyloxy, or $C_2$-$C_7$ alkoxycarbonyl group. $R^{14}$ is a single bond or a straight or branched $C_1$-$C_6$ alkanediyl group in which at least one carbon atom may be replaced by an ether or ester bond, k1 is 1 or 2, and k2 is an integer of 0 to 4.

Typically, the resist composition is a chemically amplified positive tone resist composition.

The base polymer may further comprise recurring units of at least one type selected from recurring units having the formulae (f1), (f2) and (f3).

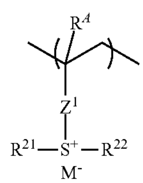

(f1)

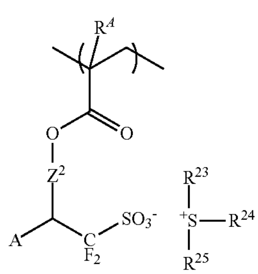

(f2)

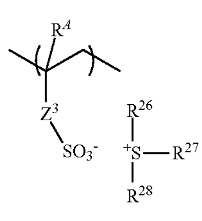

(f3)

Herein $R^A$ is each independently hydrogen or methyl. $Z^1$ is a single bond, phenylene group, —O—$Z^{11}$—, —C(═O)—O—$Z^{11}$—, or —C(═O)—NH—$Z^{11}$—, $Z^{11}$ is a $C_1$-$C_6$ alkanediyl group, $C_2$-$C_6$ alkenediyl group or phenylene group, which may contain a carbonyl moiety, ester bond, ether bond or hydroxyl moiety. $Z^2$ is a single bond, —$Z^{21}$—C(═O)—O—, —$Z^{21}$—O—, or —$Z^{21}$—O—C(═O)—, $Z^{21}$ is a $C_1$-$C_{12}$ alkanediyl group which may contain a carbonyl moiety, ester bond or ether bond, A is hydrogen or trifluoromethyl. $Z^3$ is a single bond, methylene, ethylene, phenylene or fluorinated phenylene group, —O—$Z^{31}$—, —C(═O)—O—$Z^{31}$—, or —C(═O)—NH—$Z^{31}$—, $Z^{31}$ is a $C_1$-$C_6$ alkanediyl group, phenylene group, fluorinated phenylene group, trifluoromethyl-substituted phenylene group, or $C_2$-$C_6$ alkenediyl group, which may contain a carbonyl moiety, ester bond, ether bond or hydroxyl moiety. $R^{21}$ to $R^{28}$ are each independently a $C_1$-$C_{20}$ monovalent hydrocarbon group which may contain a heteroatom, any two of $R^{23}$, $R^{24}$ and $R^{25}$ or any two of $R^{26}$, $R^{27}$ and $R^{28}$ may bond together to form a ring with the sulfur atom to which they are attached. $M^-$ is a non-nucleophilic counter ion.

In another aspect, the invention provides a pattern forming process comprising the steps of coating the resist composition defined above onto a substrate, baking to form a resist film, exposing the resist film to high-energy radiation, and developing the exposed resist film in a developer.

Typically, the high-energy radiation is ArF excimer laser of wavelength 193 nm, KrF excimer laser of wavelength 248 nm, EB or EUV of wavelength 3 to 15 nm.

ADVANTAGEOUS EFFECTS OF INVENTION

The compound having formula (A) is an effective sensitizer because it contains an iodine atom which is highly absorptive to EUV and a phenolic hydroxyl group. The compound at this site effectively generates secondary electrons which are transported to the acid generator to increase sensitivity. Also the compound is highly effective for suppressing acid diffusion because of the large atomic weight of iodine. These lead to a high sensitivity and improved LWR and CDU. Thus a resist composition having a high sensitivity, minimal LWR and improved CDU is designed.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. As used herein, the term "iodized" or "fluorinated" indicates that a compound contains iodine or fluorine. Me stands for methyl, and Ac for acetyl.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Briefly stated, the invention provides a resist composition comprising a base polymer and a compound containing an iodized benzene ring and an aromatic ring-containing group having a phenolic hydroxyl group.

Compound Containing Iodized Benzene Ring and Hydroxyl-Substituted Aromatic Group The compound containing an iodized benzene ring and an aromatic ring-containing group having a phenolic hydroxyl group is represented by the formula (A).

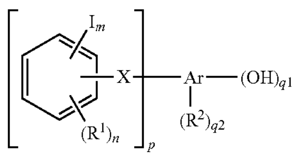

(A)

In formula (A), $R^1$ is each independently a hydroxyl group, carboxyl group, fluorine atom, chlorine atom, bromine atom, $C_1$-$C_{20}$ alkyl group, $C_1$-$C_{20}$ alkoxy group, $C_2$-$C_{20}$ acyloxy group, $C_2$-$C_{20}$ alkoxycarbonyl group, —$NR^{1A}$—C(═O)—$R^{1B}$, or —$NR^{1A}$—C(═O)—O—$R^{1B}$ At least one hydrogen atom (i.e., one or more or even all hydrogen atoms) in the alkyl, alkoxy, acyloxy or alkoxycarbonyl group may be substituted by a fluorine, chlorine, bromine, hydroxy or alkoxy radical.

$R^{1A}$ is hydrogen or a $C_1$-$C_6$ alkyl group. At least one hydrogen atom (i.e., one or more or even all hydrogen atoms) in the alkyl group may be substituted by a halogen, hydroxyl, $C_1$-$C_6$ alkoxy, $C_2$-$C_7$ acyl or $C_2$-$C_7$ acyloxy radical. $R^{1B}$ is a $C_1$-$C_{16}$ alkyl group, $C_2$-$C_{16}$ alkenyl group or $C_6$-$C_{12}$ aryl group. At least one hydrogen atom (i.e., one or more or even all hydrogen atoms) in the alkyl, alkenyl or aryl group may be substituted by a halogen, hydroxyl, $C_1$-$C_6$ alkoxy, $C_2$-$C_7$ acyl or $C_2$-$C_7$ acyloxy radical.

In formula (A), $R^2$ is a $C_1$-$C_{10}$ alkyl group, $C_1$-$C_{10}$ alkoxy group, $C_2$-$C_{10}$ alkoxycarbonyl group, $C_2$-$C_{10}$ acyl group, $C_2$-$C_{10}$ acyloxy group, cyano group, fluorine atom, chlorine atom, or bromine atom.

The alkyl group may be straight, branched or cyclic. Exemplary alkyl groups include methyl, ethyl, n-propyl, isopropyl, n-butyl, isobutyl, sec-butyl, tert-butyl, n-pentyl, neopentyl, cyclopentyl, n-hexyl, cyclohexyl, n-heptyl, n-octyl, 2-ethylhexyl, n-nonyl, n-decyl, n-undecyl, n-dodecyl, n-tridecyl, n-pentadecyl, and n-hexadecyl.

The alkoxy group may be straight, branched or cyclic. Exemplary alkoxy groups include methoxy, ethoxy, n-propyloxy, isopropyloxy, n-butyloxy, isobutyloxy, sec-butyloxy, tert-butyloxy, n-pentyloxy, neopentyloxy, cyclopentyloxy, n-hexyloxy, cyclohexyloxy, n-heptyloxy, n-octyloxy, 2-ethylhexyloxy, n-nonyloxy, n-decyloxy, n-undecyloxy, n-dodecyloxy, n-tridecyloxy, n-pentadecyloxy, and n-hexadecyloxy.

Suitable acyl groups include acetyl, propionyl, butyryl and isobutyryl.

Suitable acyloxy groups include acetyloxy, propionyloxy, butyryloxy and isobutyryloxy.

Suitable alkoxycarbonyl groups include methoxycarbonyl, ethoxycarbonyl, n-propyloxycarbonyl, isopropyloxycarbonyl, n-butyloxycarbonyl, isobutyloxycarbonyl, sec-butyloxycarbonyl, tert-butyloxycarbonyl, n-pentyloxycarbonyl, neopentyloxycarbonyl, cyclopentyloxycarbonyl, n-hexyloxycarbonyl, cyclohexyloxycarbonyl, n-heptyloxycarbonyl, n-octyloxycarbonyl, 2-ethylhexyloxycarbonyl, n-nonyloxycarbonyl, n-decyloxycarbonyl, n-undecyloxycarbonyl, n-dodecyloxycarbonyl, n-tridecyloxycarbonyl, and n-pentadecyloxycarbonyl.

The alkenyl group may be straight, branched or cyclic, and examples thereof include vinyl, 1-propenyl, 2-propenyl, butenyl, hexenyl, and cyclohexenyl.

Suitable aryl groups include phenyl, tolyl, xylyl, 1-naphthyl, and 2-naphthyl.

Preferably, $R^1$ is hydroxyl, $C_1$-$C_6$ alkyl, $C_2$-$C_4$ acyl, $C_2$-$C_6$ alkoxycarbonyl or —$NR^{1A}$—C(═O)—$R^{1B}$. Also preferably, $R^2$ is hydrogen, $C_1$-$C_{10}$ alkyl, $C_2$-$C_{10}$ acyl, cyano, fluorine, chlorine or bromine. When n is 2 or more, groups $R^1$ may be the same or different. When q2 is 2 or more, groups $R^2$ may be the same or different.

In formula (A), X is a single bond, ester bond, ether bond, sulfonic acid ester bond, or $C_1$-$C_{10}$ divalent saturated aliphatic hydrocarbon group.

The divalent saturated aliphatic hydrocarbon group may be straight, branched or cyclic. Examples thereof include straight or branched alkanediyl groups such as methylene, ethane-1,1-diyl, ethane-1,2-diyl, propane-1,2-diyl, propane-2,2-diyl, propane-1,3-diyl, 2-methylpropane-1,3-diyl, butane-1,3-diyl, butane-2,3-diyl, butane-1,4-diyl, pentane-1,3-diyl, pentane-1,4-diyl, 2,2-dimethylpropane-1,3-diyl, pentane-1,5-diyl, and hexane-1,6-diyl, and divalent saturated cyclic hydrocarbon groups such as cyclopentanediyl, cyclohexanediyl, norbornanediyl, and adamantanediyl.

Also, some (i.e., one or more) carbon atom in the divalent saturated aliphatic hydrocarbon group may be replaced by an ether bond, thioether bond, ester bond, sulfonic acid ester bond, lactone ring-containing moiety or sultone ring-containing moiety.

In formula (A), Ar is a $C_6$-$C_{20}$ aromatic ring-containing group having a valence of p+q1+q2. Examples of the aromatic ring-containing group include groups derived from benzene, naphthalene, anthracene, phenanthrene, biphenyl, benzophenone, diphenyl sulfide, diphenyl sulfoxide, diphenyl sulfone, diphenylmethane, 2,2-diphenylpropane, and 1,1,1,3,3,3-hexafluoro-2,2-diphenylpropane.

In formula (A), m and n are integers in the range: $1 \le m \le 5$, $0 \le n \le 4$ and $1 \le m+n \le 5$, preferably $1 \le m \le 3$ and $0 \le n \le 2$; p is 1 or 2; q1 and q2 are integers in the range: $1 \le q1 \le 5$, $0 \le q2 \le 4$ and $1 \le q1+q2 \le 5$, preferably $1 \le q1 \le 3$ and $0 \le q2 \le 2$.

Examples of the compound having formula (A) are shown below, but not limited thereto.

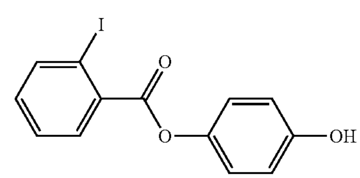

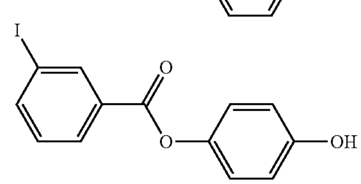

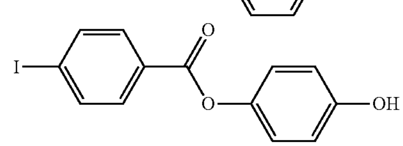

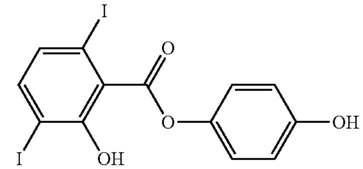

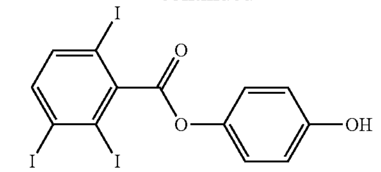
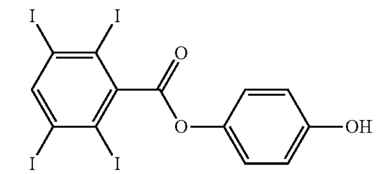
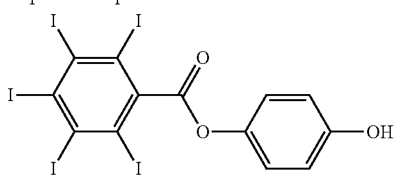
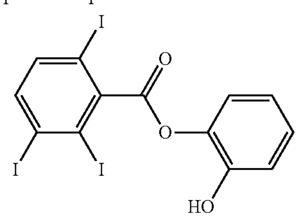
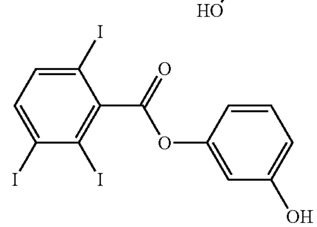
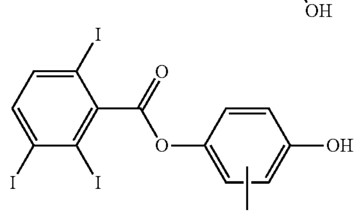
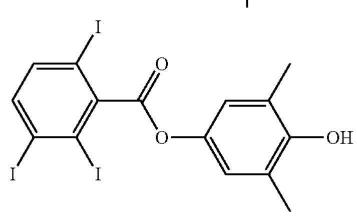
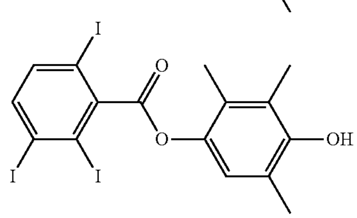
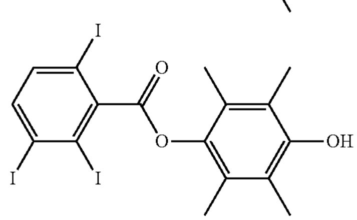
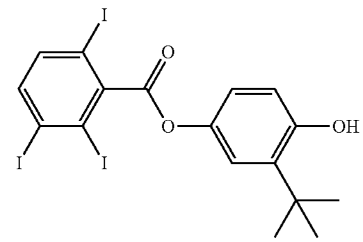
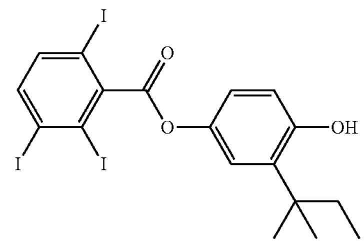
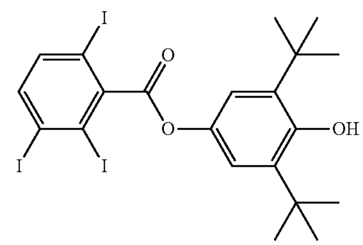
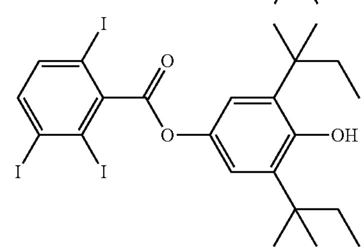
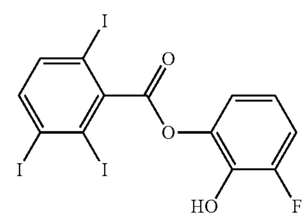
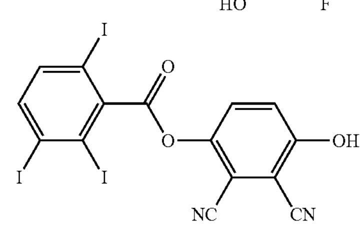
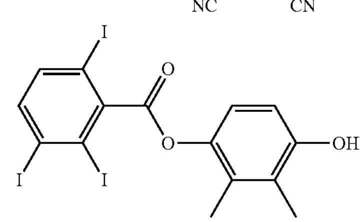

-continued
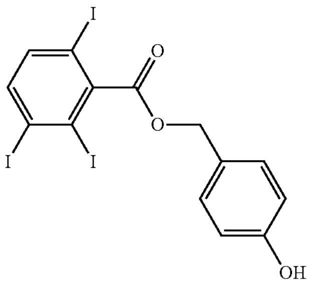
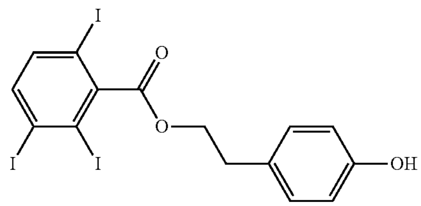
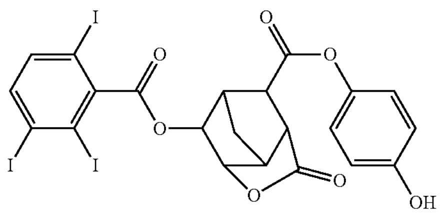
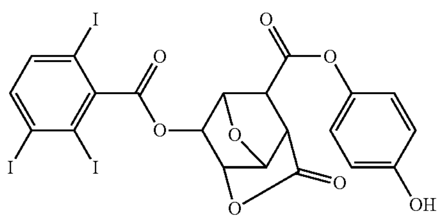
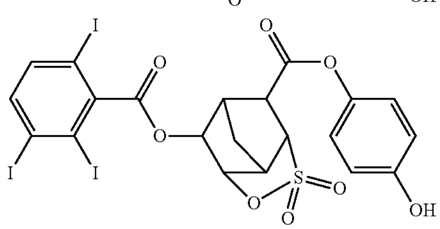
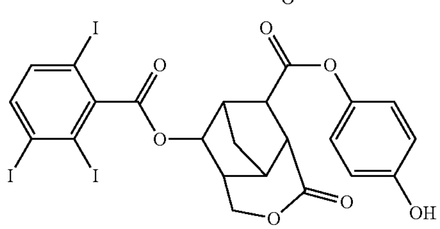
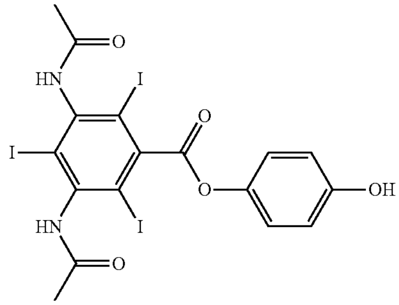
-continued
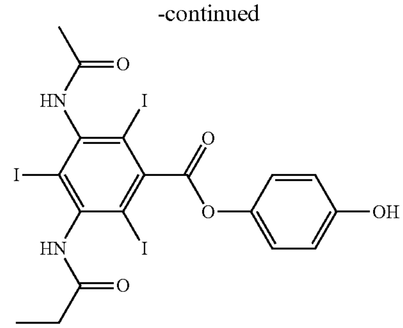
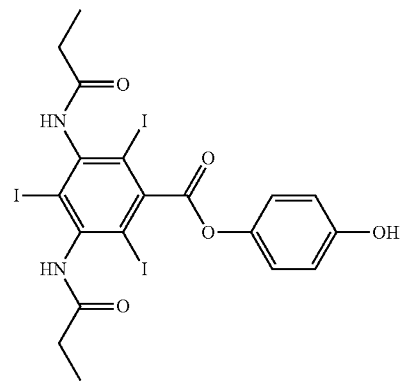
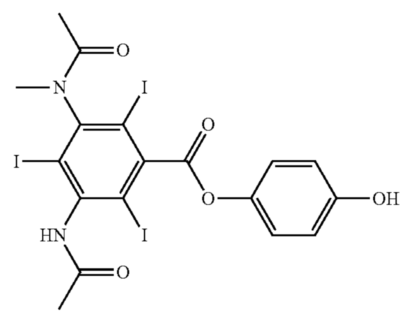
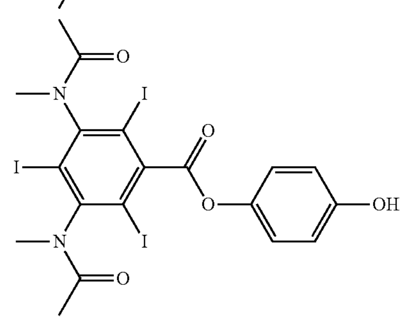
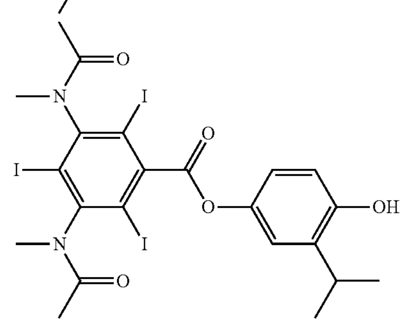

-continued
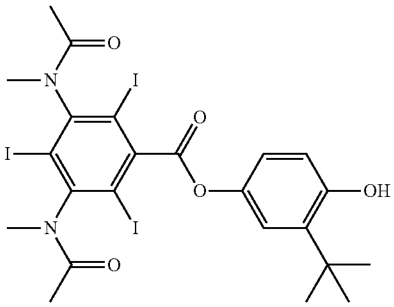
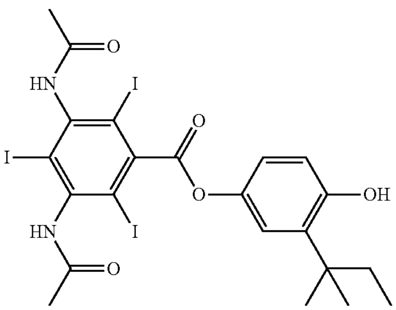
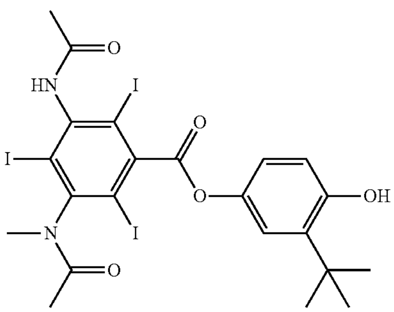
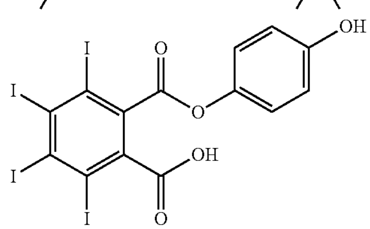
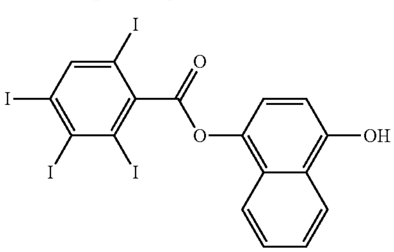
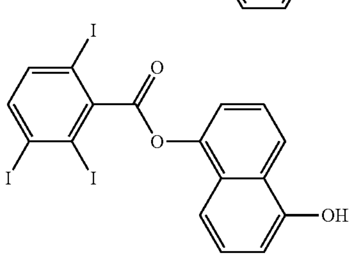
-continued
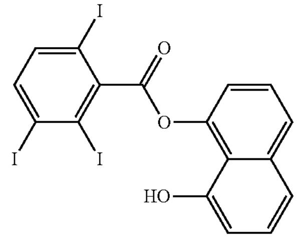
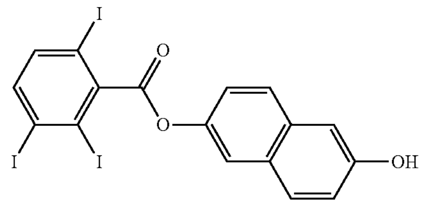
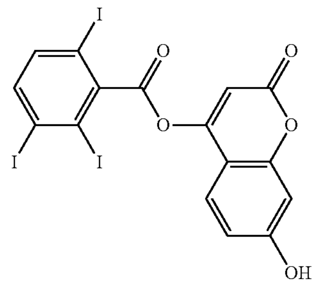
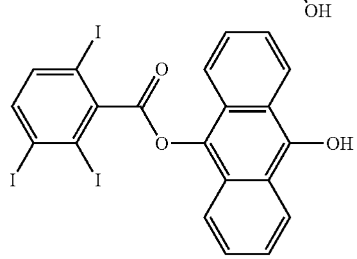
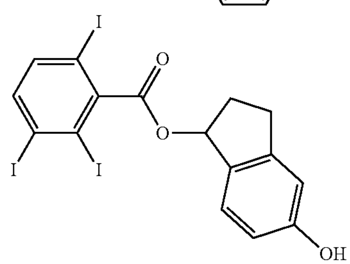
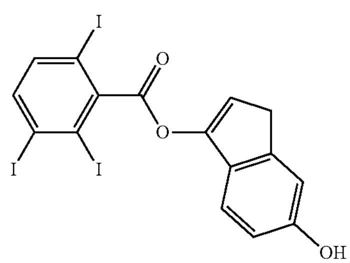
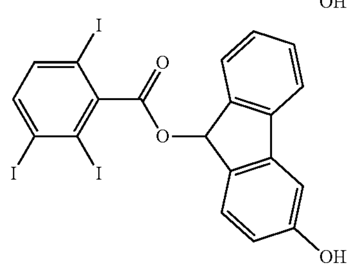

-continued
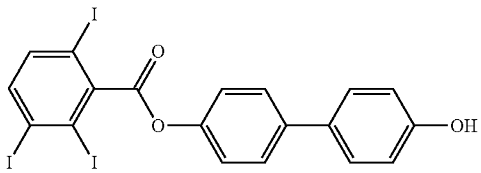
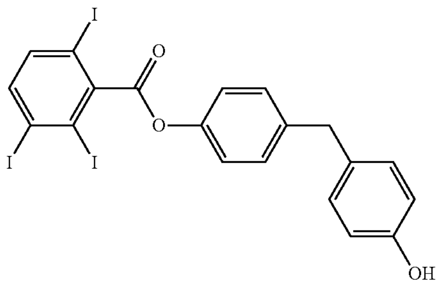
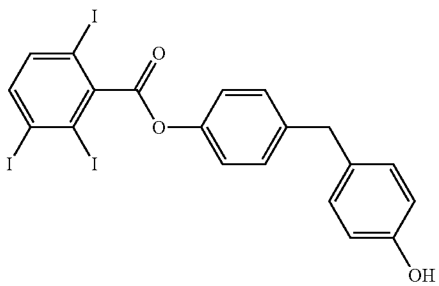
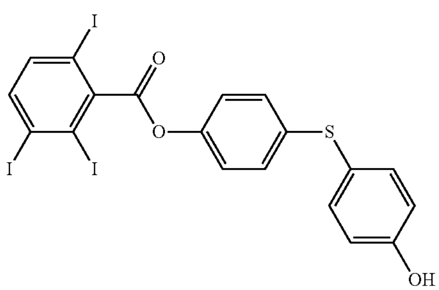
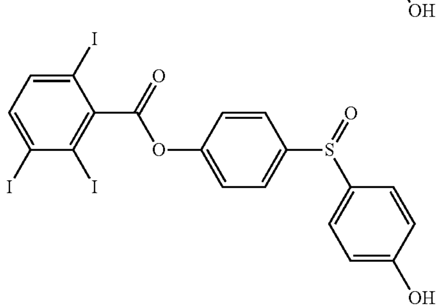
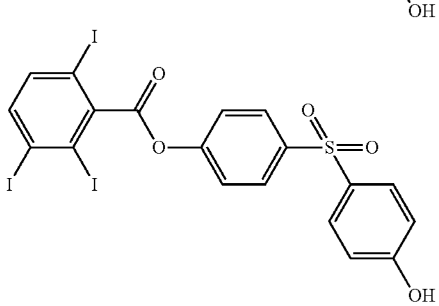
-continued
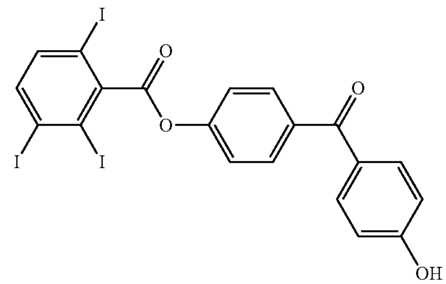
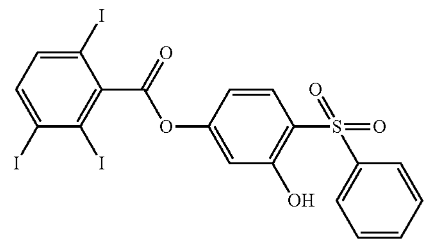
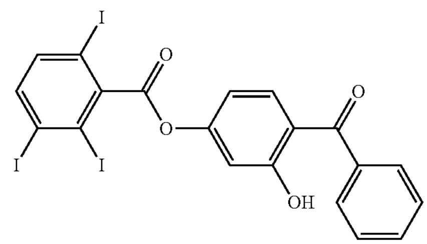
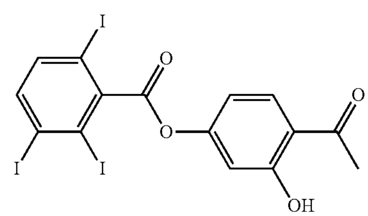
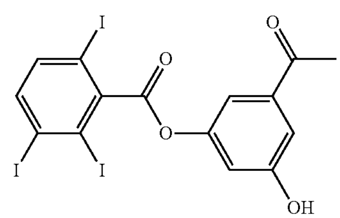
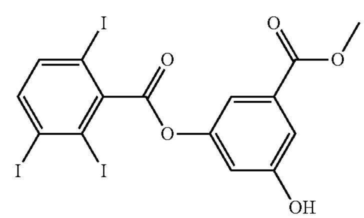
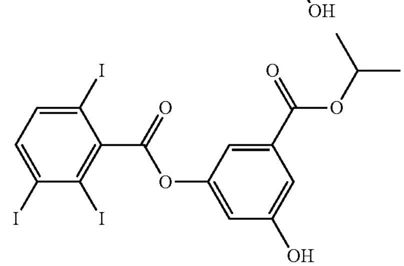

-continued
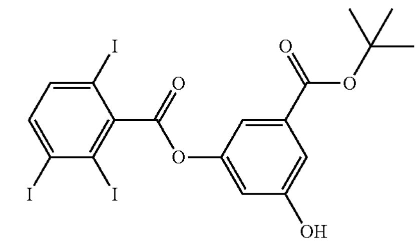
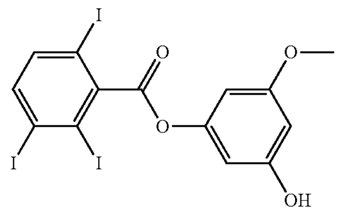
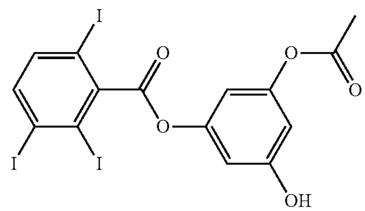
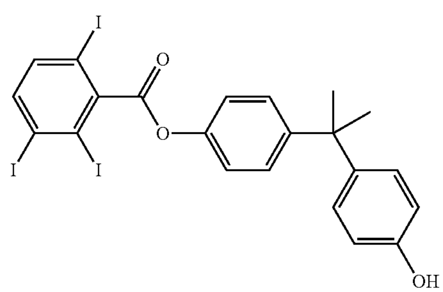
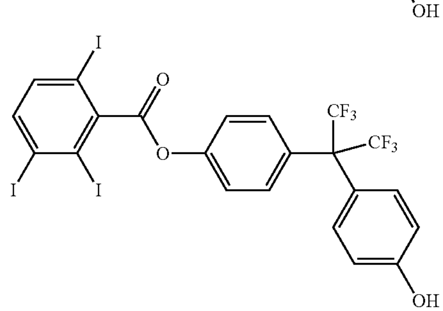
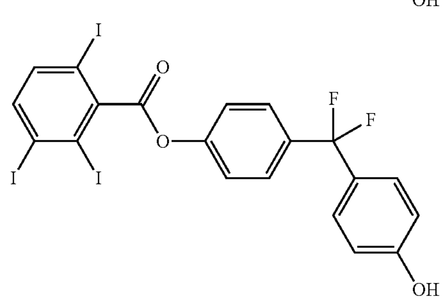
-continued
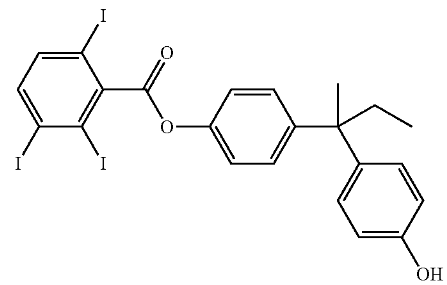
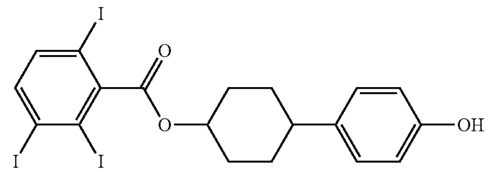
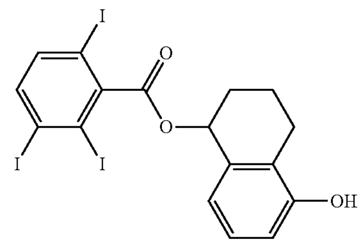
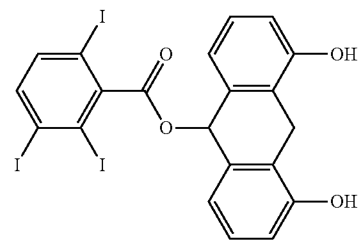
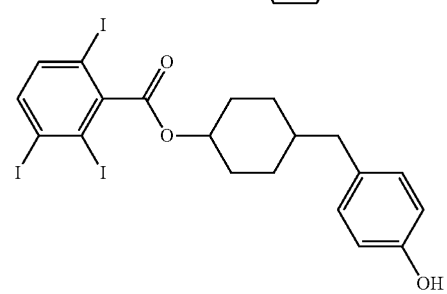
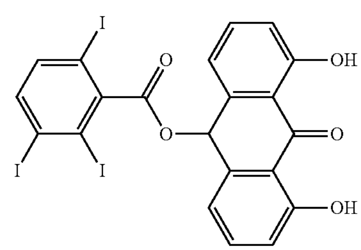
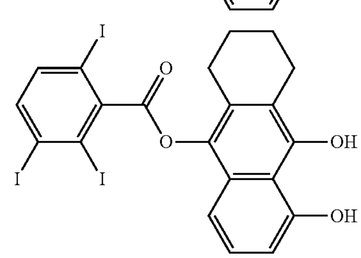

-continued
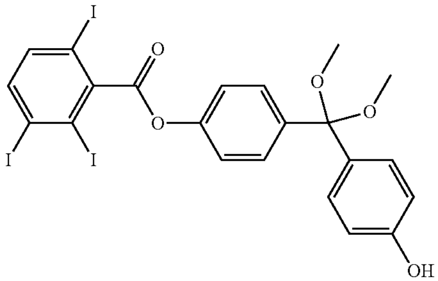
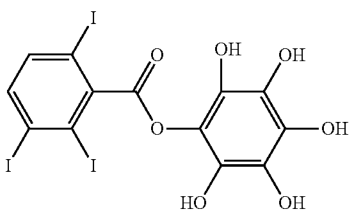
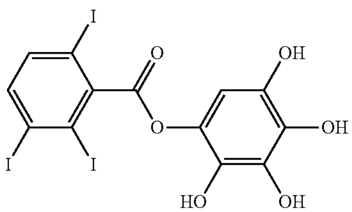
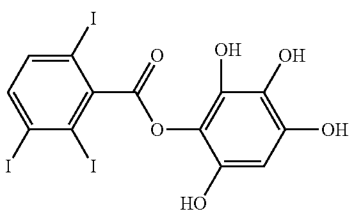
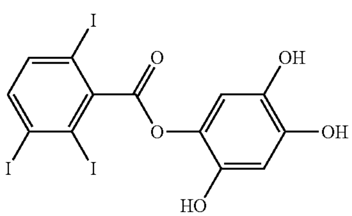
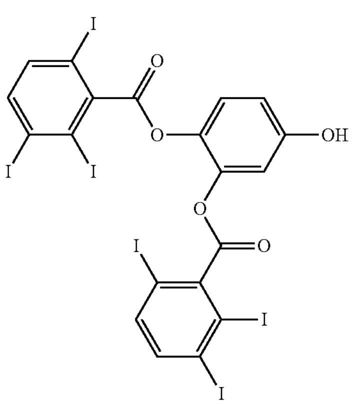
-continued
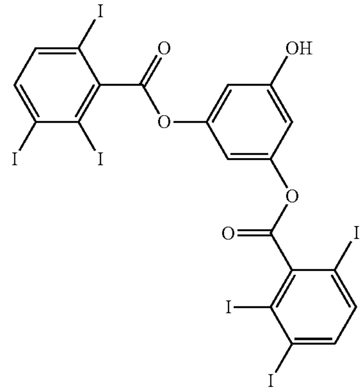
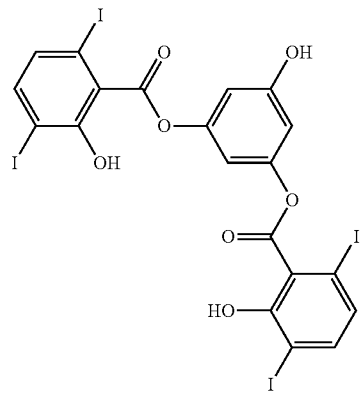
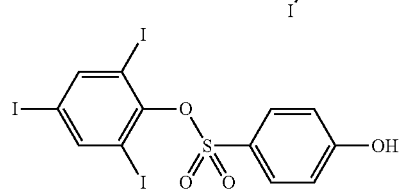
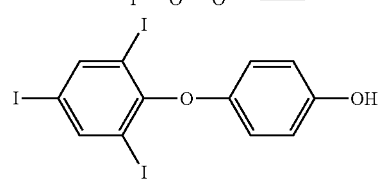
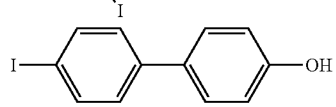
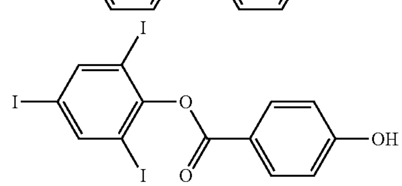
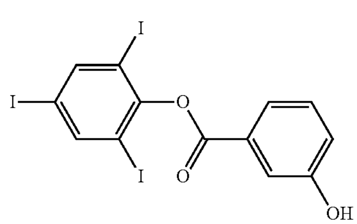

-continued
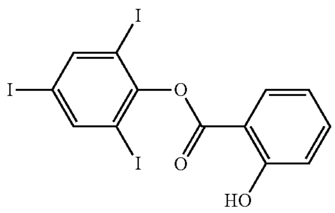
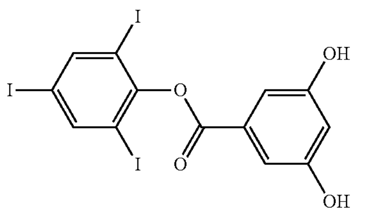
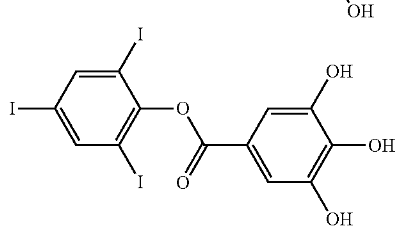
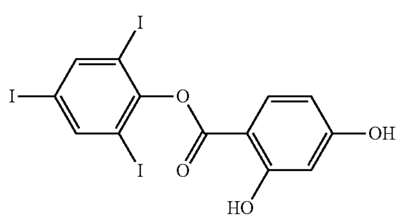
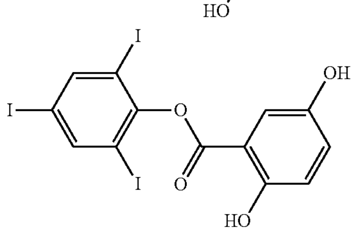
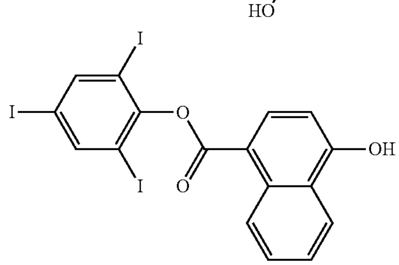
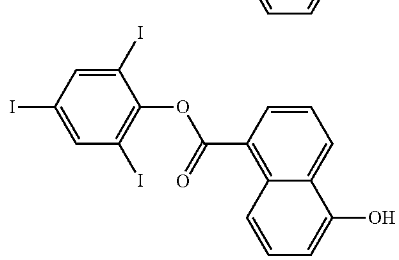
-continued
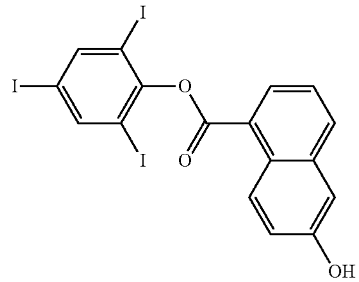
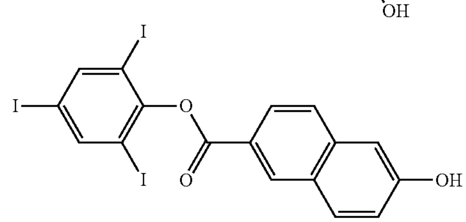
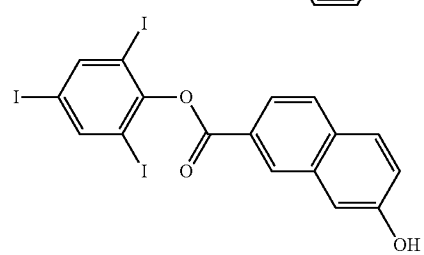
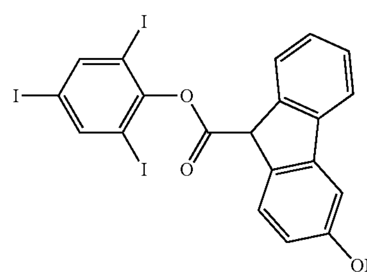
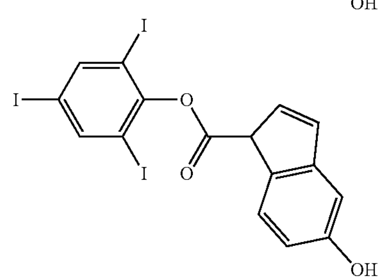
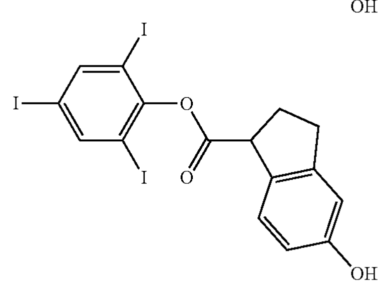
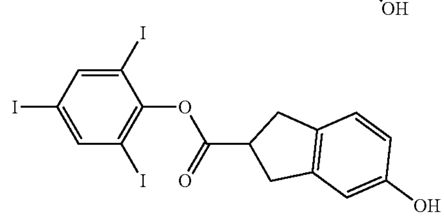

-continued

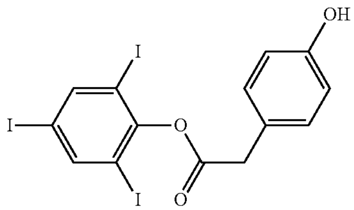

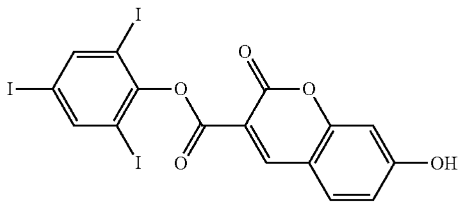

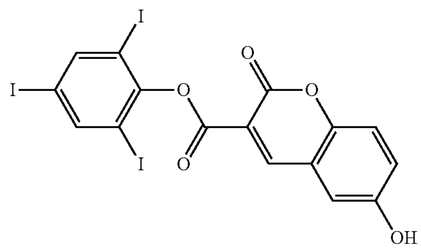

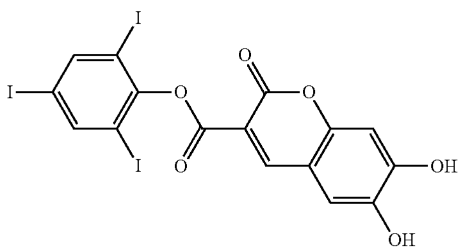

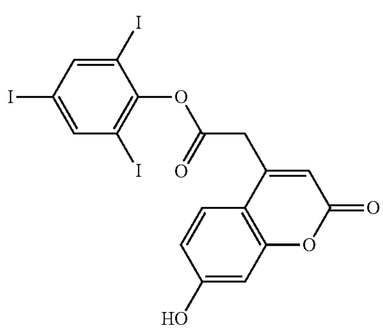

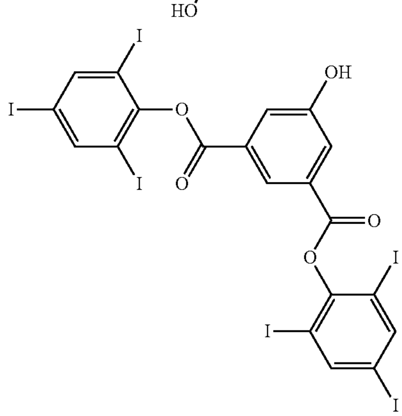

The compound having formula (A) may be synthesized, for example, by esterification reaction of iodized benzoic acid with hydroquinone.

The compound having formula (A) functions as an additive having a sensitizing effect in a resist composition. The iodized moiety absorbs EUV or EB while the phenolic hydroxyl group generates secondary electrons. The released secondary electrons transport their energy to the acid generator to increase sensitivity, i.e., to exert a sensitizing effect.

In the resist composition, the compound having formula (A) is preferably added in an amount of 0.001 to 50 parts by weight per 100 parts by weight of the base polymer, from the standpoints of sensitivity and acid diffusion suppressing effect. The amount of the compound is more preferably 0.01 to 40 parts, even more preferably 0.1 to 30 parts by weight.

Base Polymer

The base polymer used herein is a polymer comprising recurring units having an acid labile group when the resist composition is of positive tone. The recurring units having an acid labile group are preferably recurring units having the formula (a1) or recurring units having the formula (a2). These units are referred to as recurring units (a1) or (a2), hereinafter.

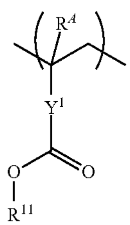

(a1)

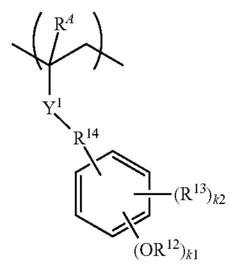

(a2)

In formulae (a1) and (a2), $R^A$ is each independently hydrogen or methyl. $Y^1$ is a single bond, phenylene group, naphthylene group, or a $C_1$-$C_{12}$ linking group containing an ester bond, ether bond or lactone ring. $Y^2$ is a single bond, —C(═O)—O— or —C(═O)—NH—. $R^{11}$ and $R^{12}$ are each independently an acid labile group. $R^{13}$ is fluorine, trifluoromethyl, cyano, $C_1$-$C_6$ alkyl, $C_1$-$C_6$ alkoxy, $C_2$-$C_7$ acyl, $C_2$-$C_7$ acyloxy, or $C_2$-$C_7$ alkoxycarbonyl group. $R^{14}$ is a single bond or a straight or branched $C_1$-$C_6$ alkanediyl group in which some (i.e., one or more) carbon atom may be replaced by an ether or ester bond. The subscript k1 is 1 or 2, and k2 is an integer of 0 to 4. Examples of the foregoing alkyl, alkoxy, acyl, acyloxy, alkoxycarbonyl and alkanediyl groups are as exemplified above.

Examples of the monomer from which recurring units (a1) are derived are shown below, but not limited thereto. Herein $R^A$ and $R^{11}$ are as defined above.

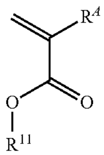
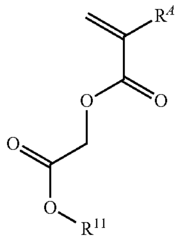
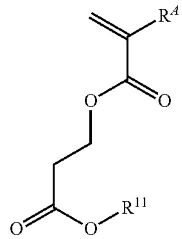
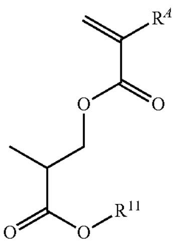
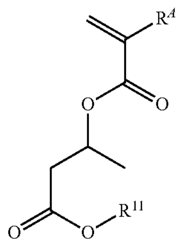
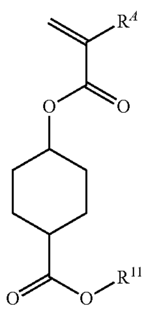
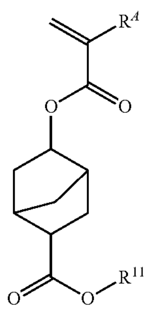
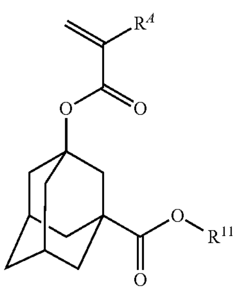
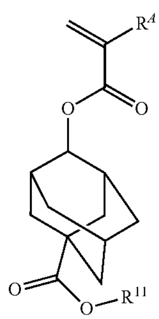
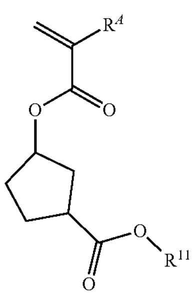
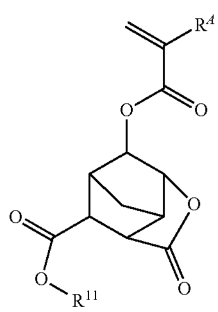
-continued
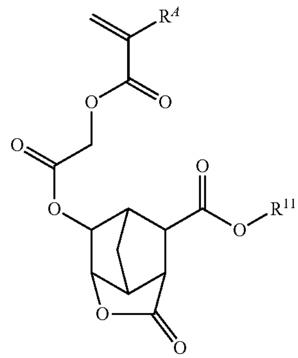
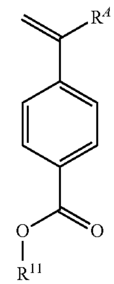
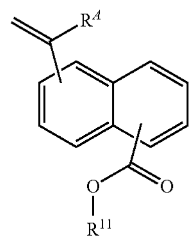
Examples of the monomer from which recurring units (a2) are derived are shown below, but not limited thereto. Herein $R^A$ and $R^{12}$ are as defined above.
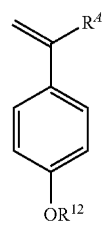
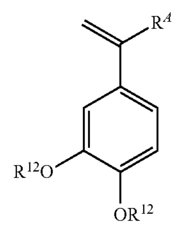
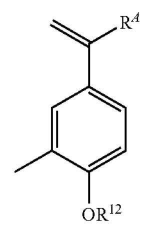
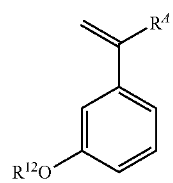
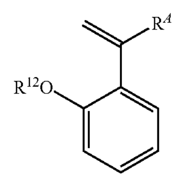
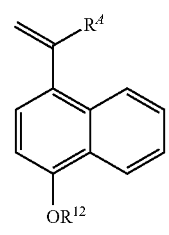
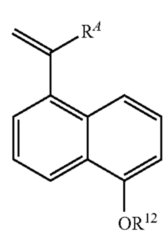
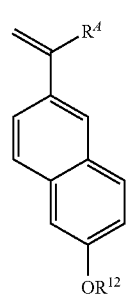
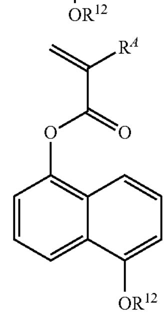

-continued
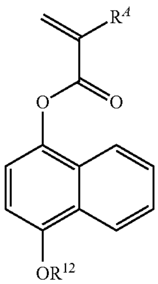
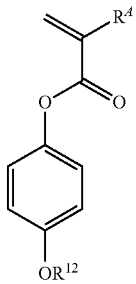
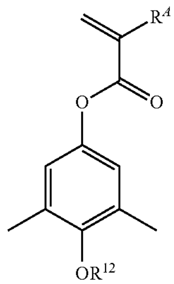
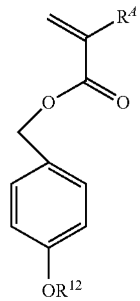
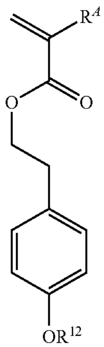
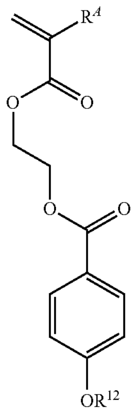
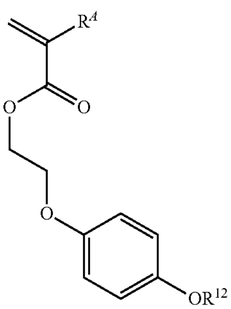
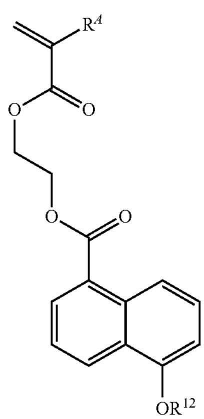
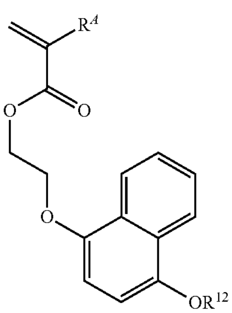
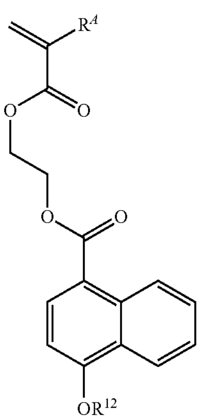
-continued
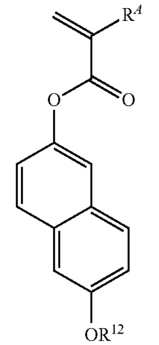
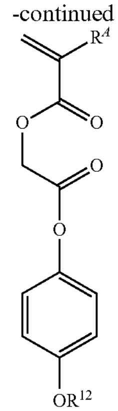
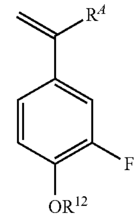
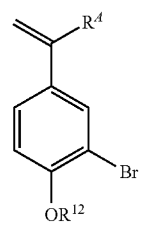
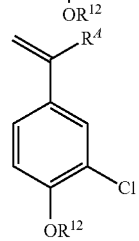
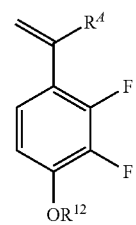
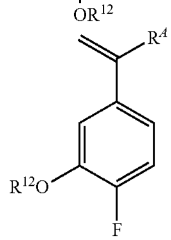
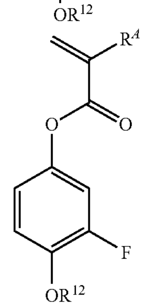
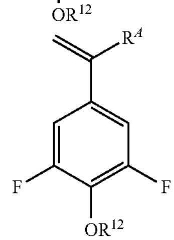
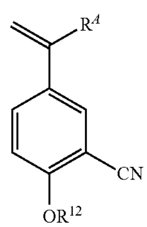
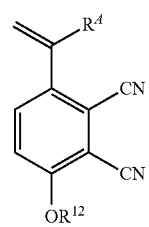
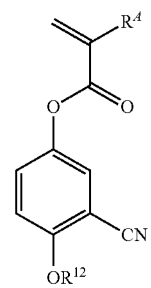
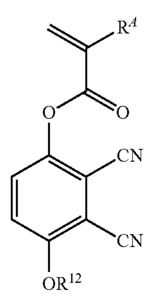
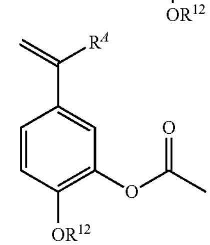
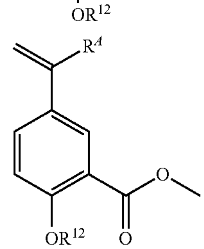
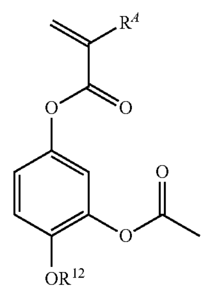

-continued

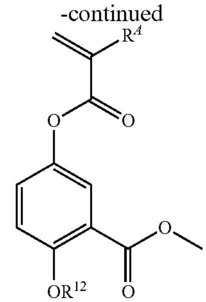

The acid labile groups represented by $R^{11}$ and $R^{12}$ in formulae (a1) and (a2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

(AL-1)

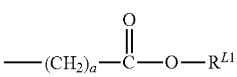

(AL-2)

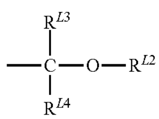

(AL-3)

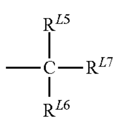

In formulae (AL-1) and (AL-2), $R^{L1}$ and $R^{L2}$ are each independently a $C_1$-$C_{40}$ monovalent hydrocarbon group which may contain a heteroatom such as oxygen, sulfur, nitrogen or fluorine. The monovalent hydrocarbon groups may be straight, branched or cyclic, and are preferably $C_1$-$C_{40}$ alkyl groups, more preferably $C_1$-$C_{20}$ alkyl groups. In formula (AL-1), "a" is an integer of 0 to 10, especially 1 to 5.

In formula (AL-2), $R^{L3}$ and $R^{L4}$ are each independently hydrogen or a $C_1$-$C_{20}$ monovalent hydrocarbon group which may contain a heteroatom such as oxygen, sulfur, nitrogen or fluorine. The monovalent hydrocarbon groups may be straight, branched or cyclic, and are preferably $C_1$-$C_{20}$ alkyl groups. Any two of $R^{L2}$, $R^{L3}$ and $R^{L4}$ may bond together to form a ring, especially alicyclic, with the carbon atom or carbon and oxygen atoms to which they are attached, the ring containing 3 to 20 carbon atoms, preferably 4 to 16 carbon atoms.

In formula (AL-3), $R^{L5}$, $R^{L6}$ and $R^{L7}$ are each independently a $C_1$-$C_{20}$ monovalent hydrocarbon group which may contain a heteroatom such as oxygen, sulfur, nitrogen or fluorine. The monovalent hydrocarbon groups may be straight, branched or cyclic, and are preferably $C_1$-$C_{20}$ alkyl groups. Any two of $R^{L5}$, $R^{L6}$ and $R^{L7}$ may bond together to form a ring, especially alicyclic, with the carbon atom to which they are attached, the ring containing 3 to 20 carbon atoms, preferably 4 to 16 carbon atoms.

In a preferred embodiment, the polymer may further comprise recurring units (b) having a phenolic hydroxyl group as an adhesive group. Examples of the monomer from which recurring units (b) are derived are shown below, but not limited thereto. Herein $R^A$ is as defined above.

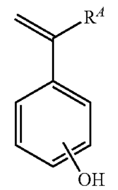
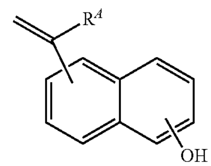
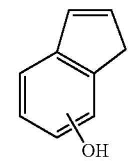
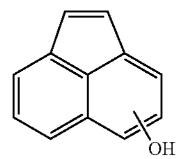
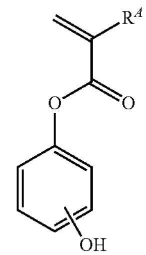
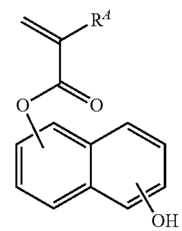
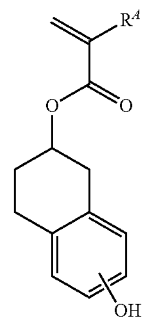
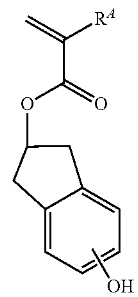
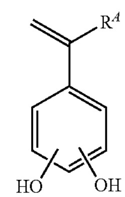
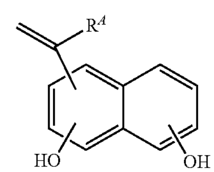
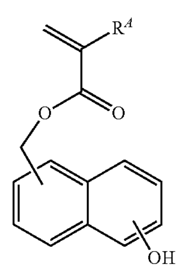
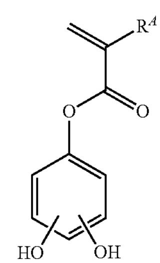
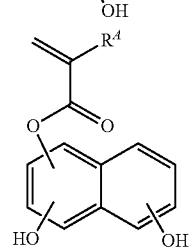
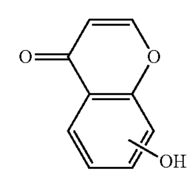
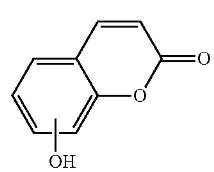
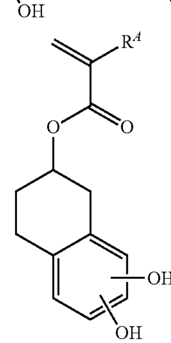
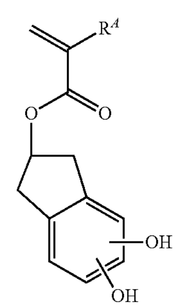

-continued

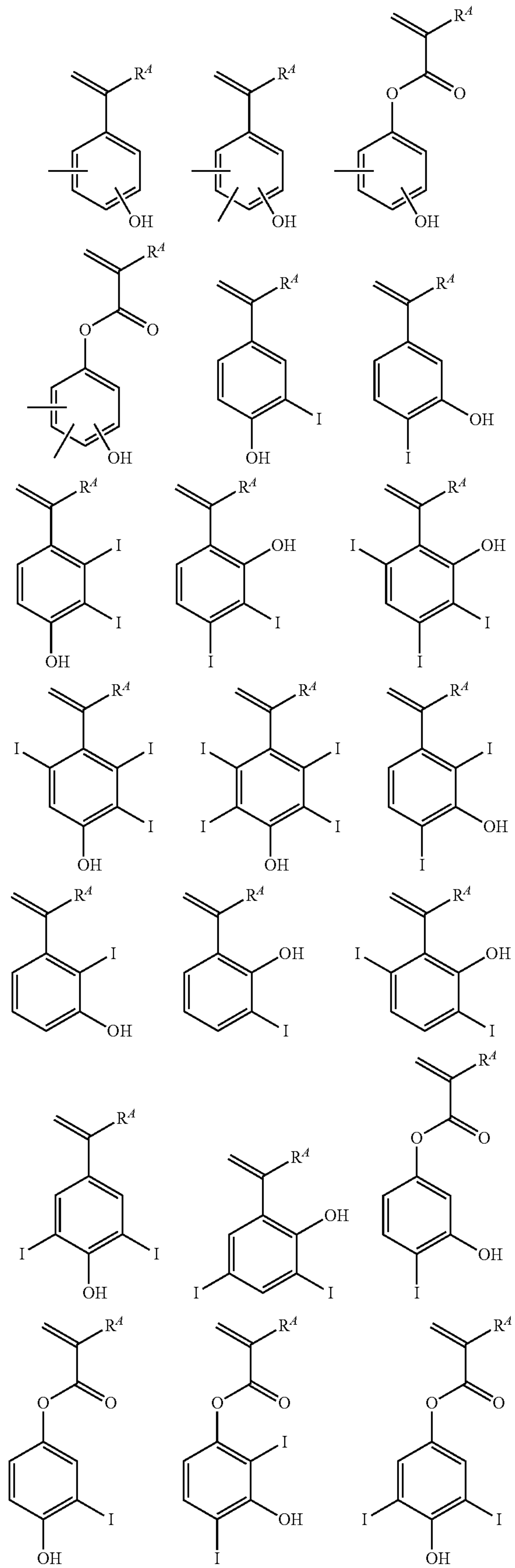

-continued

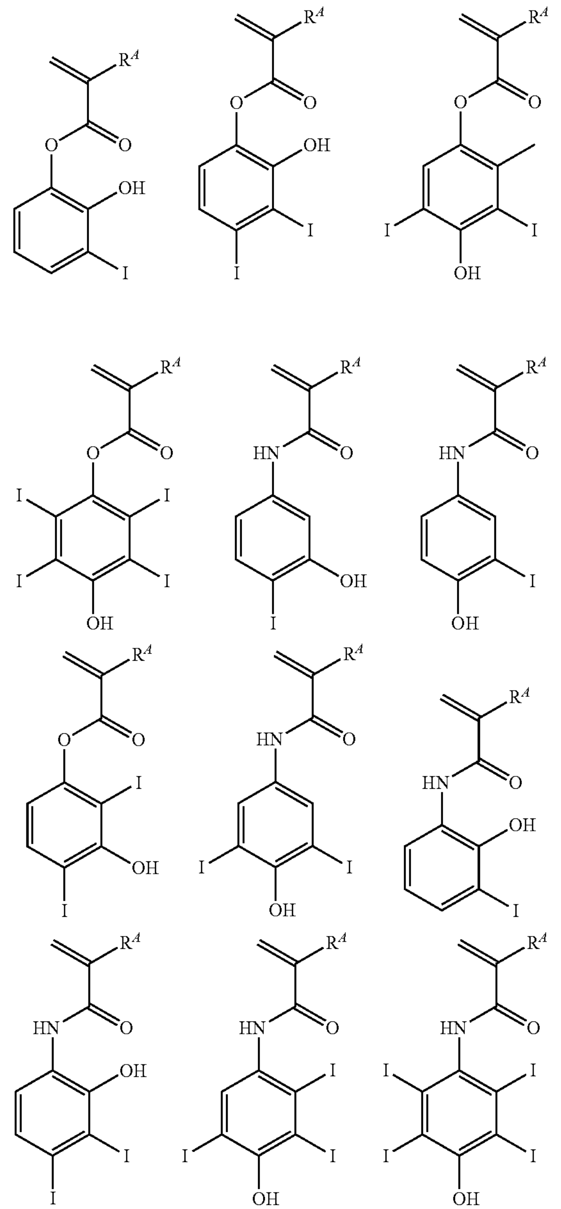

The polymer may further comprise recurring units (c) having another adhesive group. The other adhesive group is selected from among hydroxyl (other than the phenolic hydroxyl), lactone ring, ether bond, ester bond, carbonyl, cyano, and carboxyl. Examples of the monomer from which recurring units (c) are derived are shown below, but not limited thereto. Herein $R^A$ is as defined above.

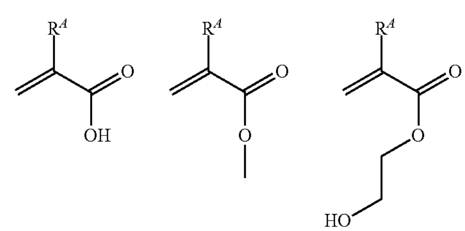

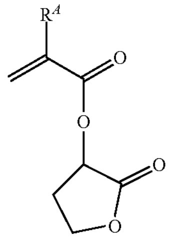
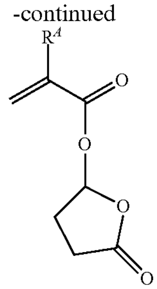
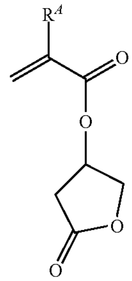
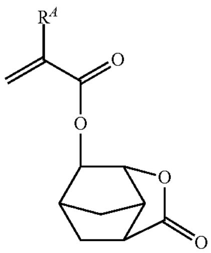
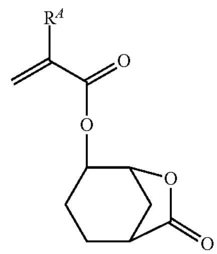
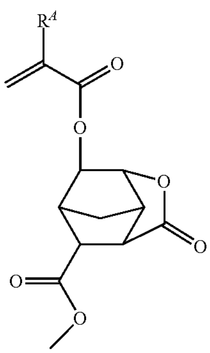
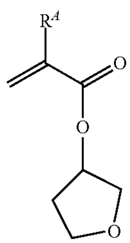
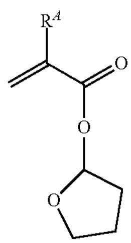
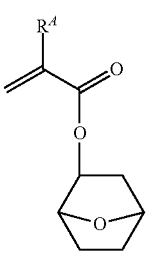
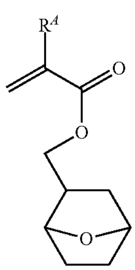
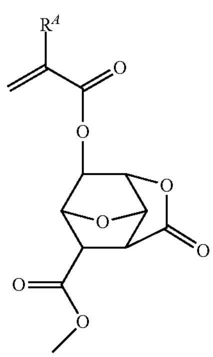
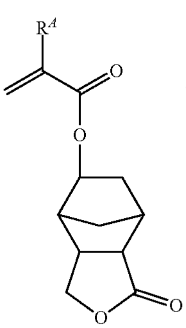
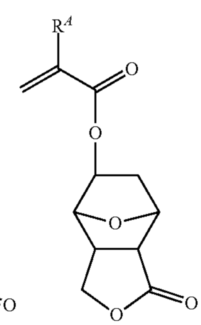
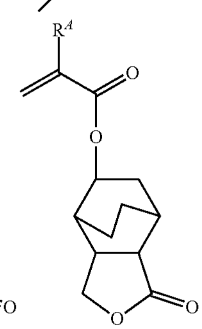
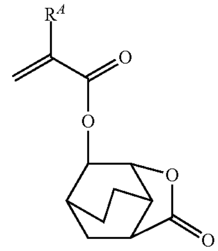
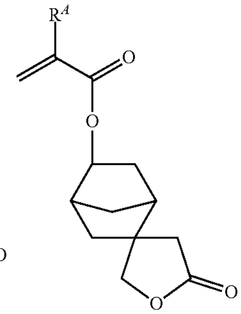
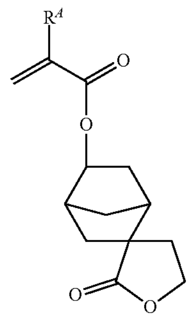
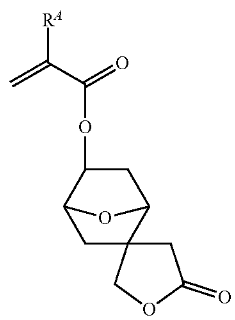
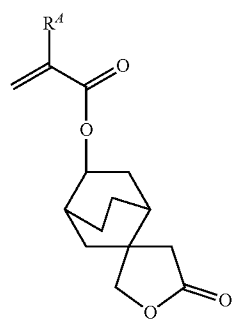
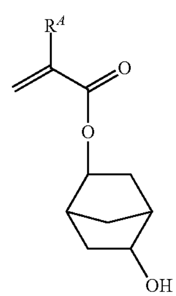
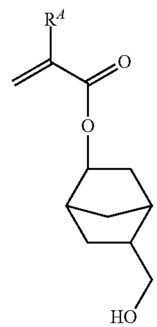
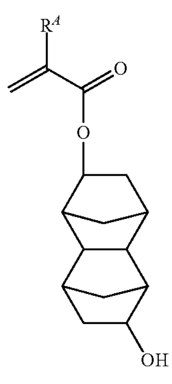
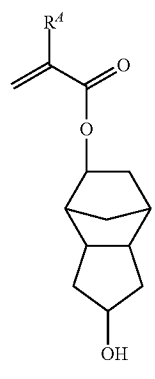
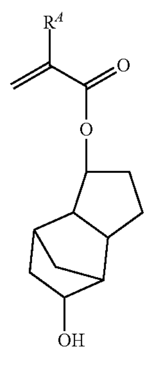

-continued
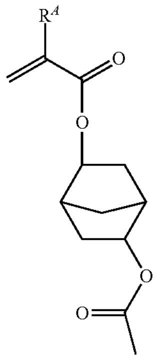
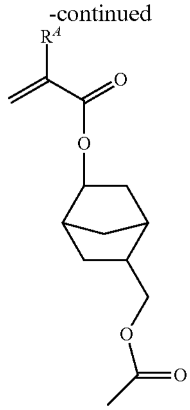
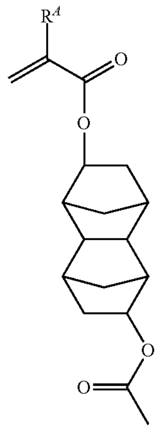
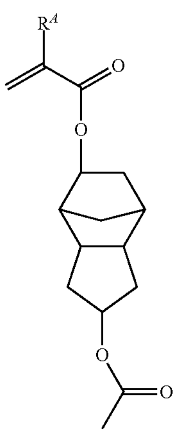
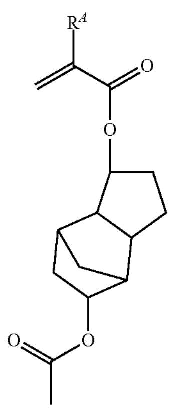
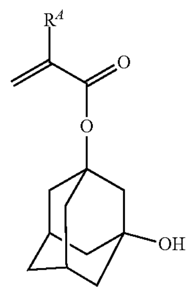
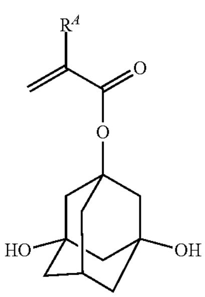
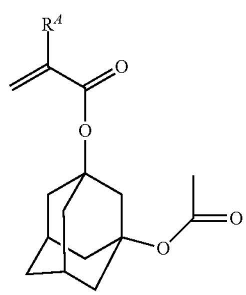
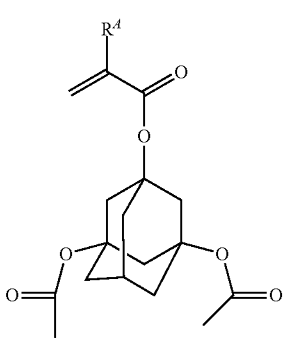
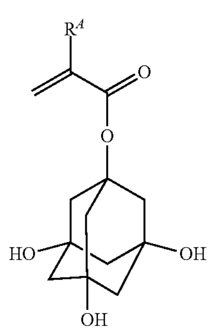
-continued
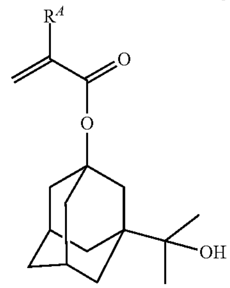
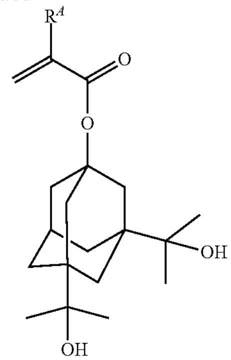
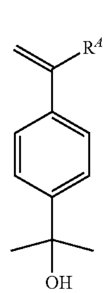
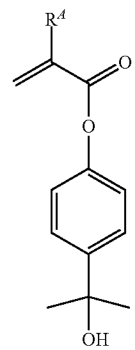
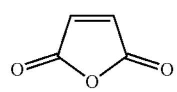
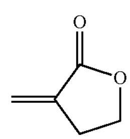
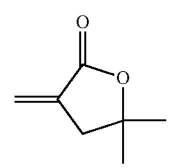
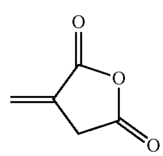
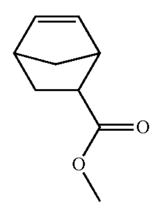
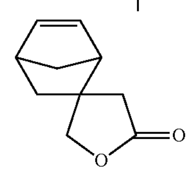
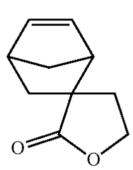
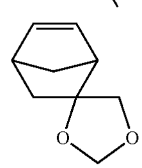
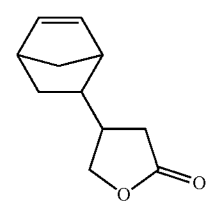
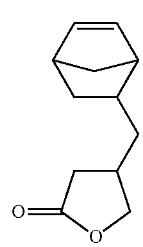
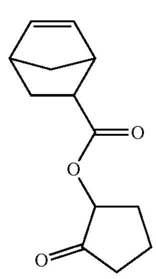
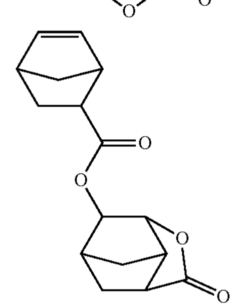

-continued
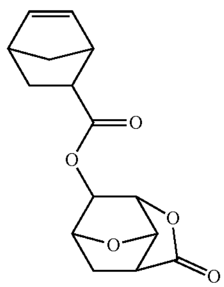
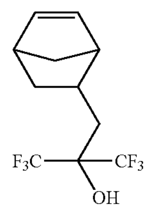
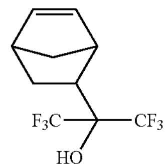
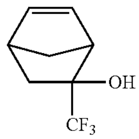
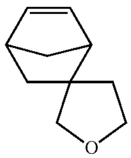
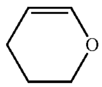
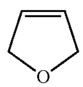
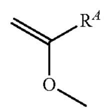
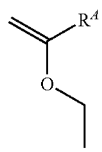
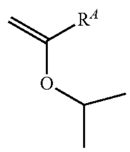
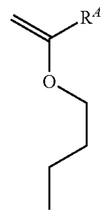
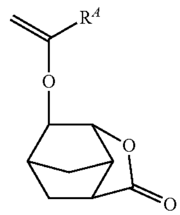
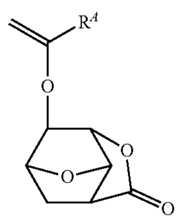
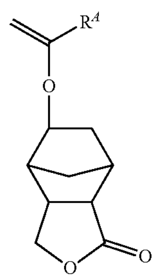
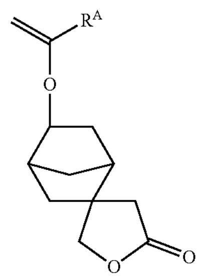
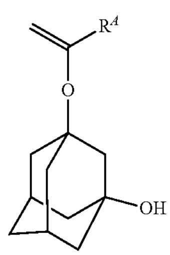
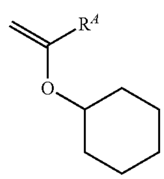
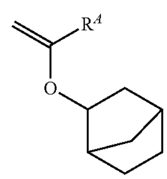
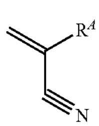
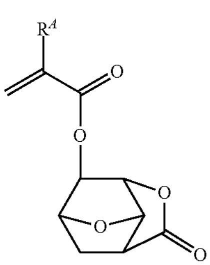
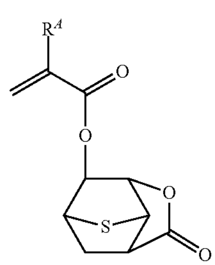
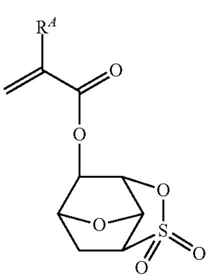
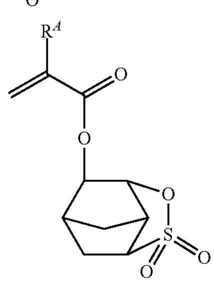
-continued
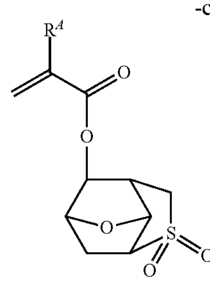
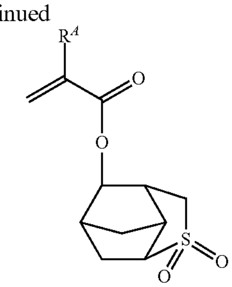
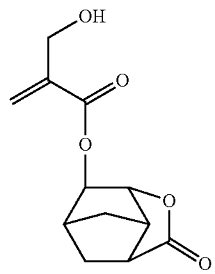
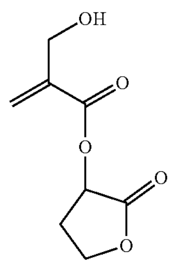
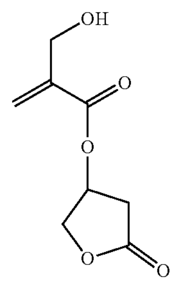
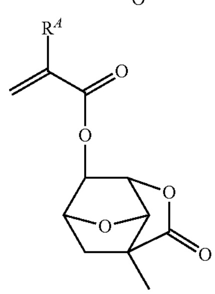
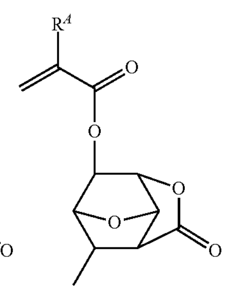
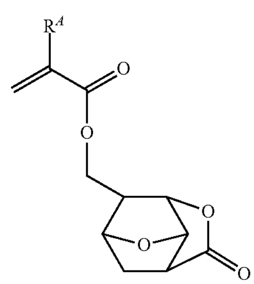
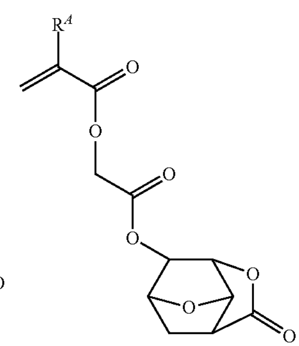
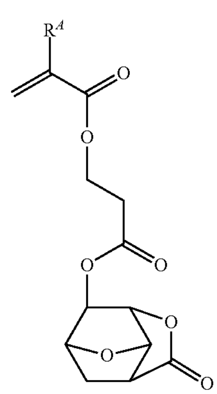
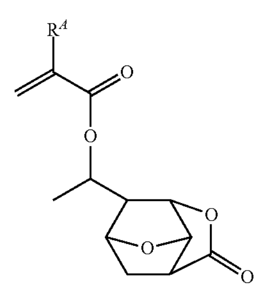

-continued
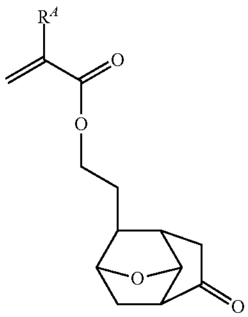
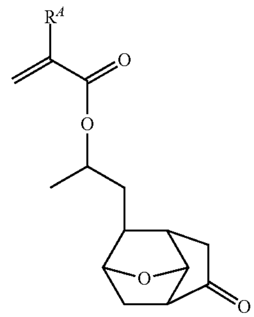
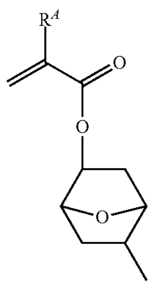
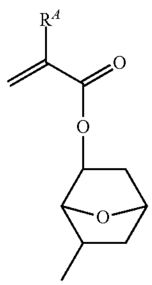
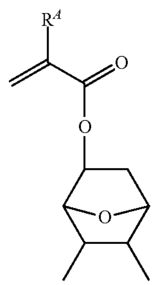
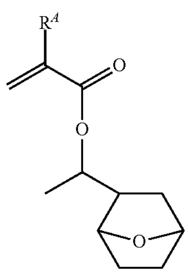
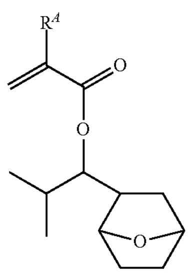
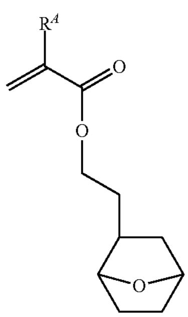
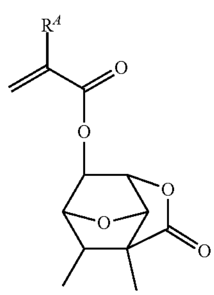
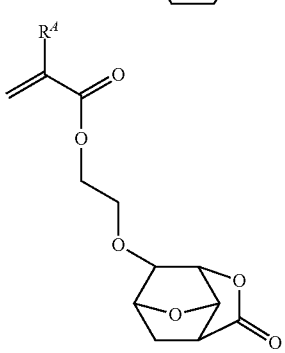
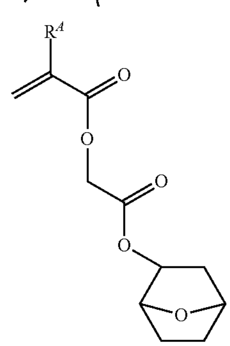
-continued
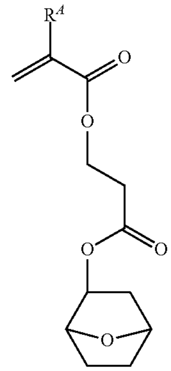
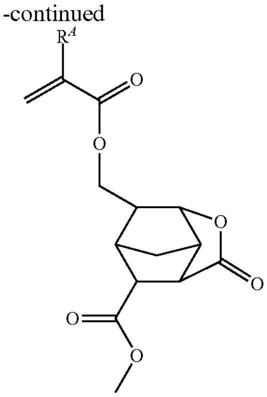
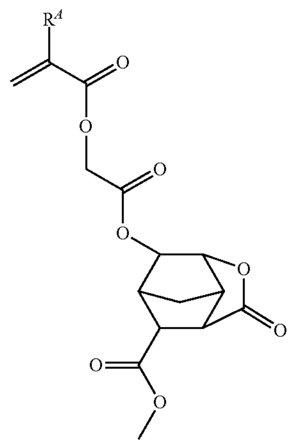
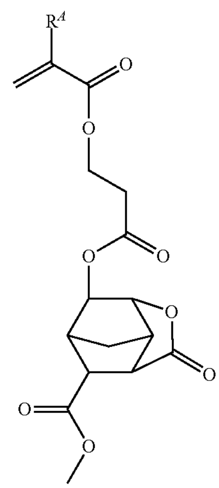
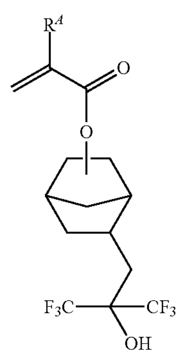
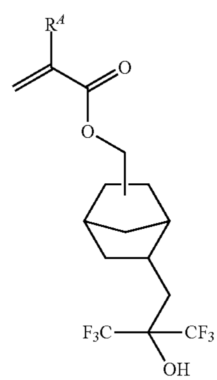
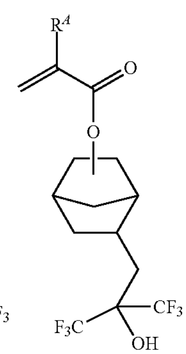
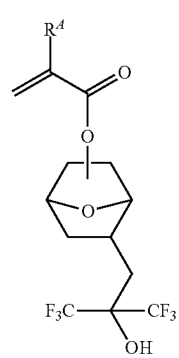
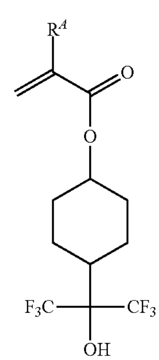
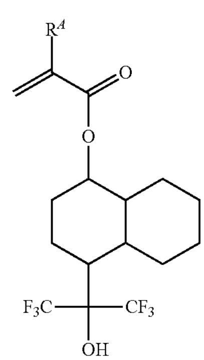

-continued
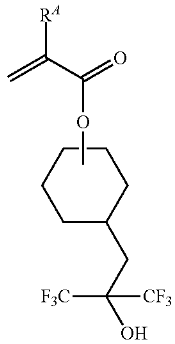
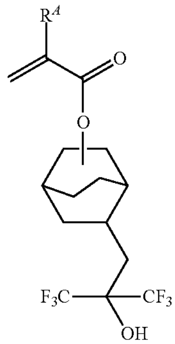
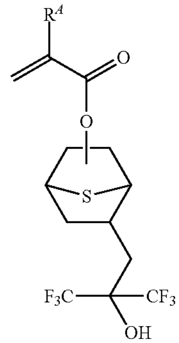
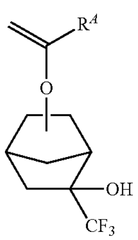
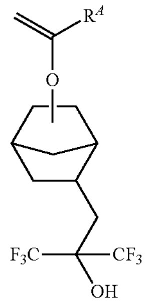
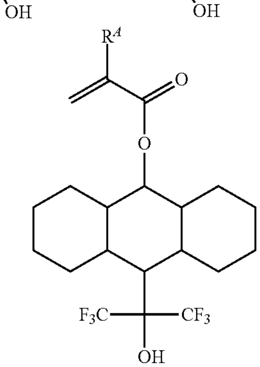
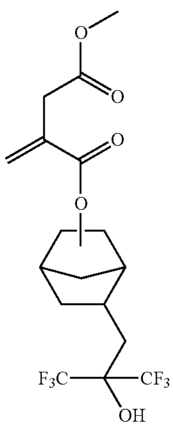
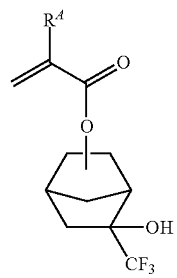
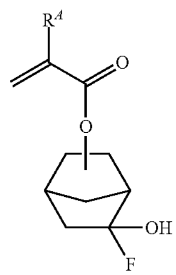
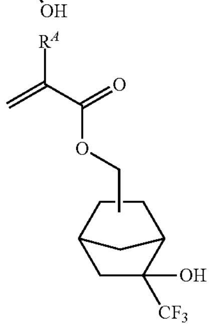
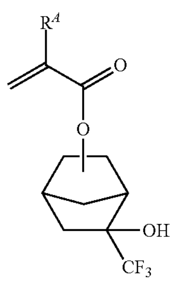
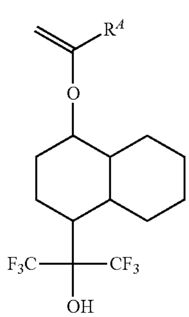
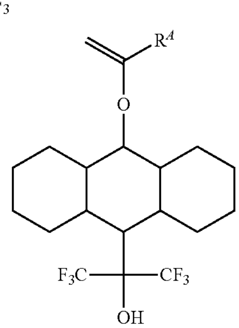
-continued
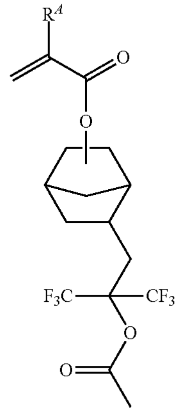
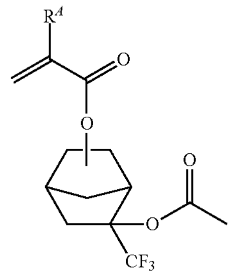
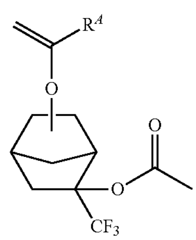
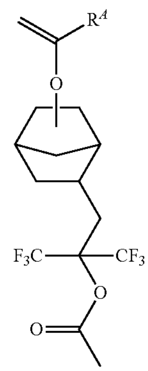
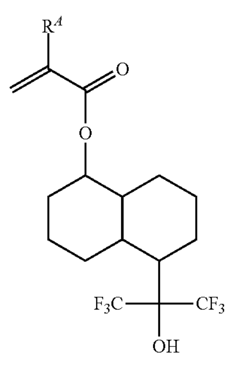
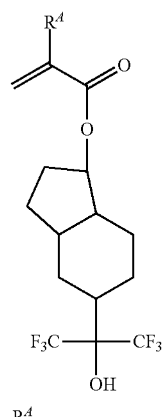
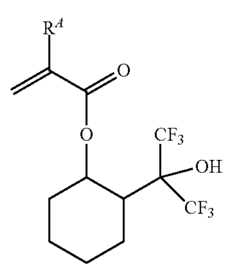
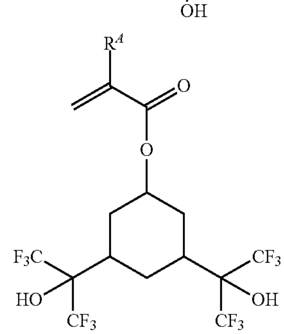

-continued
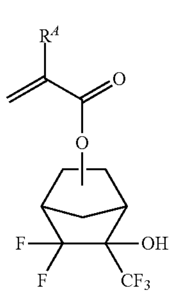
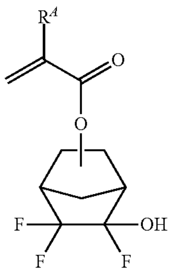
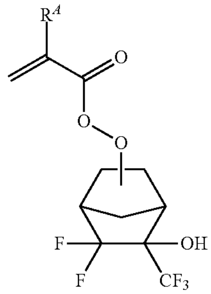
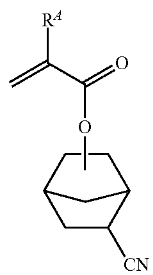
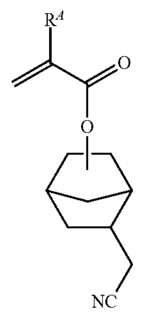
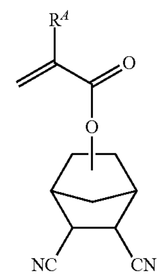
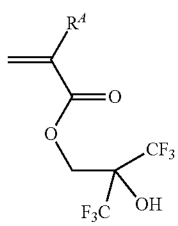
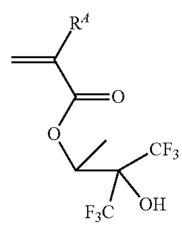
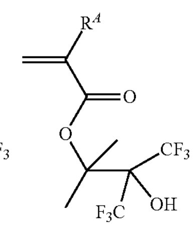
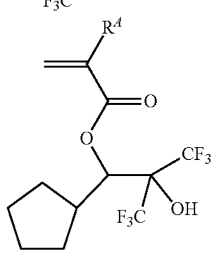
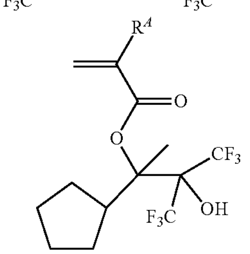
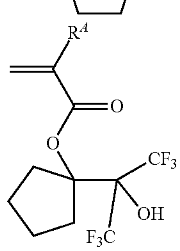
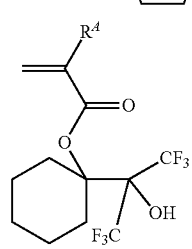
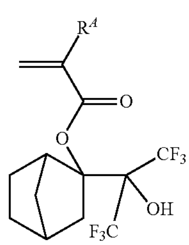
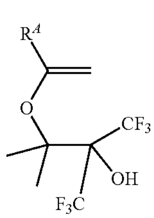
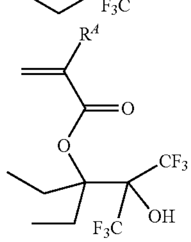
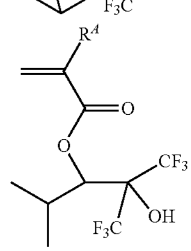
-continued
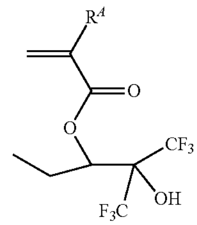
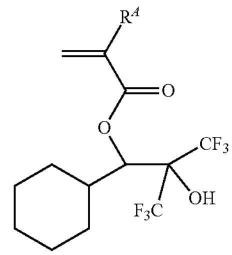
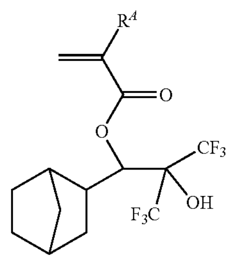
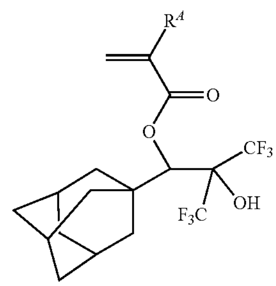
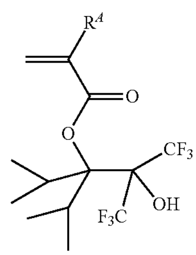
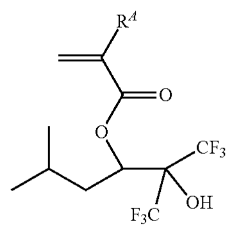
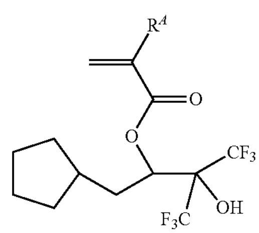
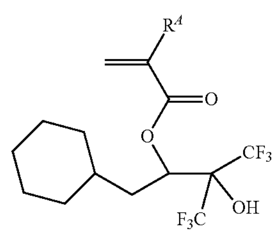
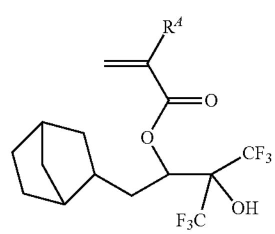
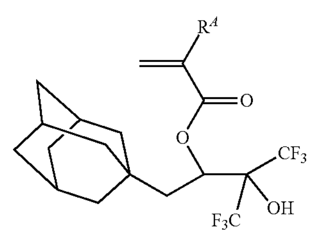
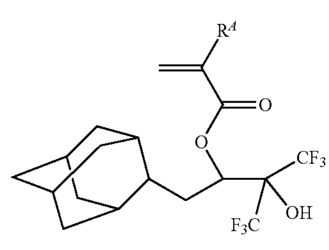
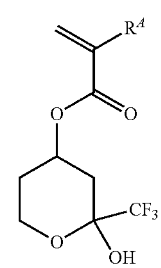

-continued
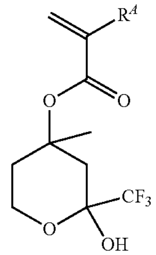
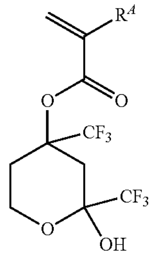
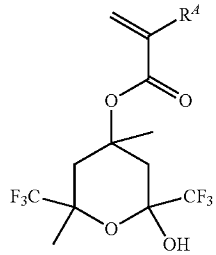
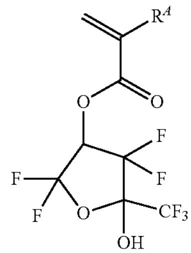
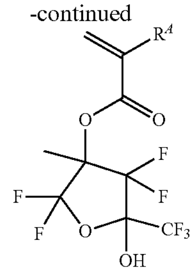
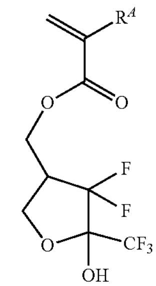
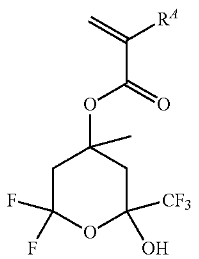
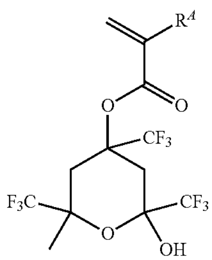
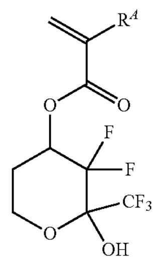
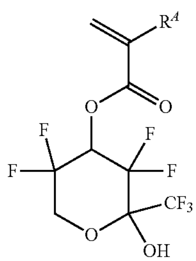
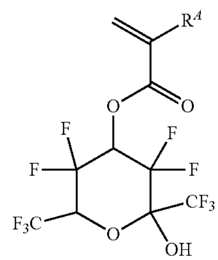
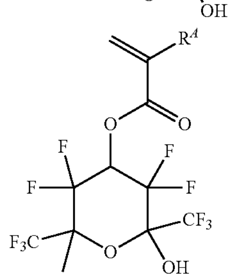
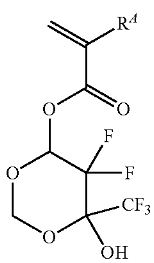
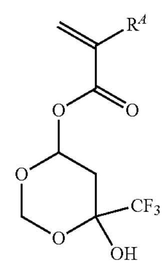
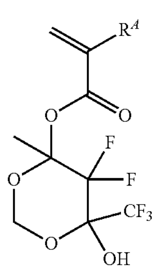
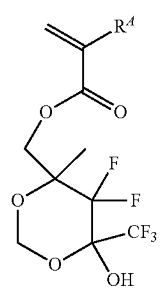
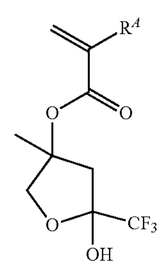
-continued
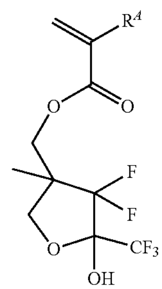
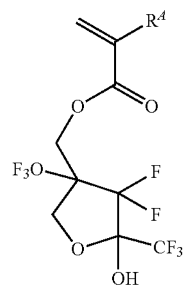
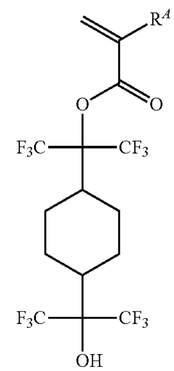
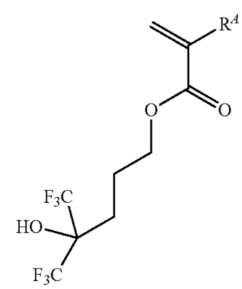
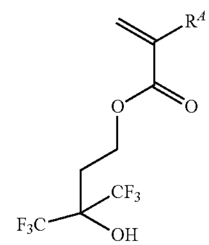
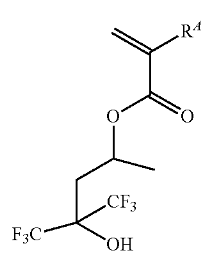
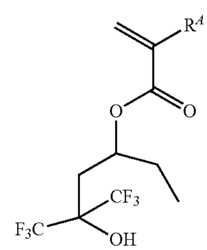
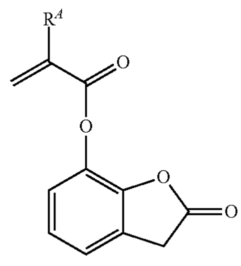
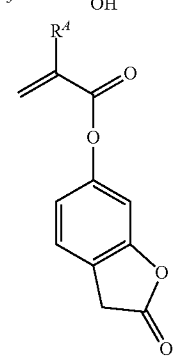
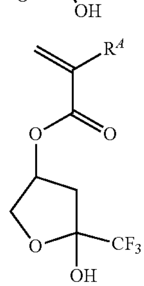
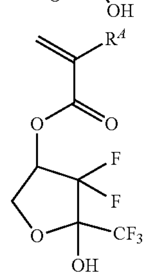
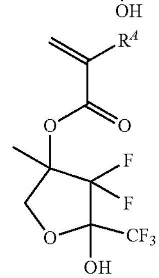

-continued
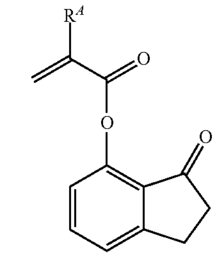
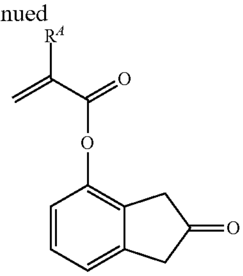
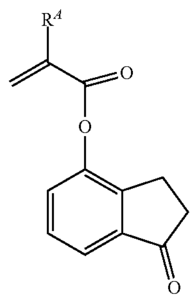
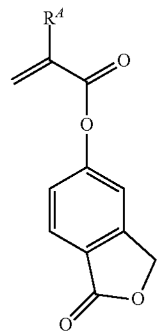
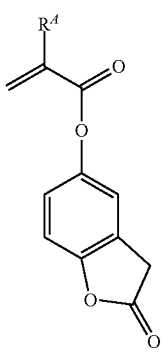
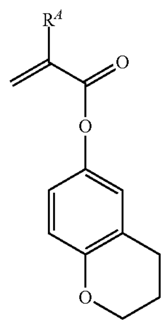
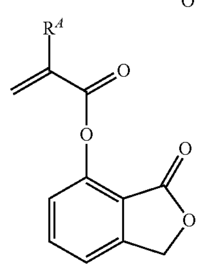
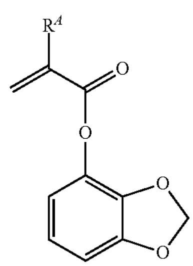
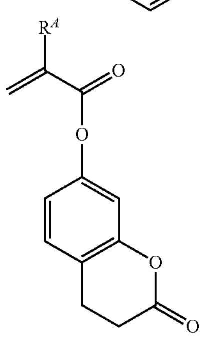
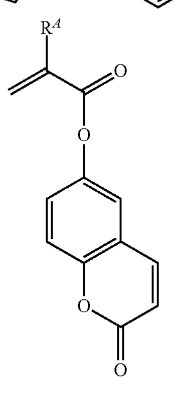
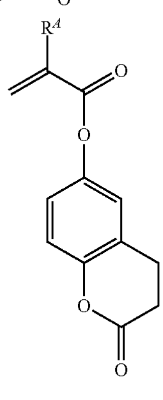
-continued
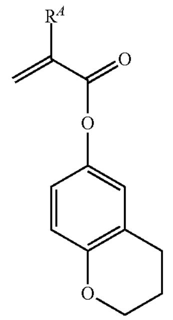
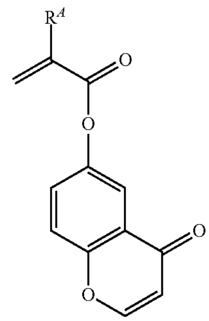
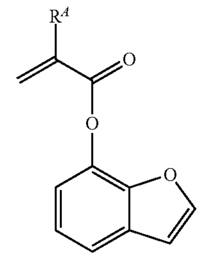
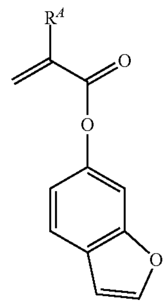
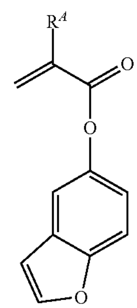
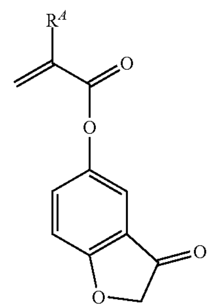
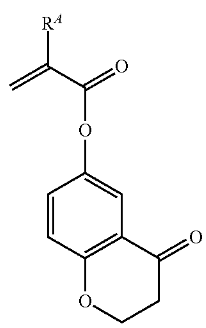
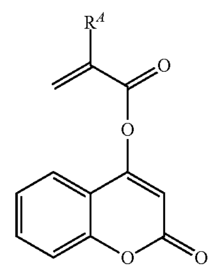
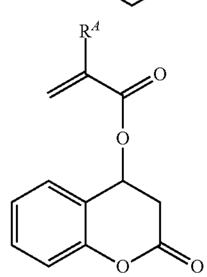
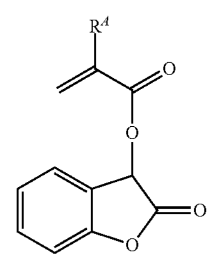
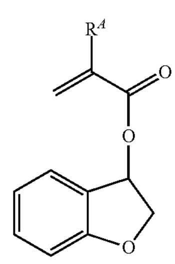
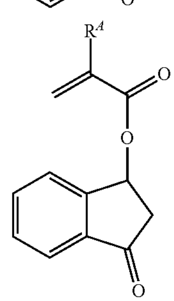

-continued
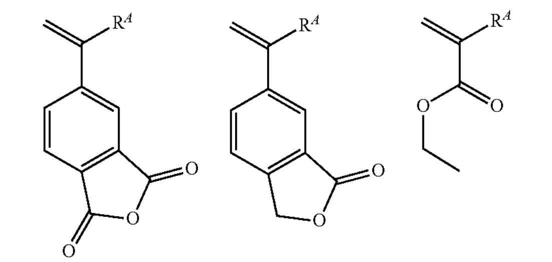
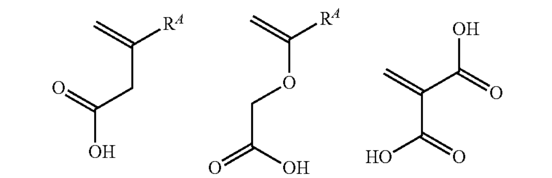
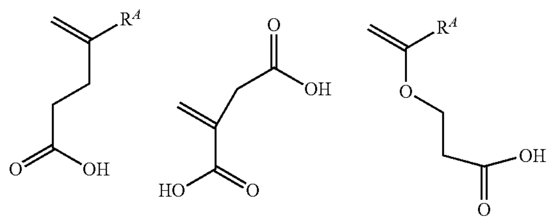
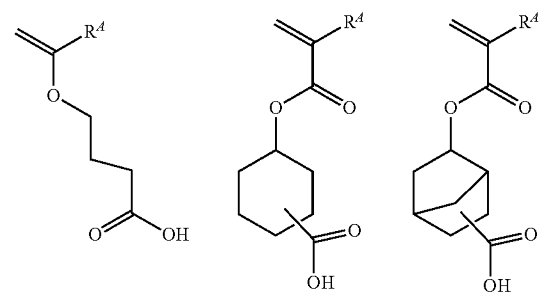
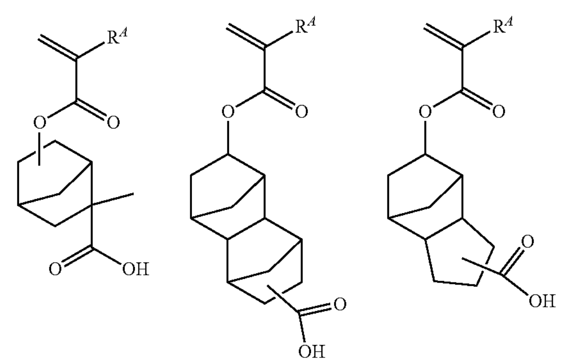
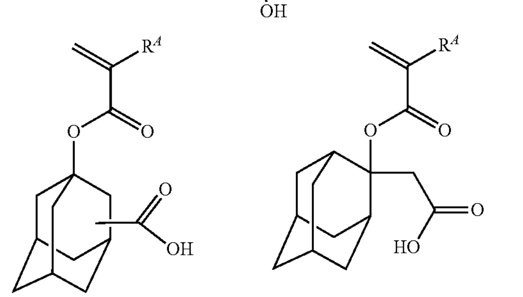
-continued
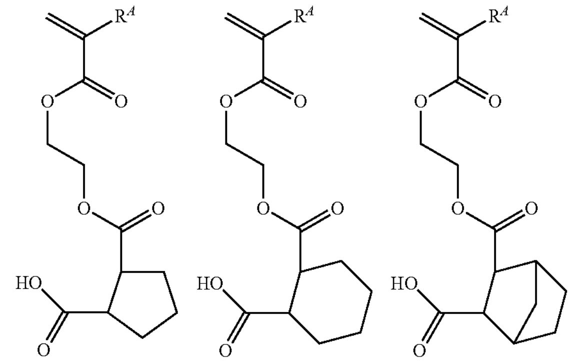
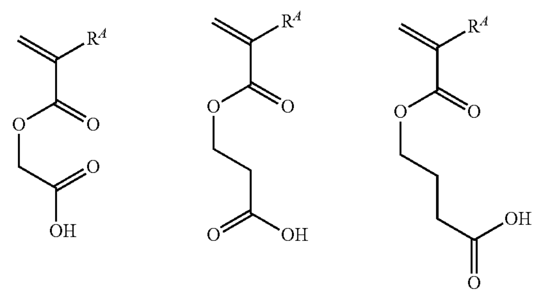
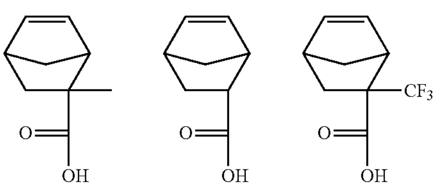
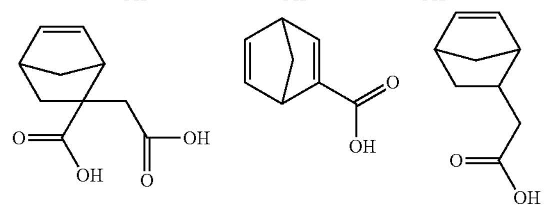
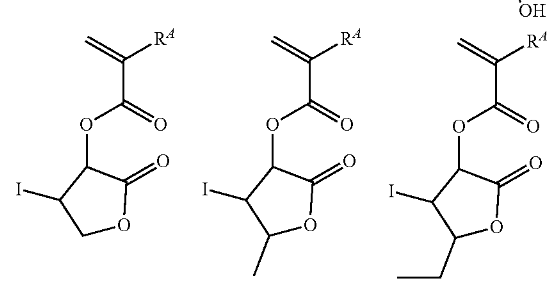
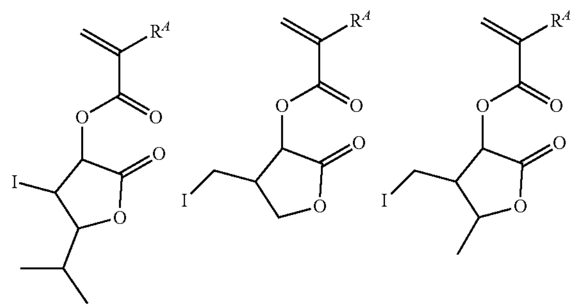

-continued

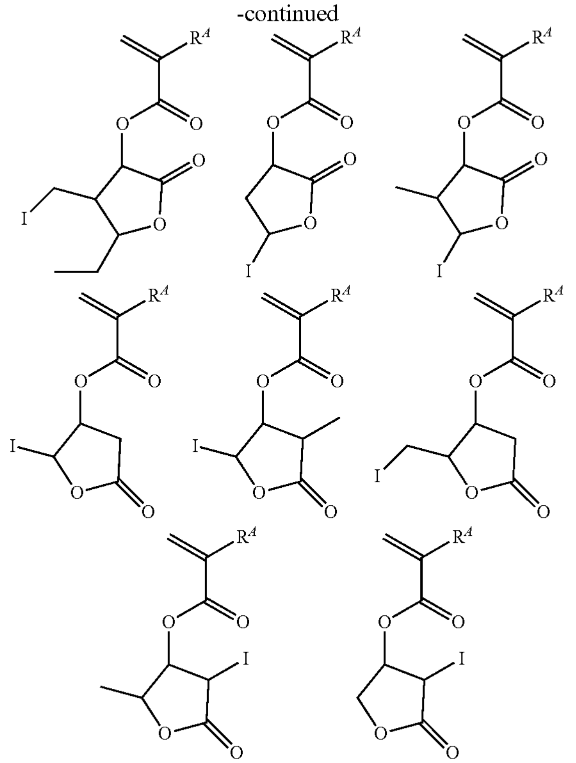

In a preferred embodiment, the polymer may further comprise recurring units (d) derived from indene, benzofuran, benzothiophene, acenaphthylene, chromone, coumarin, norbornadiene or derivatives thereof. Examples of the monomer from which recurring units (d) are derived are shown below, but not limited thereto.

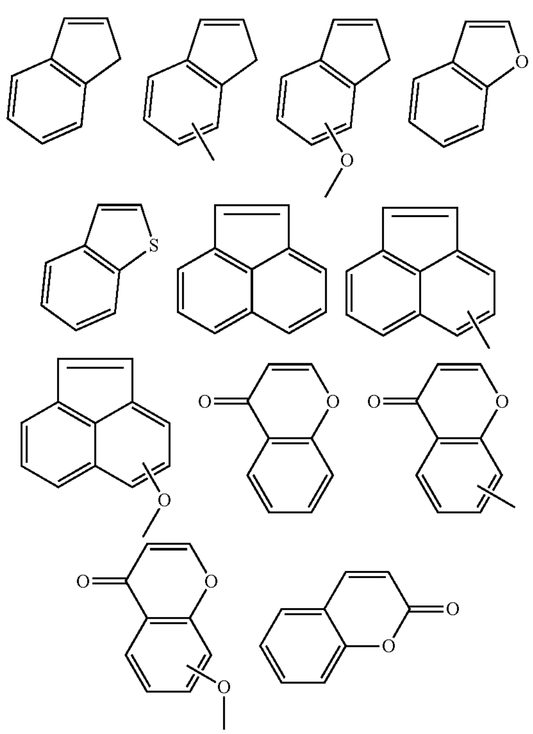

-continued

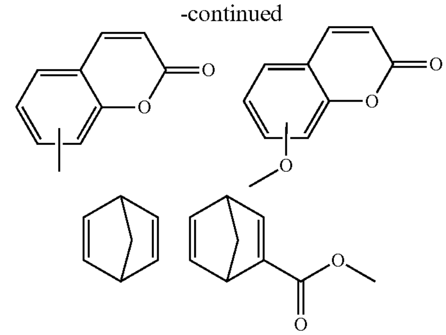

The polymer may further comprise recurring units (e) derived from styrene, vinylnaphthalene, vinylanthracene, vinylpyrene, methyleneindane, vinylpyridine or vinylcarbazole compounds.

The polymer may further comprise recurring units (f) derived from onium salts containing a polymerizable unsaturated bond. The preferred recurring units (f) include recurring units having the formula (f1), recurring units having the formula (f2), and recurring units having the formula (f3), which are also referred to as recurring units (f1), (f2) and (f3) and may be used alone or in admixture.

(f1)

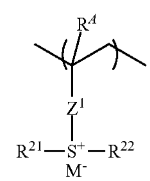

(f2)

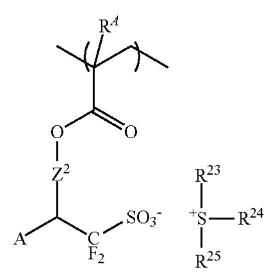

(f3)

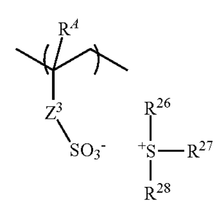

In formulae (f1) to (f3), $R^A$ is each independently hydrogen or methyl. $Z^1$ is a single bond, phenylene group, —O—$Z^{11}$—, —C(═O)—O—$Z^{11}$—, or —C(═O)—NH—$Z^{11}$—, wherein $Z^{11}$ is a $C_1$-$C_6$ alkanediyl group, $C_2$-$C_6$ alkenediyl group or phenylene group, which may contain a carbonyl, ester bond, ether bond or hydroxyl moiety. $Z^2$ is a single bond, —$Z^{21}$—C(═O)—O—, —$Z^{21}$—O—, or —$Z^{21}$—O—C(═O)—, wherein $Z^{21}$ is a $C_1$-$C_{12}$ alkanediyl group which may contain a carbonyl moiety, ester bond or ether bond. A is hydrogen or trifluoromethyl. $Z^3$ is a single bond, methylene, ethylene, phenylene or fluorinated phenylene group, —O—$Z^{31}$—, —C(═O)—O—$Z^{31}$— or —C(═O)—NH—$Z^{31}$—, wherein $Z^{31}$ is a $C_1$-$C_6$ alkanediyl group, phenylene group, fluorinated phenylene group, trifluoromethyl-substituted phenylene group, or $C_2$-$C_6$ alkenediyl group, which may contain a carbonyl moiety, ester bond, ether bond or hydroxyl moiety.

In formulae (f1) to (f3), $R^{21}$ to $R^{28}$ are each independently a $C_1$-$C_{20}$ monovalent hydrocarbon group which may contain a heteroatom. The monovalent hydrocarbon group may be straight, branched or cyclic. Examples include $C_1$-$C_{12}$ alkyl groups, $C_6$-$C_{12}$ aryl groups, and $C_7$-$C_{20}$ aralkyl groups, with the aryl groups being preferred. In these groups, at least one (i.e., one or more or even all) hydrogen atom may be substituted by $C_1$-$C_{10}$ alkyl, halogen, trifluoromethyl, cyano, nitro, hydroxyl, mercapto, $C_1$-$C_{10}$ alkoxy, $C_2$-$C_{10}$ alkoxycarbonyl, or $C_2$-$C_{10}$ acyloxy, and some (i.e., one or more) carbon atom may be replaced by a carbonyl group, ether bond or ester bond. Also, any two of $R^{23}$, $R^{24}$ and $R^{25}$ or any two of $R^{26}$, $R^{27}$ and $R^{28}$ may bond together to form a ring with the sulfur atom to which they are attached.

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; and methide ions such as tris(trifluoromethylsulfonyl)methide and tris(perfluoroethylsulfonyl)methide.

Also included are a sulfonate ion which is fluorinated at α-position as represented by the formula (K-1) and a sulfonate ion which is fluorinated at α- and β-positions as represented by the formula (K-2).

$$R^{31}—CF_2—SO_3^- \quad \text{(K-1)}$$

(K-2)

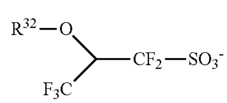

In formula (K-1), $R^{31}$ is hydrogen, or a $C_1$-$C_{20}$ alkyl group, $C_2$-$C_{20}$ alkenyl group or $C_6$-$C_{20}$ aryl group, which may contain an ether bond, ester bond, carbonyl moiety, lactone ring or fluorine atom. Herein the alkyl and alkenyl groups may be straight, branched or cyclic.

In formula (K-2), $R^{32}$ is hydrogen, or a $C_1$-$C_{30}$ alkyl group, $C_2$-$C_{20}$ acyl group, $C_2$-$C_{20}$ alkenyl group, $C_6$-$C_{20}$ aryl group or $C_6$-$C_{20}$ aryloxy group, which may contain an ether bond, ester bond, carbonyl moiety or lactone ring. Herein the alkyl, acyl and alkenyl groups may be straight, branched or cyclic.

Examples of the monomer from which recurring units (f1) are derived are given below, but not limited thereto. Notably $R^A$ and $M^-$ are as defined above.

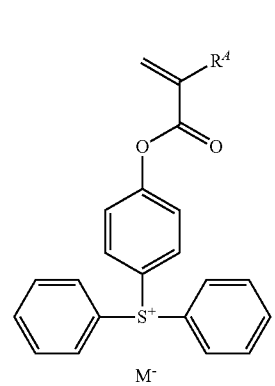

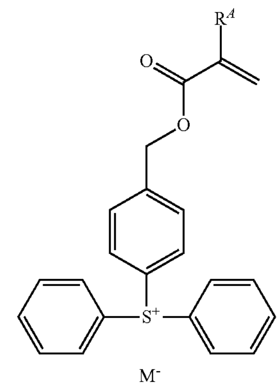

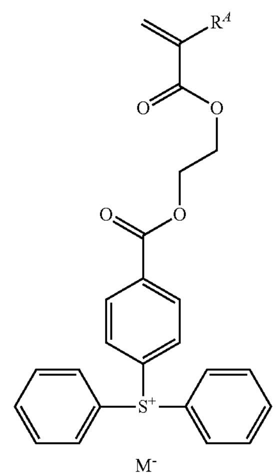

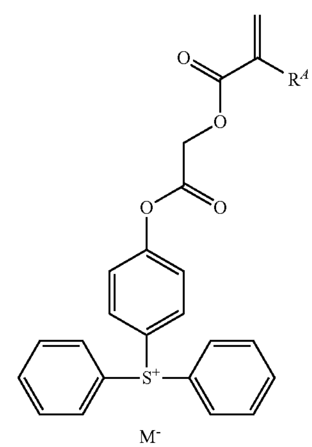

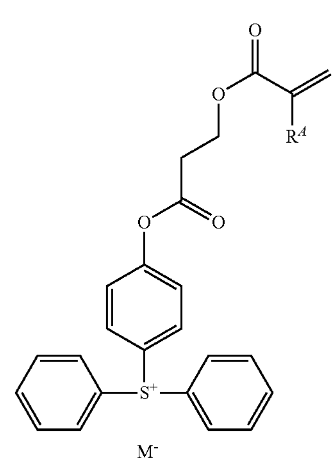

-continued
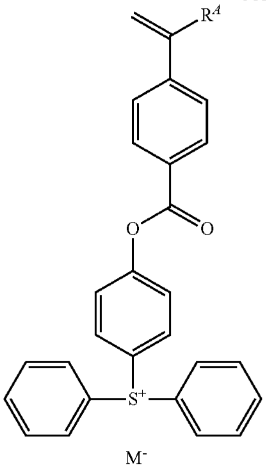
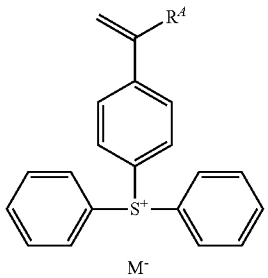
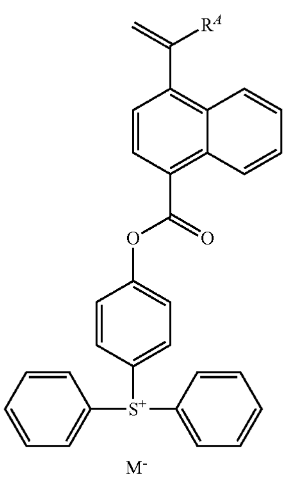
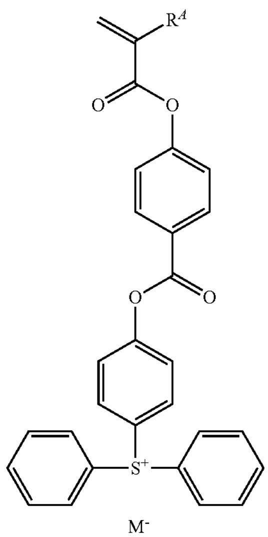
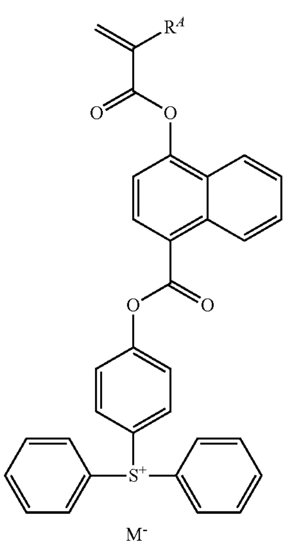
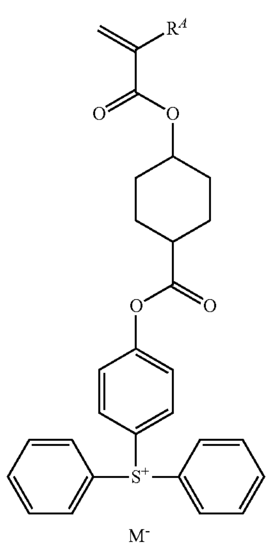
-continued
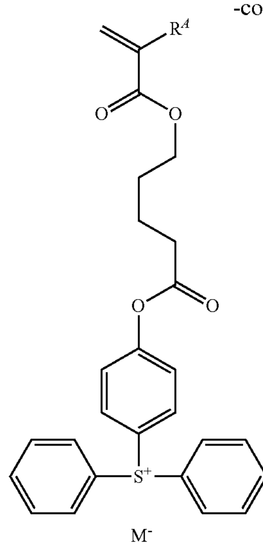
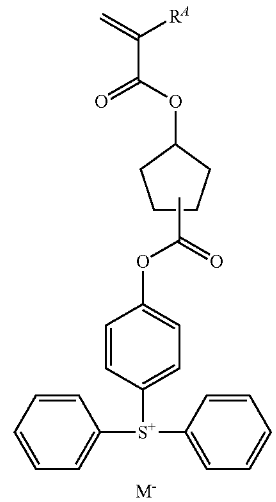
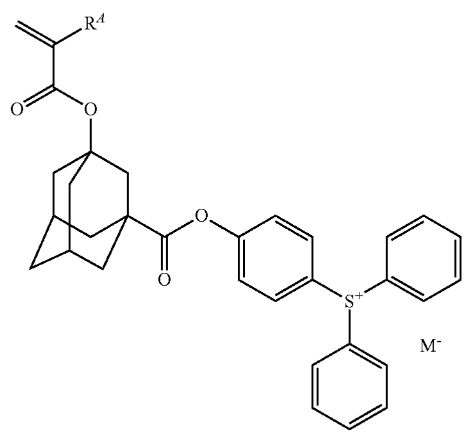
Examples of the monomer from which recurring units (f2) are derived are given below, but not limited thereto. Notably $R^A$ is as defined above.
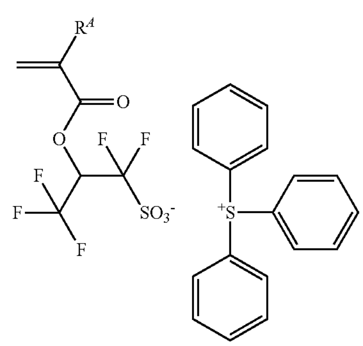

-continued
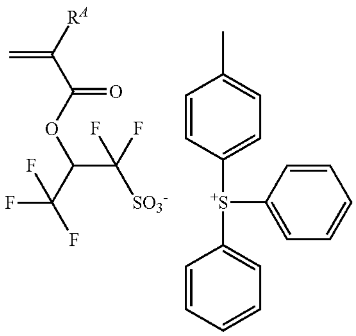
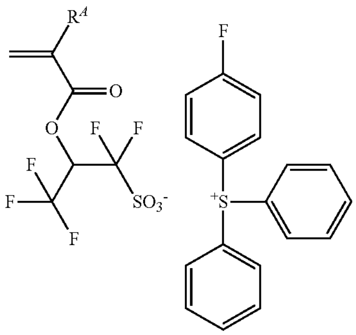
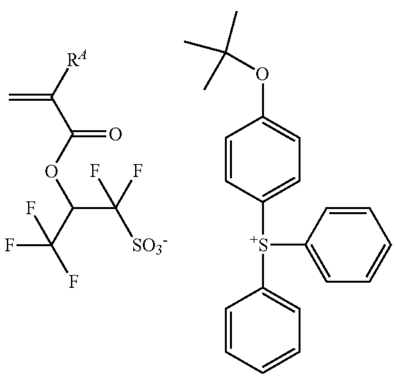
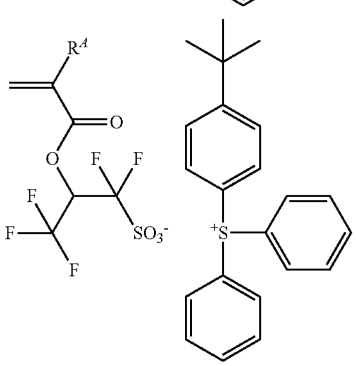
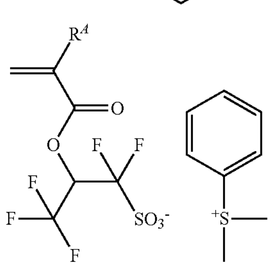
-continued
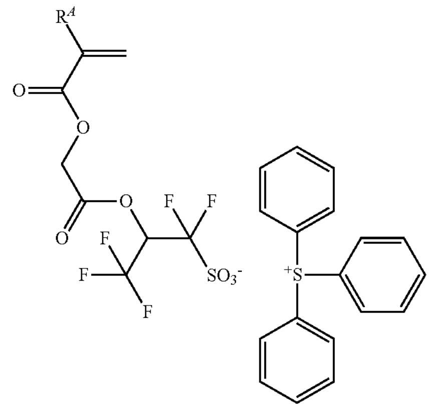
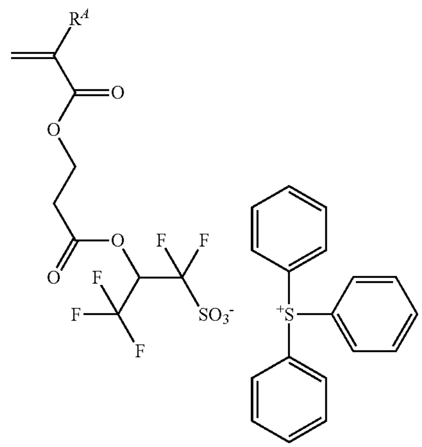
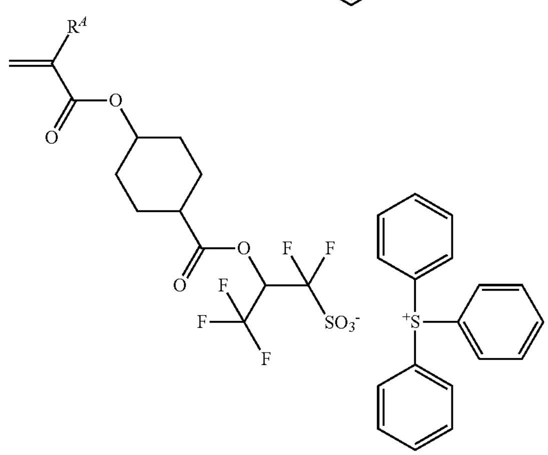
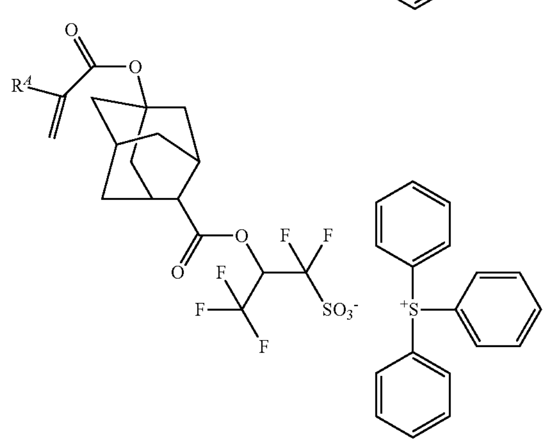

-continued
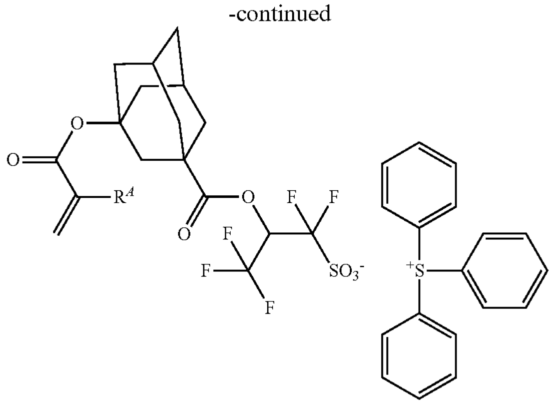
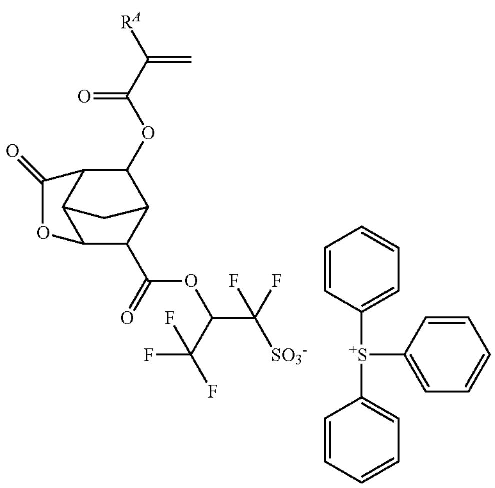
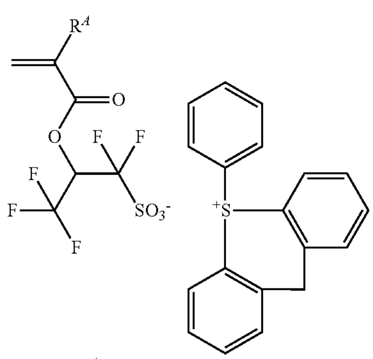
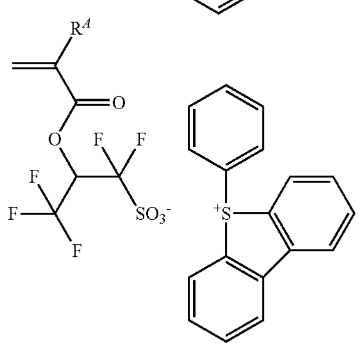
-continued
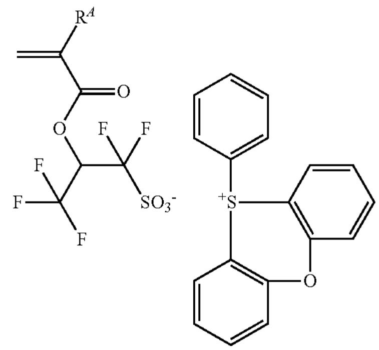
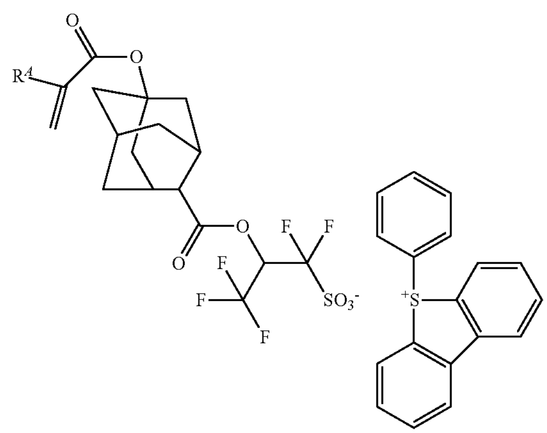
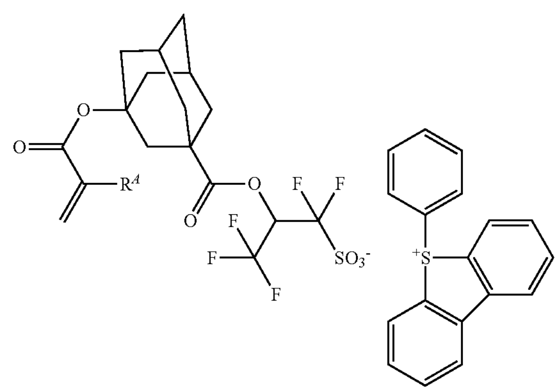
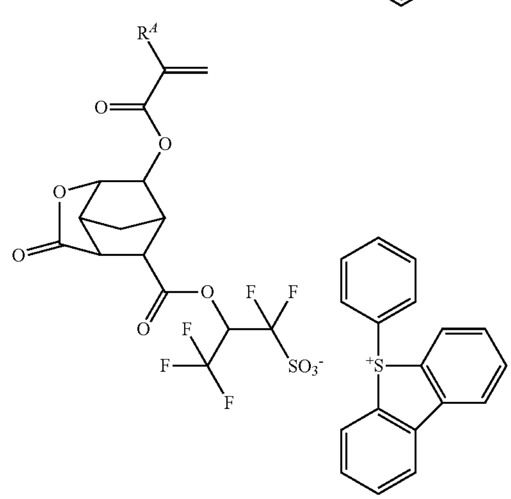

-continued
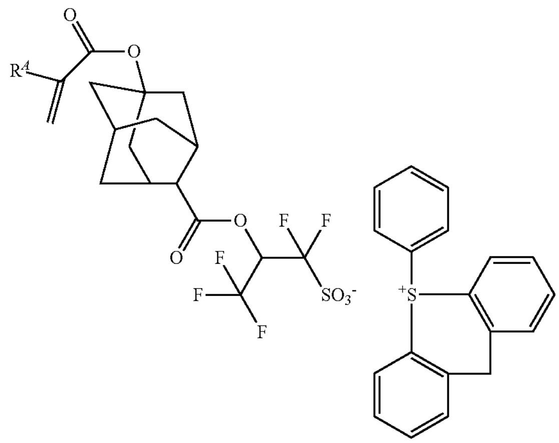
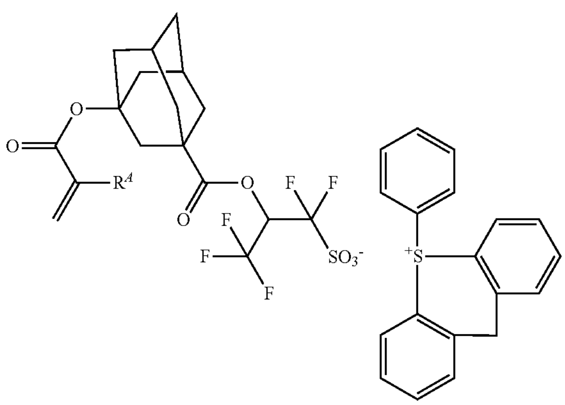
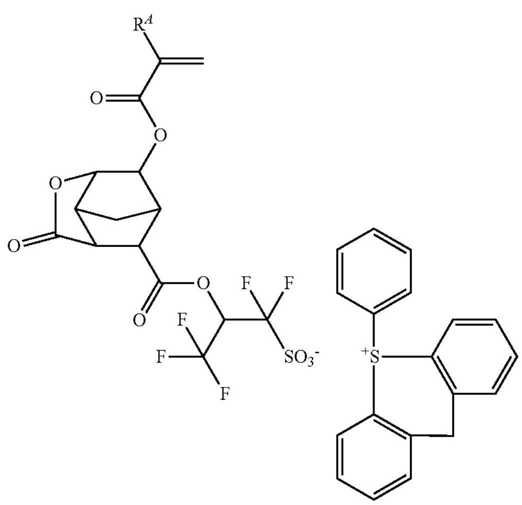
-continued
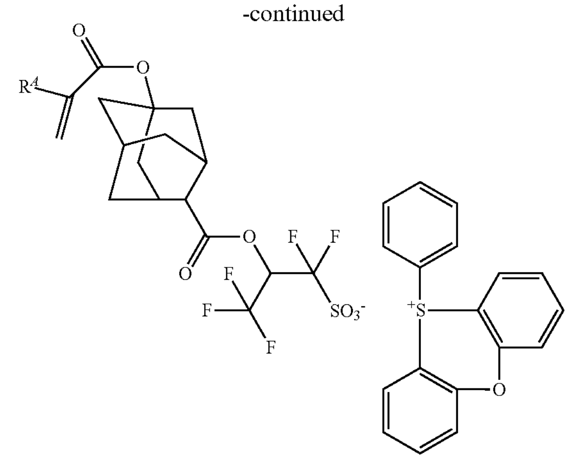
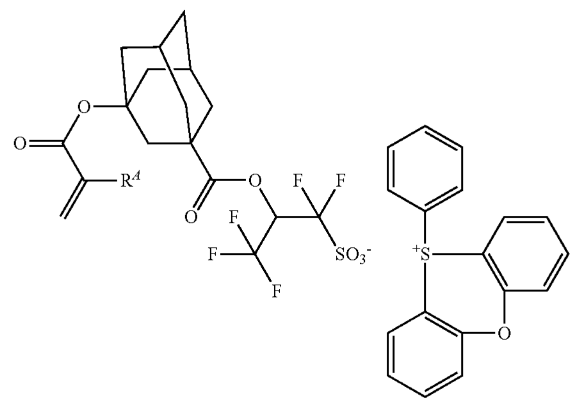
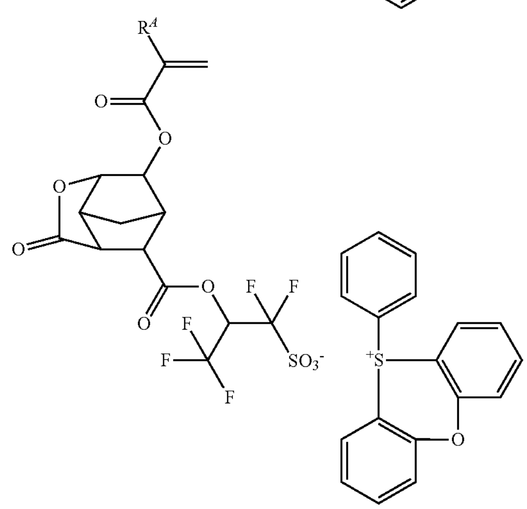
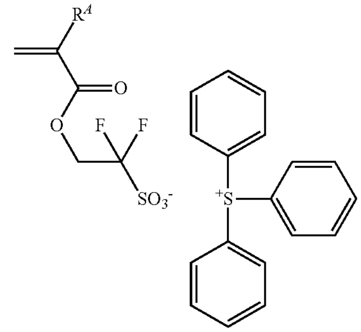

-continued
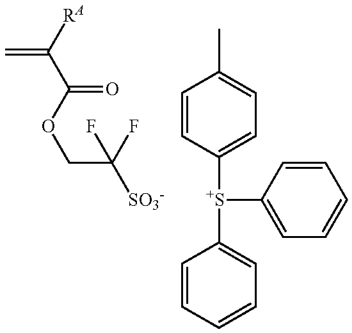
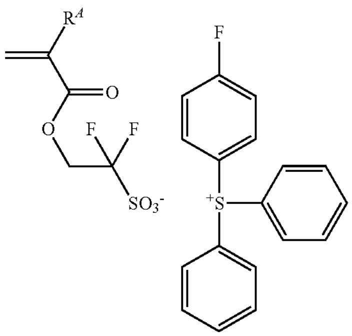
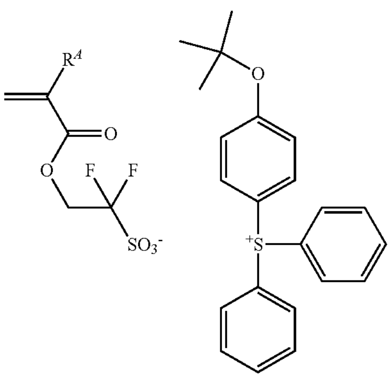
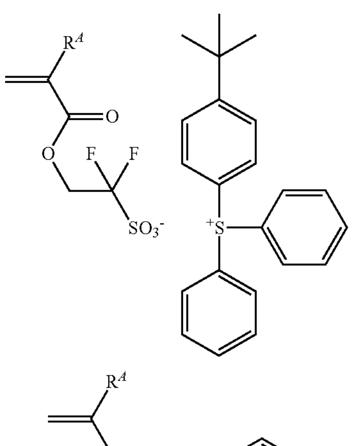
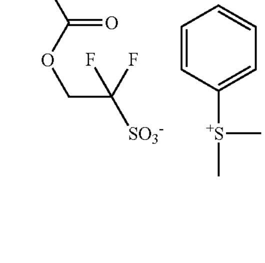
-continued
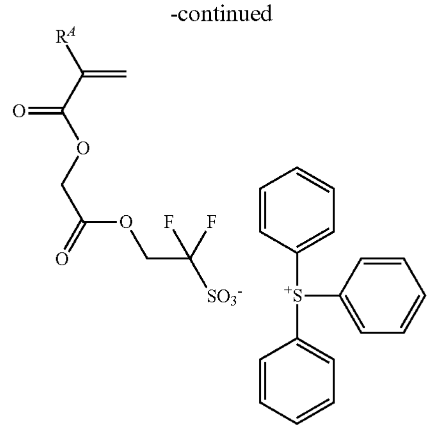
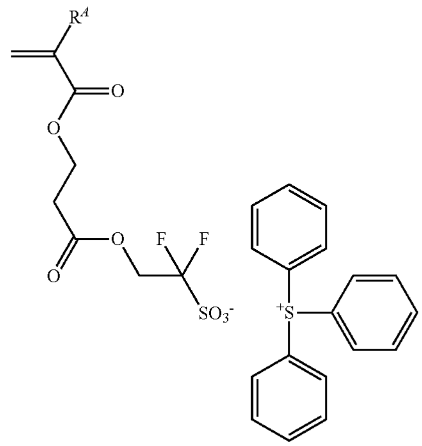
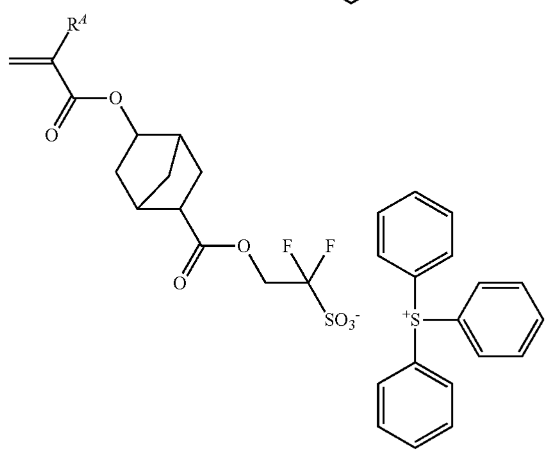
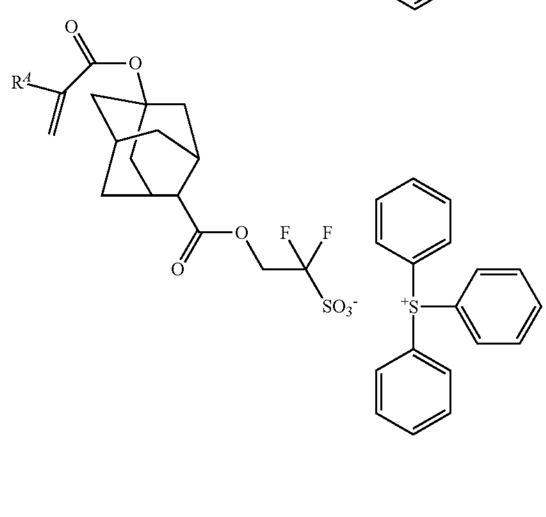

-continued
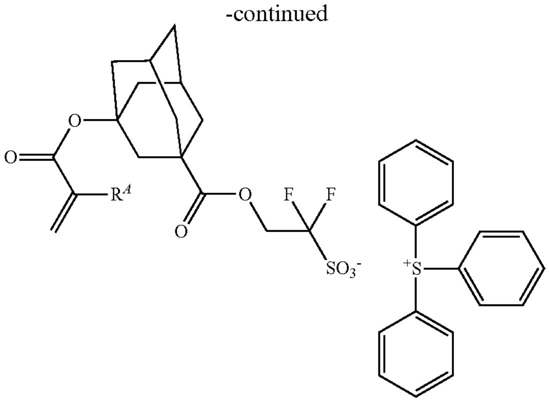
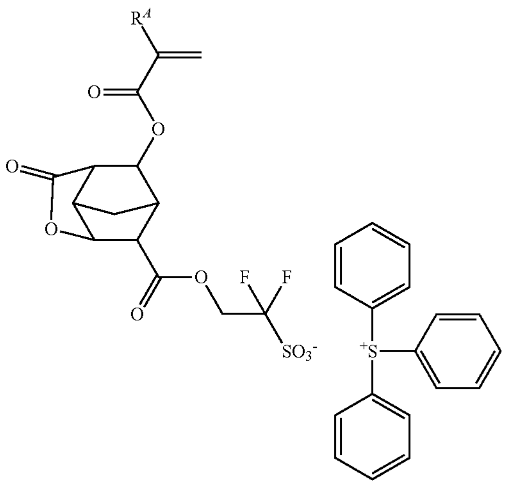
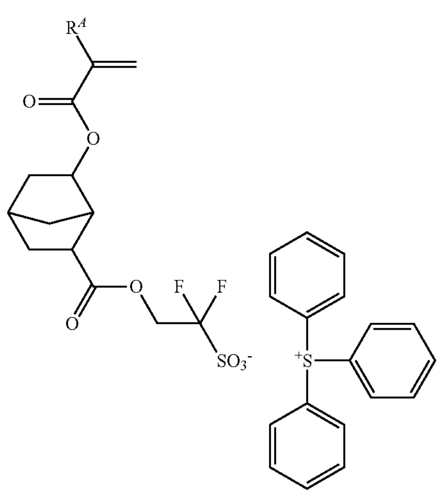
Examples of the monomer from which recurring units (f3) are derived are given below, but not limited thereto. Notably $R^A$ is as defined above.
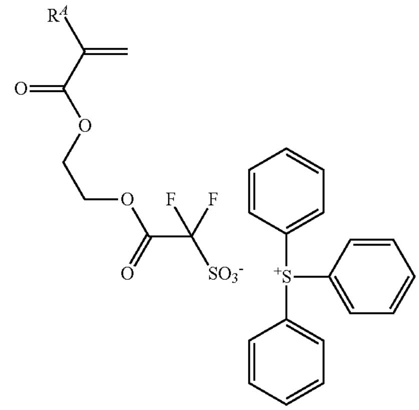
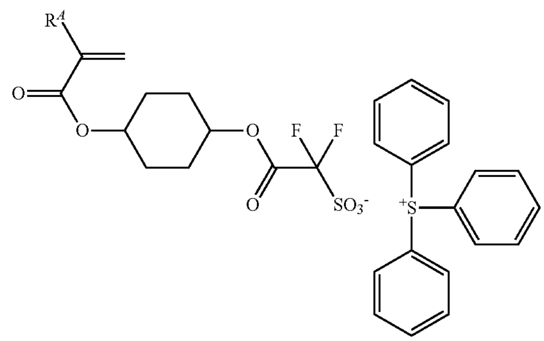
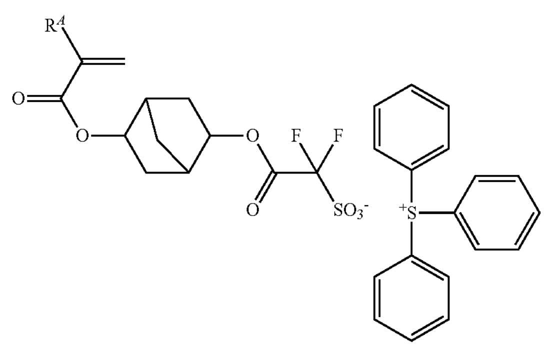
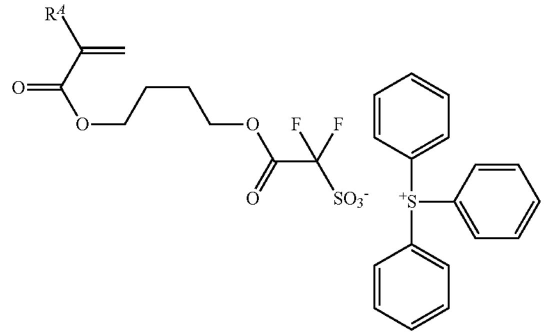

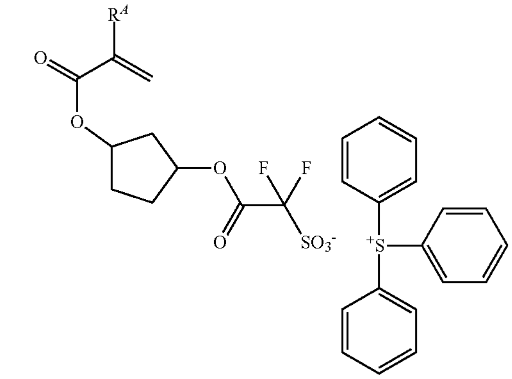
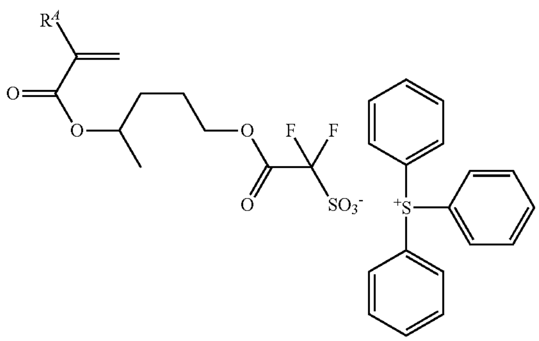
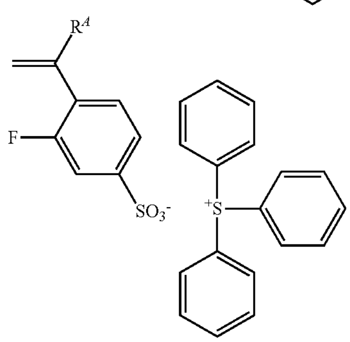
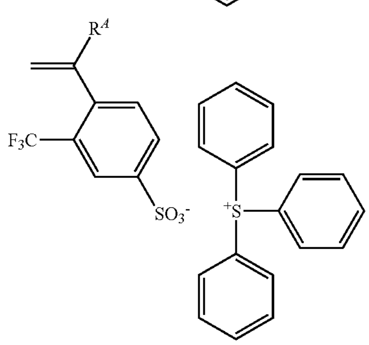
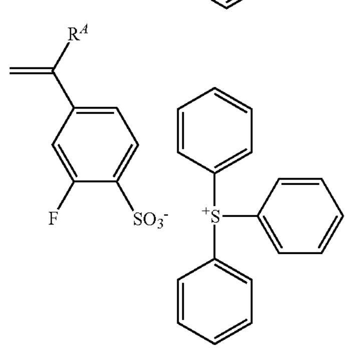
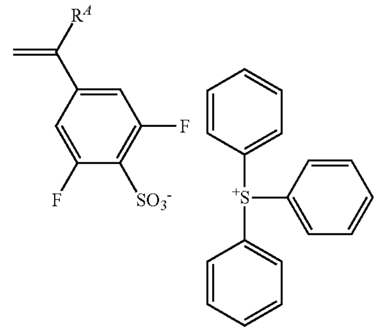
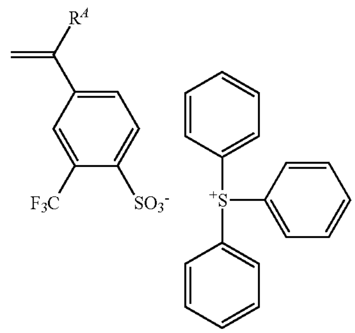
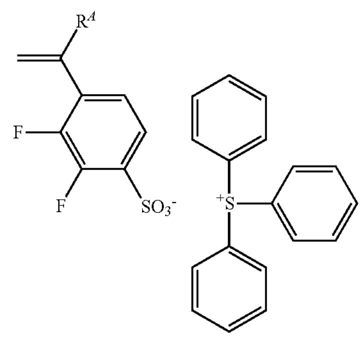
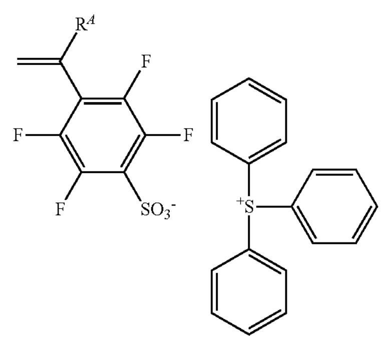
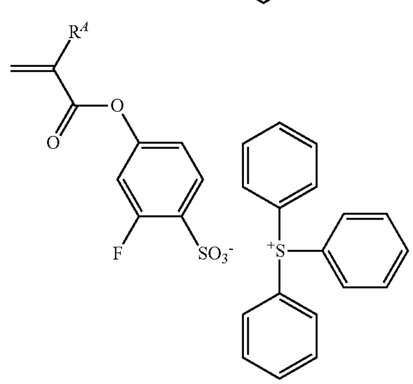

-continued

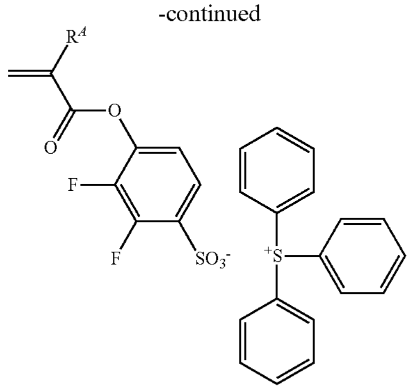

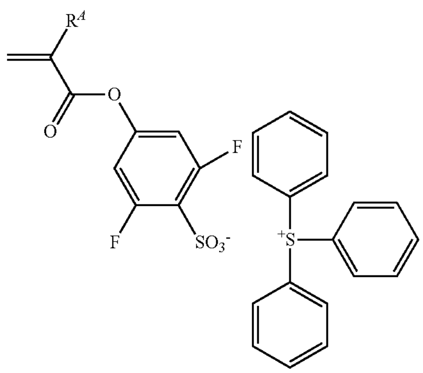

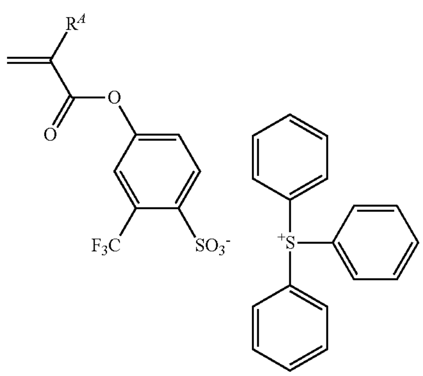

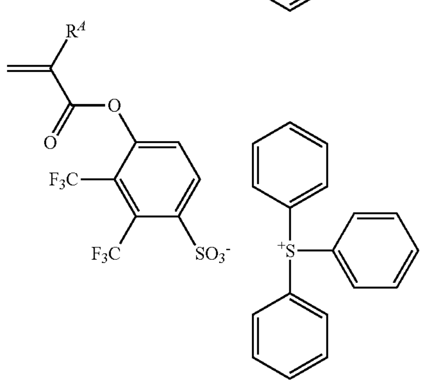

-continued

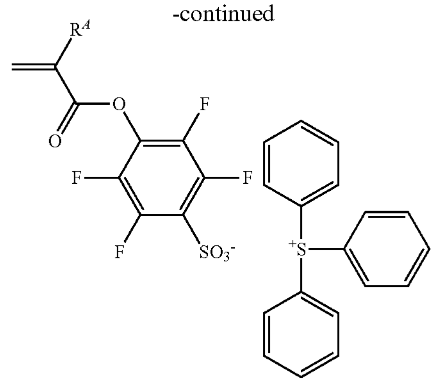

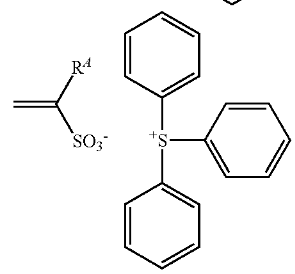

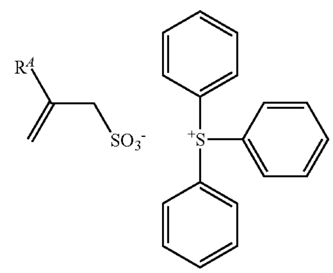

The recurring units (f1) to (f3) function as an acid generator. Binding an acid generator to the polymer backbone is effective for reducing acid diffusion and preventing the resolution from lowering due to blur by acid diffusion. Additionally, edge roughness (LER, LWR) is improved because the acid generator is uniformly dispersed. It is noted that when a base polymer containing recurring units (f) is used, an acid generator to be described below may be omitted.

The base polymer for use in the positive resist composition should comprise recurring units (a1) or (a2) having an acid labile group. In the polymer, a fraction of recurring units (a1), (a2), (b), (c), (d), (e) and (f) is preferably in the range: $0\le a1<1.0$, $0\le a2<1.0$, $0<a1+a2<1.0$, $0\le b\le 0.9$, $0\le c\le 0.9$, $0\le d\le 0.8$, $0\le e\le 0.8$, and $0\le f\le 0.5$; more preferably $0\le a1\le 0.9$, $0\le a2\le 0.9$, $0.1\le a1+a2\le 0.9$, $0\le b\le 0.8$, $0\le c\le 0.8$, $0\le d\le 0.7$, $0\le e\le 0.7$, and $0\le f\le 0.4$; even more preferably $0\le a1\le 0.8$, $0\le a2\le 0.8$, $0.1\le a1+a2\le 0.8$, $0\le b\le 0.75$, $0\le c\le 0.75$, $0\le d\le 0.6$, $0\le e\le 0.6$, and $0\le f\le 0.3$. Notably, recurring units (f) are those of at least one type selected from recurring units (f1) to (f3), that is, $f=f1+f2+f3$, and $a1+a2+b+c+d+e+f=1.0$.

The base polymer for use in the negative resist composition need not necessarily contain an acid labile group. A base polymer comprising recurring units (b) and optionally recurring units (c), (d), (e) and/or (f) is suitable. A fraction of recurring units (b), (c), (d), (e) and (f) is preferably in the range: $0<b\le 1.0$, $0\le c\le 0.9$, $0\le d\le 0.8$, $0\le e\le 0.8$, and $0\le f\le 0.5$; more preferably $0.2\le b\le 1.0$, $0\le c\le 0.8$, $0\le d\le 0.7$, $0\le e\le 0.7$, and $0\le f\le 0.4$; even more preferably $0.3\le b\le 1.0$, $0\le c\le 0.75$, $0\le d\le 0.6$, $0\le e\le 0.6$, and $0\le f\le 0.3$. Notably, recurring units (f)

are those of at least one type selected from recurring units (f1) to (f3), that is, f=f1+f2+f3, and b+c+d+e+f=1.0.

The polymer may be synthesized by any desired methods, for example, by dissolving one or more monomers selected from the monomers corresponding to the recurring units (a) to (f) in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C. and the reaction time is 2 to 100 hours, more preferably 5 to 20 hours.

When a hydroxy-bearing monomer is copolymerized, a corresponding monomer in which the hydroxyl group has been replaced by an acetal group which is susceptible to deprotection with acid, typically ethoxyethoxy, may be used, and polymerization be followed by deprotection with weak acid and water. Alternatively, the hydroxyl group may have been replaced by an acetyl, formyl or pivaloyl group, and polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the relevant units to hydroxystyrene or hydroxyvinylnaphthalene units. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. A polymer with a Mw below the range may be less heat resistant whereas a polymer with too high Mw may lose alkaline solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the polymer should preferably have a narrow dispersity (Mw/Mn) of 1.0 to 2.0, especially 1.0 to 1.5, in order to provide a resist composition suitable for micropatterning to a small feature size.

The base polymer may be a mixture of polymers which are different in compositional ratio, Mw and/or Mw/Mn.

Acid Generator

The resist composition may include an acid generator capable of generating a strong acid (also referred to as acid generator of addition type) in order for the composition to function as a chemically amplified resist composition. As used herein, the strong acid refers to a compound having a sufficient acidity to cleave the acid labile group on the base polymer.

Typical of the acid generator used herein is a compound capable of generating an acid in response to actinic light or radiation, that is, photoacid generator (PAG). The PAG is any compound capable of generating an acid upon exposure to high-energy radiation, preferably a sulfonic acid, imide acid (imidic acid) or methide acid. Suitable PAGs include sulfonium salts, iodonium salts, sulfonyldiazomethane, N-sulfonyloxyimide, and oxime-O-sulfonate acid generators. Exemplary PAGs are described in U.S. Pat. No. 7,537,880 (JP-A 2008-111103, paragraphs [0122]-[0142]).

As the PAG, sulfonium salts having the formula (1-1) and iodonium salts having the formula (1-2) are also preferably used.

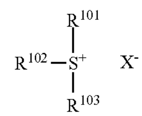

(1-1)

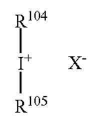

(1-2)

In formulae (1-1) and (1-2), $R^{101}$, $R^{102}$, $R^{103}$, $R^{104}$ and $R^{105}$ are each independently a $C_1$-$C_{20}$ monovalent hydrocarbon group which may contain a heteroatom. Any two of $R^{101}$, $R^{102}$ and $R^{103}$ may bond together to form a ring with the sulfur atom to which they are attached. The monovalent hydrocarbon groups may be straight, branched or cyclic, and examples thereof are as exemplified above for $R^{21}$ to $R^{28}$ in formulae (f1) to (f3). Preferably $R^{101}$ to $R^{105}$ are aryl groups.

Examples of the cation moiety in the sulfonium salt having formula (1-1) are shown below, but not limited thereto.

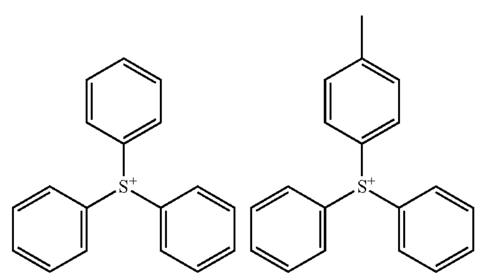

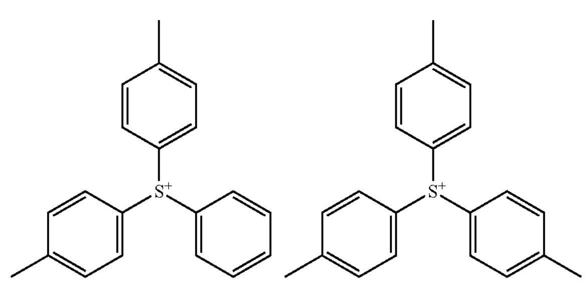

-continued
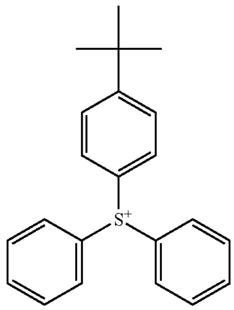
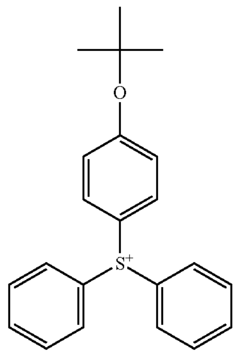
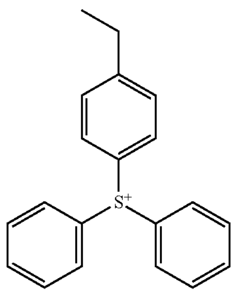
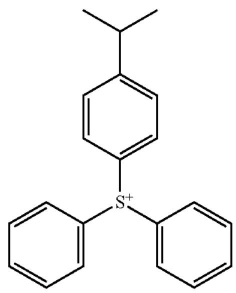
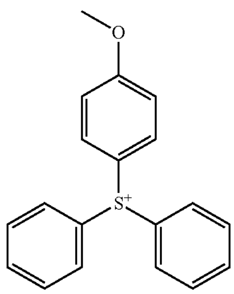
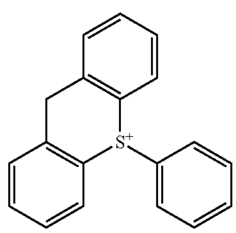
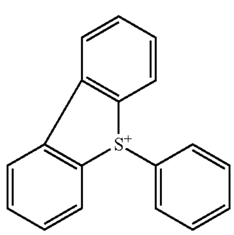
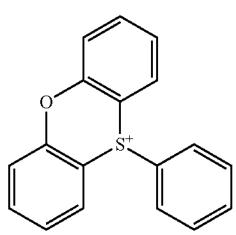
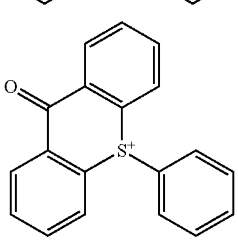
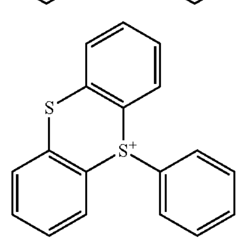
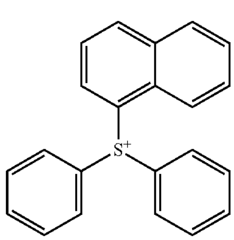
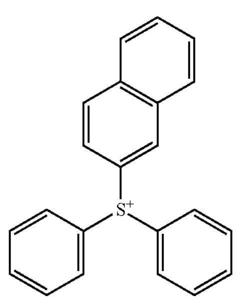
-continued
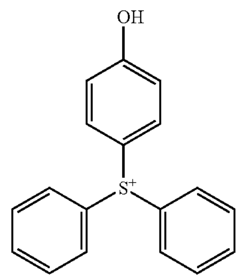
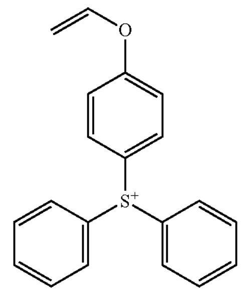
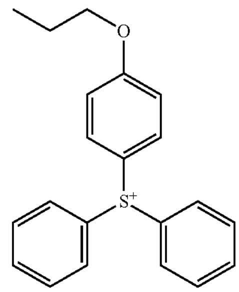
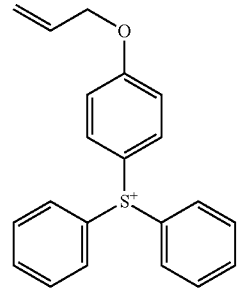
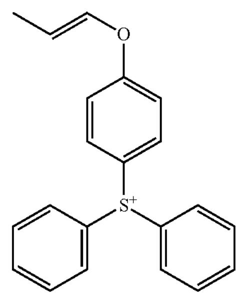
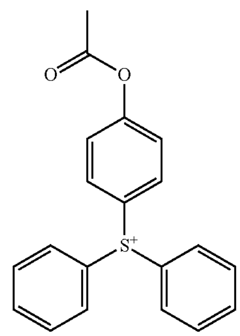
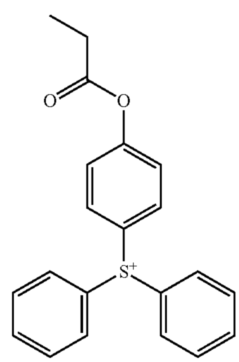
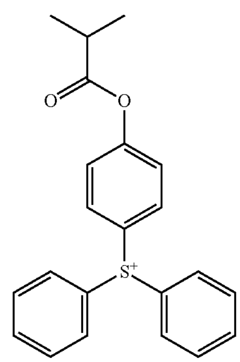
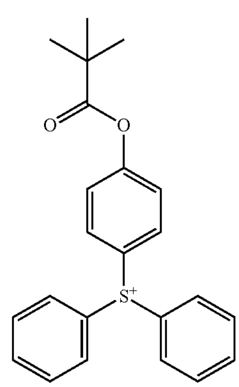
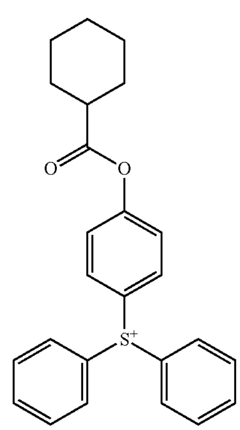

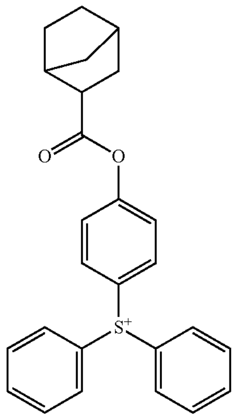
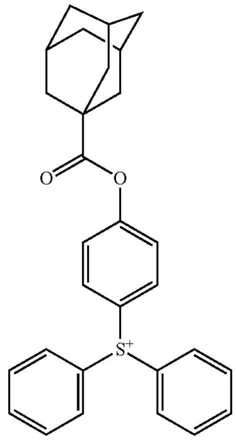
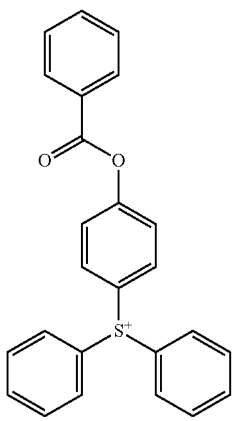
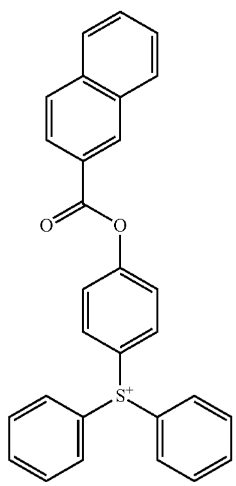
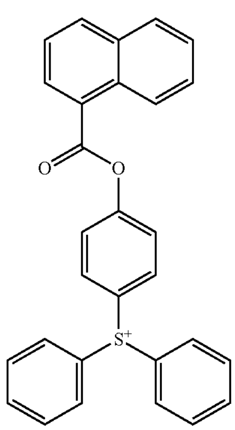
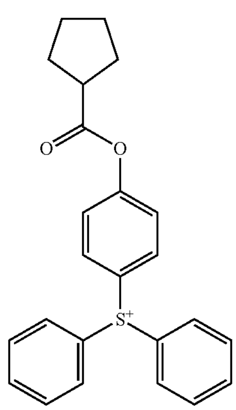
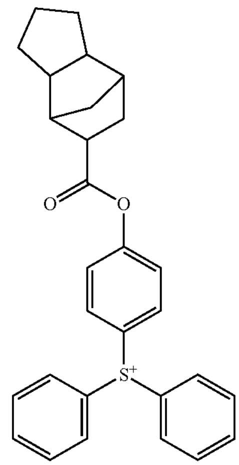
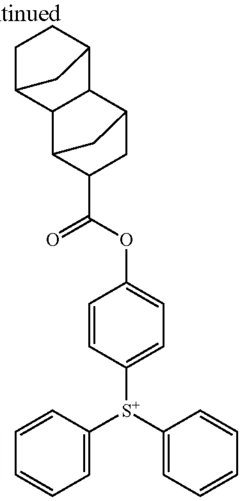
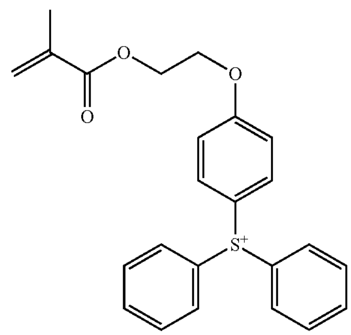
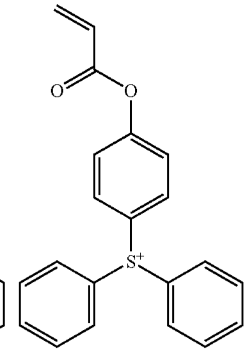
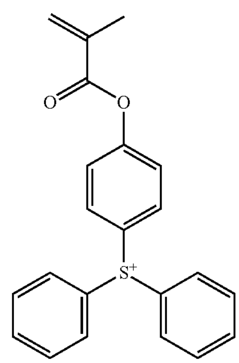
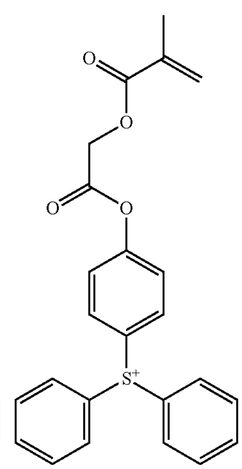
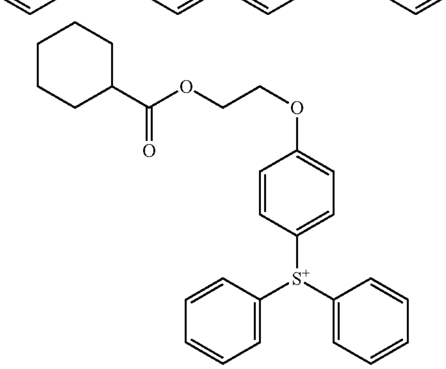

-continued
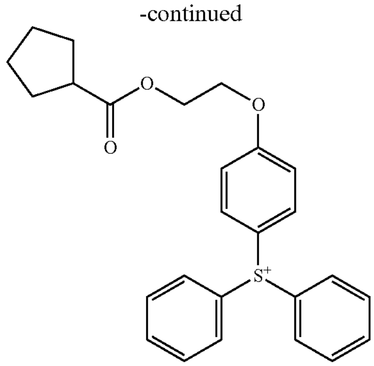
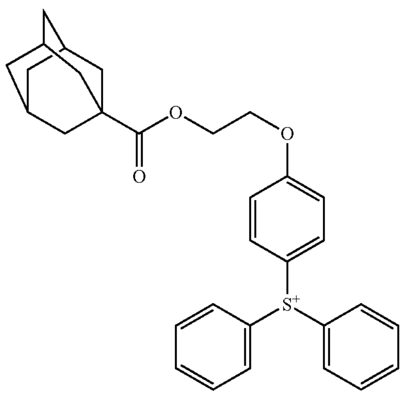
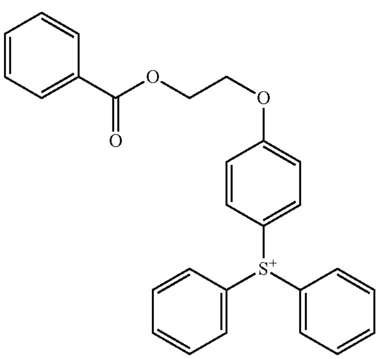
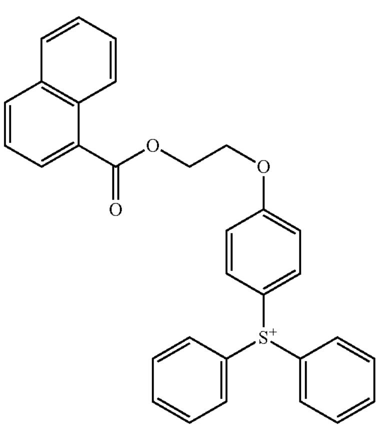
-continued
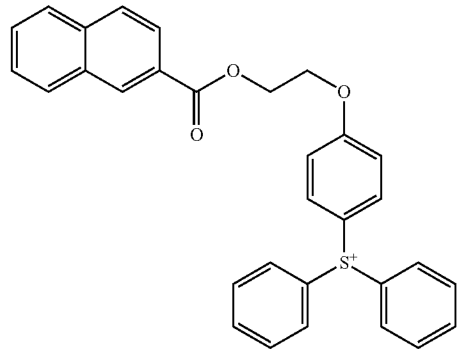
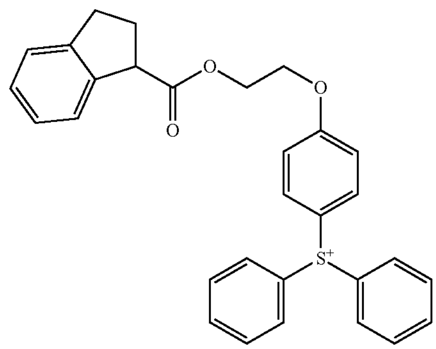
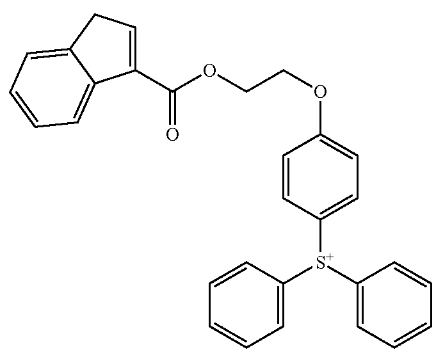
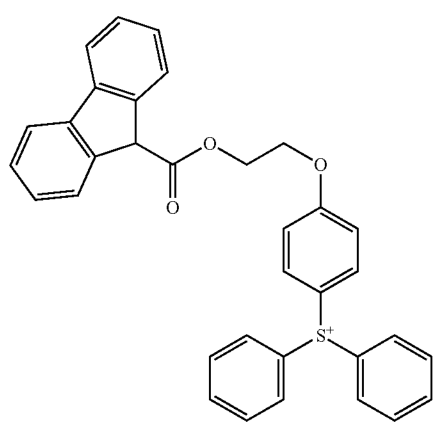

-continued
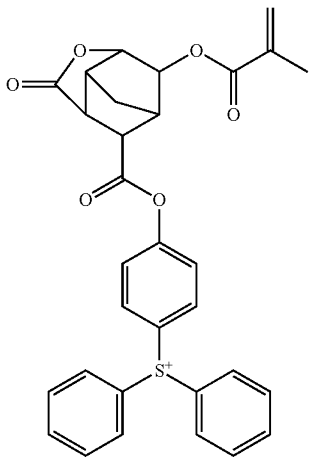
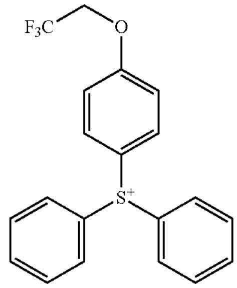
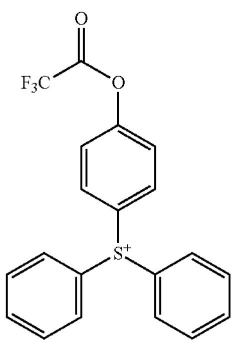
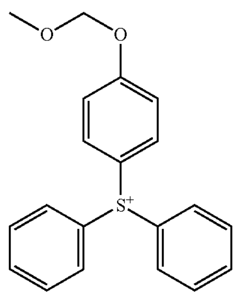
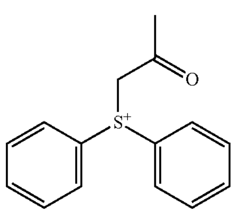
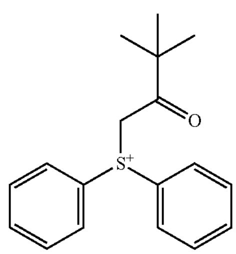
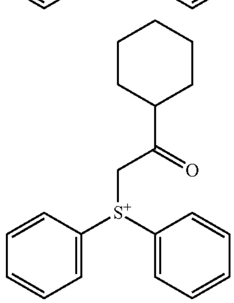
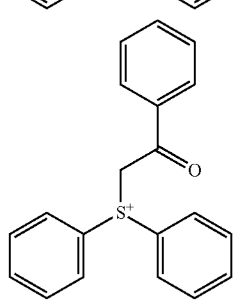
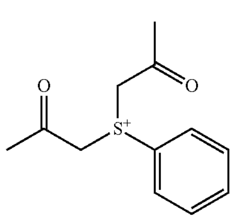
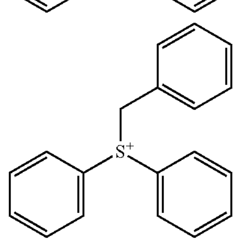
-continued
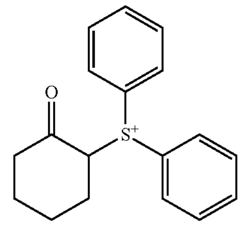
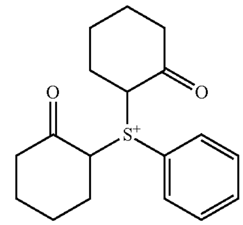
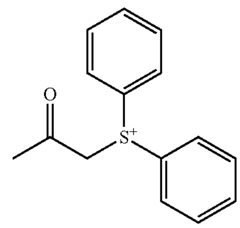
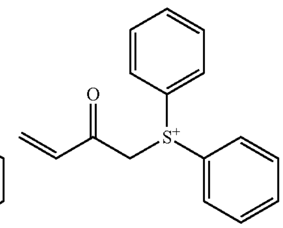
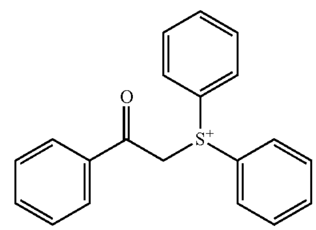
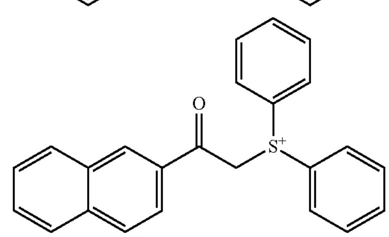
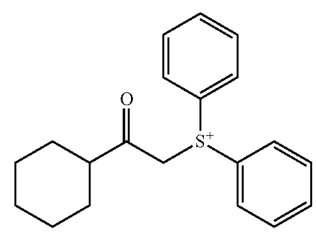
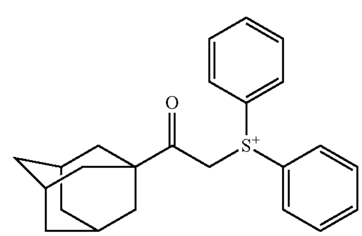
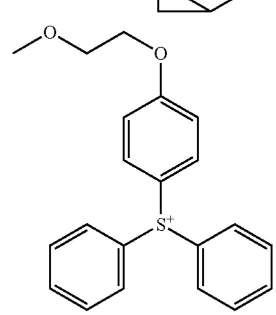
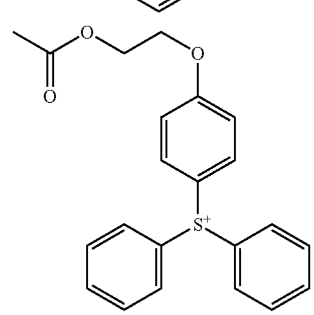

-continued
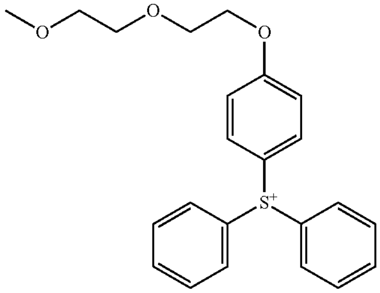
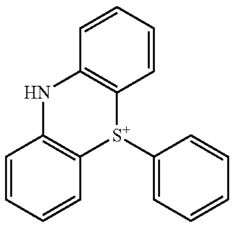
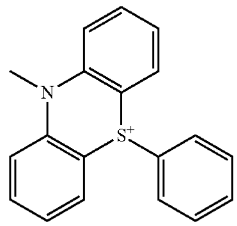
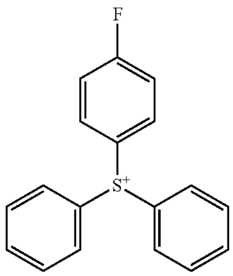
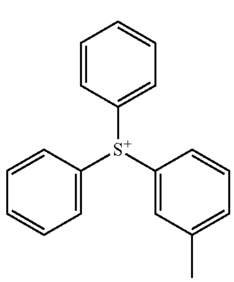
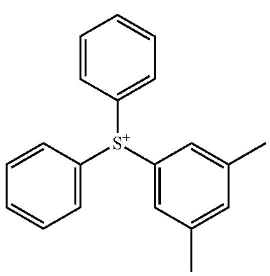
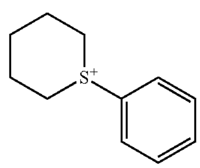
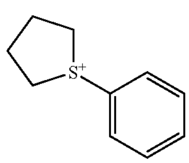
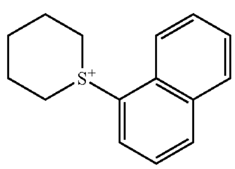
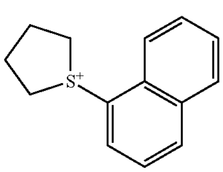
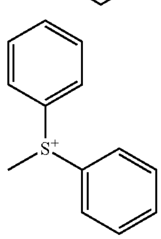
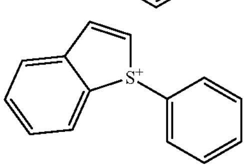
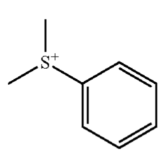
-continued
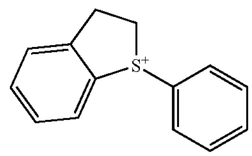
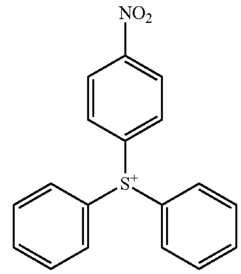
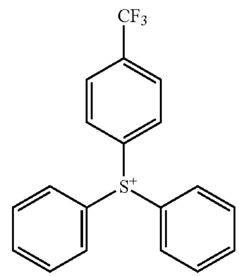
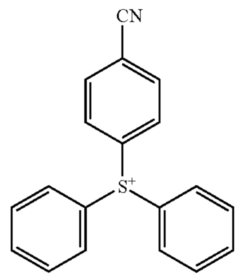
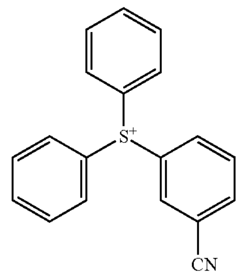
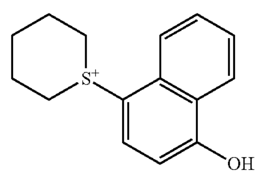
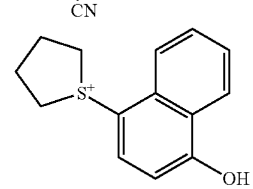
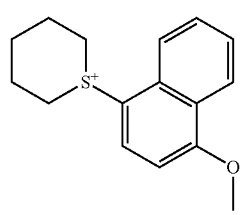
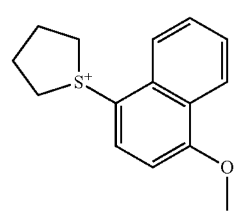
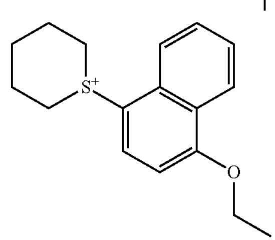
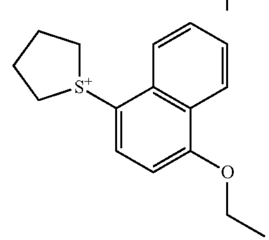
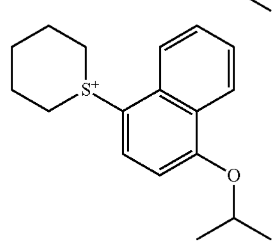
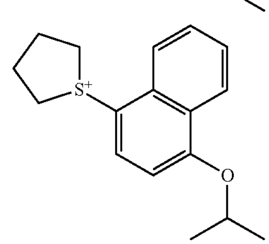

-continued
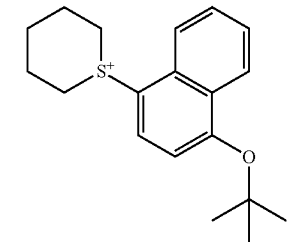
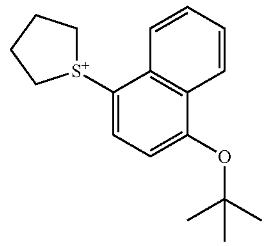
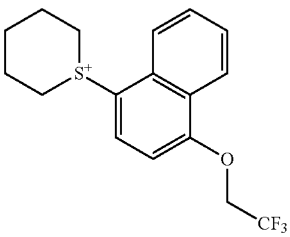
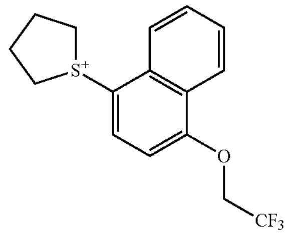
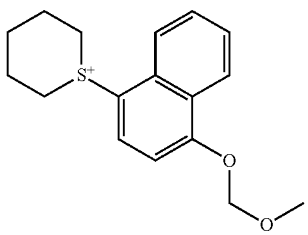
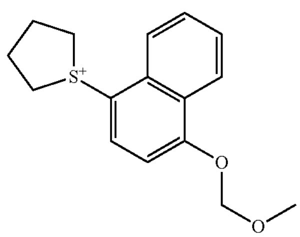
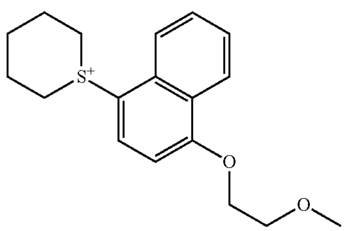
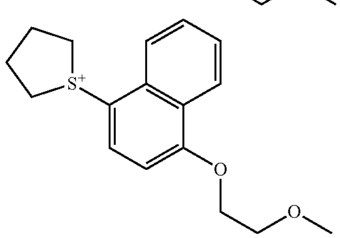
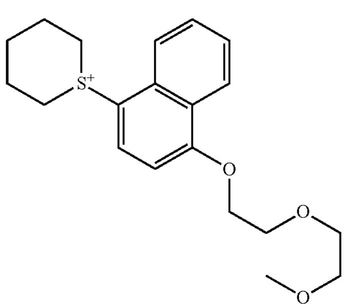
-continued
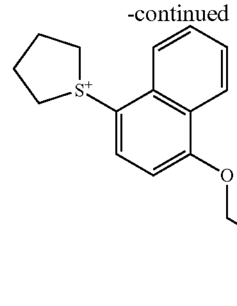
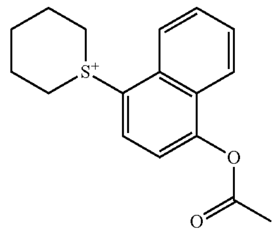
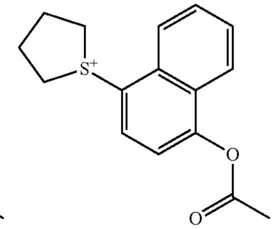
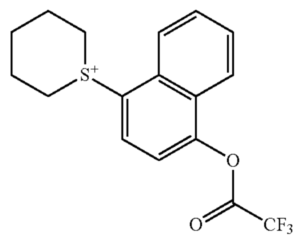
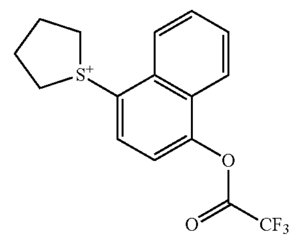
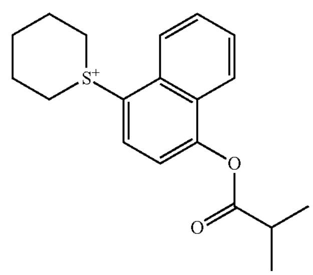
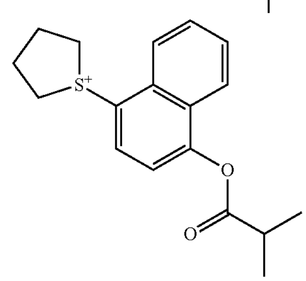
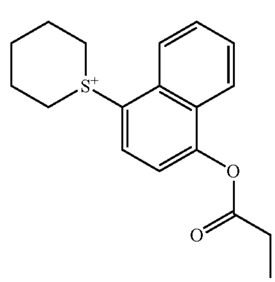
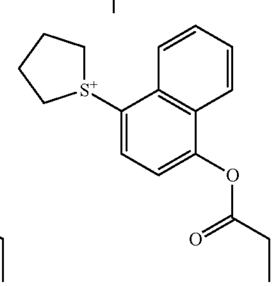

-continued
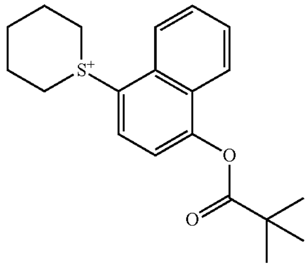
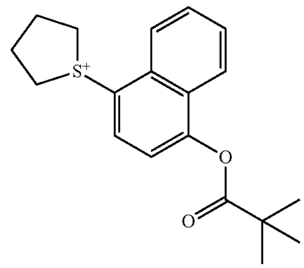
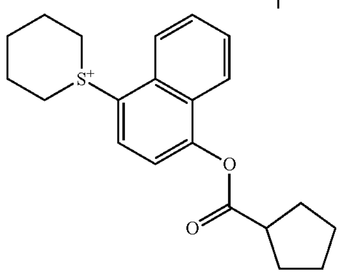
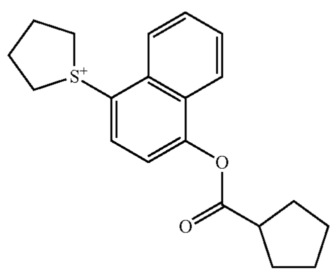
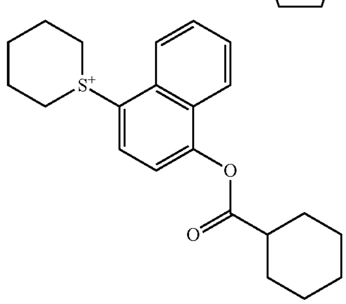
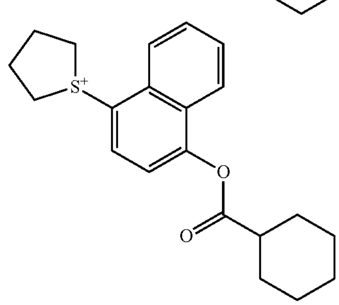
-continued
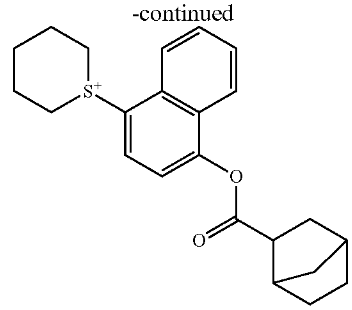
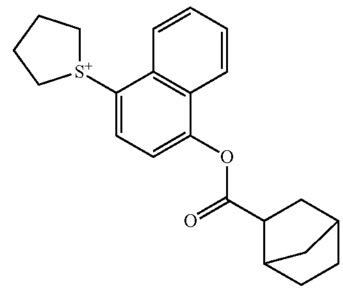
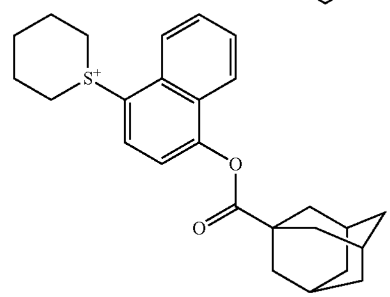
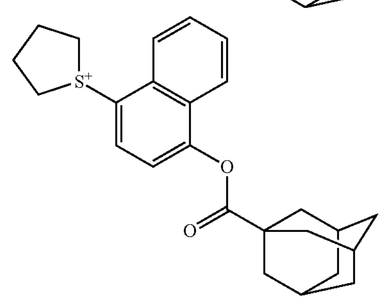
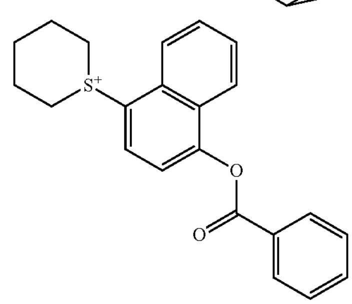
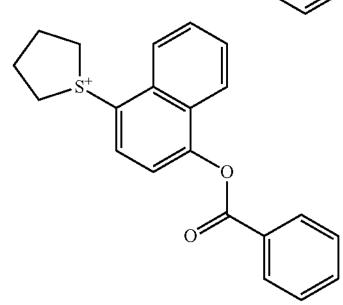

-continued
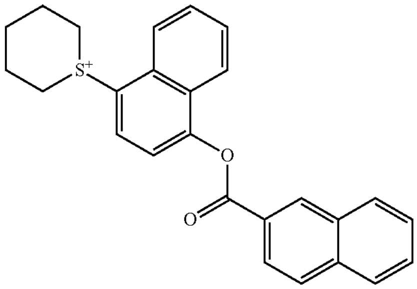
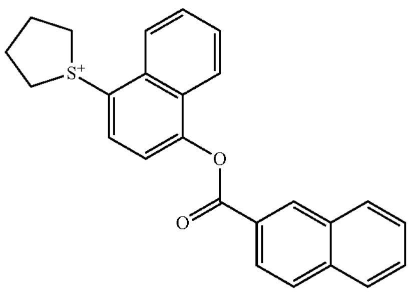
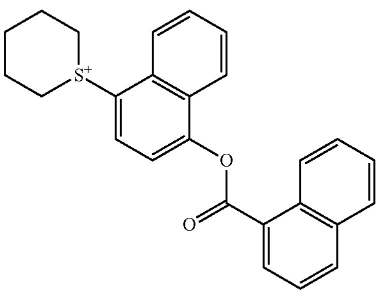
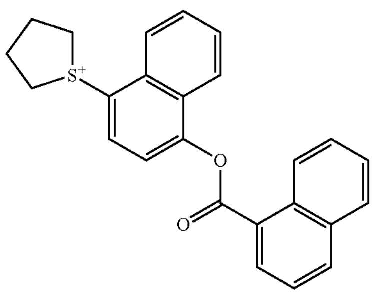
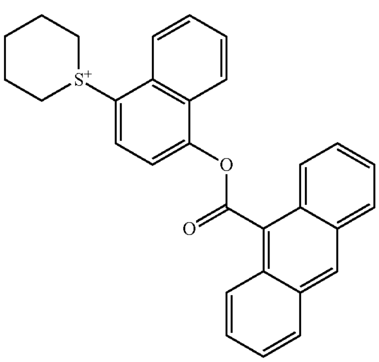
-continued
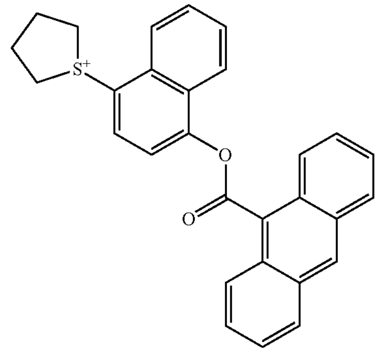
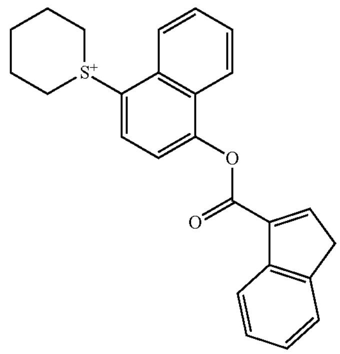
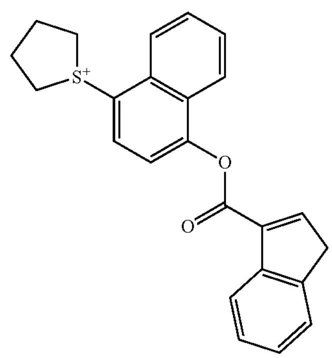
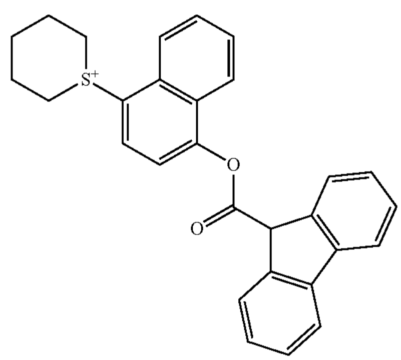

-continued
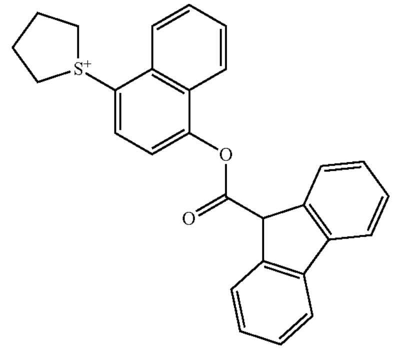
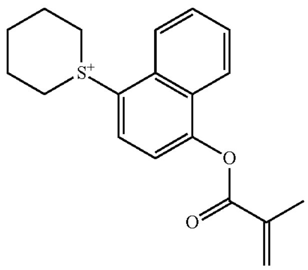
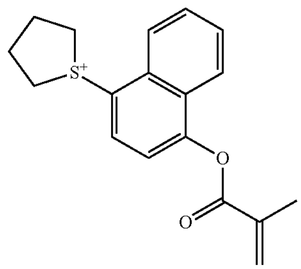
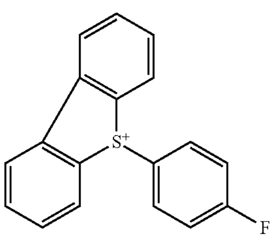
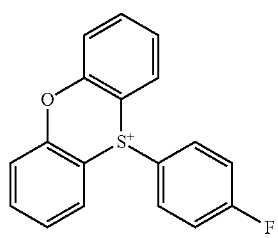
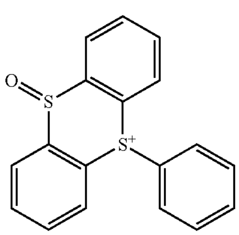
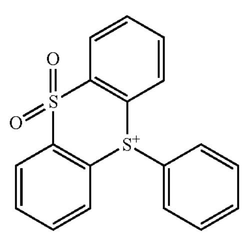
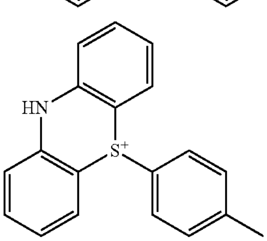
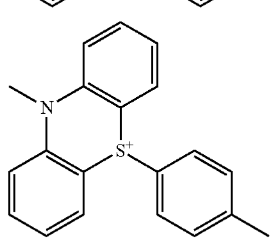
-continued
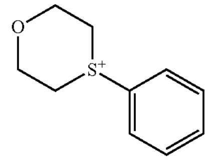
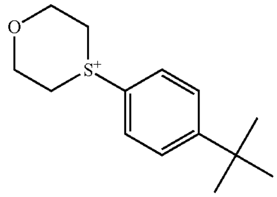
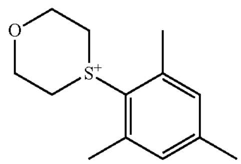
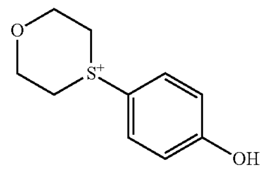
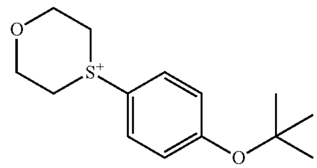
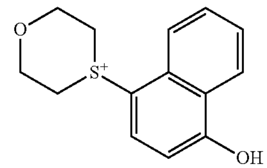
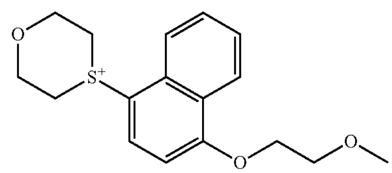
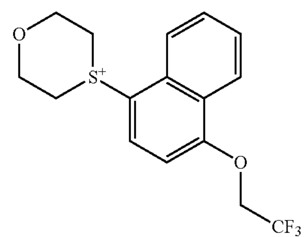
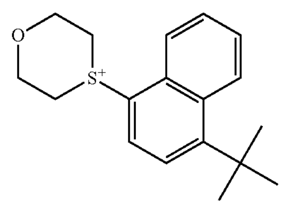
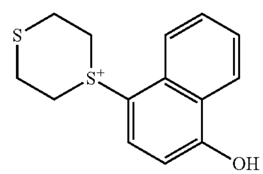
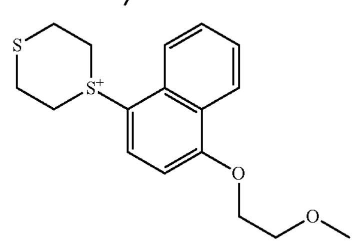
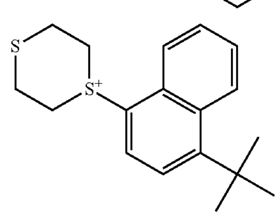

-continued
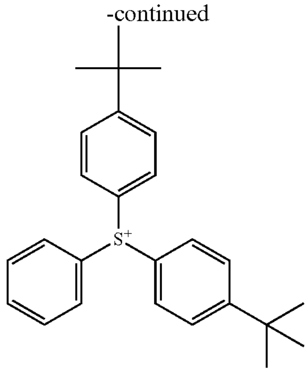
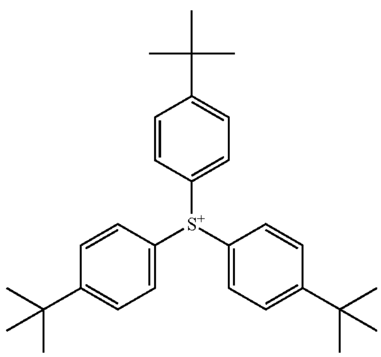
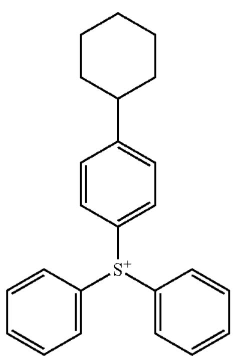
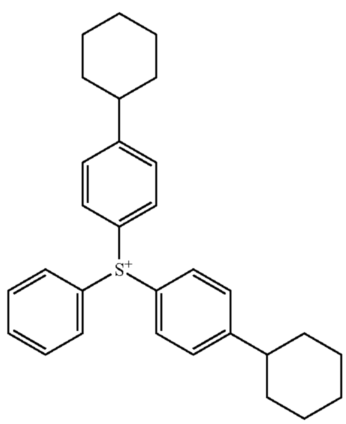
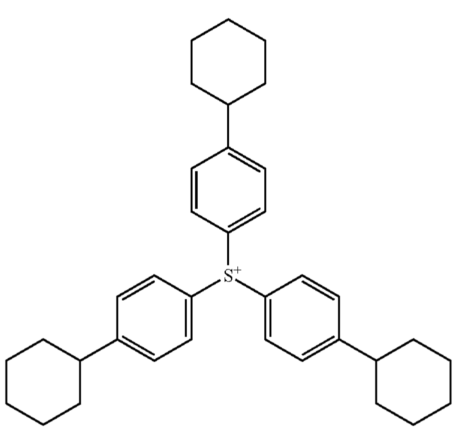
-continued
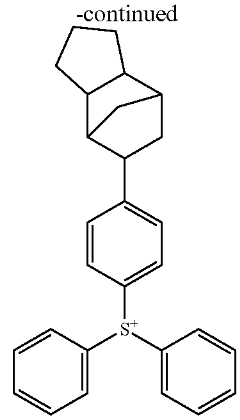
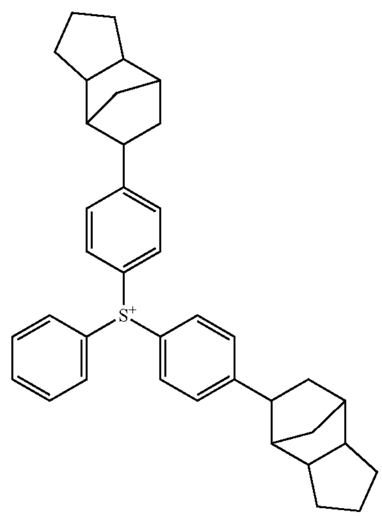
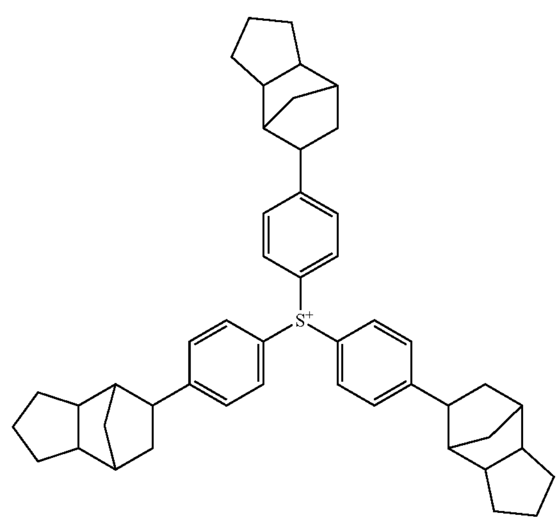

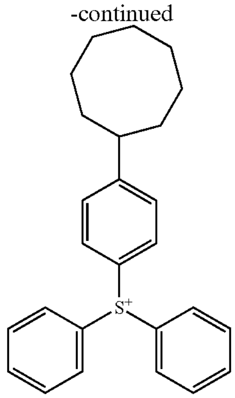
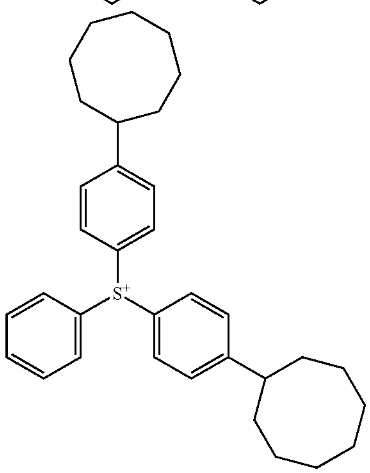
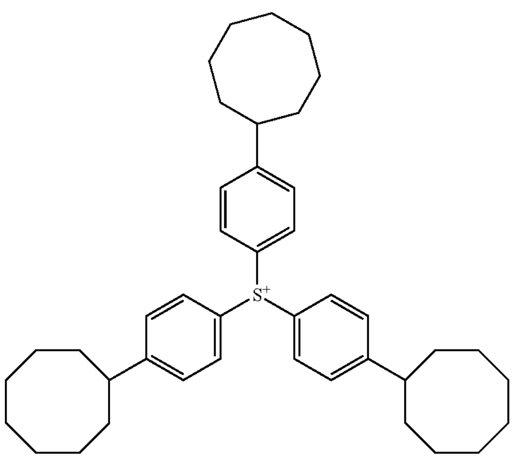
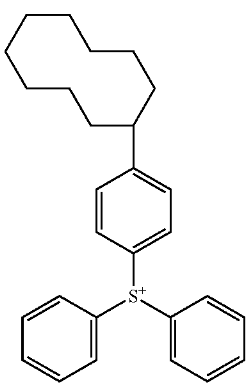
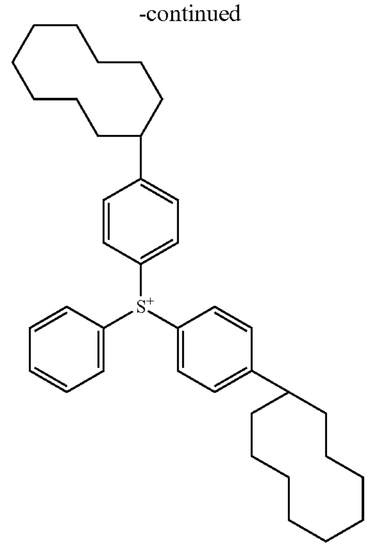
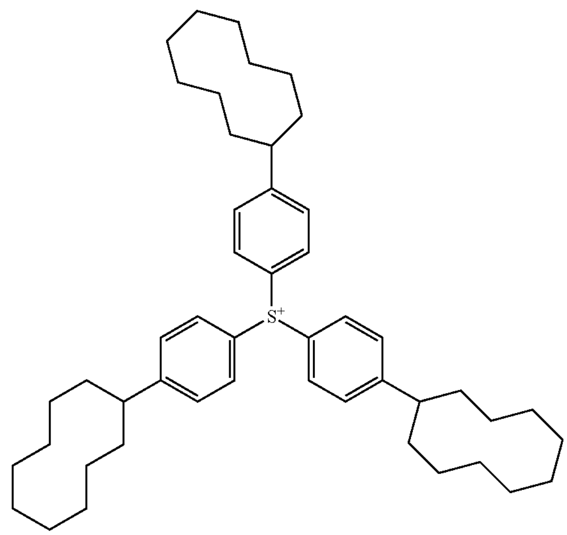
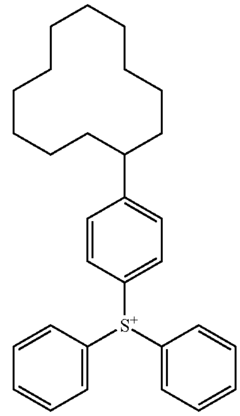

-continued
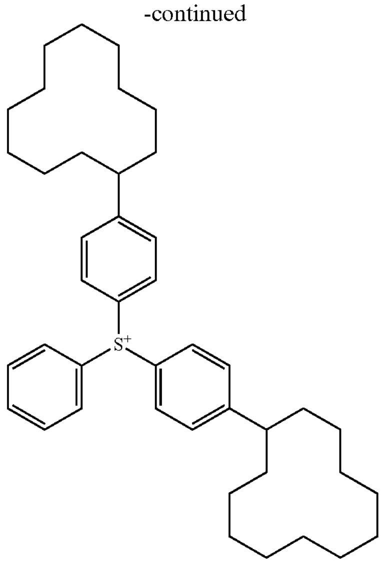
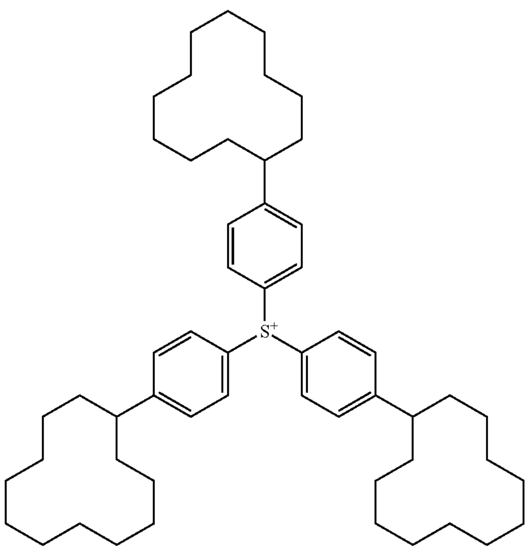
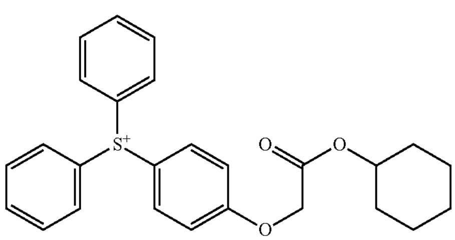
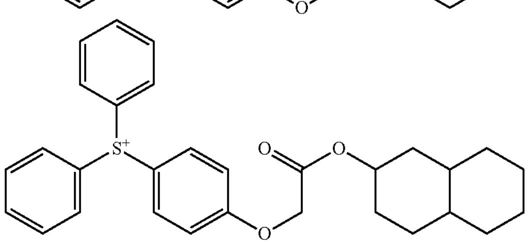
-continued
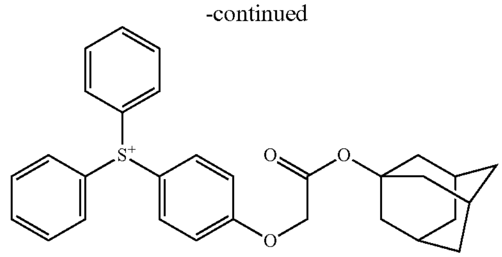
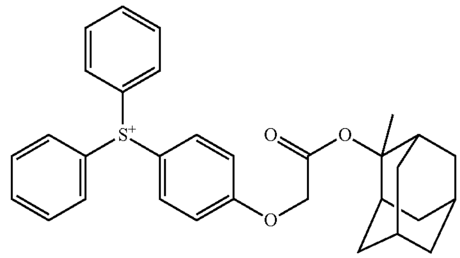
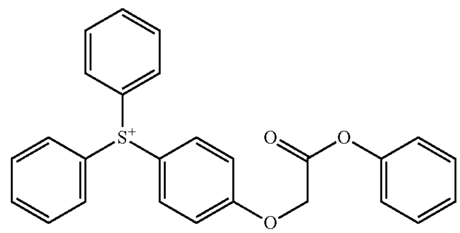
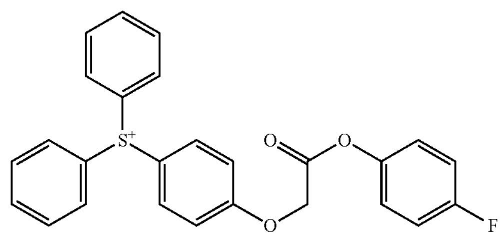
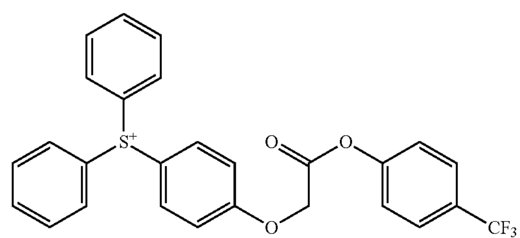
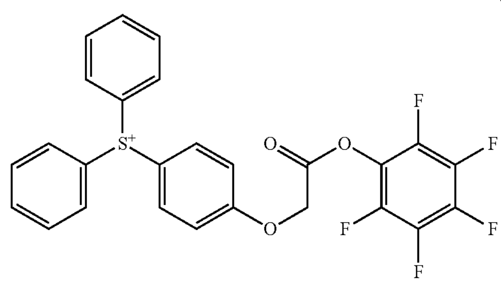

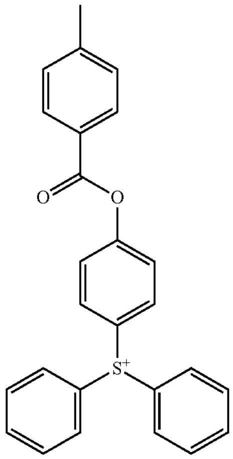
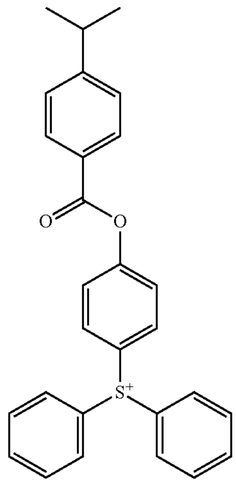
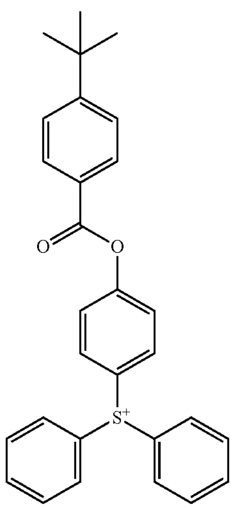
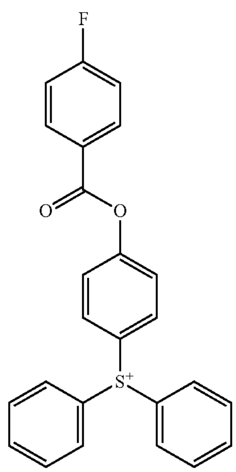
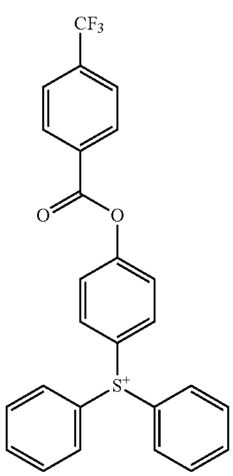
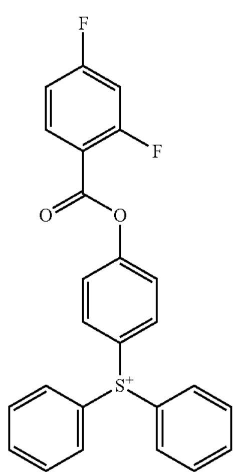
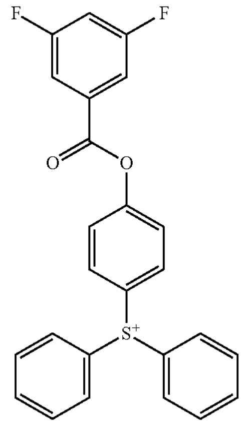
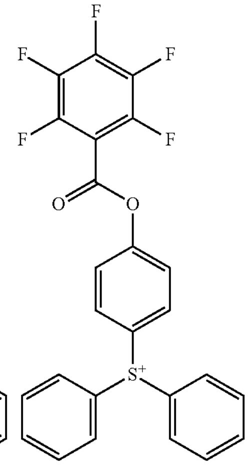
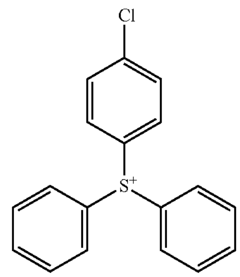
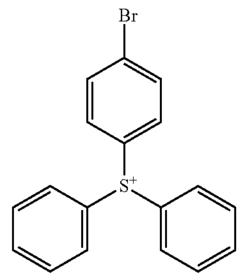
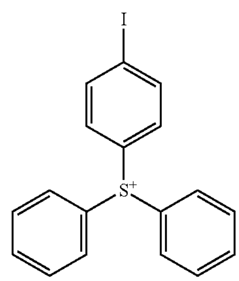
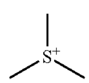
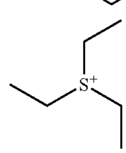
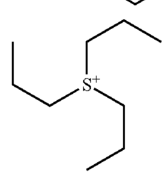
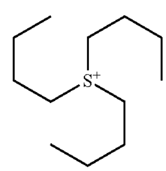
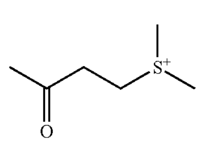
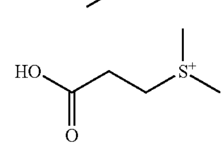
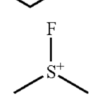
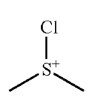
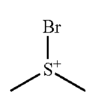
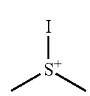
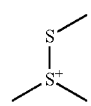
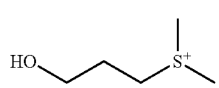
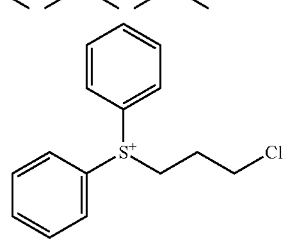

-continued
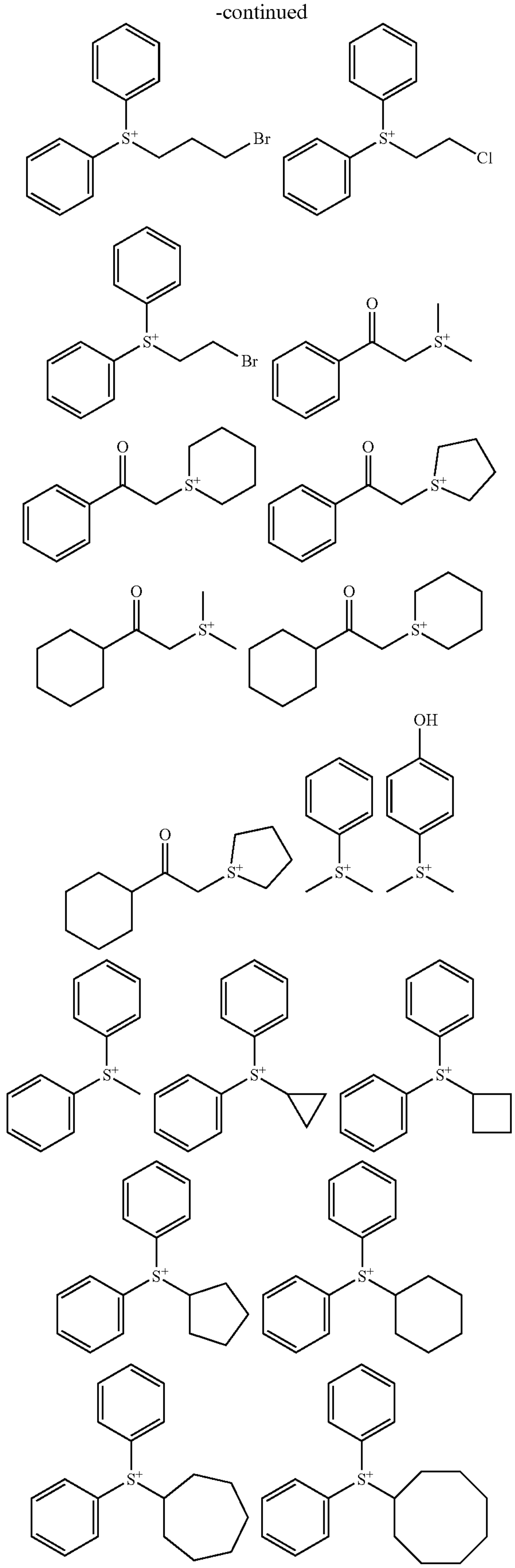
-continued
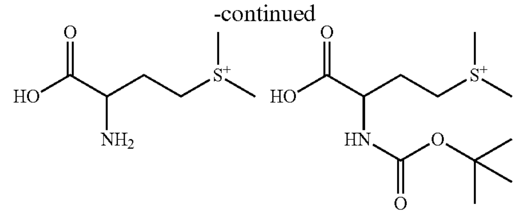
Examples of the cation moiety in the iodonium salt having formula (1-2) are shown below, but not limited thereto.
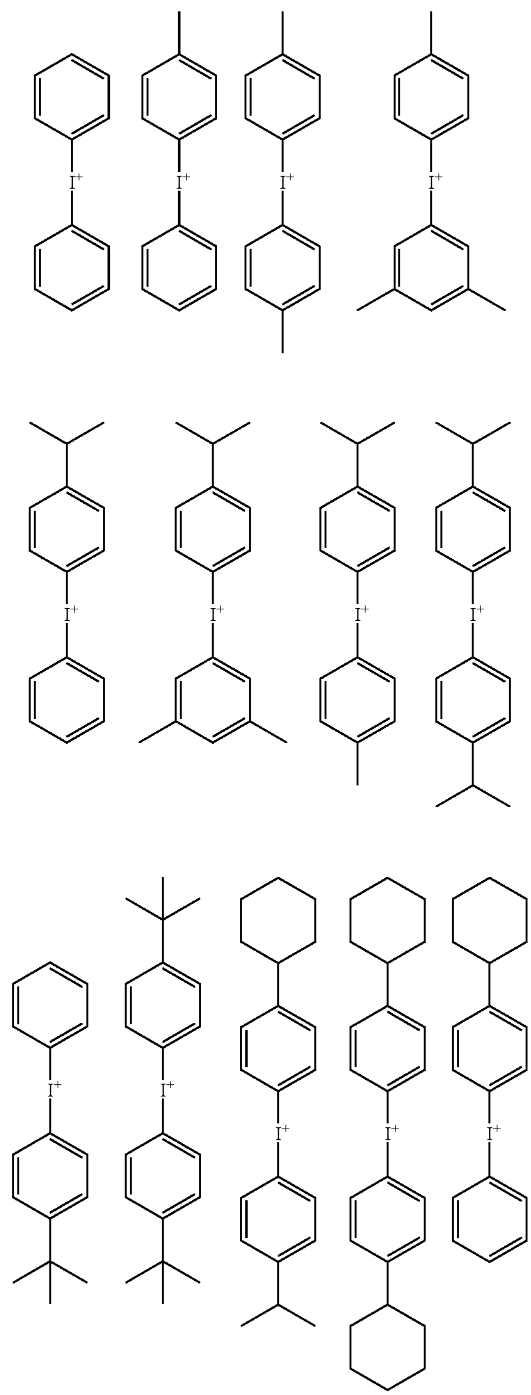

-continued
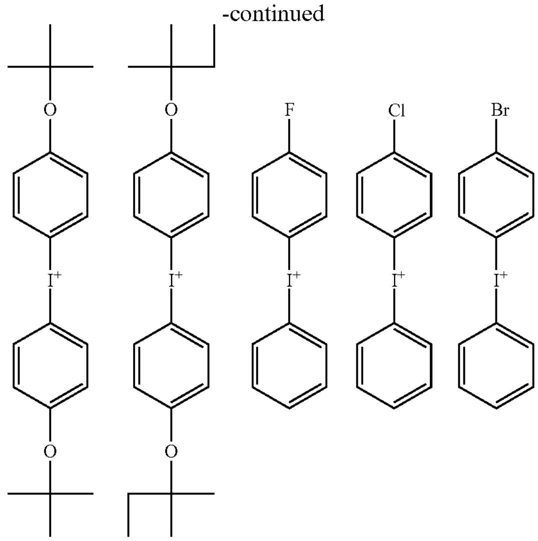
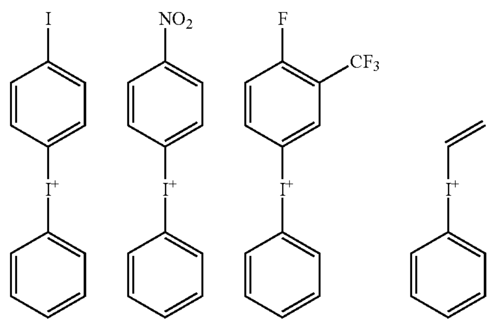
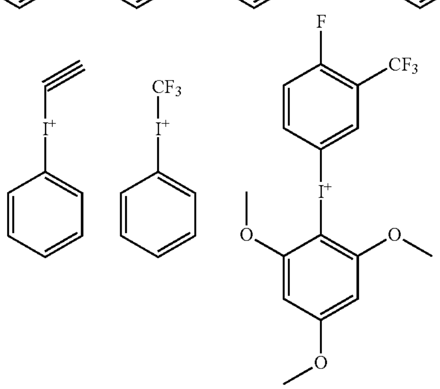
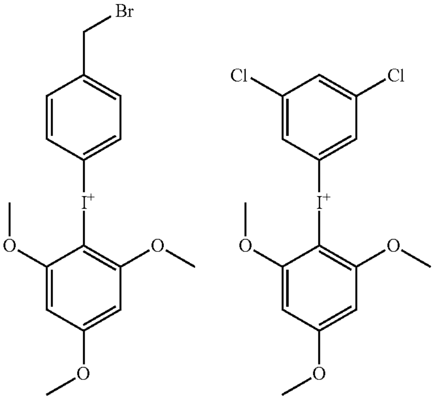
-continued
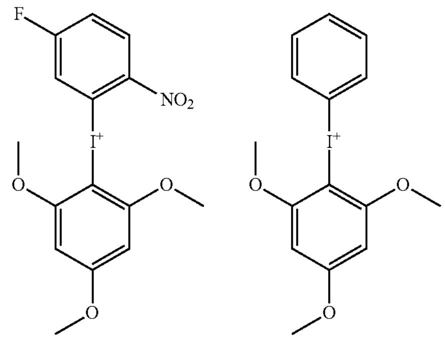
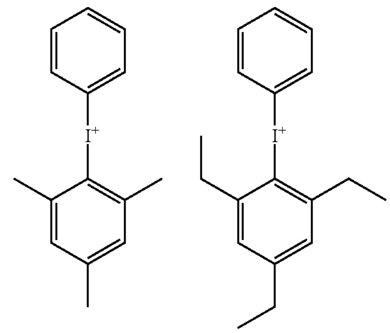
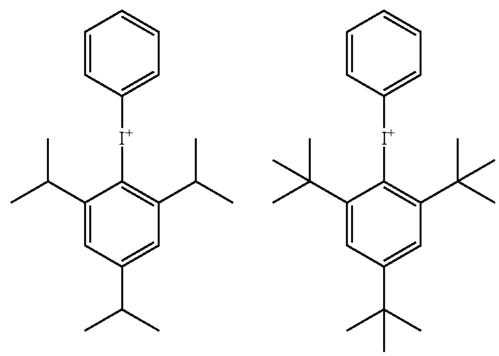
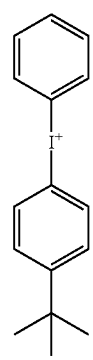
In formulae (1-1) and (1-2), $X^-$ is an anion selected from the formulae (1A) to (1D).
$$R^{fa}-CF_2-SO_3^- \tag{1A}$$
$$\begin{matrix} R^{fb1}-CF_2-SO_2 \\ R^{fb2}-CF_2-SO_2 \end{matrix} \rangle N^- \tag{1B}$$

-continued (1C)

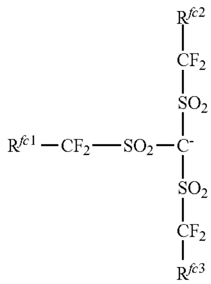

(1D)

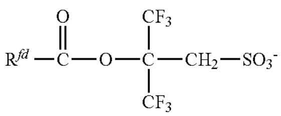

In formula (1A), $R^{fa}$ is fluorine or a $C_1$-$C_{40}$ monovalent hydrocarbon group which may contain a heteroatom. The monovalent hydrocarbon groups may be straight, branched or cyclic, and examples thereof are as will be exemplified for $R^{107}$ later.

Of the anions of formula (1A), a structure having formula (1A') is preferred.

(1A')

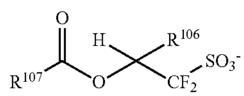

In formula (1A'), $R^{106}$ is hydrogen or trifluoromethyl, preferably trifluoromethyl. $R^{107}$ is a $C_1$-$C_{38}$ monovalent hydrocarbon group which may contain a heteroatom. Suitable heteroatoms include oxygen, nitrogen, sulfur and halogen, with oxygen being preferred. Those monovalent hydrocarbon groups of 6 to 30 carbon atoms are preferred because a high resolution is available in fine pattern formation.

The monovalent hydrocarbon groups represented by $R^{107}$ may be straight, branched or cyclic. Suitable monovalent hydrocarbon groups include straight or branched alkyl groups such as methyl, ethyl, propyl, isopropyl, butyl, isobutyl, s-butyl, t-butyl, pentyl, neopentyl, cyclopentyl, hexyl, heptyl, 2-ethylhexyl, nonyl, undecyl, tridecyl, pentadecyl, heptadecyl, and icosanyl; monovalent saturated cycloaliphatic hydrocarbon groups such as cyclohexyl, 1-adamantyl, 2-adamantyl, 1-adamantylmethyl, norbornyl, norbornylmethyl, tricyclodecanyl, tetracyclododecanyl, tetracyclododecanylmethyl, and dicyclohexylmethyl; monovalent unsaturated aliphatic hydrocarbon groups such as allyl and 3-cyclohexenyl; aryl groups such as phenyl, 1-naphthyl and 2-naphthyl; and aralkyl groups such as benzyl and diphenylmethyl. Suitable heteroatom-containing monovalent hydrocarbon groups include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl. Also included are the foregoing groups in which at least one hydrogen is substituted by a moiety containing a heteroatom such as oxygen, sulfur, nitrogen or halogen, or in which some carbon is replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic acid anhydride or haloalkyl moiety.

With respect to the synthesis of the sulfonium salt having an anion of formula (1A'), reference is made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (1A) are shown below, but not limited thereto.

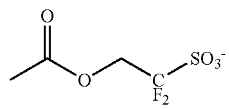
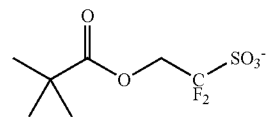

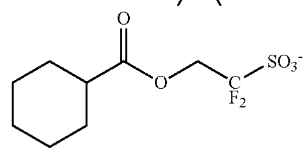

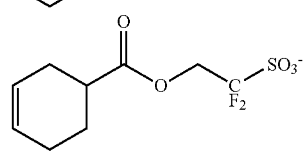

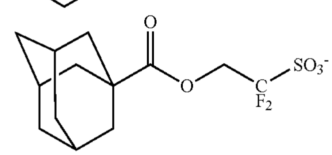

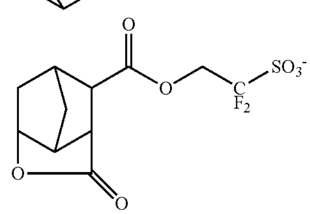

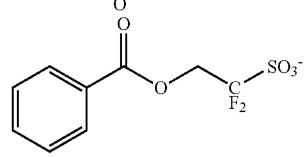

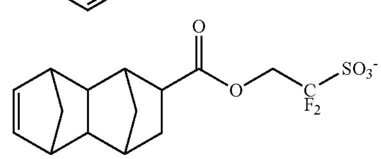

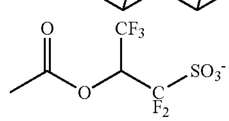
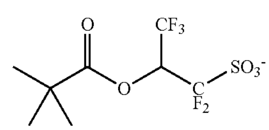

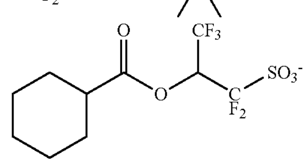

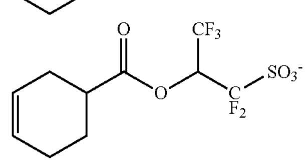

-continued
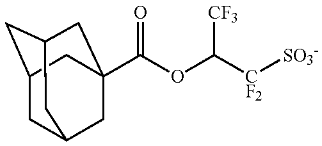
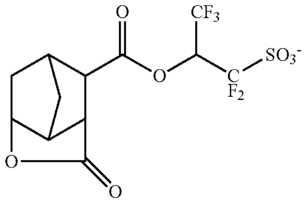
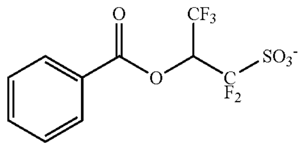
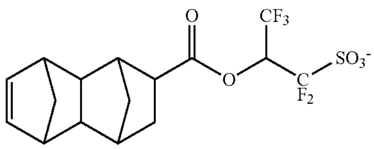
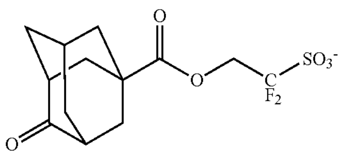
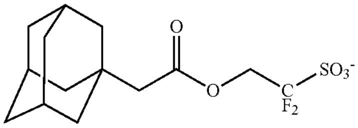
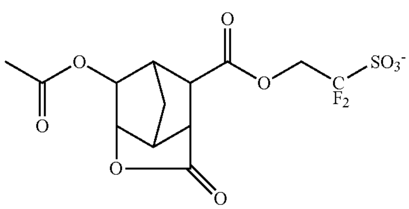
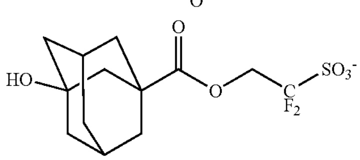
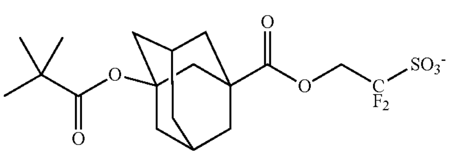
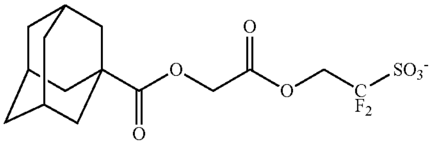
-continued
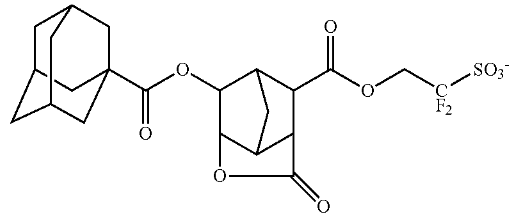
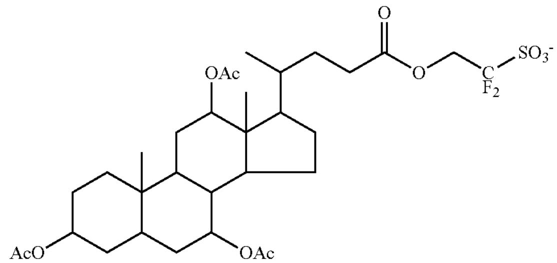
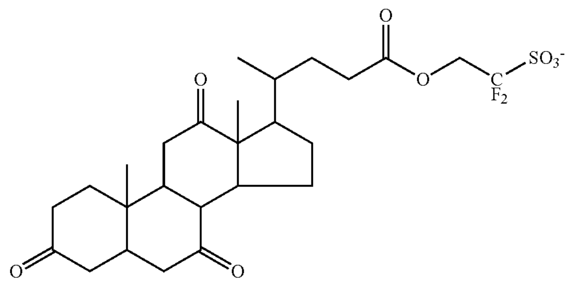
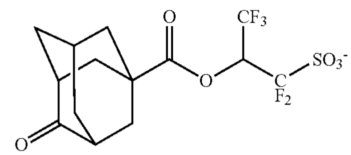
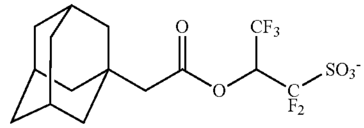
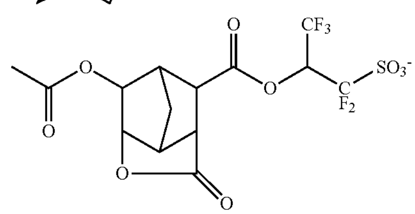
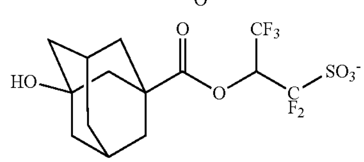
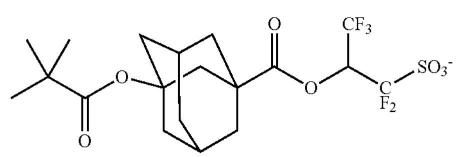
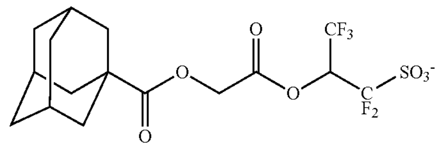

-continued

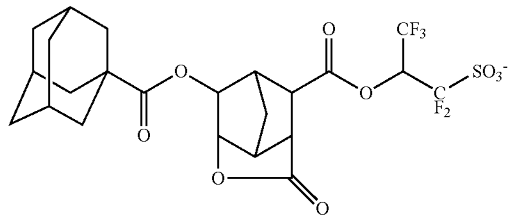

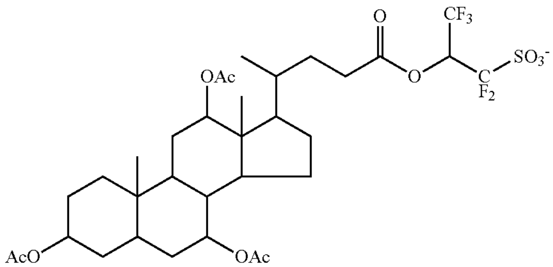

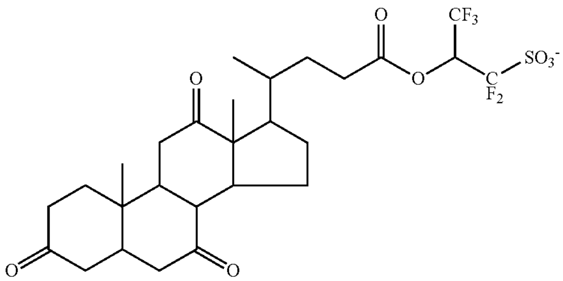

In formula (1B), $R^{fb1}$ and $R^{fb2}$ are each independently fluorine or a $C_1$-$C_{40}$ monovalent hydrocarbon group which may contain a heteroatom. The monovalent hydrocarbon groups may be straight, branched or cyclic, and examples thereof are as exemplified above for $R^{107}$. Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage (—$CF_2$—$SO_2$—N—$SO_2$—$CF_2$—) to which they are attached, and preferably the pair is a fluorinated ethylene or fluorinated propylene group.

In formula (1C), $R^{fc1}$, $R^{fc2}$ and $R^{fc3}$ are each independently fluorine or a $C_1$-$C_{40}$ monovalent hydrocarbon group which may contain a heteroatom. The monovalent hydrocarbon groups may be straight, branched or cyclic, and examples thereof are as exemplified above for $R^{107}$. Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage (—$CF_2$—$SO_2$—$C^-$—$SO_2$—$CF_2$—) to which they are attached, and preferably the pair is a fluorinated ethylene or fluorinated propylene group.

In formula (1D), $R^{fd}$ is a $C_1$-$C_{40}$ monovalent hydrocarbon group which may contain a heteroatom. The monovalent hydrocarbon groups may be straight, branched or cyclic, and examples thereof are as exemplified above for $R^{107}$.

With respect to the synthesis of the sulfonium salt having an anion of formula (1D), reference is made to JP-A 2010-215608 and JP-A 2014-133723.

Examples of the anion having formula (1D) are shown below, but not limited thereto.

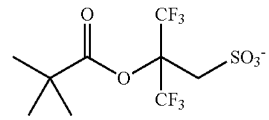

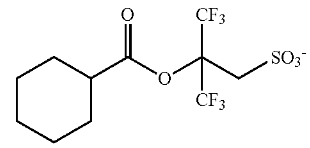

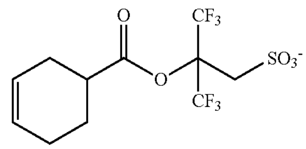

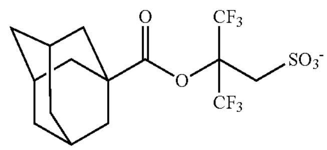

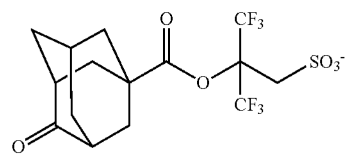

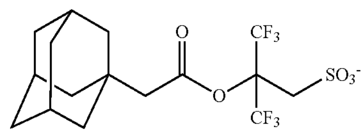

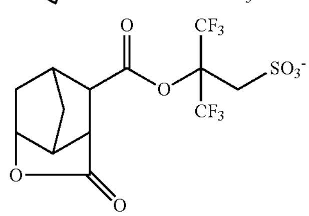

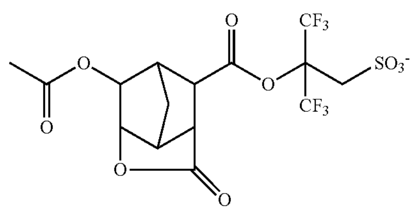

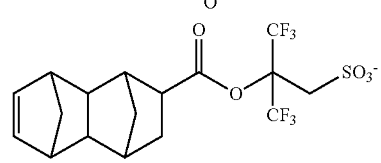

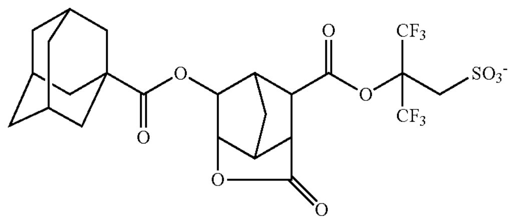

-continued

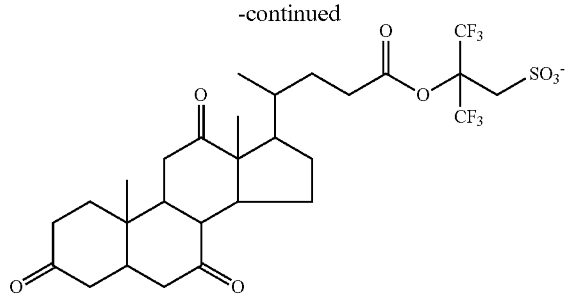

The compound having the anion of formula (1D) has a sufficient acid strength to cleave acid labile groups in the base polymer because it is free of fluorine at α-position of sulfo group, but has two trifluoromethyl groups at β-position. Thus the compound is a useful PAG.

Further, compounds having the formula (2) are also useful as the PAG.

(2)

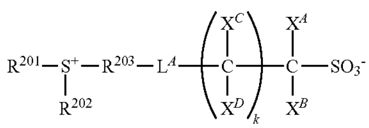

In formula (2), $R^{201}$ and $R^{202}$ are each independently a $C_1$-$C_{30}$ monovalent to hydrocarbon group which may contain a heteroatom. $R^{203}$ is a $C_1$-$C_{30}$ divalent hydrocarbon group which may contain a heteroatom. Any two of $R^{201}$, $R^{202}$ and $R^{203}$ may bond together to form a ring with the sulfur atom to which they are attached. $L^A$ is a single bond or ether bond, or a $C_1$-$C_{20}$ divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

The monovalent hydrocarbon groups may be straight, branched or cyclic and include straight or branched alkyl groups such as methyl, ethyl, propyl, isopropyl, n-butyl, s-butyl, t-butyl, n-pentyl, t-pentyl, n-hexyl, n-octyl, n-nonyl, n-decyl, and 2-ethylhexyl; monovalent saturated cyclic hydrocarbon groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.$0^{2,6}$]decanyl, and adamantyl; and aryl groups such as phenyl, naphthyl and anthracenyl. Also included are the foregoing groups in which at least one hydrogen is substituted by a moiety containing a heteroatom such as oxygen, sulfur, nitrogen or halogen, or in which some carbon is replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic acid anhydride or haloalkyl moiety.

The divalent hydrocarbon groups may be straight, branched or cyclic, and examples thereof include linear or branched alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl; divalent saturated cyclic hydrocarbon groups such as cyclopentanediyl, cyclohexanediyl, norbornanediyl, and adamantanediyl; and divalent unsaturated cyclic hydrocarbon groups such as phenylene and naphthylene. Also included are the foregoing groups in which at least one hydrogen atom is substituted by an alkyl group such as methyl, ethyl, propyl, n-butyl or t-butyl, or in which at least one hydrogen atom is substituted by a moiety containing a heteroatom such as oxygen, sulfur, nitrogen or halogen, or in which some carbon atom is replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic acid anhydride or haloalkyl moiety. The preferred heteroatom is oxygen.

Of the PAGs having formula (2), those compounds having formula (2') are preferred.

(2')

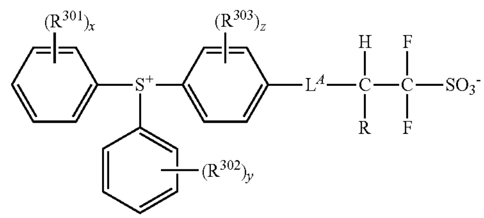

In formula (2'), $L^A$ is as defined above. R is hydrogen or trifluoromethyl, preferably trifluoromethyl. $R^{301}$, $R^{302}$ and $R^{303}$ are each independently hydrogen or a $C_1$-$C_{20}$ monovalent hydrocarbon group which may contain a heteroatom. The monovalent hydrocarbon groups may be straight, branched or cyclic, and examples thereof are as exemplified above for $R^{107}$. The subscripts x and y each are an integer of 0 to 5, and z is an integer of 0 to 4.

Examples of the PAG having formula (2) are shown below, but not limited thereto. Herein R is as defined above.

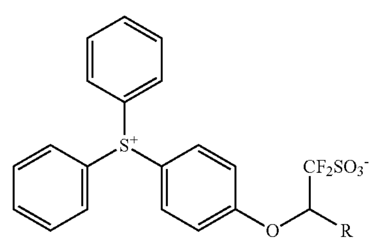

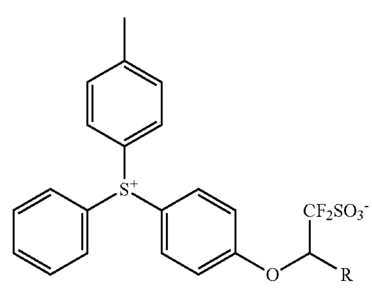

-continued
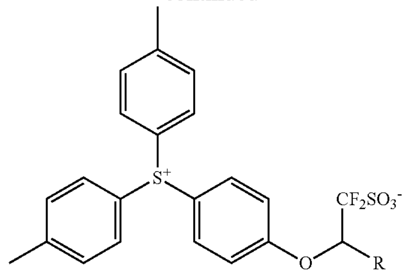
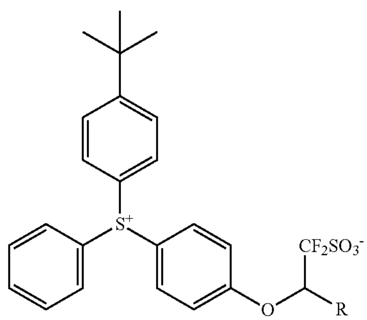
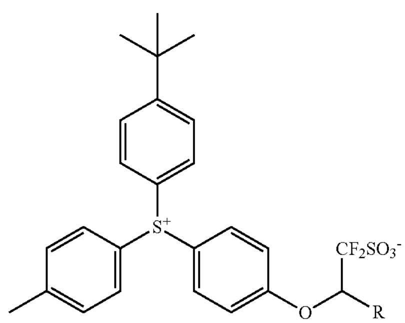
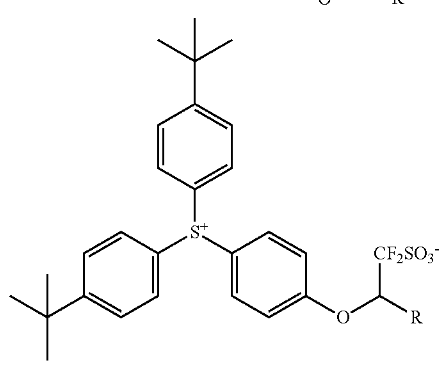
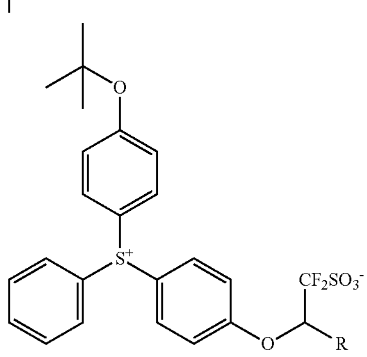
-continued
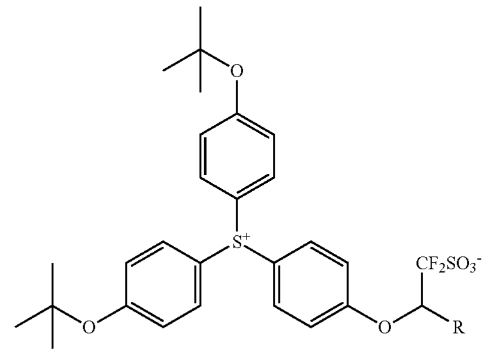
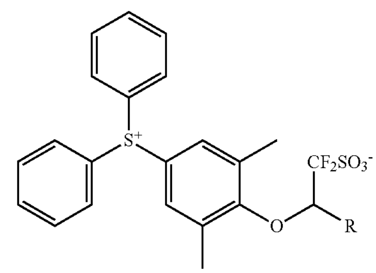
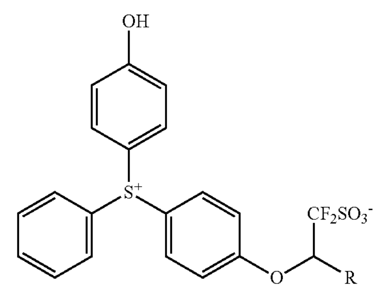
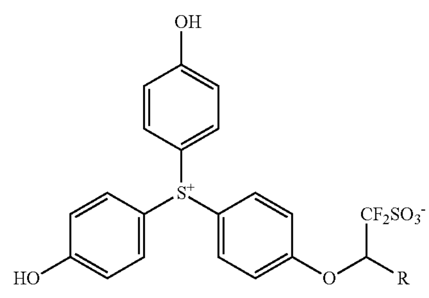
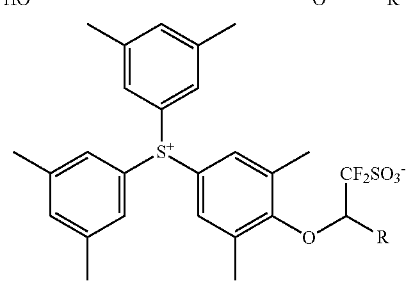
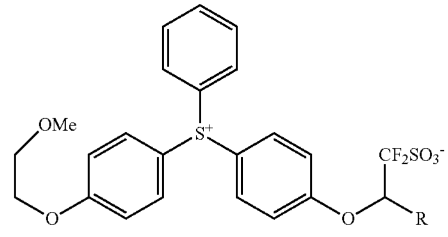

-continued
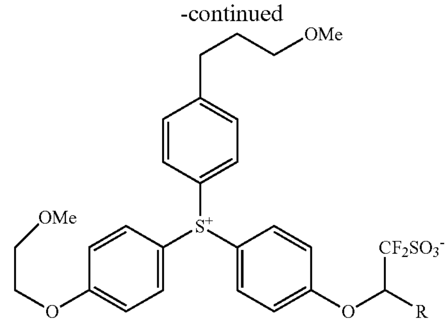
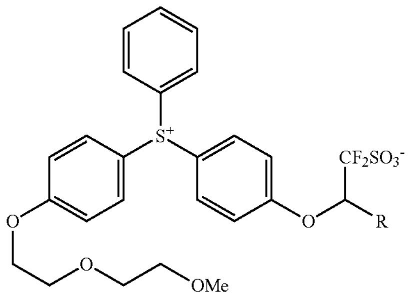
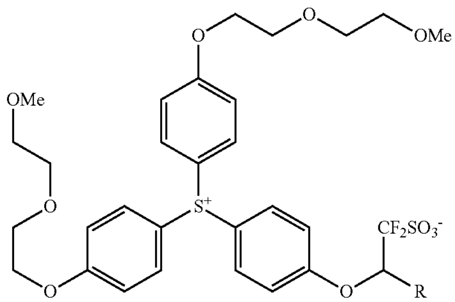
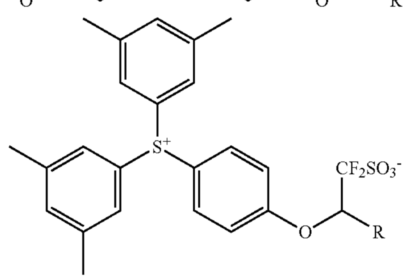
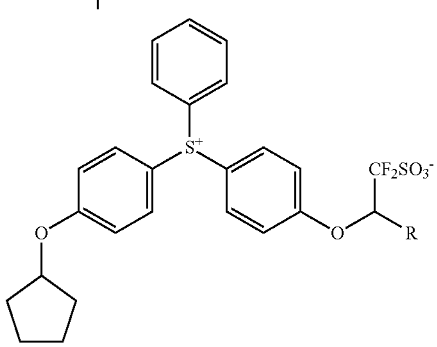
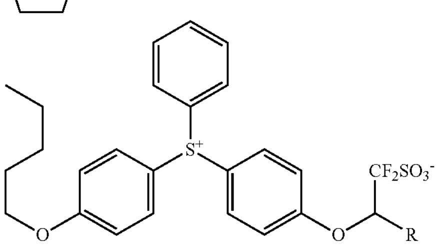
-continued
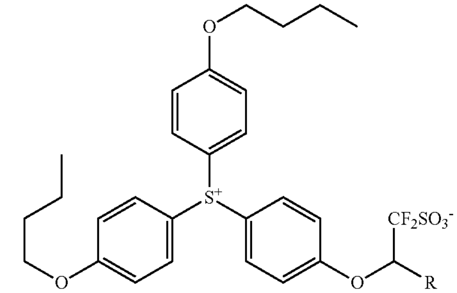
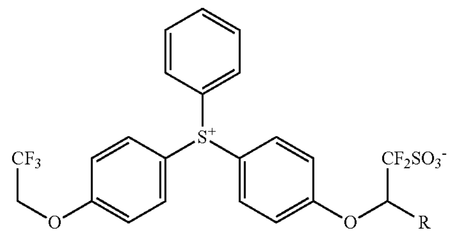
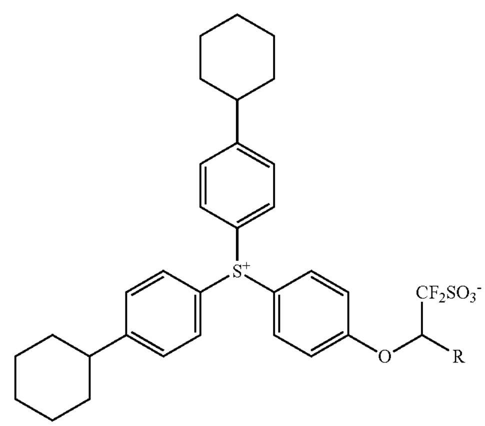
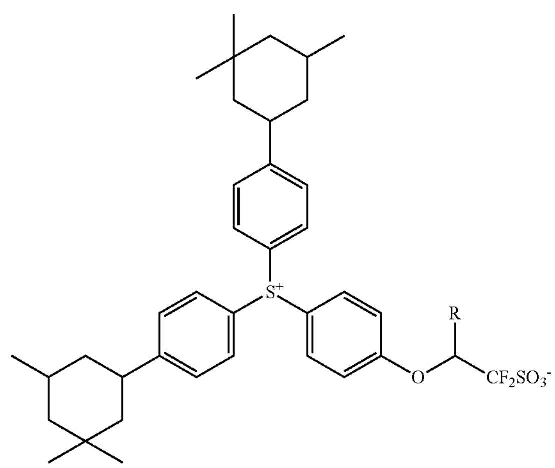
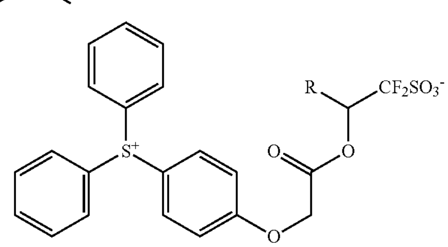

-continued

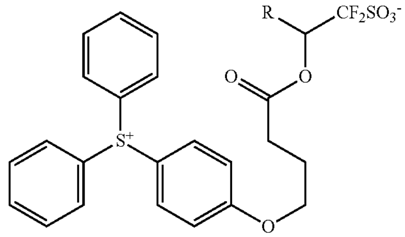

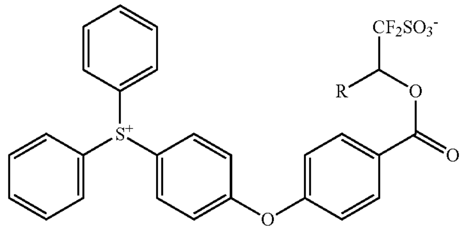

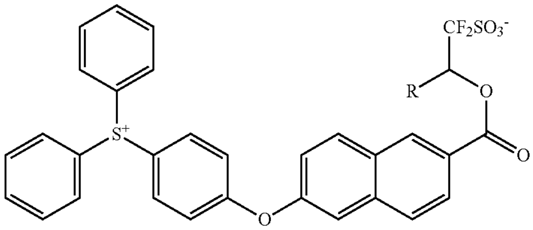

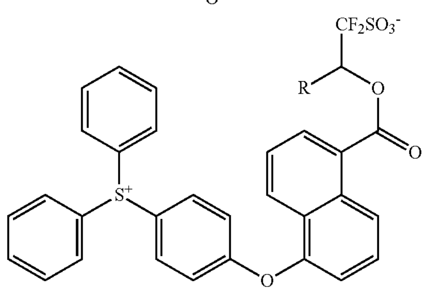

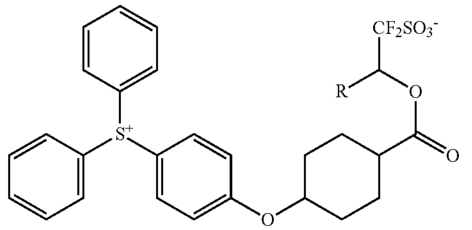

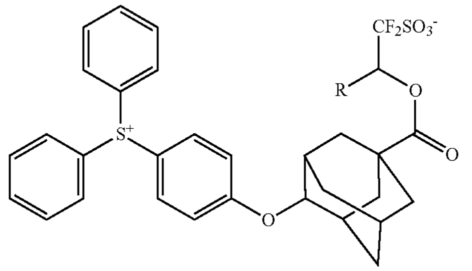

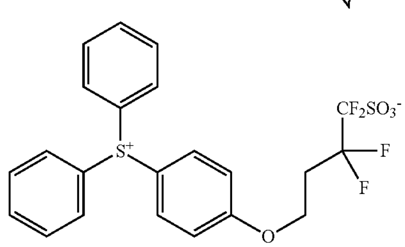

-continued

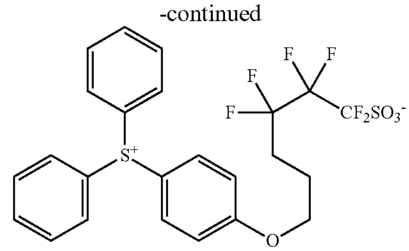

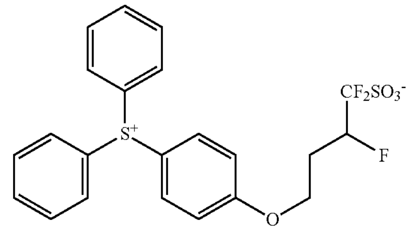

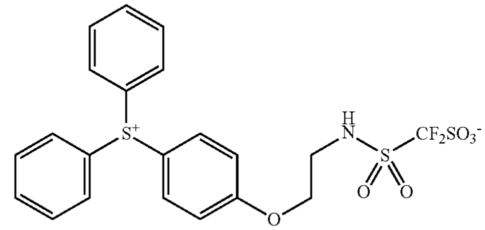

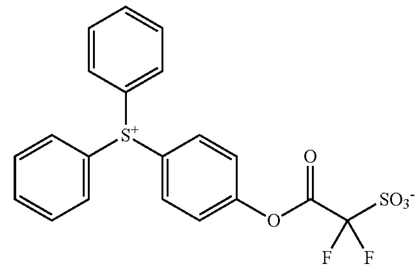

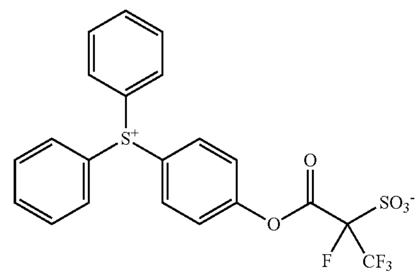

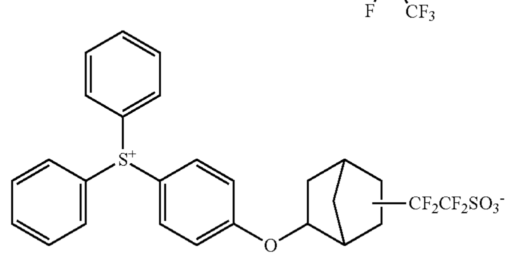

Of the foregoing PAGs, those compounds having an anion of formula (1A') or (1D) are especially preferred because of reduced acid diffusion and high solubility in resist solvent, and those compounds having an anion of formula (2') are especially preferred because of minimized acid diffusion.

Also sulfonium and iodonium salts having an iodized anion are useful as the PAG, for example, sulfonium and iodonium salts of iodized benzoyloxy-containing fluorinated sulfonic acid having the formulae (3-1) and (3-2).

(3-1)

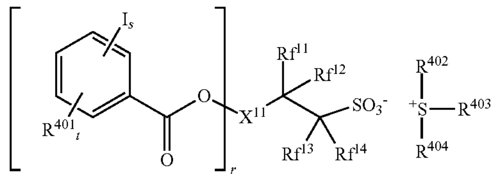

(3-2)

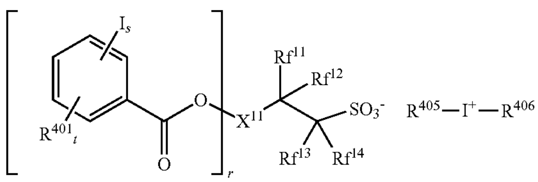

In formulae (3-1) and (3-2), $R^{401}$ is hydrogen, hydroxyl, carboxyl, nitro, cyano, fluorine, chlorine, bromine, amino group, or a $C_1$-$C_{20}$ alkyl, $C_1$-$C_{20}$ alkoxy, $C_2$-$C_{20}$ alkoxycarbonyl, $C_2$-$C_{20}$ acyloxy or $C_1$-$C_4$ alkylsulfonyloxy group, which may contain fluorine, chlorine, bromine, hydroxy, amino or alkoxy moiety, or —$NR^{407}$—C(═O)—$R^{408}$ or —$NR^{407}$—C(═O)—O—$R^{408}$, wherein $R^{407}$ is hydrogen, or a $C_1$-$C_6$ alkyl group which may contain halogen, hydroxy, alkoxy, acyl or acyloxy moiety, $R^{408}$ is a $C_1$-$C_{16}$ alkyl or $C_2$-$C_{16}$ alkenyl group, or $C_6$-$C_{12}$ aryl group, which may contain halogen, hydroxy, alkoxy, acyl or acyloxy moiety. Notably, the foregoing alkyl, alkoxy, alkoxycarbonyl, acyloxy, alkylsulfonyloxy, alkenyl and alkynyl groups may be straight, branched or cyclic.

$X^{11}$ is a single bond or a $C_1$-$C_{20}$ divalent linking group when r=1, or a $C_1$-$C_{20}$ tri- or tetravalent linking group when r=2 or 3, the linking group optionally containing an oxygen, sulfur or nitrogen atom. $Rf^{11}$ to $Rf^{14}$ are each independently hydrogen, fluorine or trifluoromethyl, at least one of $Rf^{11}$ to $Rf^{14}$ being fluorine or trifluoromethyl, or $Rf^{11}$ and $Rf^{12}$, taken together, may form a carbonyl group.

$R^{402}$, $R^{403}$, $R^{404}$, $R^{405}$ and $R^{406}$ are each independently a $C_1$-$C_{20}$ monovalent hydrocarbon group which may contain a heteroatom. Any two of $R^{402}$, $R^{403}$ and $R^{404}$ may bond together to form a ring with the sulfur atom to which they are attached. The monovalent hydrocarbon group may be straight, branched or cyclic, and examples thereof are as exemplified above for $R^{21}$ to $R^{28}$ in formula (f1) to (f3). Preferably $R^{402}$ to $R^{406}$ are aryl groups.

The subscript r is an integer of 1 to 3, s is an integer of 1 to 5, and t is an integer of 0 to 3.

Further, sulfonium and iodonium salts of iodized benzene-containing fluorinated sulfonic acid having the formulae (3-3) and (3-4) are useful as the sulfonium and iodonium salts having an iodized anion.

(3-3)

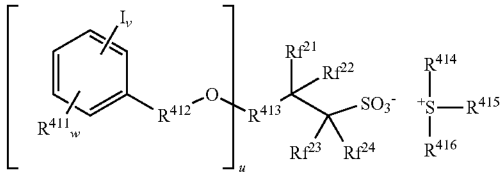

-continued (3-4)

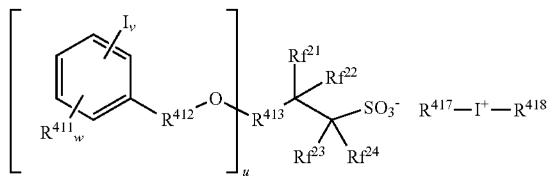

In formulae (3-3) and (3-4), $R^{411}$ is each independently a hydroxyl, $C_1$-$C_{20}$ alkyl or alkoxy group, $C_2$-$C_{20}$ acyl or acyloxy group, fluorine, chlorine, bromine, amino, or $C_2$-$C_{20}$ alkoxycarbonylamino group. $R^{412}$ is each independently a single bond or $C_1$-$C_4$ alkanediyl group. $R^{413}$ is a single bond or $C_1$-$C_{20}$ divalent linking group when u=1, or a $C_1$-$C_{20}$ tri- or tetravalent linking group when u=2 or 3, the linking group optionally containing an oxygen, sulfur or nitrogen atom.

$Rf^{21}$ to $Rf^{24}$ are each independently hydrogen, fluorine or trifluoromethyl, at least one of $Rf^{21}$ to $Rf^{24}$ being fluorine or trifluoromethyl, or $Rf^{21}$ and $Rf^{22}$, taken together, may form a carbonyl group.

$R^{414}$, $R^{415}$, $R^{416}$, $R^{417}$ and $R^{418}$ are each independently a $C_1$-$C_{20}$ monovalent hydrocarbon group which may contain a heteroatom. Any two of $R^{414}$, $R^{415}$ and $R^{416}$ may bond together to form a ring with the sulfur atom to which they are attached. The monovalent hydrocarbon group may be straight, branched or cyclic, and examples thereof are as exemplified above for $R^{21}$ to $R^{28}$ in formula (f1) to (f3). Preferably $R^{414}$ to $R^{418}$ are aryl groups.

The subscript u is an integer of 1 to 3, v is an integer of 1 to 5, and w is an integer of 0 to 3.

The foregoing alkyl, alkoxy, acyl, acyloxy and alkenyl groups may be straight, branched or cyclic.

The cation moiety in the sulfonium salt having formula (3-1) or (3-3) is as exemplified above for the cation moiety in the sulfonium salt of formula (1-1). The cation moiety in the iodonium salt having formula (3-2) or (3-4) is as exemplified above for the cation moiety in the iodonium salt of formula (1-2).

Examples of the anion moiety in the onium salts having formulae (3-1) to (3-4) are given below, but not limited thereto.

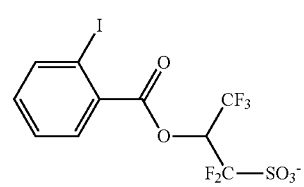

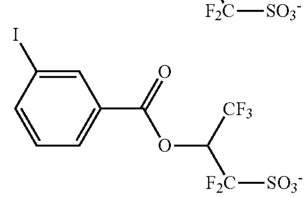

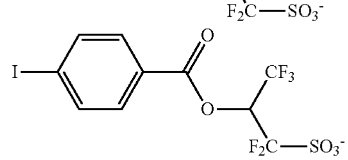

-continued
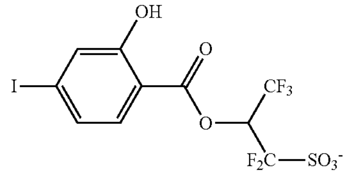
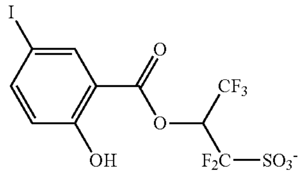
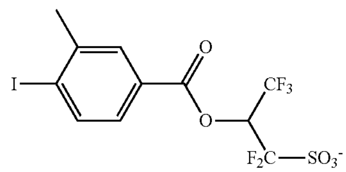
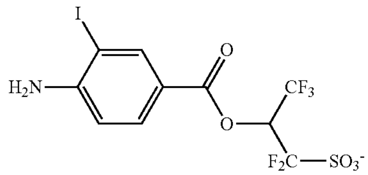
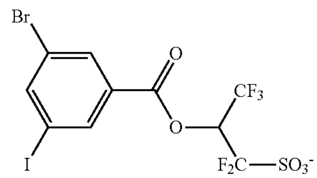
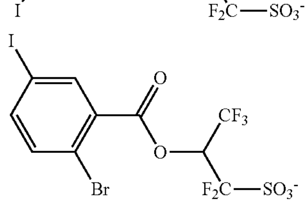
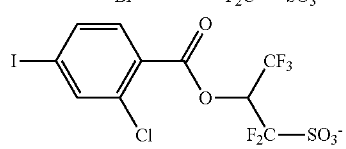
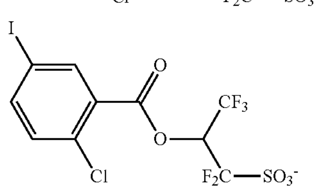
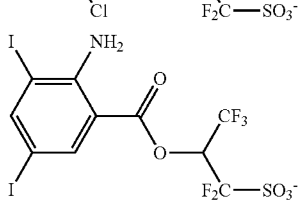
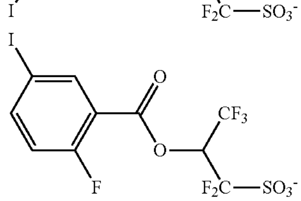
-continued
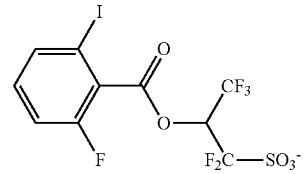
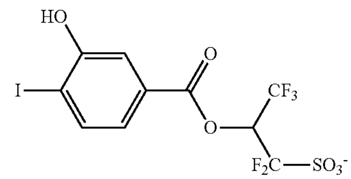
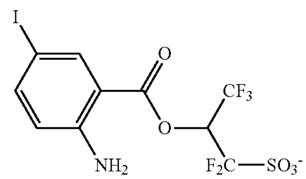
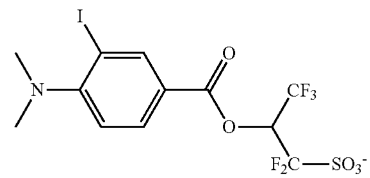
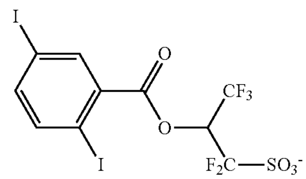
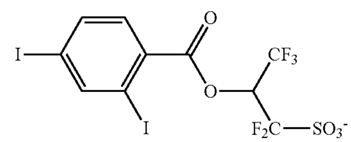
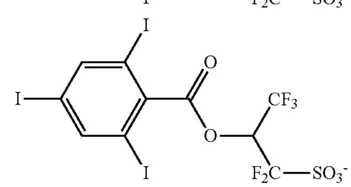
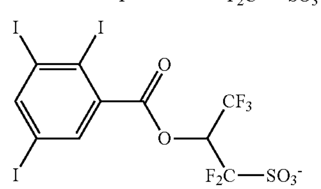
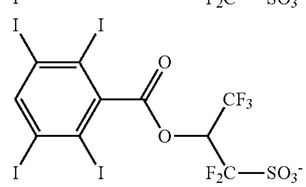
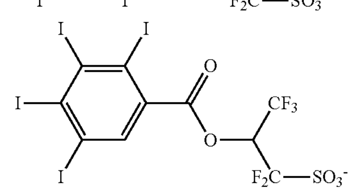

-continued
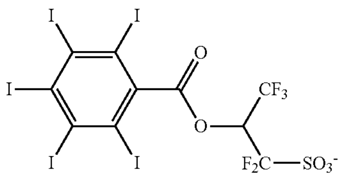
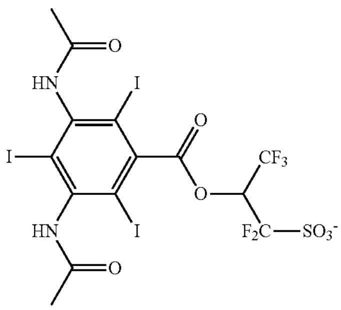
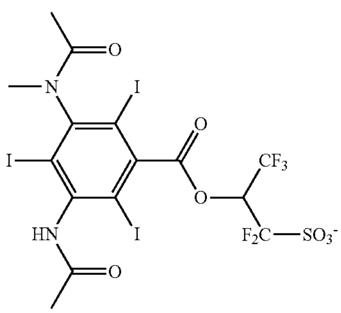
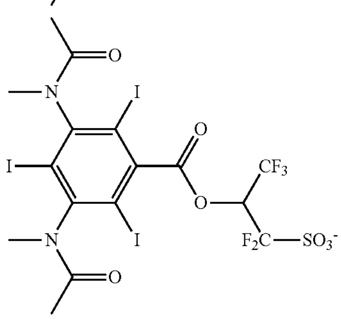
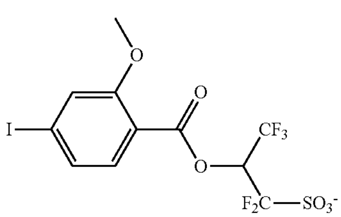
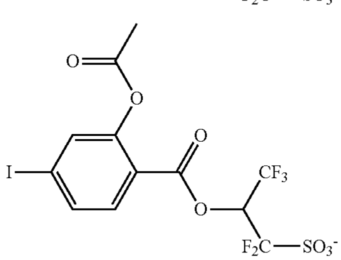
-continued
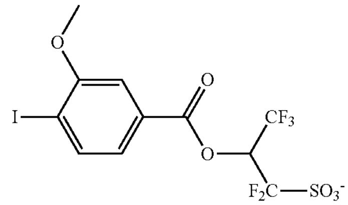
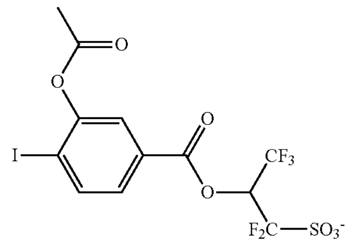
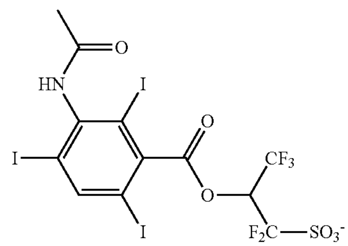
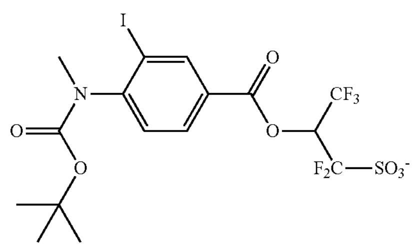
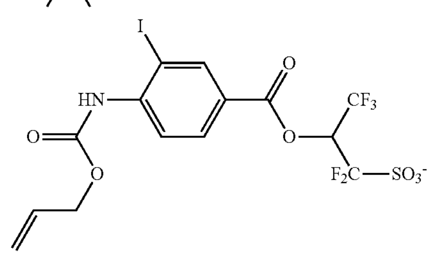
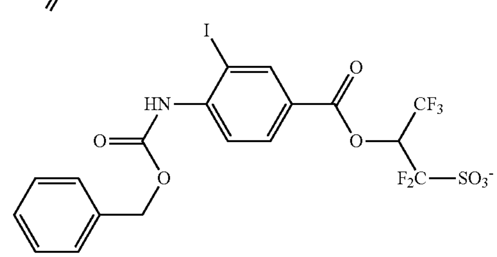
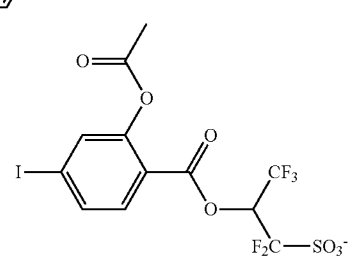

-continued
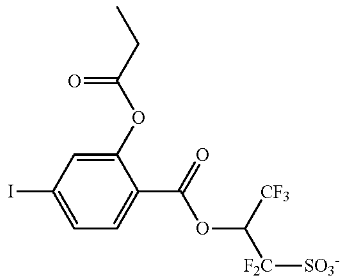
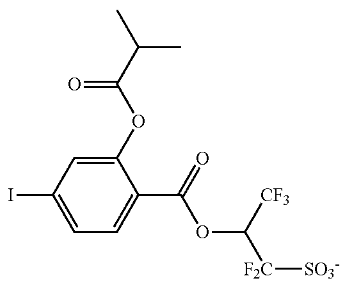
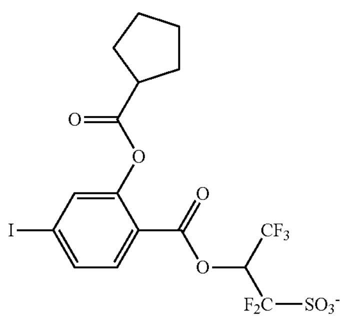
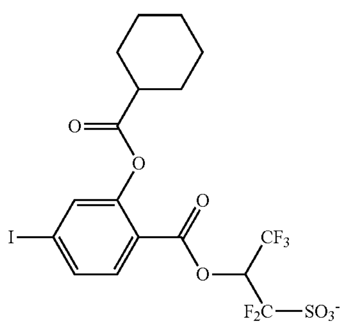
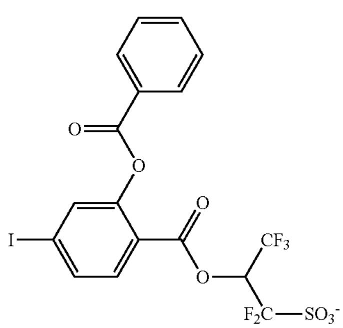
-continued
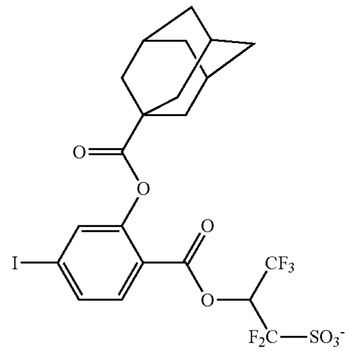
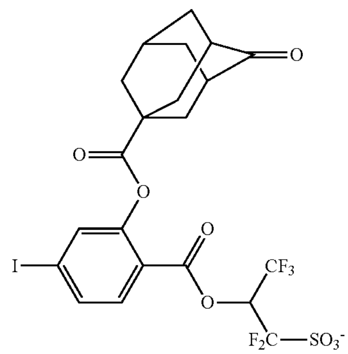
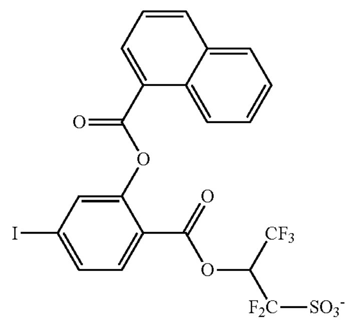
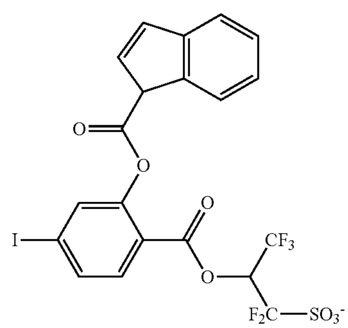
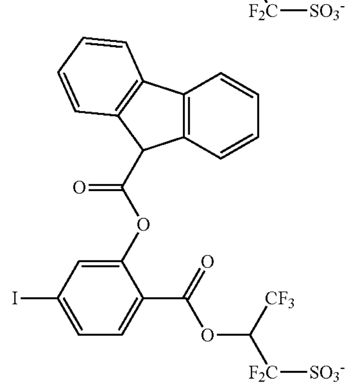

-continued
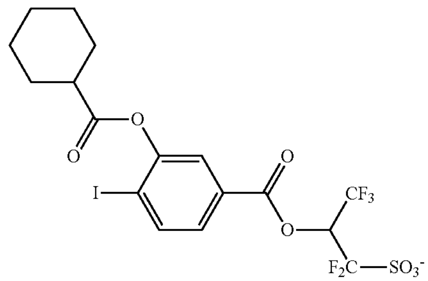
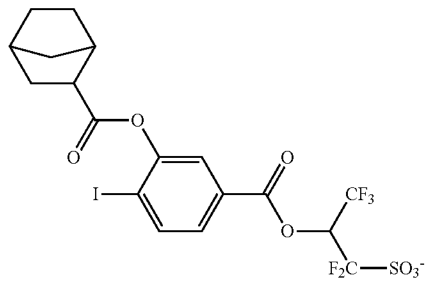
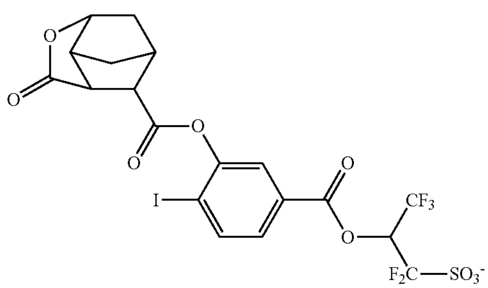
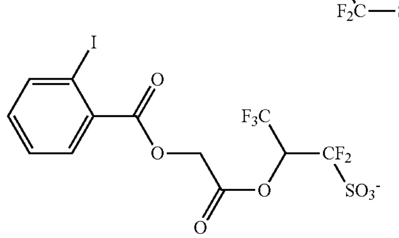
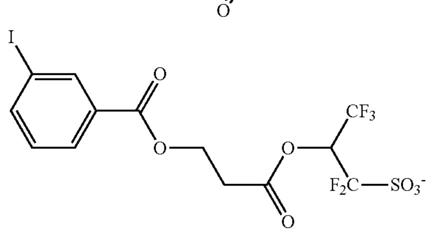
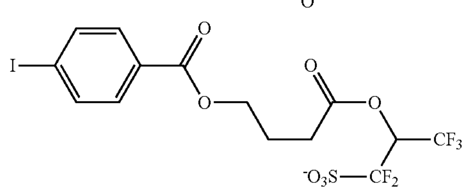
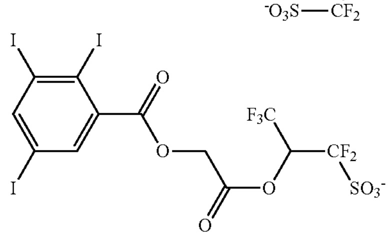
-continued
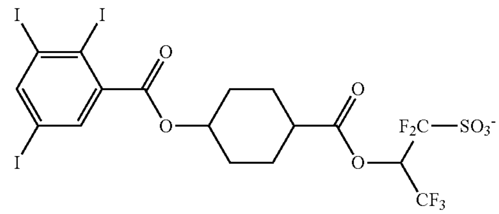
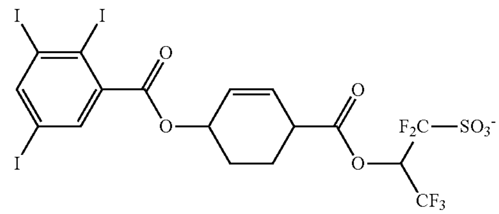
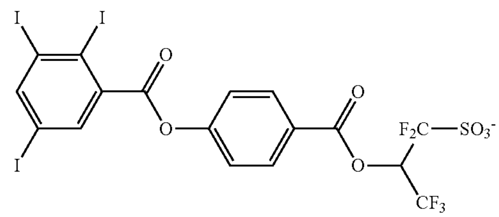
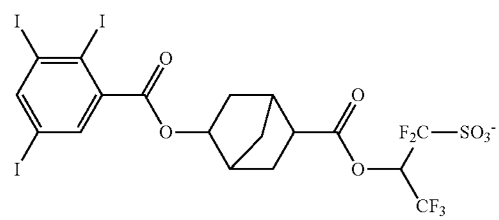
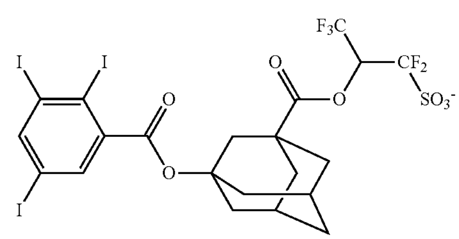
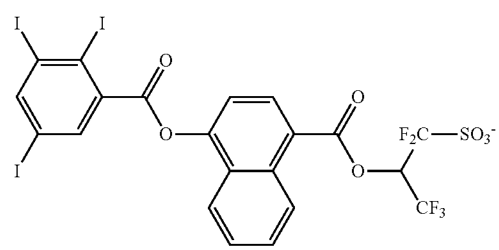
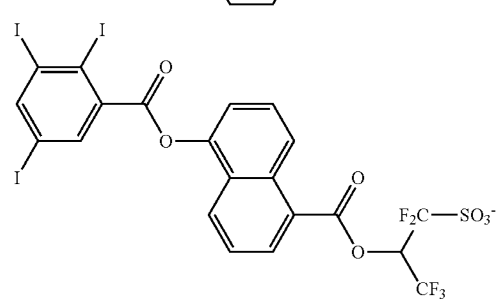

-continued
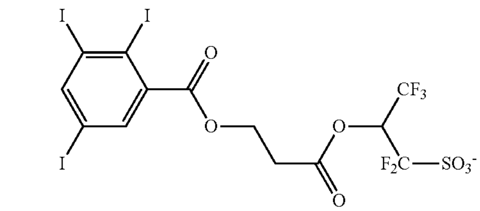
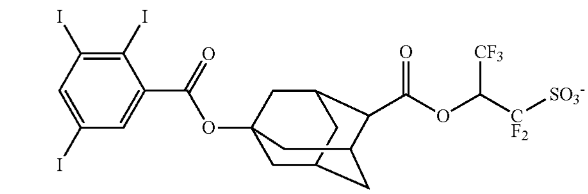
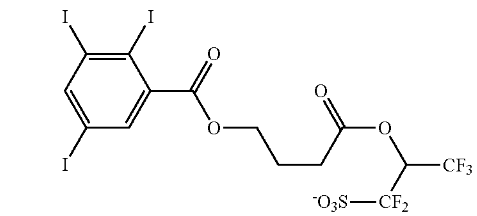
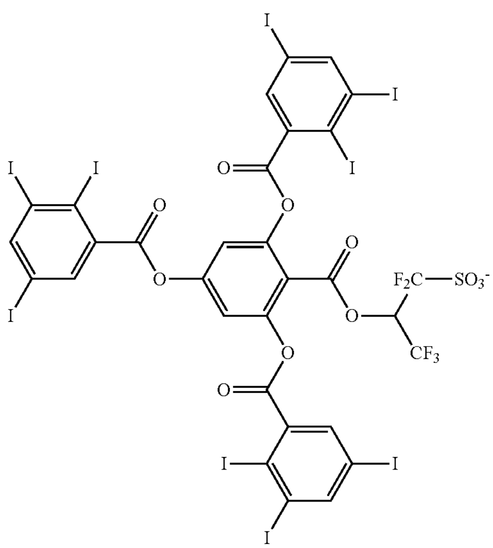
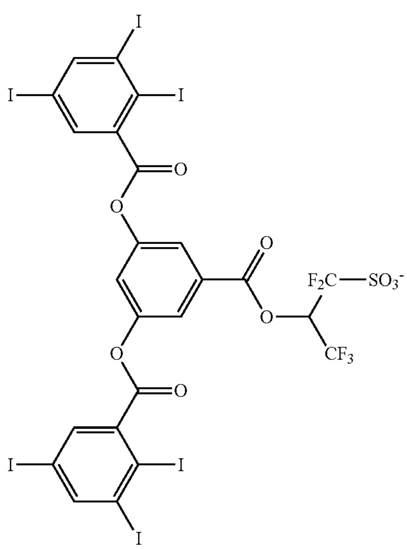
-continued
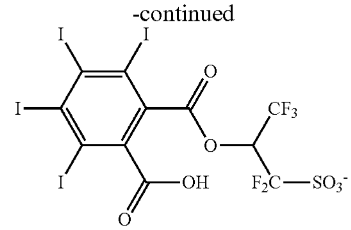
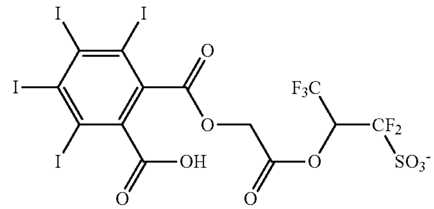
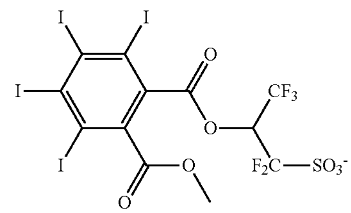
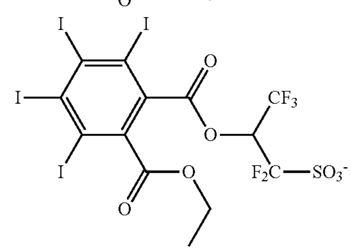
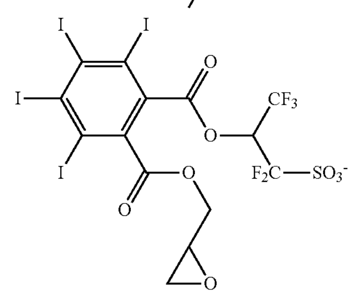
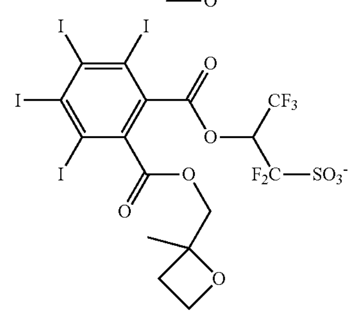
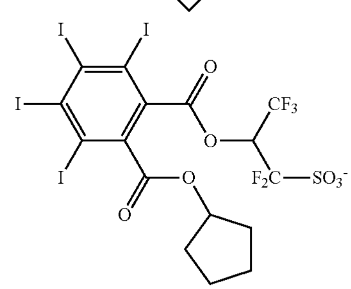

-continued
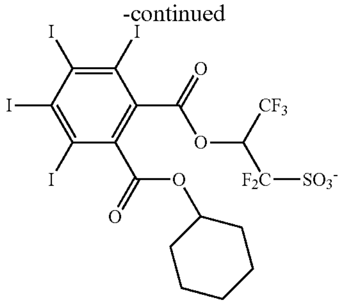
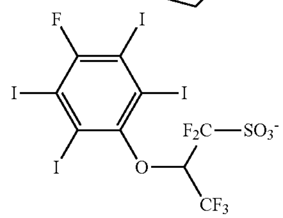
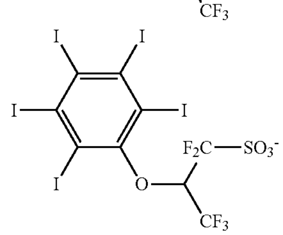
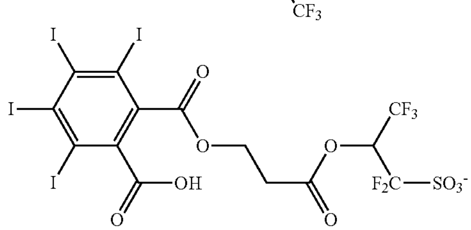
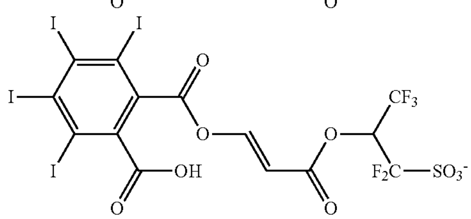
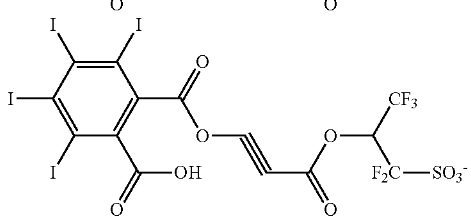
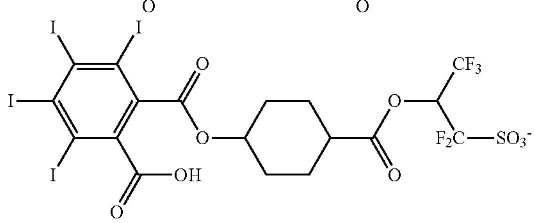
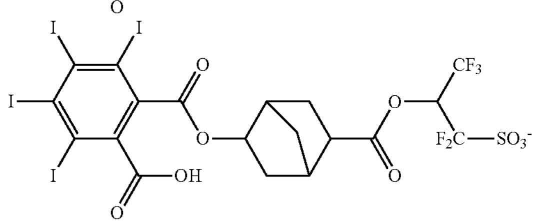
-continued
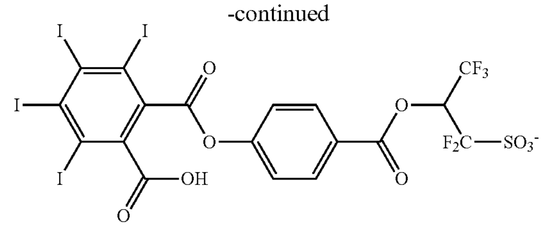
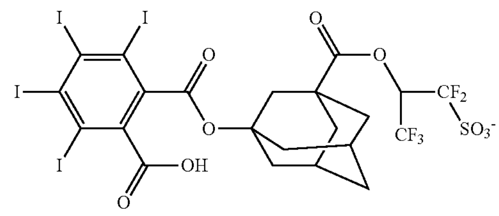
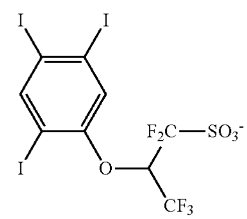
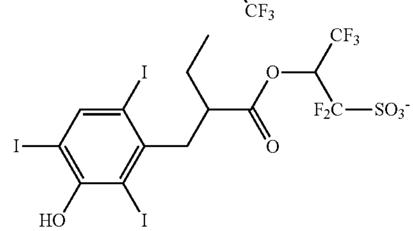
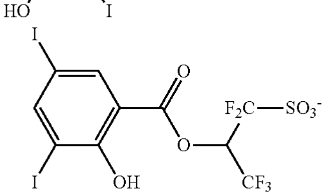
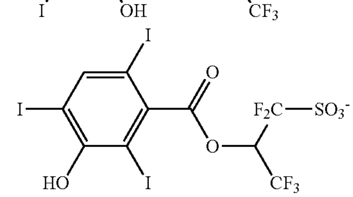
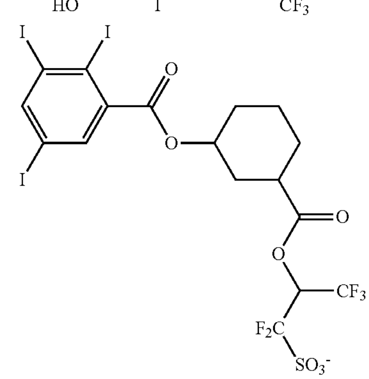

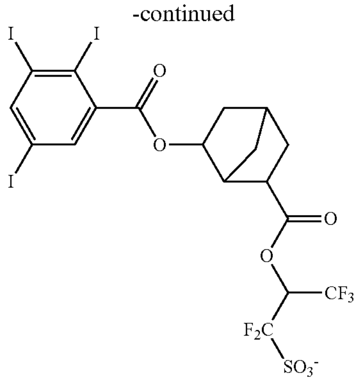
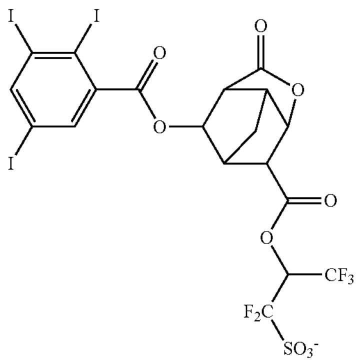
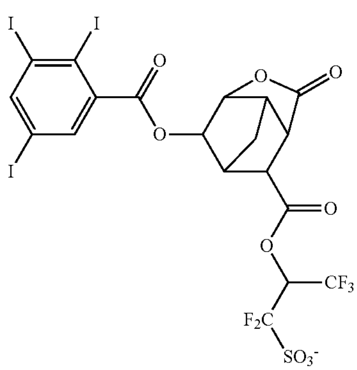
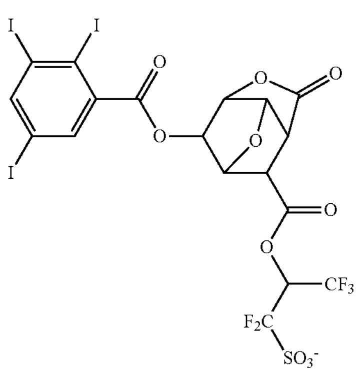
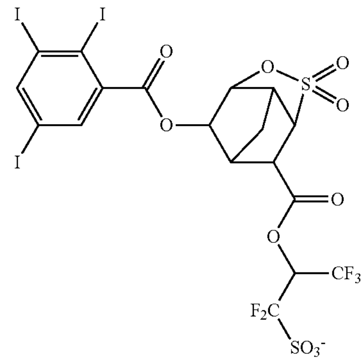
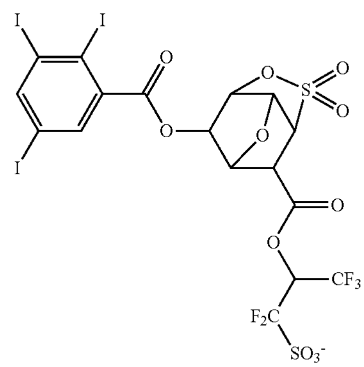
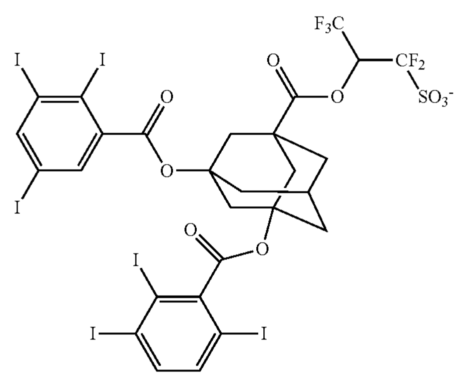
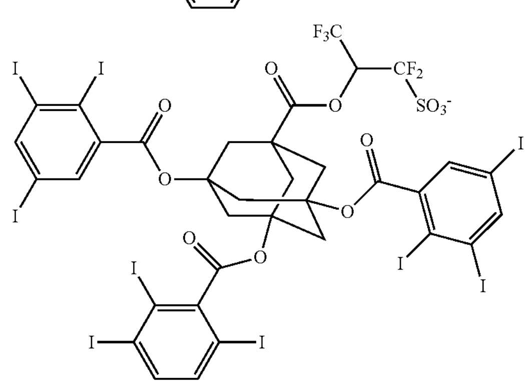

-continued
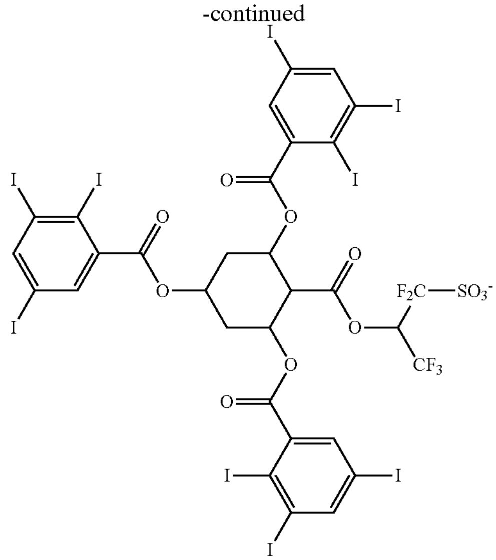
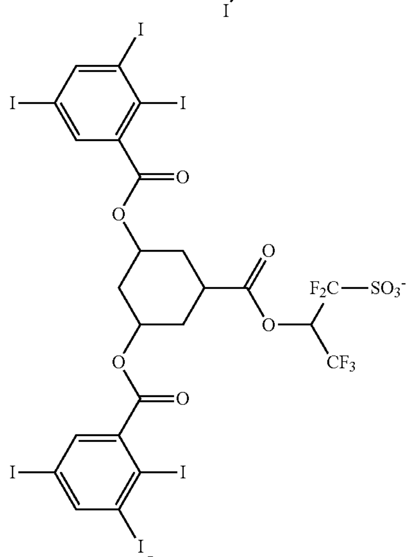
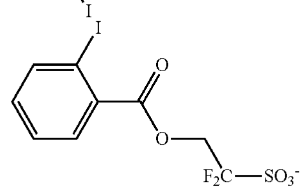
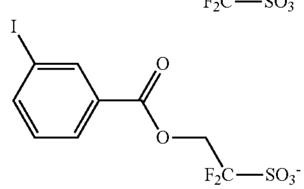
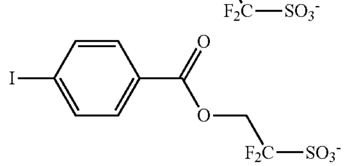
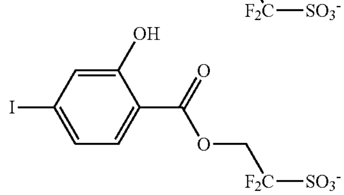
-continued
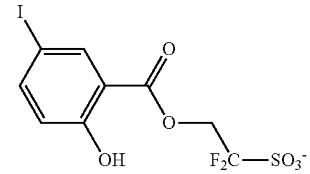
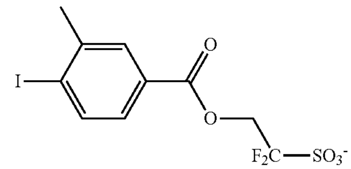
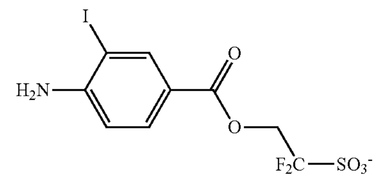
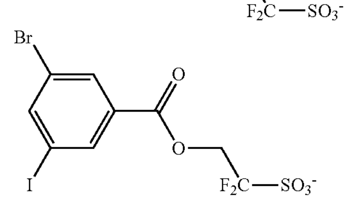
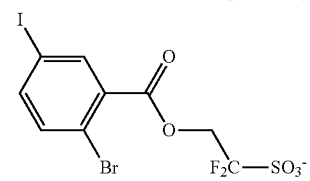
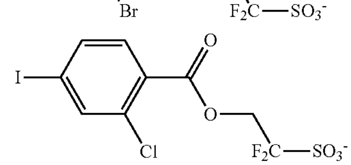
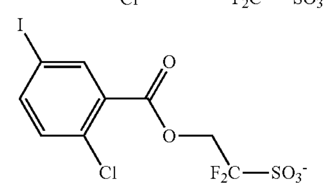
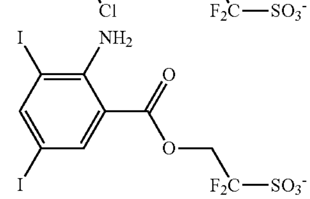
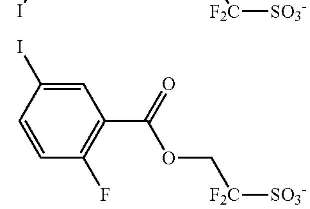
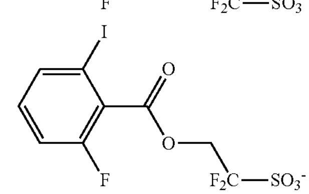

-continued
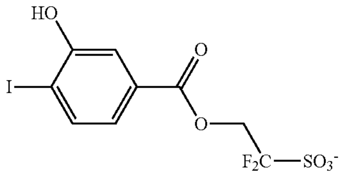
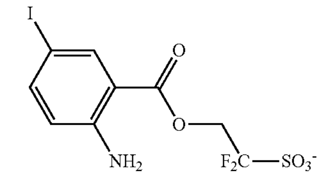
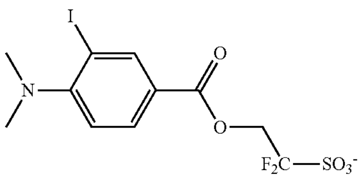
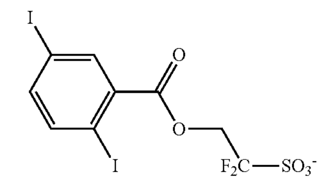
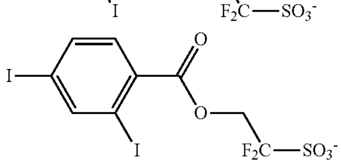
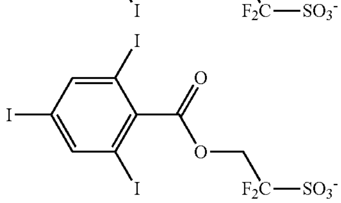
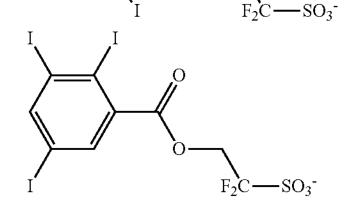
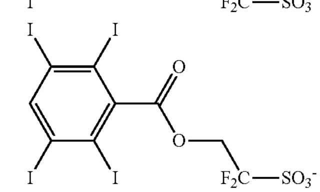
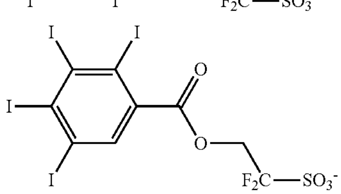
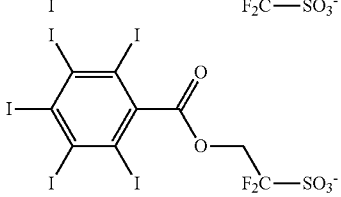
-continued
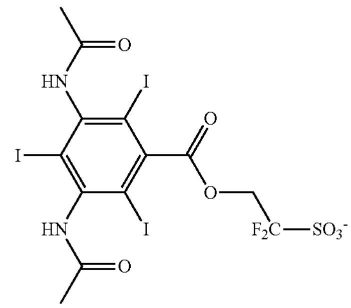
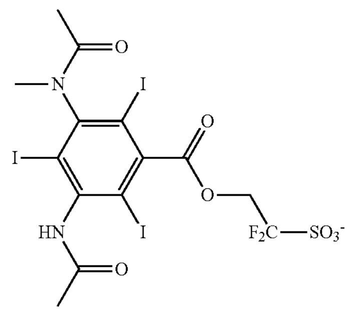
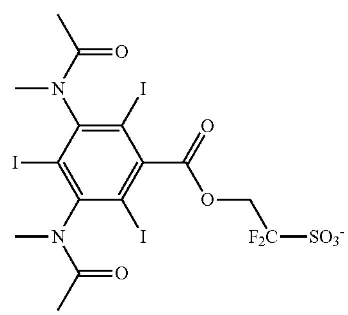
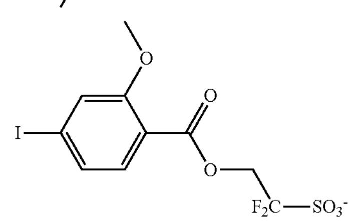
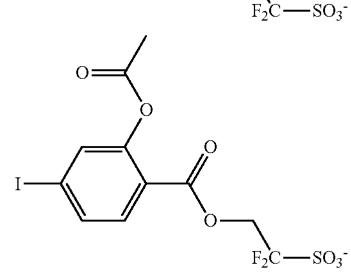
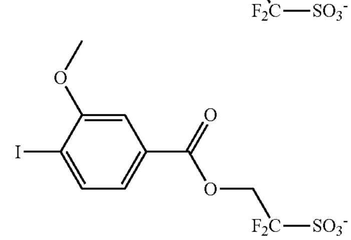

-continued
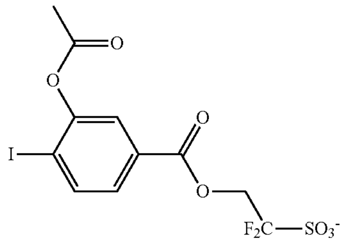
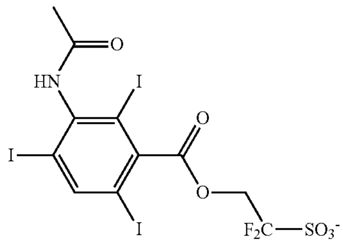
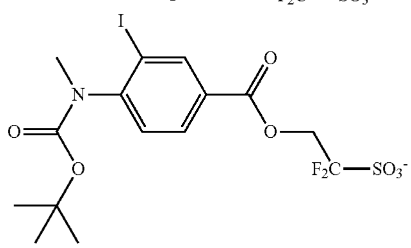
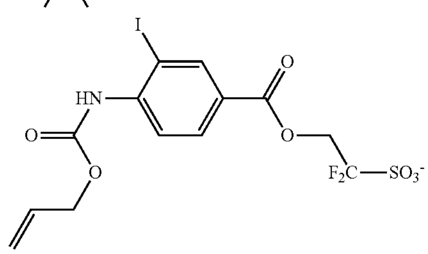
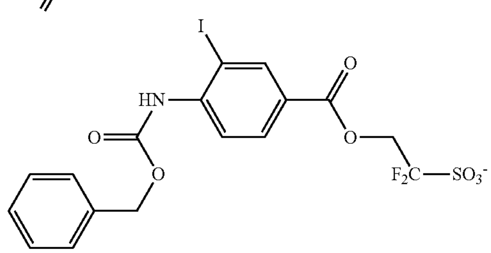
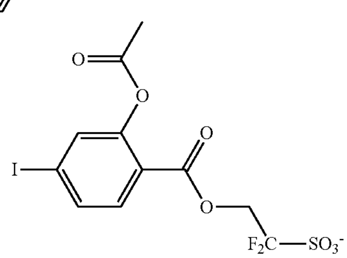
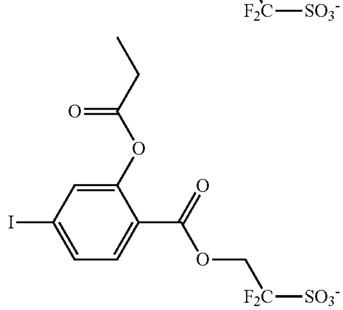
-continued
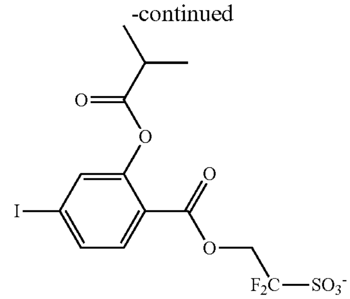
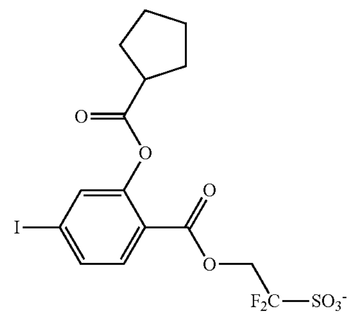
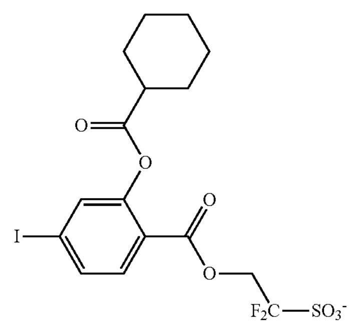
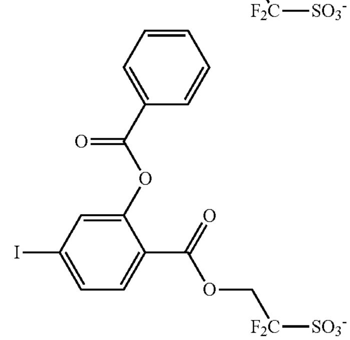
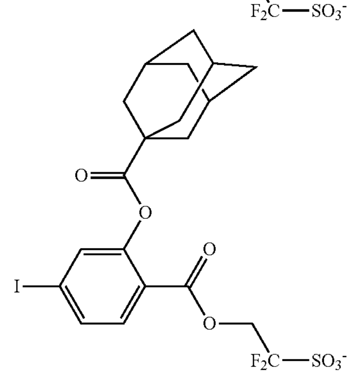

-continued
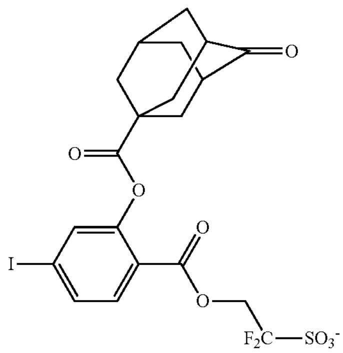
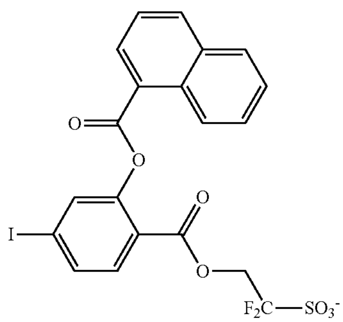
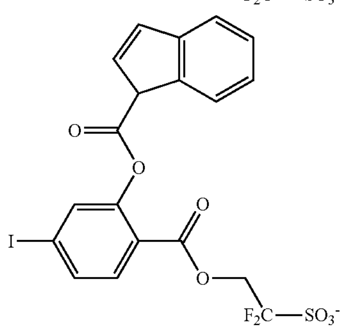
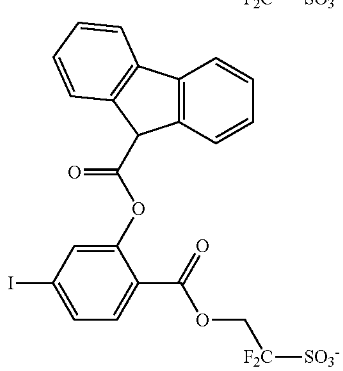
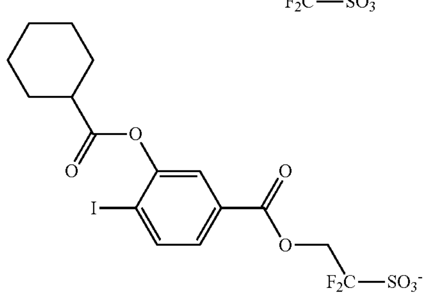
-continued
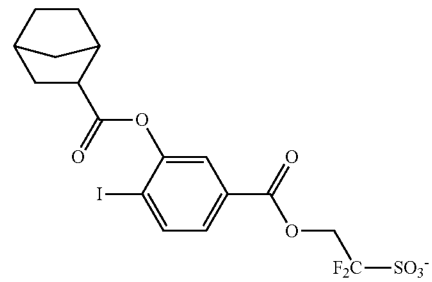
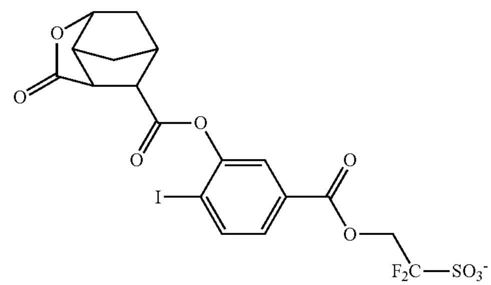
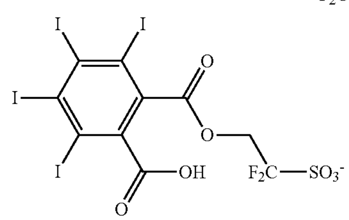
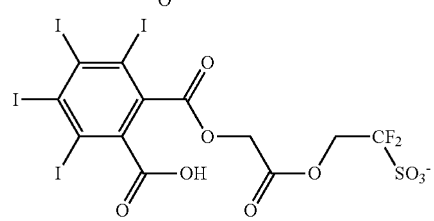
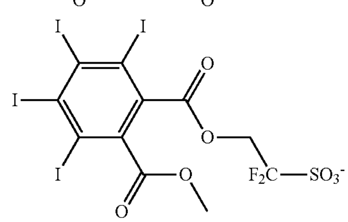
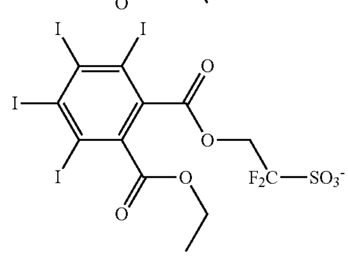
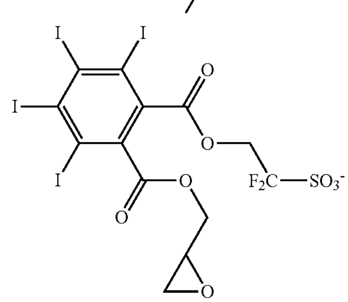

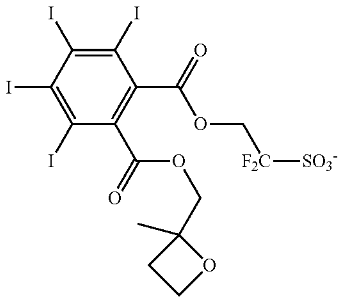
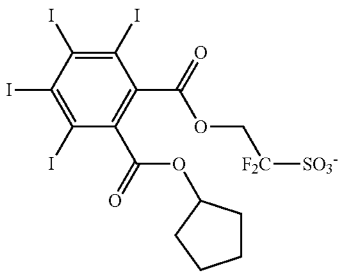
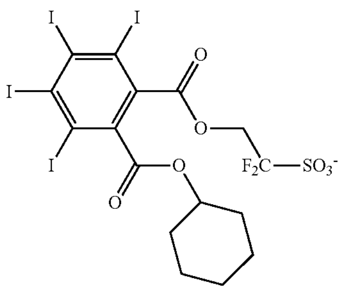
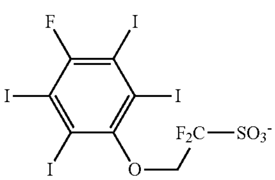
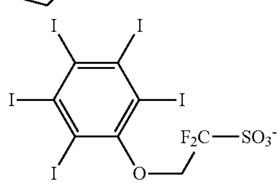
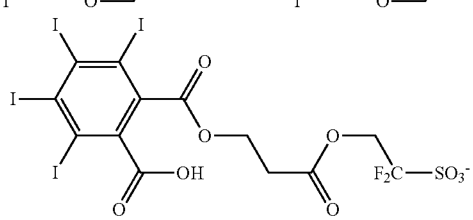
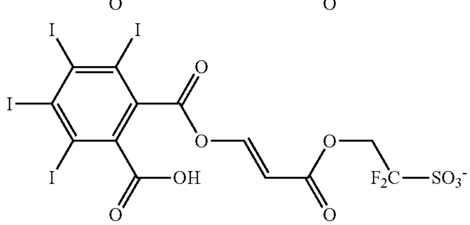
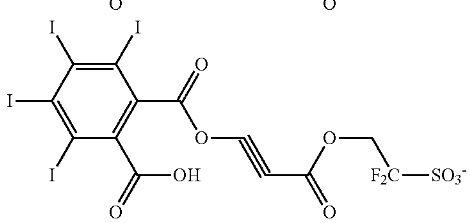
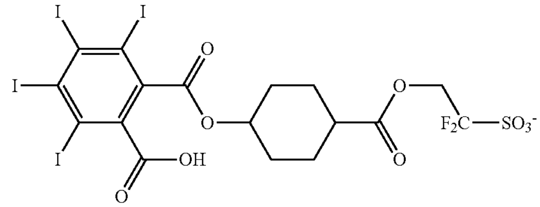
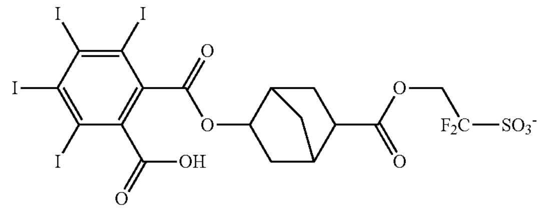
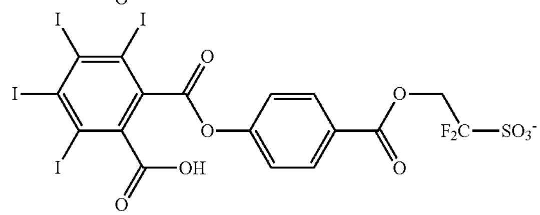
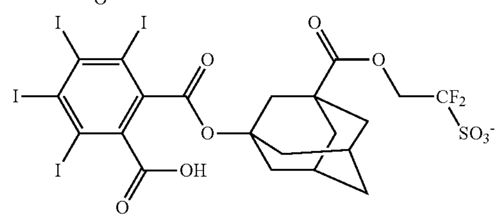
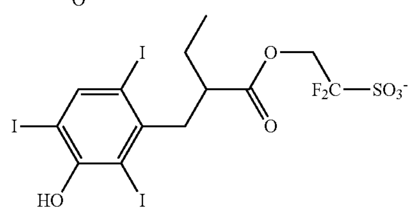
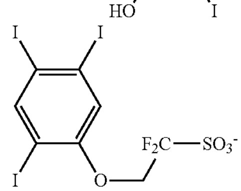
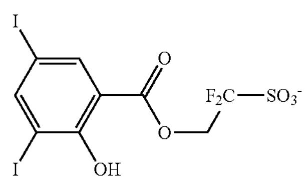
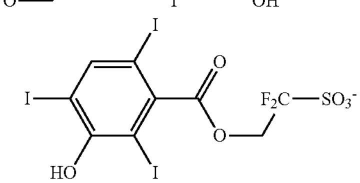
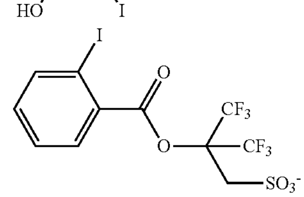
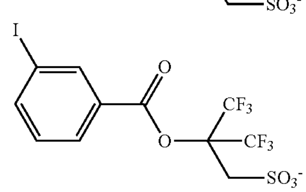

-continued
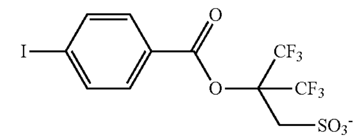
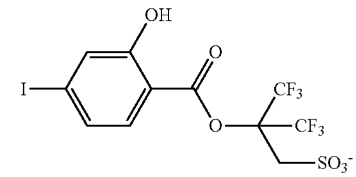
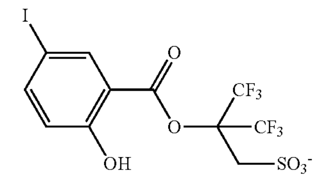
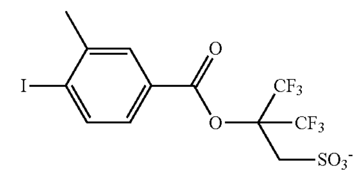
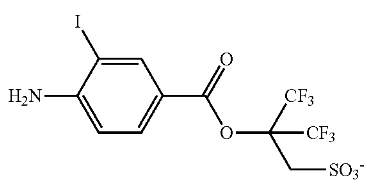
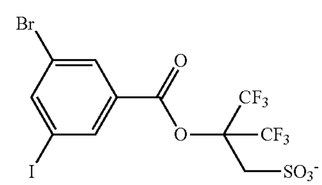
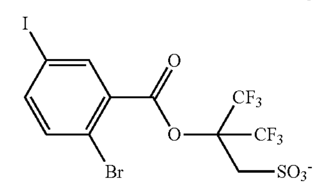
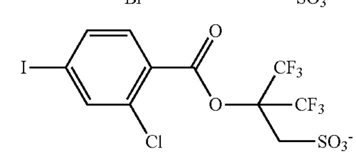
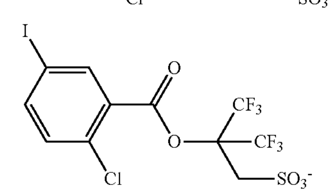
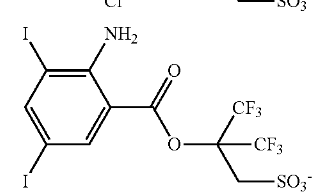
-continued
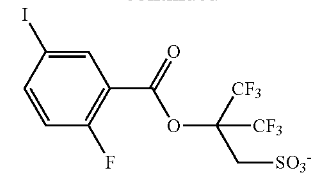
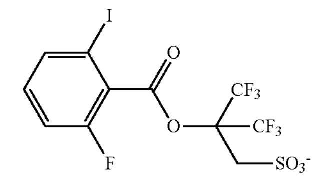
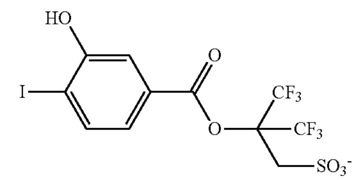
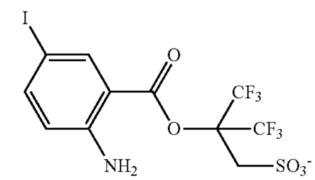
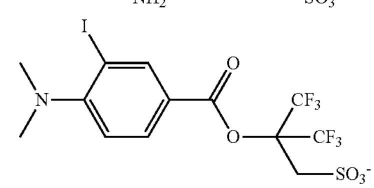
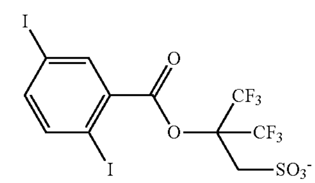
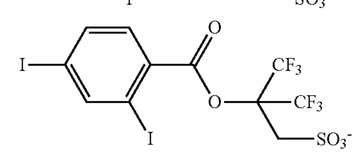
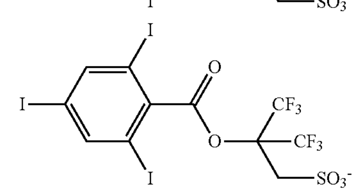
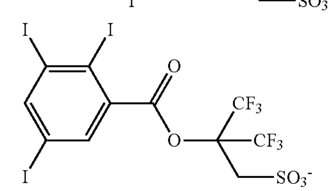
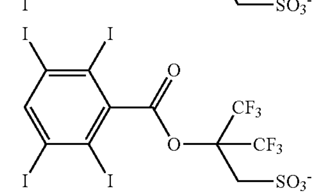

-continued
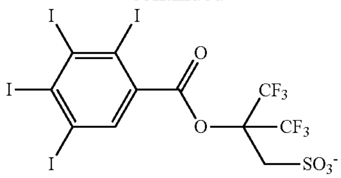
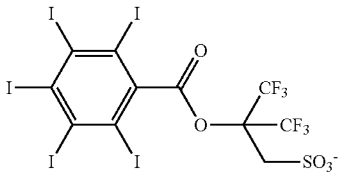
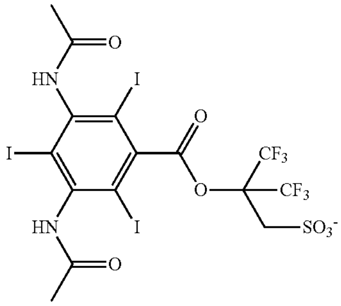
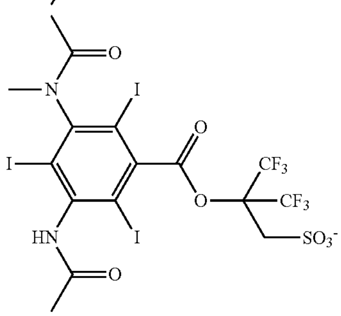
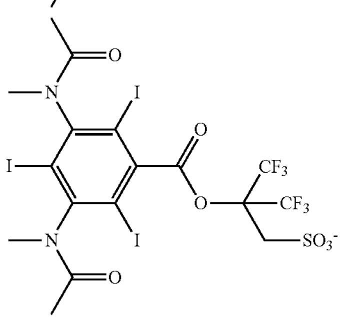
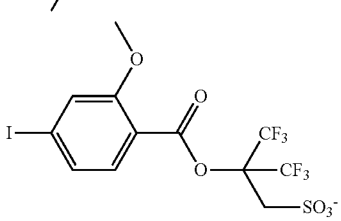
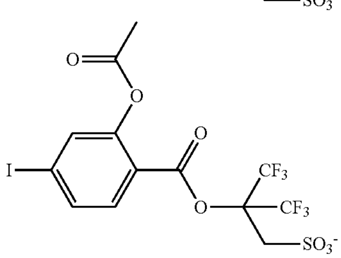
-continued
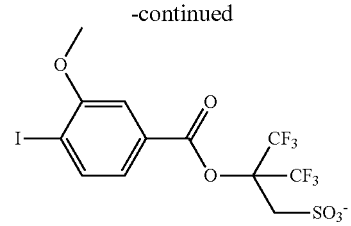
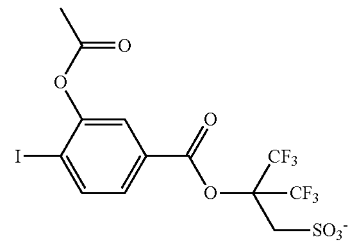
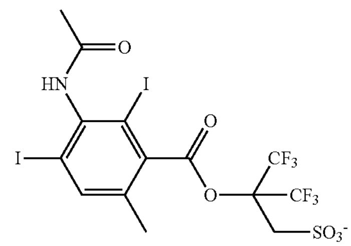
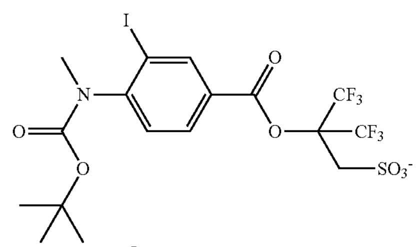
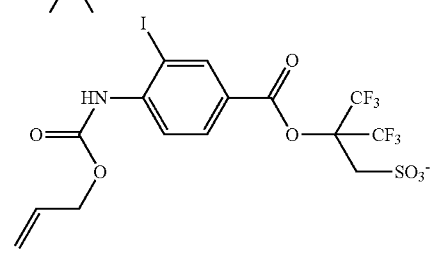
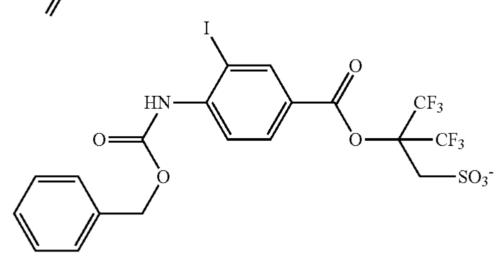
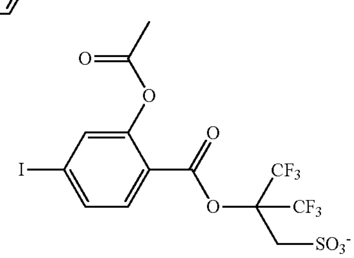

-continued
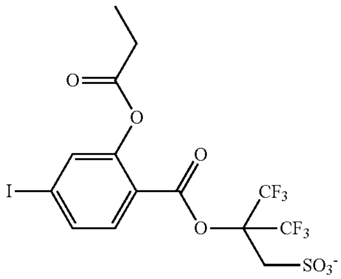
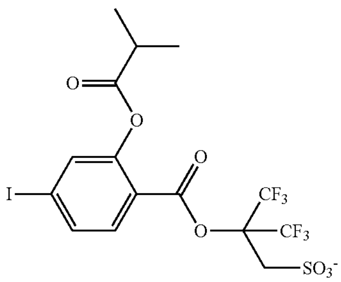
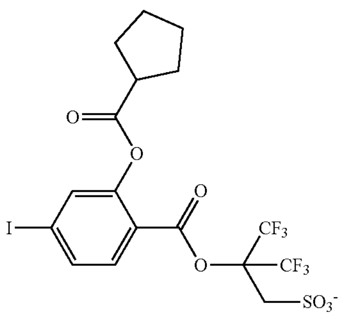
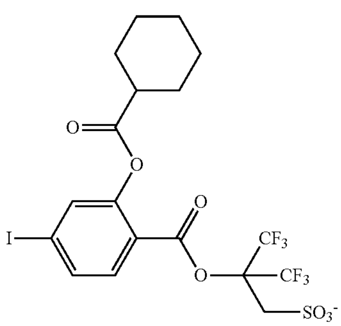
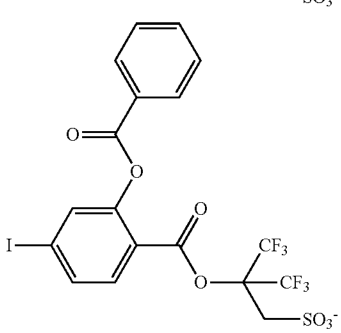
-continued
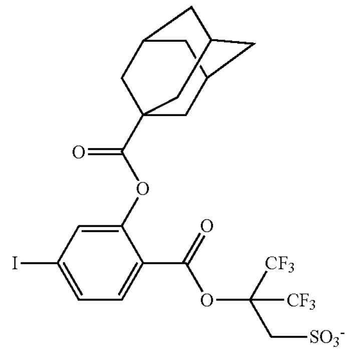
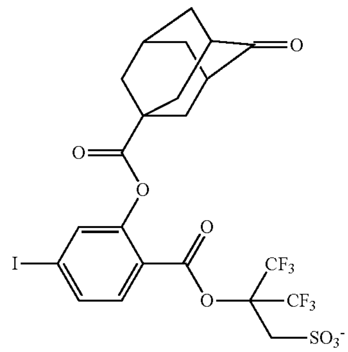
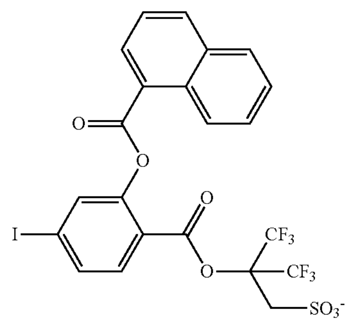
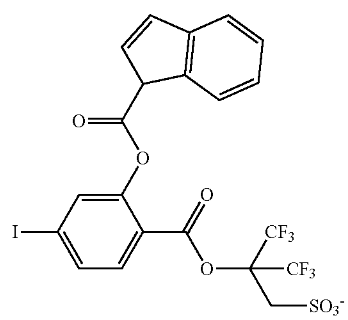
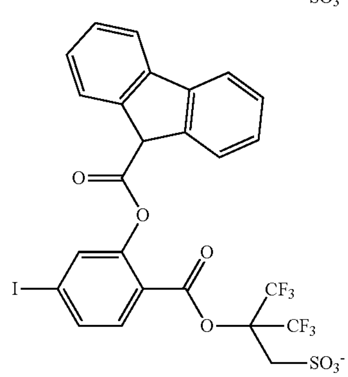

-continued
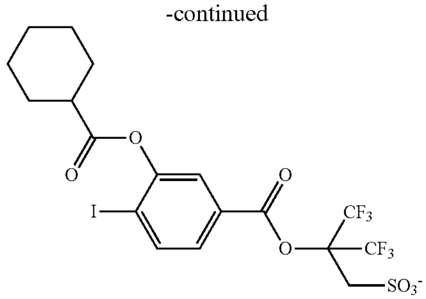
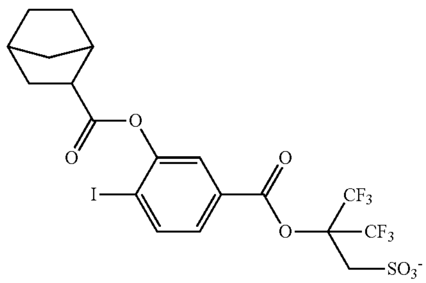
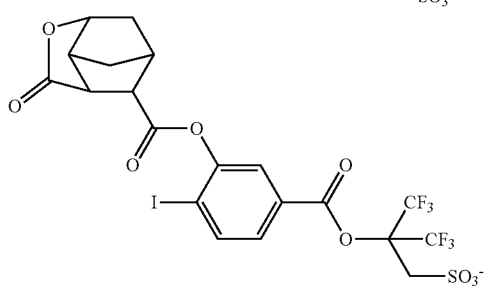
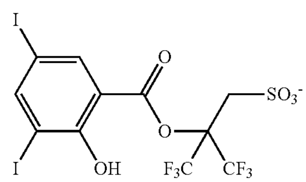
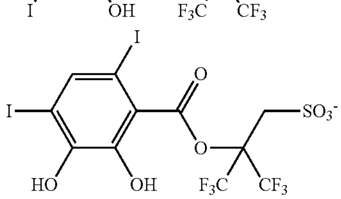
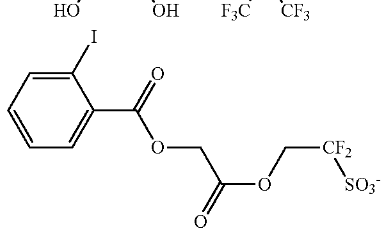
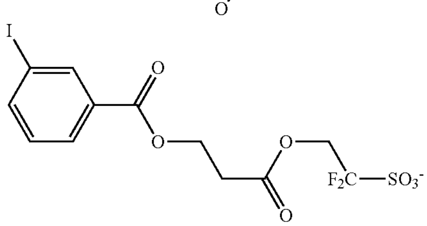
-continued
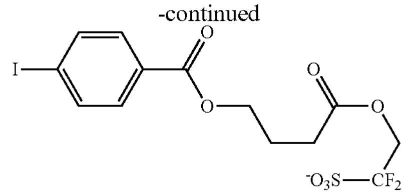
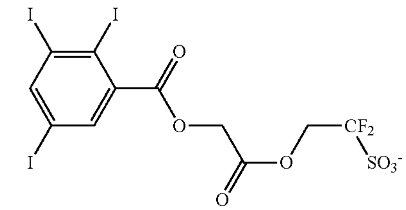
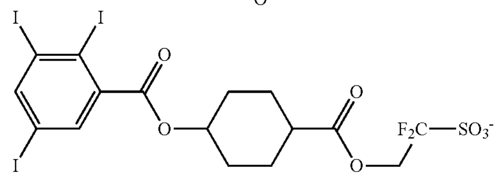
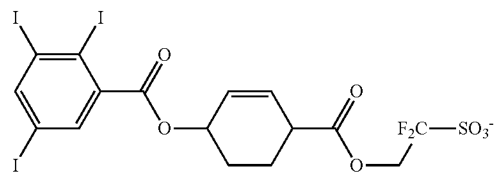
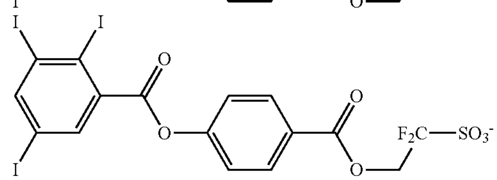
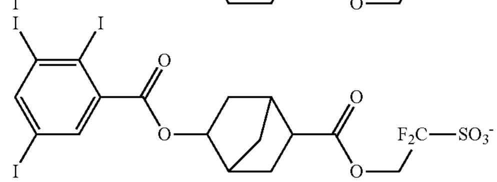
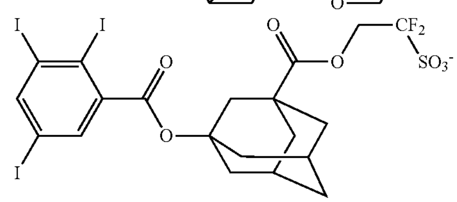
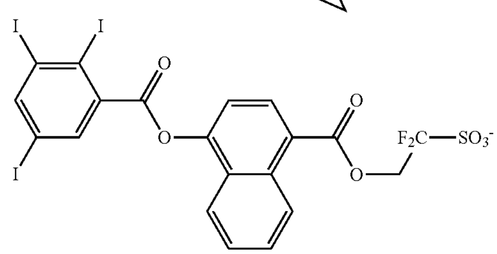
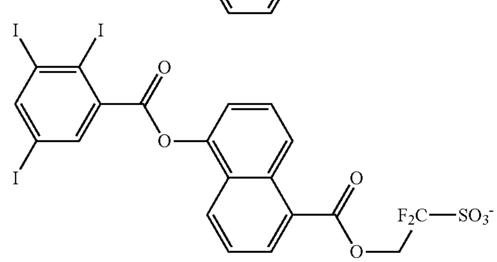

-continued
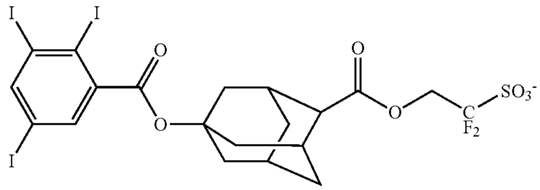
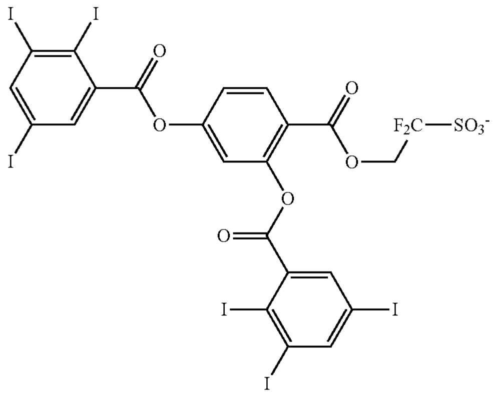
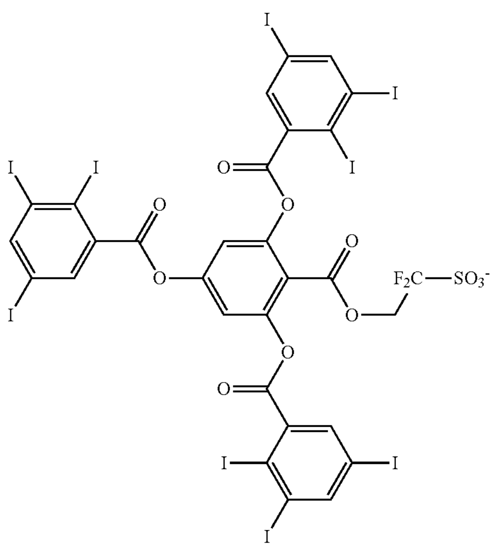
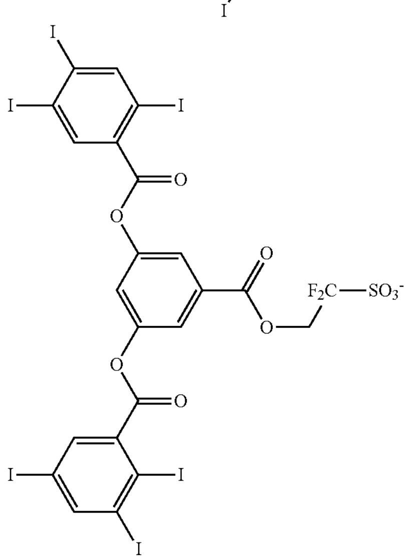
-continued
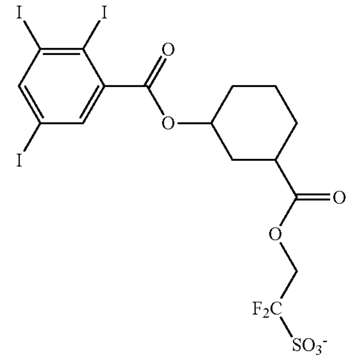
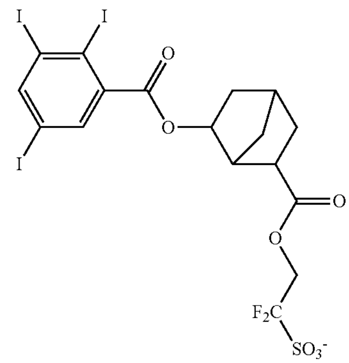
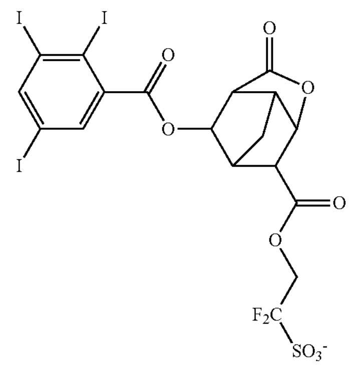
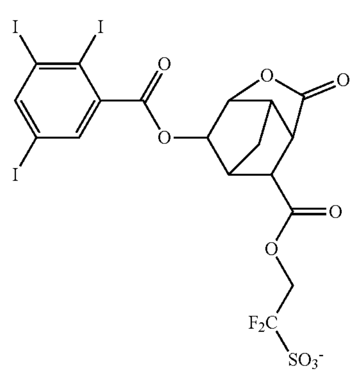

-continued
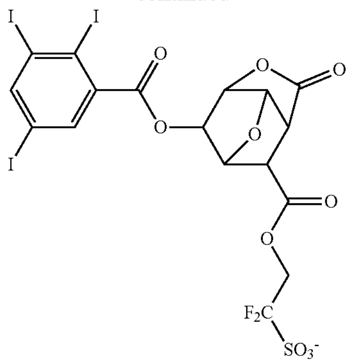
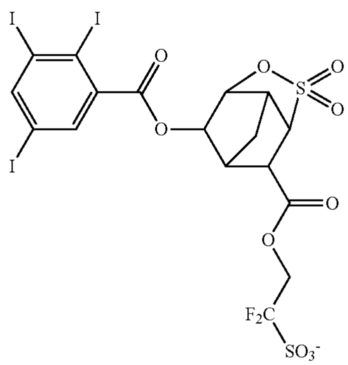
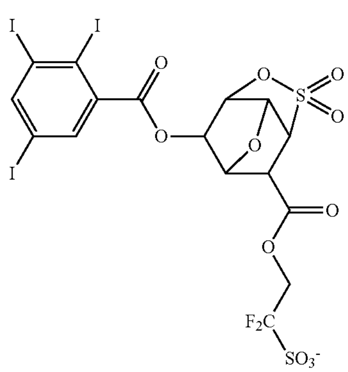
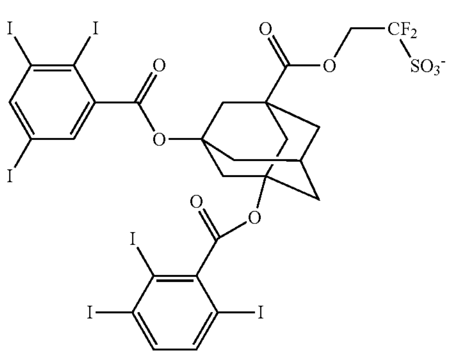
-continued
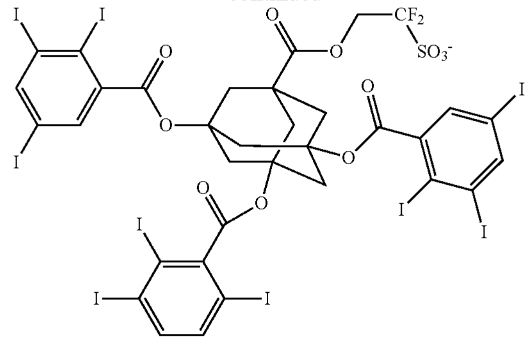
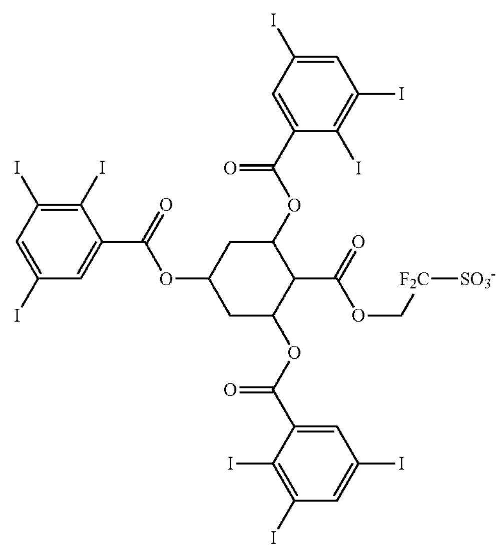
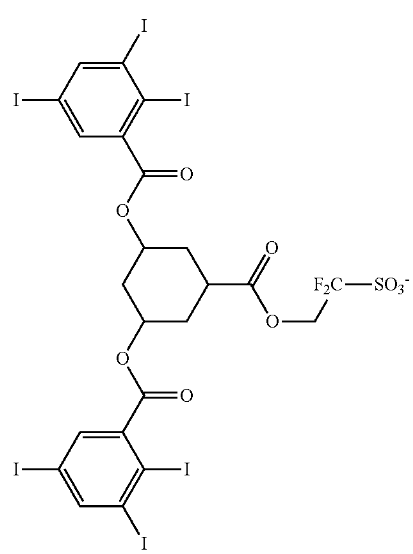
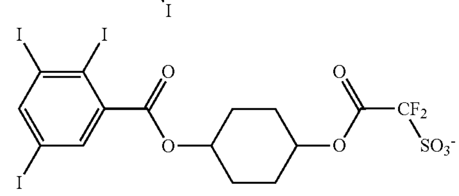

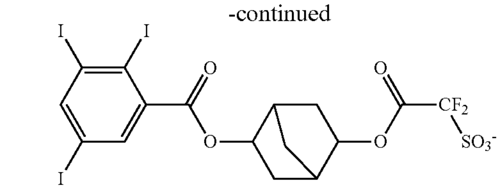
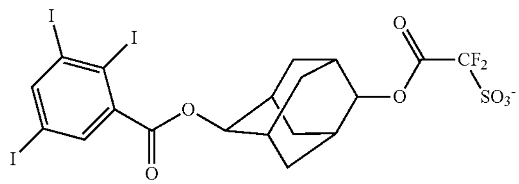
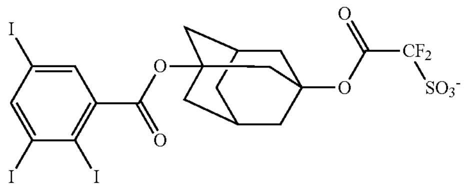
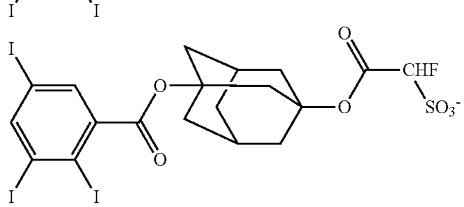
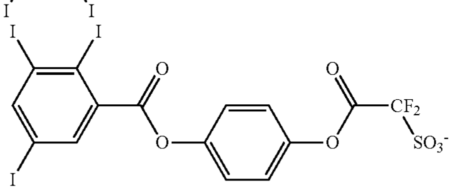
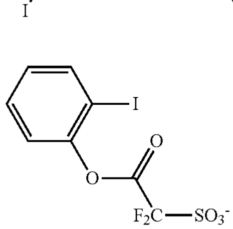
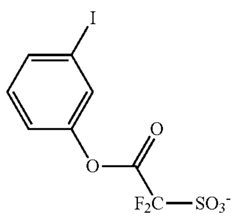
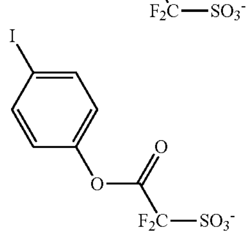
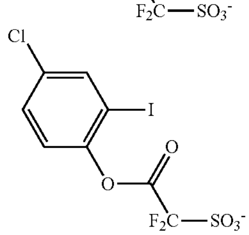
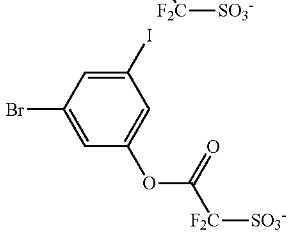
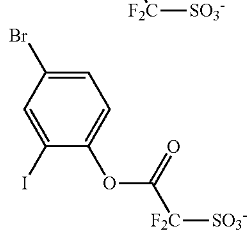
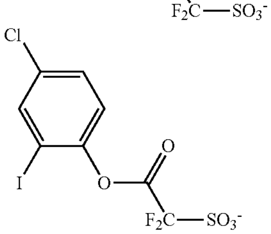
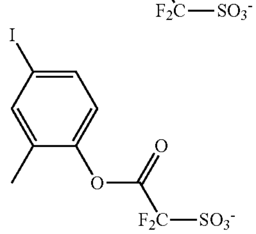
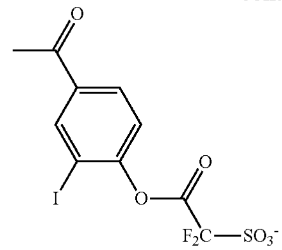
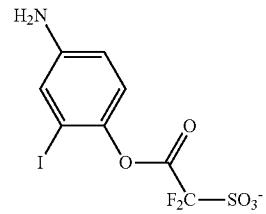
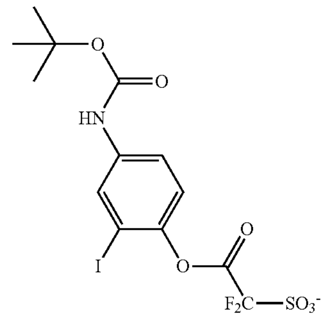
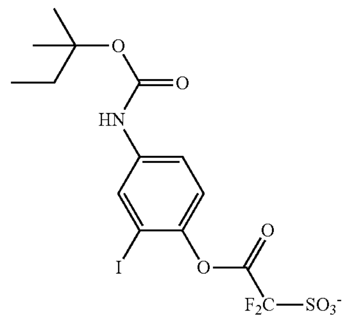
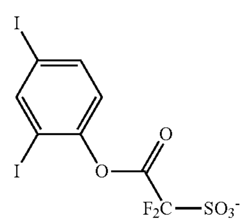
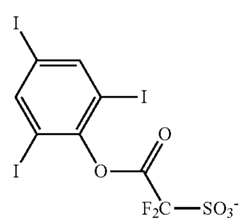
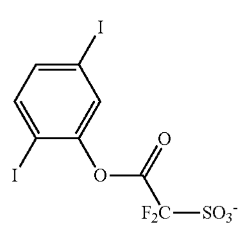
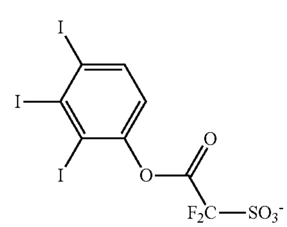
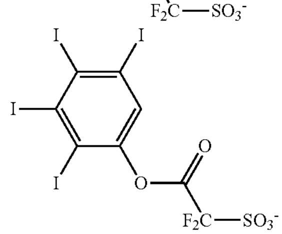
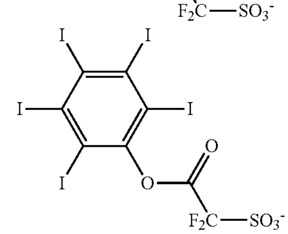

-continued
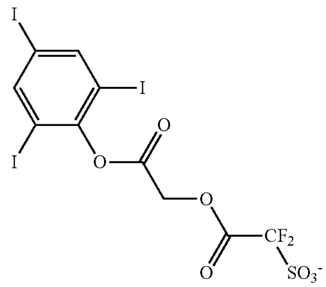
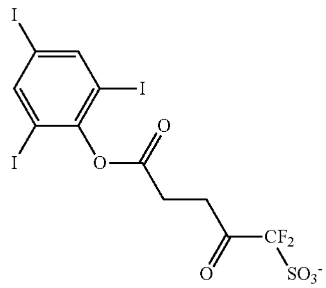
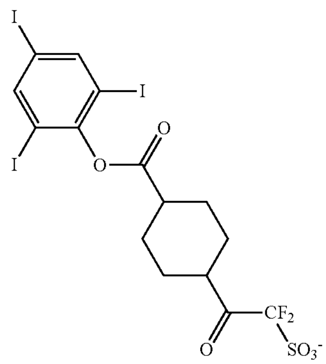
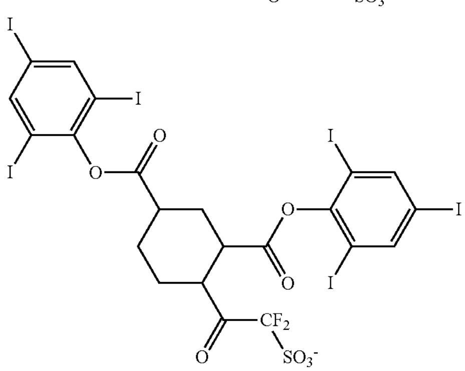
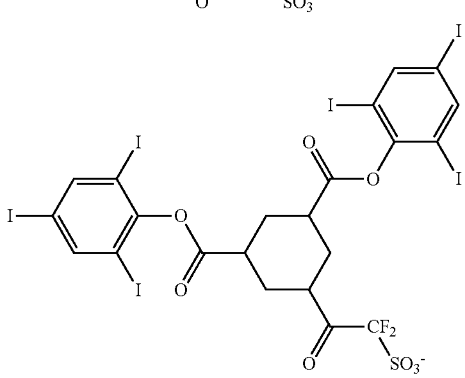
-continued
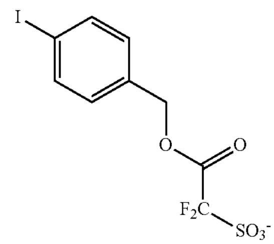
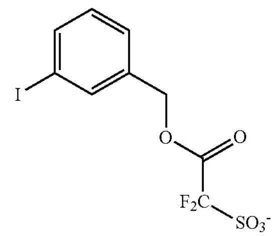
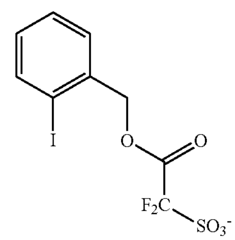
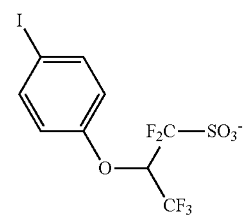
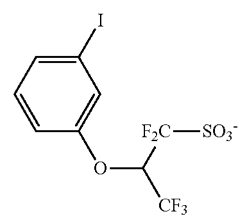
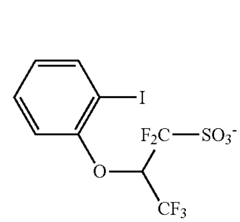
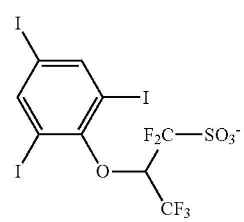
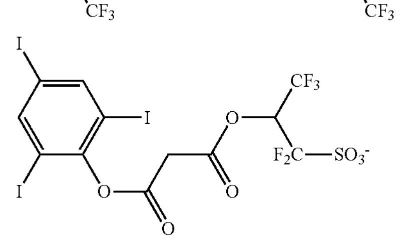
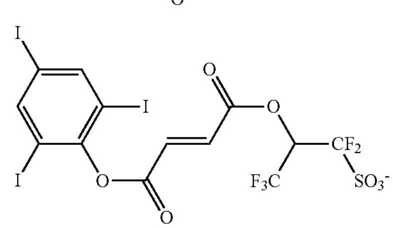

-continued
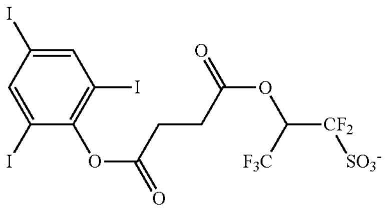
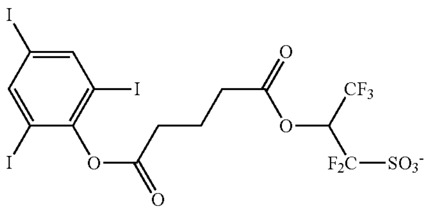
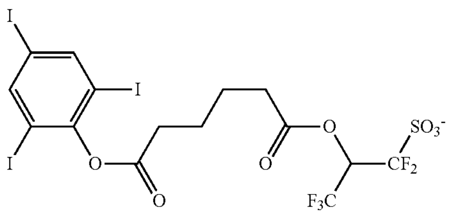
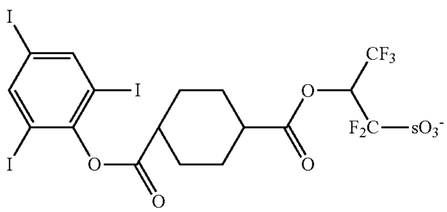
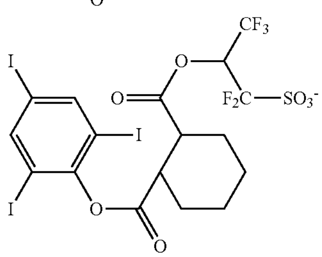
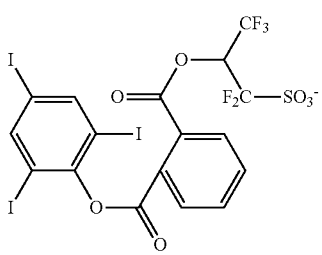
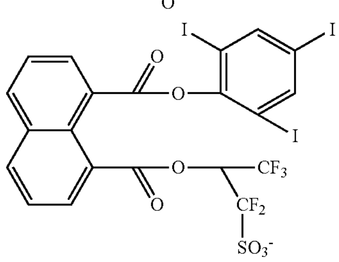
-continued
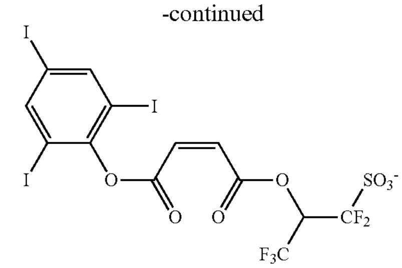
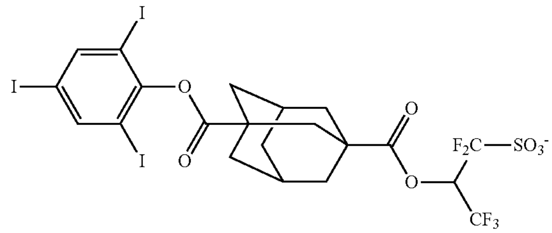
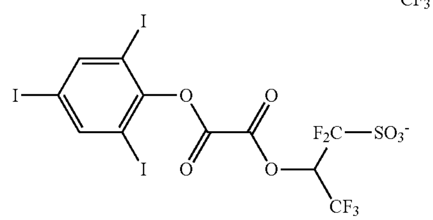
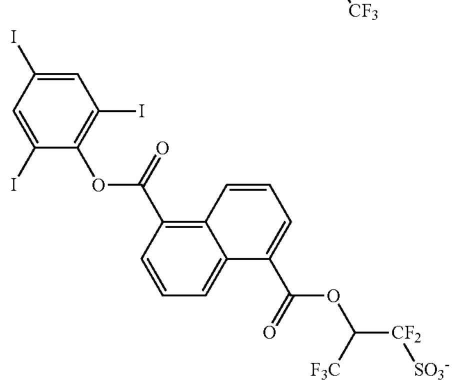
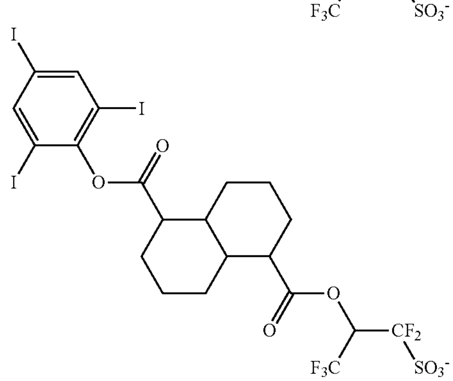
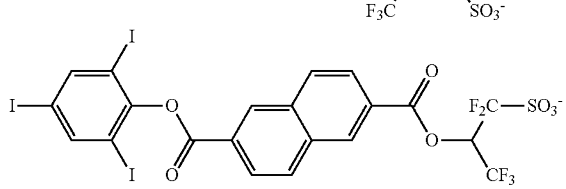
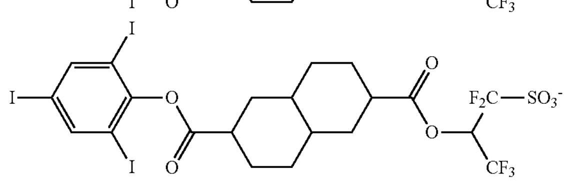

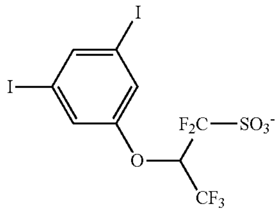
I
I
F2C—SO3-
O
CF3
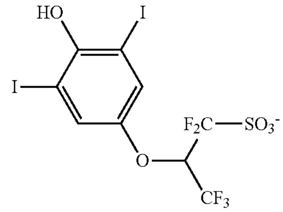
HO
I
I
F2C—SO3-
O
CF3
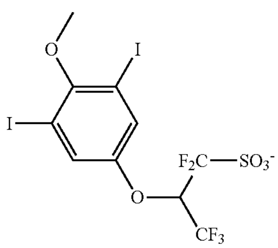
O
I
I
F2C—SO3-
O
CF3
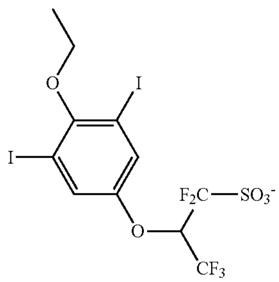
O
I
I
F2C—SO3-
O
CF3
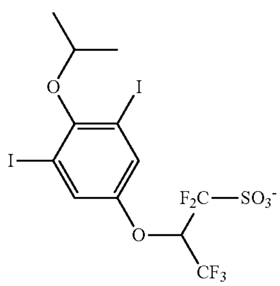
O
I
I
F2C—SO3-
O
CF3
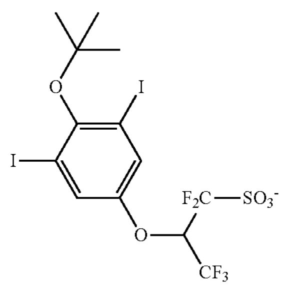
O
I
I
F2C—SO3-
O
CF3
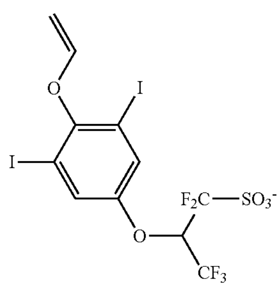
O
I
I
F2C—SO3-
O
CF3
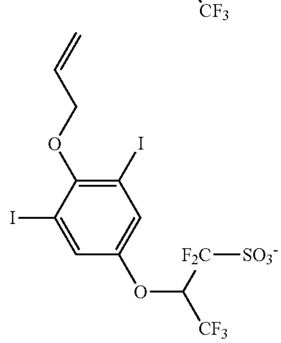
O
I
I
F2C—SO3-
O
CF3
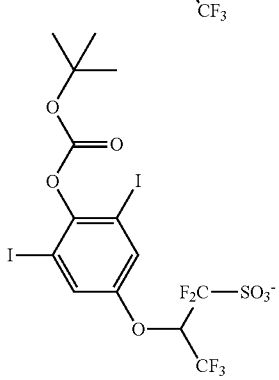
O
O
O
I
I
F2C—SO3-
O
CF3
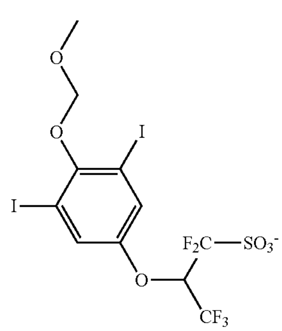
O
O
I
I
F2C—SO3-
O
CF3
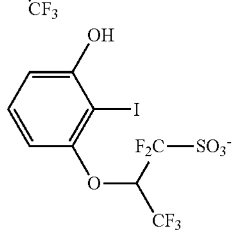
OH
I
F2C—SO3-
O
CF3
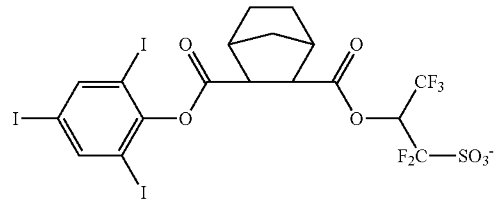
I
O
O
CF3
I
O
O
F2C—SO3-
I
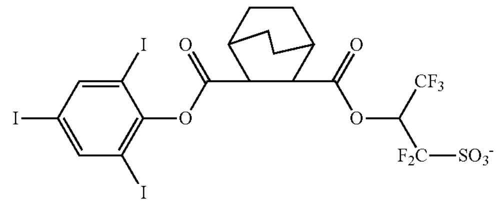
I
O
O
CF3
I
O
O
F2C—SO3-
I
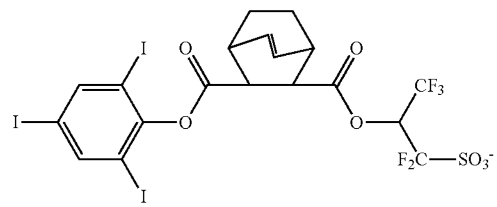
I
O
O
CF3
I
O
O
F2C—SO3-
I
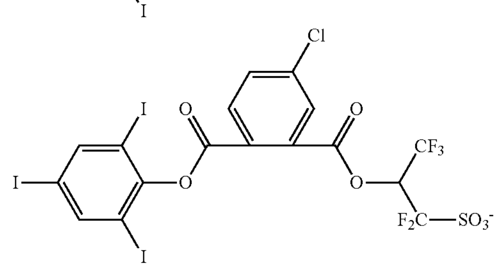
Cl
I
O
O
CF3
I
O
O
F2C—SO3-
I
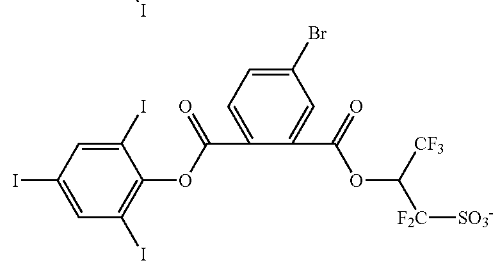
Br
I
O
O
CF3
I
O
O
F2C—SO3-
I
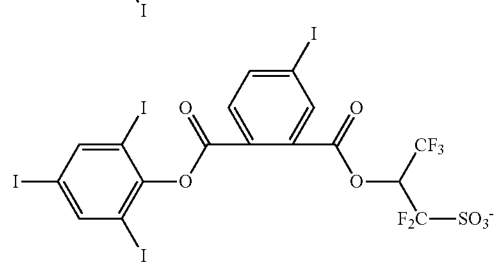
I
I
O
O
CF3
I
O
O
F2C—SO3-
I
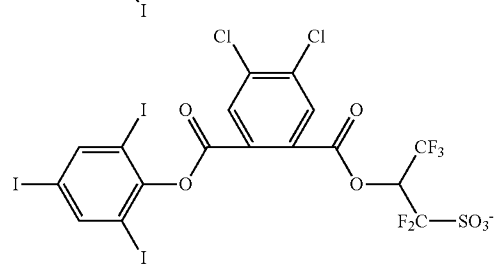
Cl
Cl
I
O
O
CF3
I
O
O
F2C—SO3-
I -continued
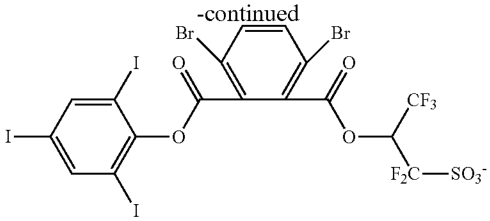
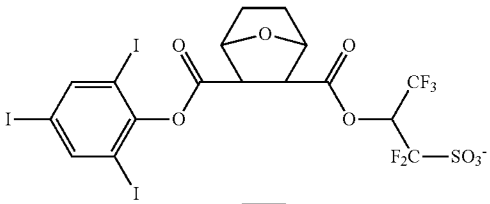
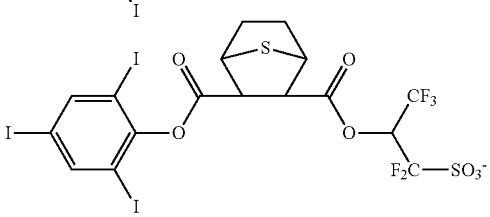
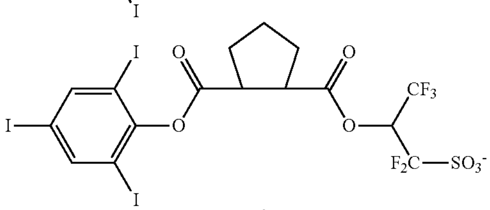
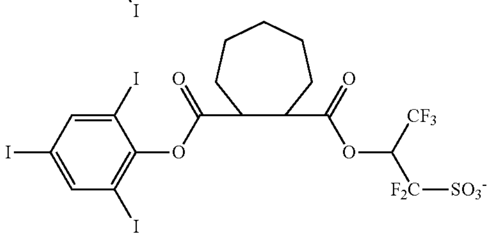
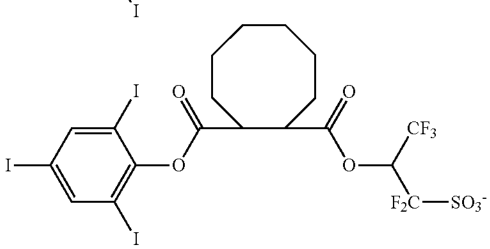
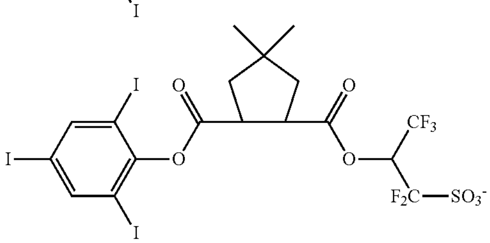
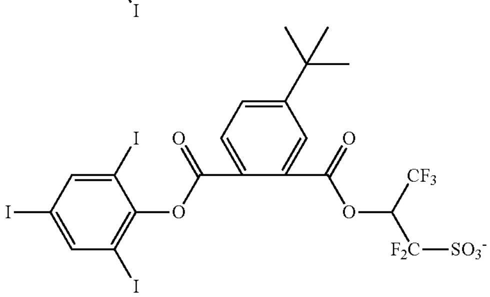
-continued
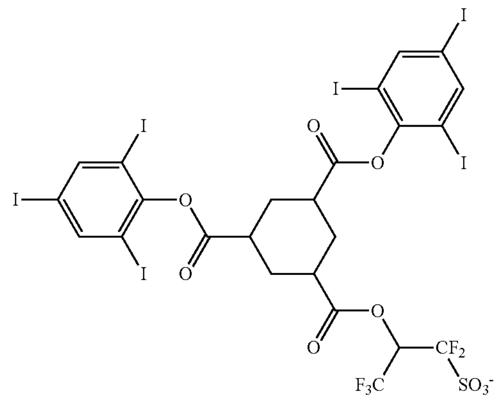
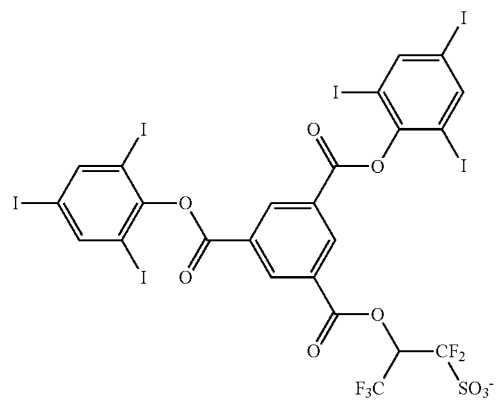
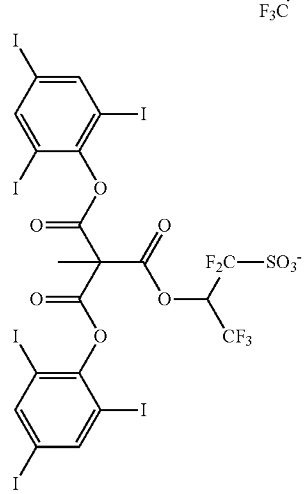
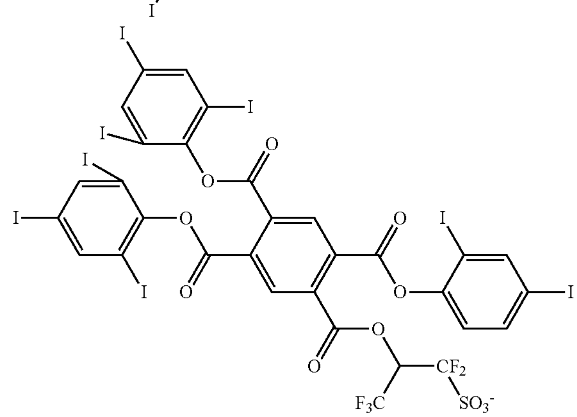

-continued
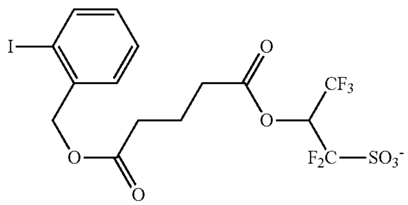
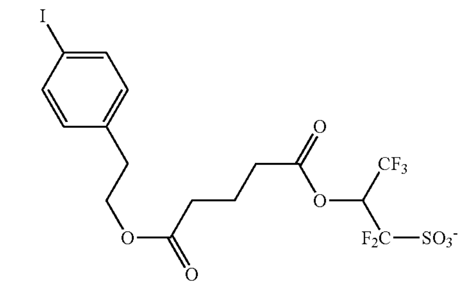
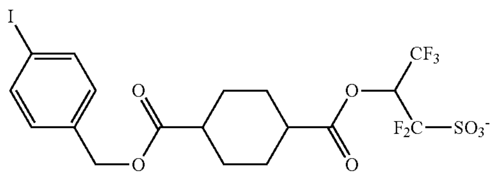
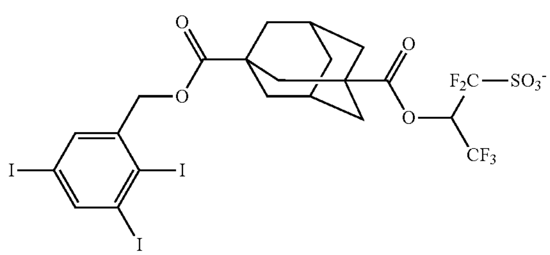
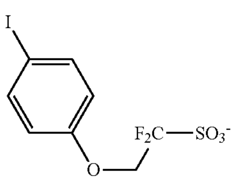
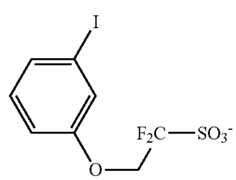
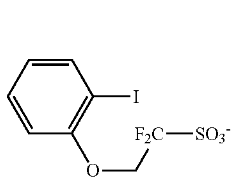
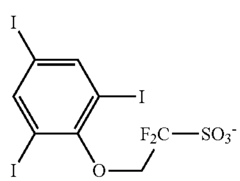
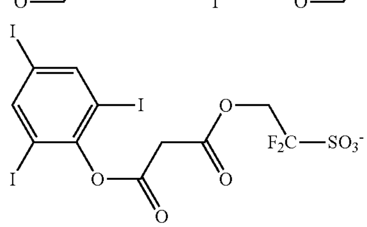
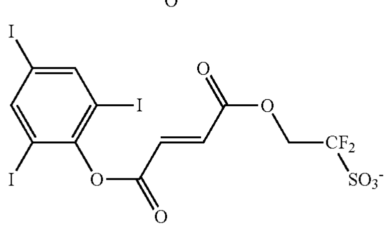
-continued
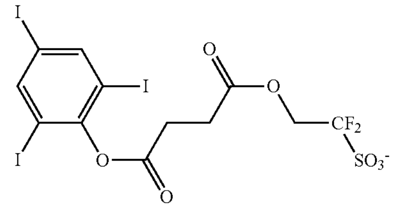
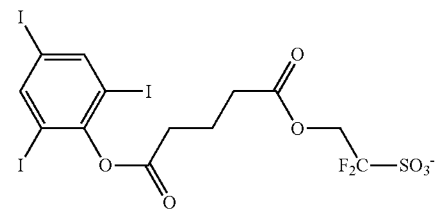
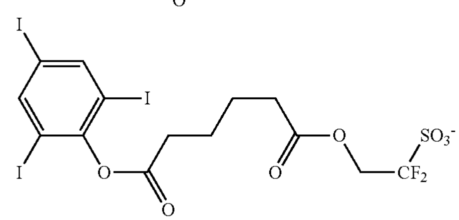
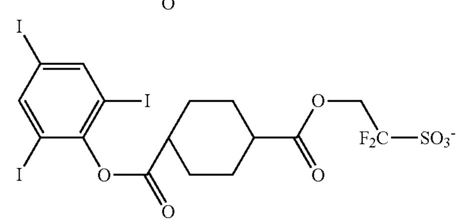
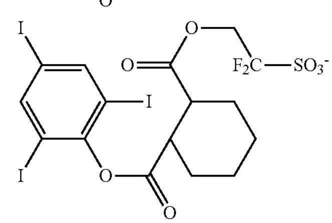
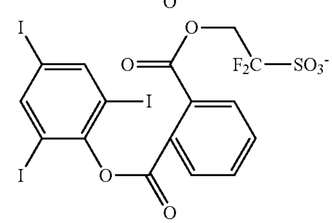
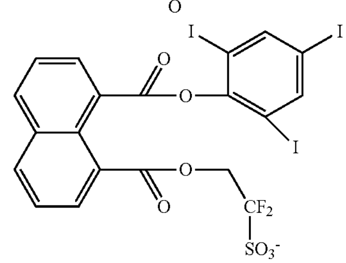
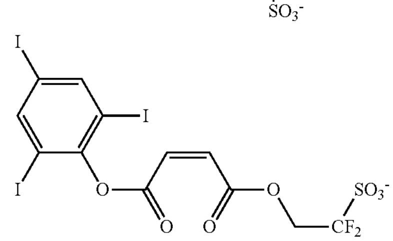

-continued
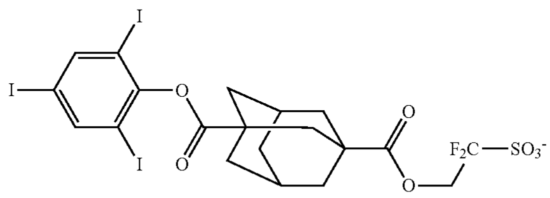
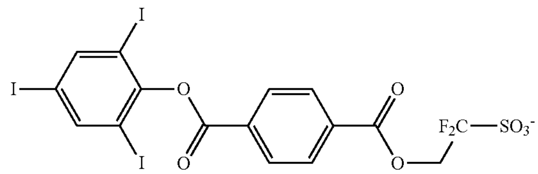
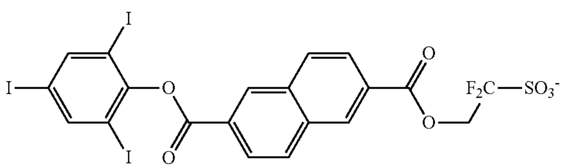
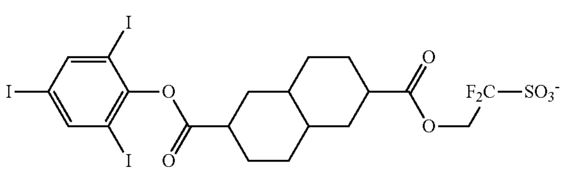
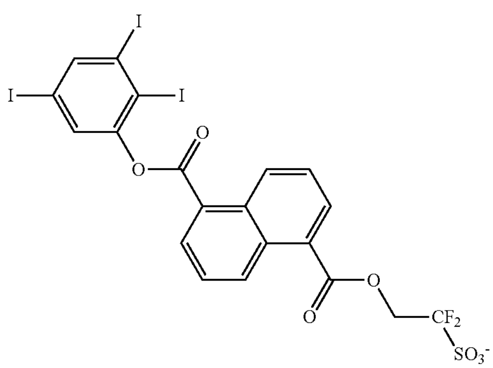
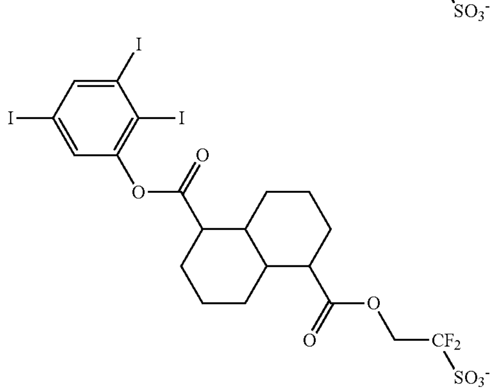
-continued
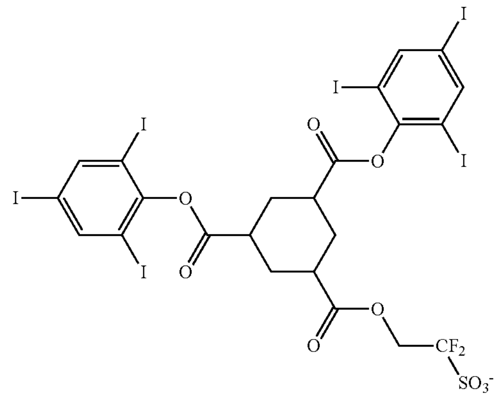
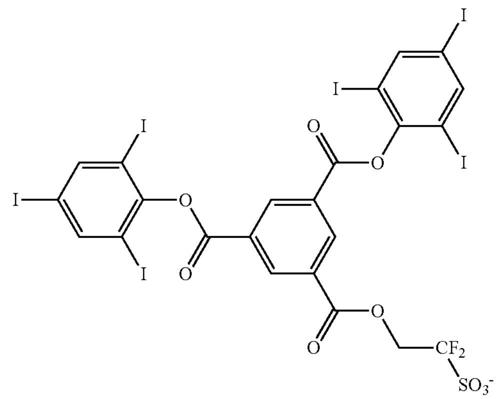
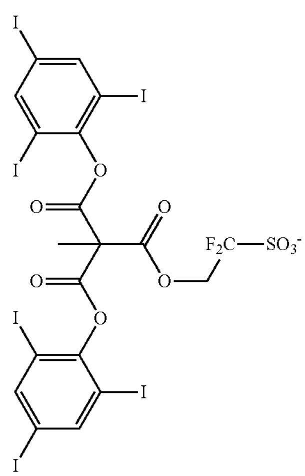
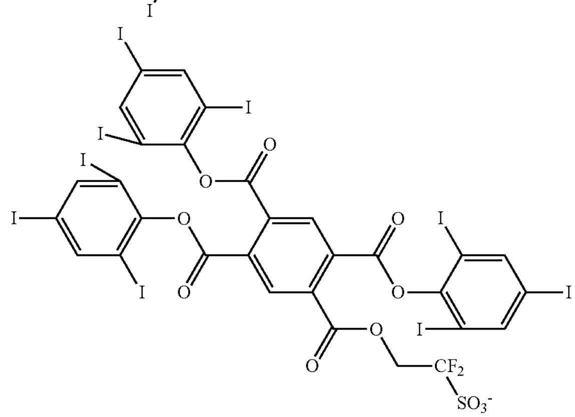

-continued
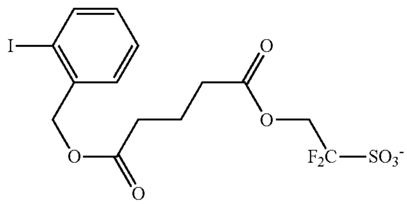
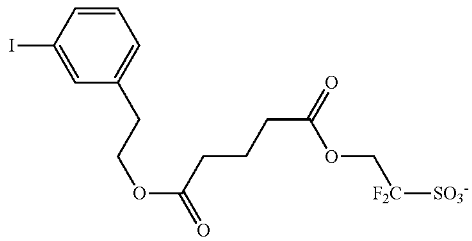
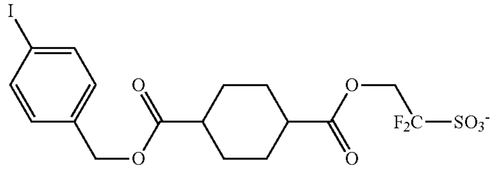
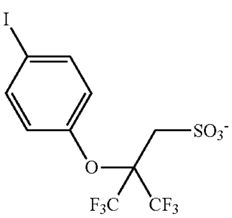
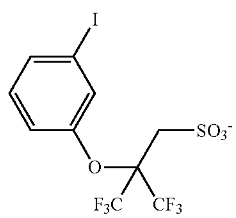
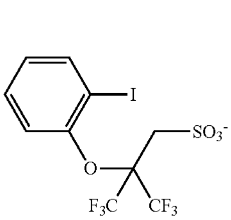
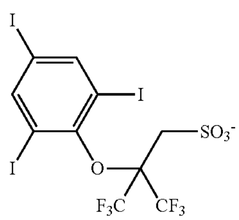
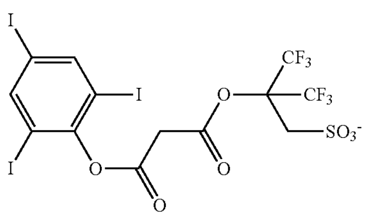
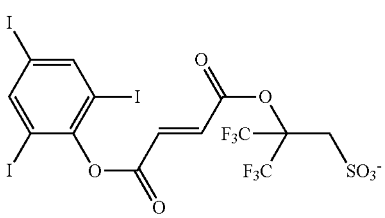
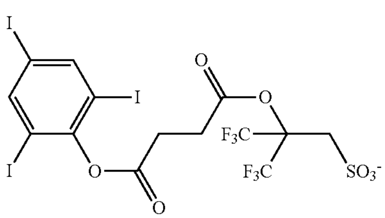
-continued
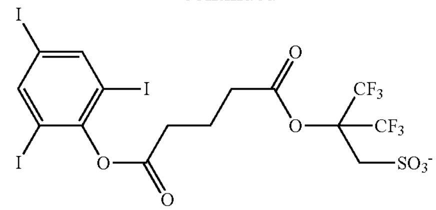
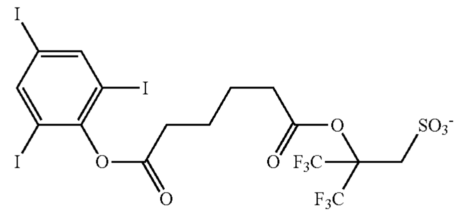
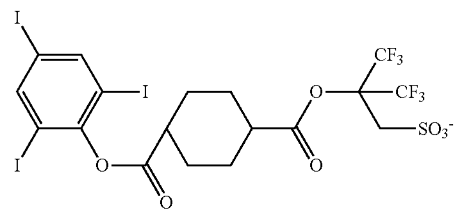
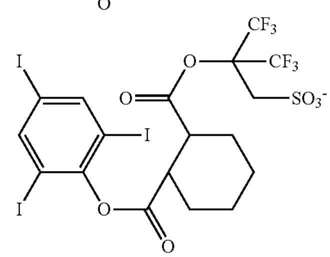
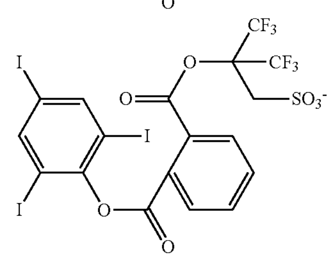
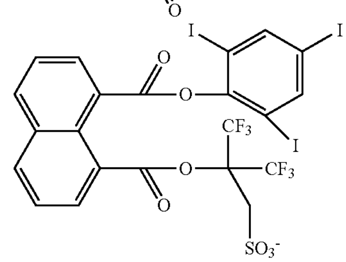
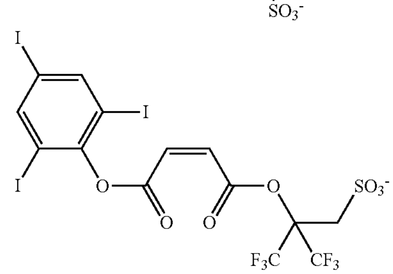

-continued
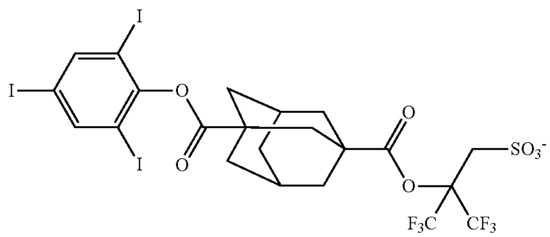
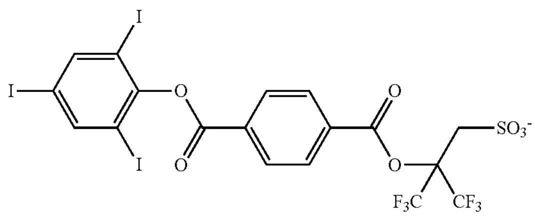
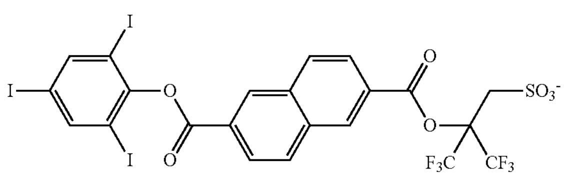
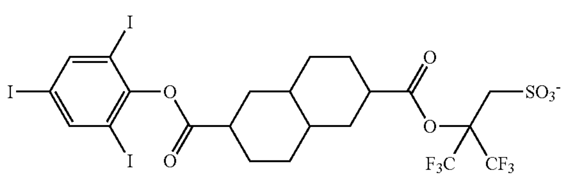
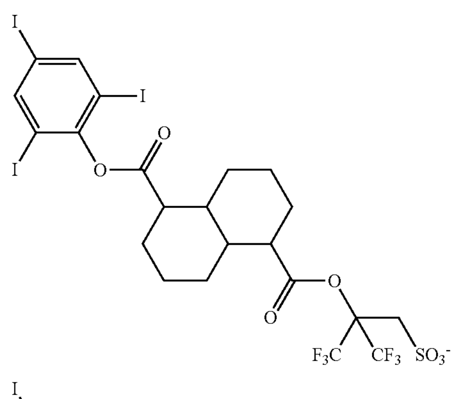
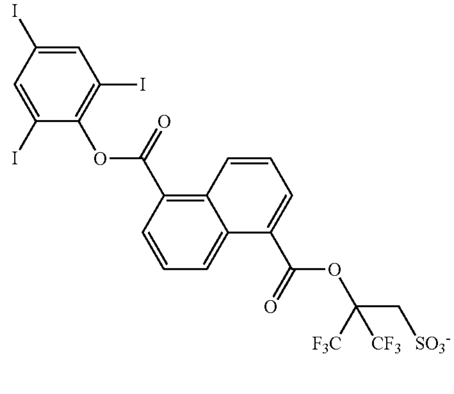
-continued
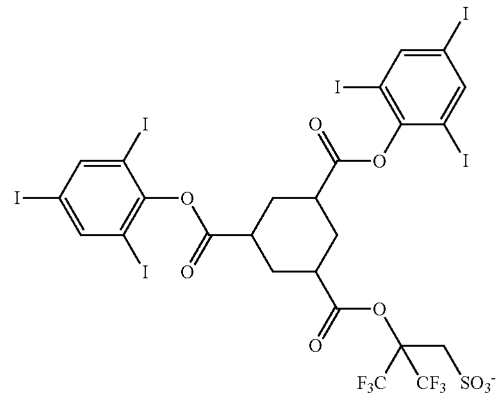
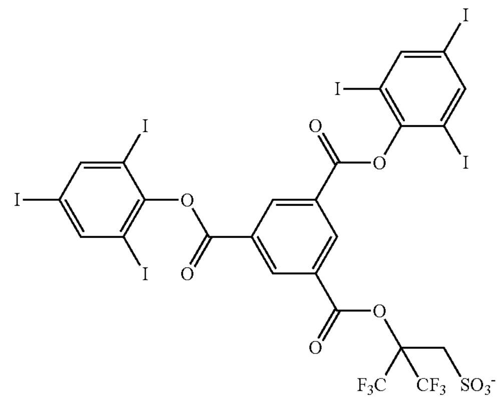
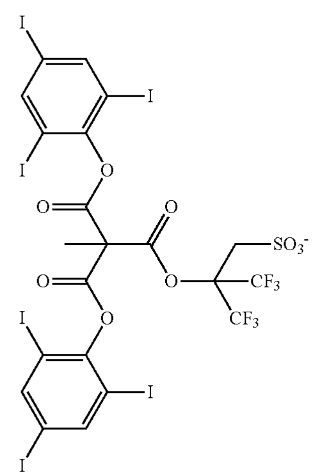
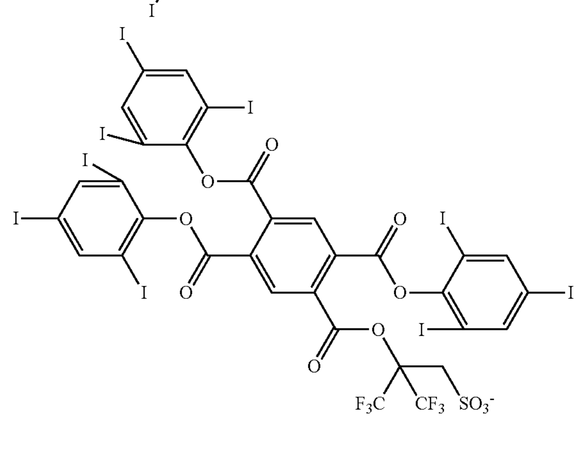

-continued

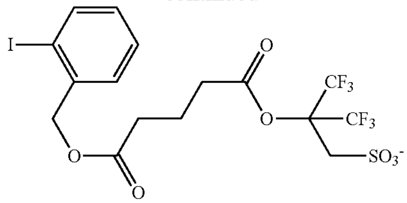

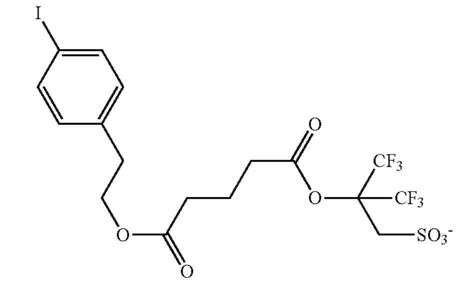

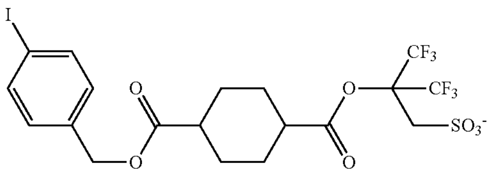

Further, sulfonium or iodonium salts having a brominated anion may be used as the PAG. The brominated anions correspond to the anions having formulae (3-1) to (3-4) wherein iodine is replaced by bromine. The sulfonium or iodonium salts having a brominated anion correspond to the foregoing salts having an iodized anion, provided that iodine is replaced by bromine.

When the resist composition contains the acid generator of addition type, an appropriate amount of the generator added is 0.1 to 50 parts, more preferably 1 to 40 parts by weight per 100 parts by weight of the base polymer. Where the base polymer contains recurring units (f), that is, when the acid generator is bound in the polymer, the acid generator of addition type is not essential.

Organic Solvent

The resist composition may further contain an organic solvent. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Suitable organic solvents include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, which may be used alone or in admixture.

The organic solvent is preferably used in an amount of 100 to 10,000 parts, more preferably 200 to 8,000 parts by weight per 100 parts by weight of the base polymer.

Other Components

The base polymer is combined with the foregoing components and any desired components such as a surfactant and dissolution inhibitor to formulate a chemically amplified positive resist composition. This positive resist composition has a very high sensitivity in that the dissolution rate in developer of the polymer in exposed regions is accelerated by catalytic reaction. In addition, the resist film has a high dissolution contrast, resolution, exposure latitude, and process adaptability, and provides a good pattern profile after exposure and minimal proximity bias because of restrained acid diffusion. By virtue of these advantages, the composition is fully useful in commercial application and suited as a pattern-forming material for the fabrication of VLSIs.

Exemplary surfactants are described in JP-A 2008-111103, paragraphs [0165]-[0166]. The addition of the surfactant to the resist composition is effective for facilitating or controlling coating operation. The surfactant may be used alone or in admixture. An appropriate amount of the surfactant added is 0.0001 to 10 parts by weight per 100 parts by weight of the base polymer.

In the positive resist composition, the dissolution inhibitor is effective for exaggerating a difference in dissolution rate between exposed and unexposed regions, thus contributing to a further improvement in resolution. The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolak, naphthalenecarboxylic acid, adamantanecarboxylic acid, and cholic acid derivatives, in which the hydrogen atom on the hydroxyl or carboxyl group is replaced by an acid labile group, as described in U.S. Pat. No. 7,771,914 (JP-A 2008-122932, paragraphs [0155]-[0178]).

The dissolution inhibitor is preferably added in an amount of 0 to 50 parts, more preferably 5 to 40 parts by weight per 100 parts by weight of the base polymer. The dissolution inhibitor may be used alone or in admixture.

To the resist composition, a quencher may also be added. The quencher may be any of conventional basic compounds. Suitable basic compounds include primary, secondary and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amides, imides, and carbamates. The preferred basic compounds include primary, secondary and tertiary amine compounds, specifically amine compounds having a hydroxyl group, ether bond, ester bond, lactone ring, cyano group or sulfonic ester bond as described in JP-A 2008-111103, paragraphs [0146]-[0164] (U.S. Pat. No. 7,537,880), and carbamate-containing compounds as described in JP 3790649. The addition of such basic compound to the resist composition is effective, for example, for further reducing the diffusion rate of acid in the resist film and correcting the resist pattern profile.

Onium salts such as sulfonium salts, iodonium salts and ammonium salts of sulfonic acids which are not fluorinated at α-position as described in US 2008153030 (JP-A 2008-

158339) and similar onium salts of carboxylic acid may also be used as the quencher. While an α-fluorinated sulfonic acid, imide acid, and methide acid are necessary to deprotect the acid labile group of carboxylic acid ester, an α-non-fluorinated sulfonic acid and a carboxylic acid are released by salt exchange with an α-non-fluorinated onium salt. An α-non-fluorinated sulfonic acid and a carboxylic acid function as a quencher because they do not induce deprotection reaction.

Also useful are quenchers of polymer type as described in JP-A 2008-239918 (U.S. Pat. No. 7,598,016). The polymeric quencher segregates at the resist surface after coating and thus enhances the rectangularity of resist pattern. When a protective film is applied on the resist film in the immersion lithography, the polymeric quencher is also effective for preventing any film thickness loss of resist pattern or rounding of pattern top.

An appropriate amount of the quencher added is 0 to 5 parts, more preferably 0 to 4 parts by weight per 100 parts by weight of the base polymer. The quencher may be used alone or in admixture.

Also, a water repellency improver may be added to the resist composition for improving the water repellency on surface of a resist film as spin coated. The water repellency improver may be used in the topcoatless immersion lithography. The preferred water repellency improvers include fluoroalkyl-containing polymers and polymers having a specific structure with a 1,1,1,3,3,3-hexafluoro-2-propanol residue, with their examples being described in JP-A 2007-297590 and JP-A 2008-111103. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellency improver and is effective for preventing evaporation of acid during PEB and any hole pattern opening failure after development. The water repellency improver may be used alone or in admixture. An appropriate amount of the water repellency improver is 0 to 20 parts, preferably 0.5 to 10 parts by weight per 100 parts by weight of the base polymer.

To the resist composition, an acetylene alcohol may also be added. Exemplary acetylene alcohols are described in JP-A 2008-122932, paragraphs [0179]-[0182]. An appropriate amount of the acetylene alcohol added is 0 to 5 parts by weight per 100 parts by weight of the base polymer.

Process

The chemically amplified resist composition is used in the fabrication of various integrated circuits. Pattern formation using the resist composition may be performed by well-known lithography processes. The process generally involves coating, prebake, exposure, and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$ or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.01 to 2.0 μm thick.

The resist film is then exposed to a desired pattern of high-energy radiation such as UV, deep-UV, EUV, EB, x-ray, soft x-ray, excimer laser light, γ-ray or synchrotron radiation directly or through a mask. The exposure dose is preferably about 1 to 200 mJ/cm$^2$, more preferably about 10 to 100 mJ/cm$^2$, or about 0.1 to 100 μC/cm$^2$, more preferably about 0.5 to 50 μC/cm$^2$. The resist film is further baked (PEB) on a hot plate at 60 to 150° C. for 10 seconds to 30 minutes, preferably at 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 5 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed region is dissolved in the developer whereas the resist film in the unexposed region is not dissolved, whereby a positive pattern is formed on the substrate. It is appreciated that the resist composition of the invention is best suited for micro-patterning using such high-energy radiation as KrF excimer laser, ArF excimer laser, EB, EUV, x-ray, soft x-ray, γ-ray and synchrotron radiation among others.

From the positive resist composition containing an acid labile group-bearing base polymer, a negative pattern can be formed by organic solvent development. The developer used to this end is at least one solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. The organic solvents may be used alone or in admixture.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents.

Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene, and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLE

Examples and Comparative Examples are given below for further illustrating the invention, but they should not be construed as limiting the invention thereto. All parts (pbw) are by weight.

Sensitizers 1 to 10 used in resist compositions have the structure shown below.

Sensitizer 1

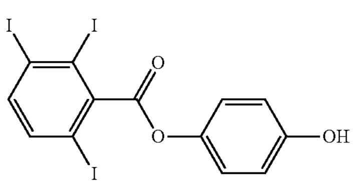

Sensitizer 2

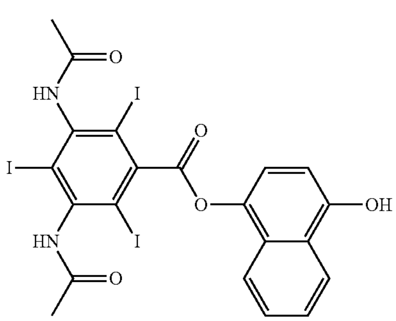

-continued

Sensitizer 3

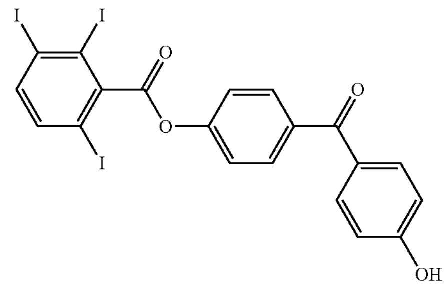

Sensitizer 4

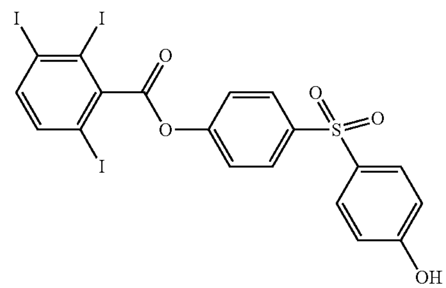

Sensitizer 5

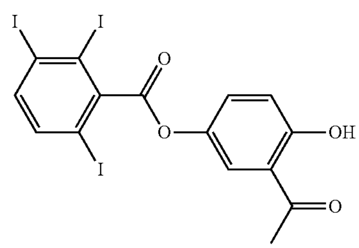

Sensitizer 6

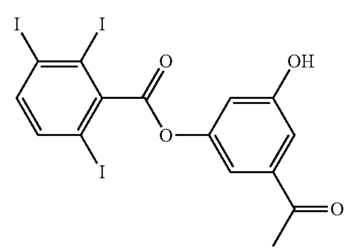

Sensitizer 7

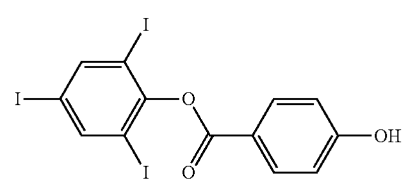

Sensitizer 8

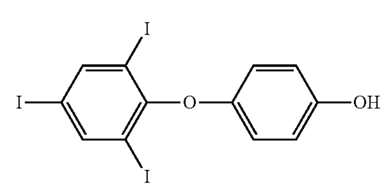

Sensitizer 9

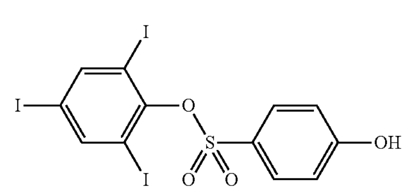

-continued

Sensitizer 10

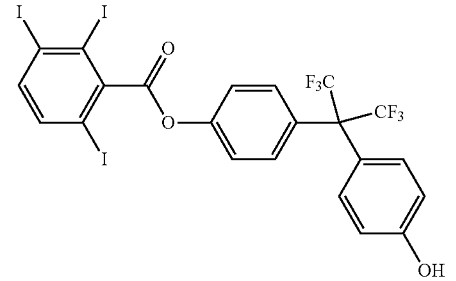

Synthesis Example: Synthesis of Base Polymers, Polymers 1 to 3

Each of base polymers (Polymers 1 to 3) was prepared by combining monomers in THF solvent, effecting copolymerization reaction, crystallizing from methanol, repeatedly washing with hexane, isolation and drying. The polymer was analyzed for composition by $^{1}$H-NMR spectroscopy and for Mw and Mw/Mn by GPC versus polystyrene standards using THF solvent.

Polymer 1

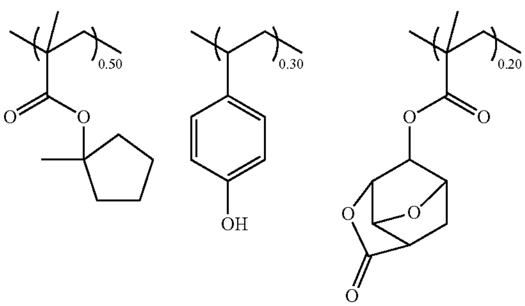

Mw = 8,600
Mw/Mn = 1.73

Polymer 2

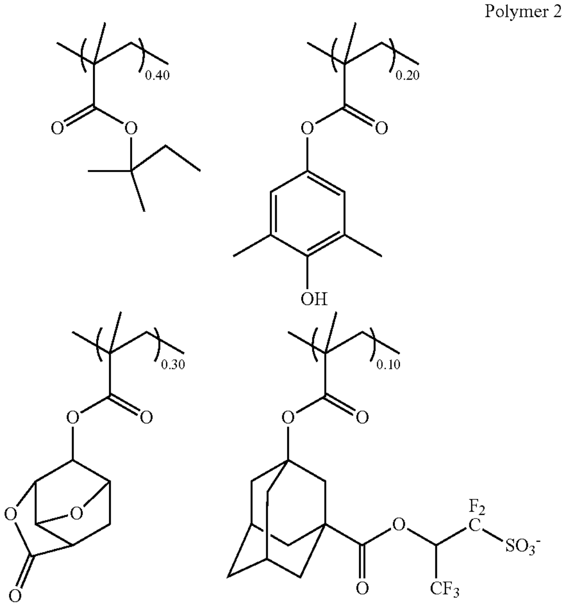

-continued

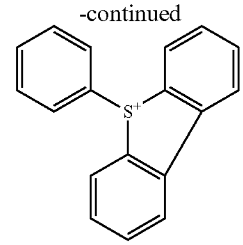

Mw = 8,900
Mw/Mn = 1.89

Polymer 3

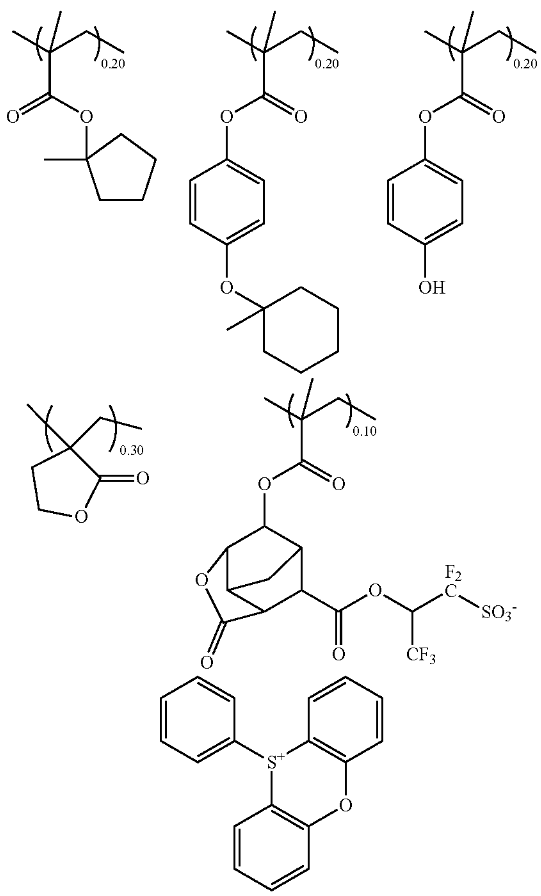

Mw = 7,600
Mw/Mn = 1.73

Examples and Comparative Examples

Resist compositions were prepared by dissolving the polymer and other components in a solvent containing 100 ppm of surfactant FC-4430 (3M) in accordance with the recipe shown in Tables 1 and 2, and filtering through a filter having a pore size of 0.2 μm.

The components in Tables 1 and 2 are as identified below.

Organic Solvent

PGMEA: propylene glycol monomethyl ether acetate

CyH: cyclohexanone

PGME: propylene glycol monomethyl ether

DAA: diacetone alcohol

Acid Generator: PAG 1 to PAG 4 of the Following Structural Formulae
PAG 1
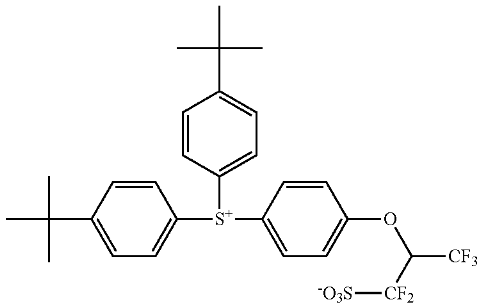
PAG 2
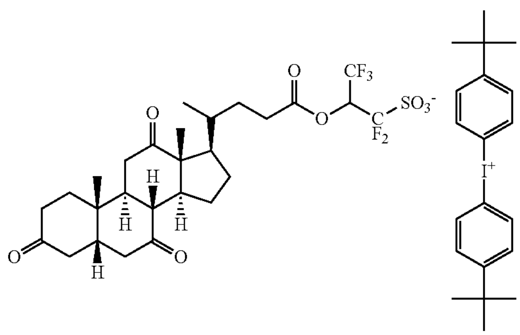
PAG 3
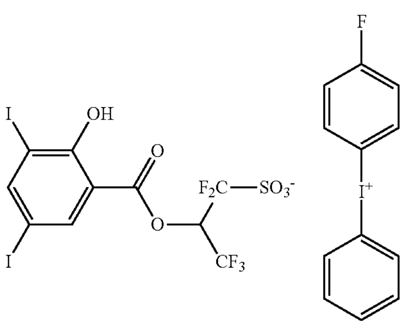
PAG 4
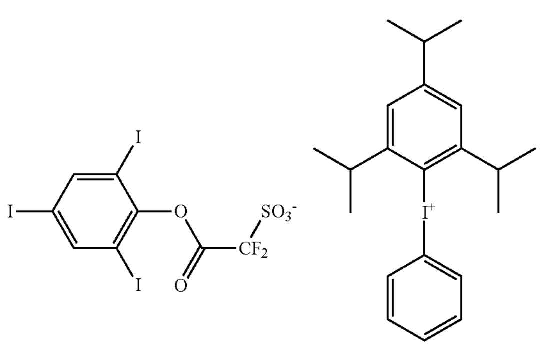
Comparative Sensitizers 1 to 6 of the Following Structural Formulae
Comparative Sensitizer 1
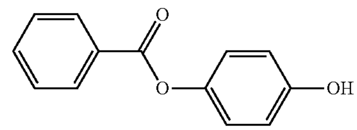
Comparative Sensitizer 2
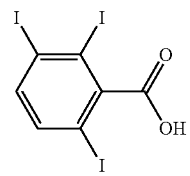
Comparative Sensitizer 3
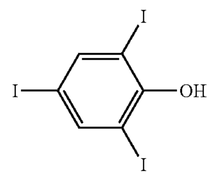
Comparative Sensitizer 4
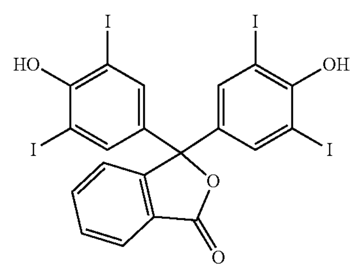
Comparative Sensitizer 5
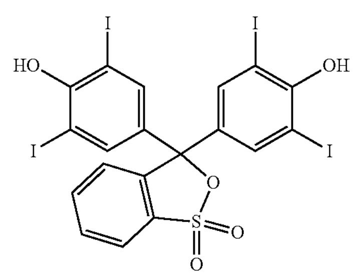
Comparative Sensitizer 6
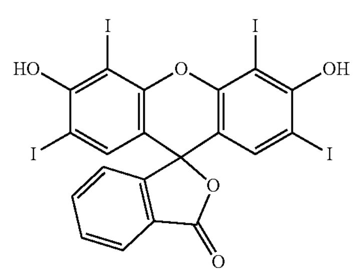

Quencher: Quenchers 1 to 3 of the Following Structural Formulae

Quencher 1

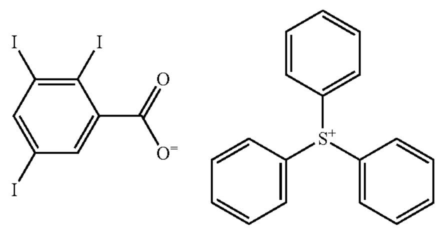

Quencher 2

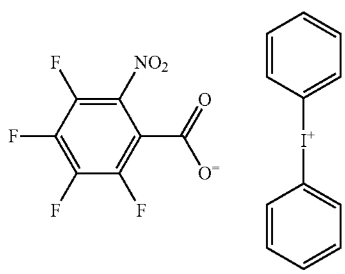

-continued

Quencher 3

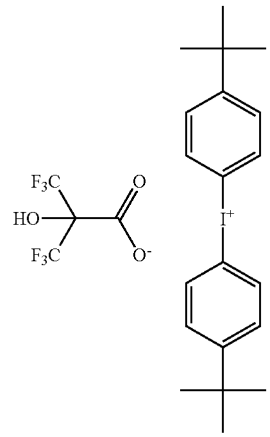

EUV Lithography Test

Examples 1 to 12 and Comparative Examples 1 to 10

Each of the resist compositions in Tables 1 and 2 was spin coated on a silicon substrate having a 20-nm coating of silicon-containing spin-on hard mask material SHB-A940 (silicon content 43 wt %, Shin-Etsu Chemical Co., Ltd.) and prebaked on a hot plate at 105° C. for 60 seconds to form a resist film of 60 nm thick. Using an EUV scanner NXE3300 (ASML, NA 0.33, σ 0.9/0.6, quadrupole illumination), the resist film was exposed to EUV through a mask bearing a hole pattern having a pitch of 46 nm+20% bias (on-wafer size). The resist film was baked (PEB) on a hot plate at the temperature shown in Tables 1 and 2 for 60 seconds and developed in a 2.38 wt % TMAH aqueous solution for 30 seconds to form a hole pattern having a size of 23 nm.

The resist pattern was observed under CD-SEM (CG-5000, Hitachi High-Technologies Corp.). The exposure dose that provided a hole pattern having a size of 23 nm was reported as sensitivity. The size of 50 holes or dots was measured, from which a size variation (3σ) was computed and reported as CDU.

The resist composition is shown in Tables 1 and 2 together with the sensitivity and CDU of EUV lithography.

TABLE 1

| Example | Polymer (pbw) | Acid generator (pbw) | Quencher (pbw) | Sensitizer (pbw) | Organic solvent (pbw) | PEB temp. (° C.) | Sensitivity ($mJ/cm^2$) | CDU (nm) |
|---|---|---|---|---|---|---|---|---|
| 1 | Polymer 1 (100) | PAG 1 (25) | Quencher 1 (4.0) | Sensitizer 1 (5.9) | PGMEA (400) CyH (2,000) PGME (100) | 100 | 26 | 2.9 |
| 2 | Polymer 1 (100) | PAG 2 (20) | Quencher 1 (4.0) | Sensitizer 2 (7.6) | PGMEA (400) CyH (2,000) PGME (100) | 100 | 28 | 2.8 |
| 3 | Polymer 1 (100) | PAG 2 (20) | Quencher 1 (4.0) | Sensitizer 3 (7.0) | PGMEA (400) CyH (2,000) PGME (100) | 100 | 25 | 2.7 |
| 4 | Polymer 1 (100) | PAG 3 (20) | Quencher 1 (4.0) | Sensitizer 4 (7.3) | PGMEA (400) CyH (2,000) PGME (100) | 100 | 24 | 2.8 |
| 5 | Polymer 1 (100) | PAG 4 (20) | Quencher 1 (4.0) | Sensitizer 5 (6.3) | PGMEA (400) CyH (2,000) PGME (100) | 100 | 25 | 2.6 |
| 6 | Polymer 1 (100) | PAG 2 (20) | Quencher 1 (4.0) | Sensitizer 6 (6.3) | PGMEA (400) CyH (2,000) PGME (100) | 100 | 24 | 2.7 |

TABLE 1-continued

| Example | Polymer (pbw) | Acid generator (pbw) | Quencher (pbw) | Sensitizer (pbw) | Organic solvent (pbw) | PEB temp. (° C.) | Sensitivity (mJ/cm$^2$) | CDU (nm) |
|---|---|---|---|---|---|---|---|---|
| 7 | Polymer 1 (100) | PAG 2 (20) | Quencher 1 (4.0) | Sensitizer 7 (5.9) | PGMEA (400) CyH (2,000) PGME (100) | 100 | 23 | 2.5 |
| 8 | Polymer 1 (100) | PAG 2 (20) | Quencher 2 (4.0) | Sensitizer 8 (5.6) | PGMEA (400) CyH (2,000) PGME (100) | 100 | 24 | 2.4 |
| 9 | Polymer 1 (100) | PAG 2 (20) | Quencher 3 (4.0) | Sensitizer 9 (6.3) | PGMEA (400) CyH (2,000) PGME (100) | 100 | 22 | 2.4 |
| 10 | Polymer 1 (100) | PAG 2 (20) | Quencher 3 (4.0) | Sensitizer 10 (7.2) | PGMEA (400) CyH (2,000) PGME (100) | 100 | 22 | 2.6 |
| 11 | Polymer 2 (100) | PAG 2 (20) | Quencher 1 (4.0) | Sensitizer 4 (7.3) | PGMEA (400) CyH (2,000) PGME (100) | 100 | 26 | 2.2 |
| 12 | Polymer 3 (100) | — | Quencher 1 (4.0) | Sensitizer 4 (7.3) | PGMEA (2,000) DAA (500) | 100 | 26 | 2.1 |

TABLE 2

| Comparative Example | Polymer (pbw) | Acid generator (pbw) | Quencher (pbw) | Sensitizer (pbw) | Organic solvent (pbw) | PEB temp. (° C.) | Sensitivity (mJ/cm$^2$) | CDU (nm) |
|---|---|---|---|---|---|---|---|---|
| 1 | Polymer 1 (100) | PAG 2 (20) | Quencher 1 (4.0) | — | PGMEA (400) CyH (2,000) PGME (100) | 100 | 38 | 2.8 |
| 2 | Polymer 1 (100) | PAG 2 (20) | Quencher 1 (4.0) | Comparative Sensitizer 1 (2.1) | PGMEA (400) CyH (2,000) PGME (100) | 100 | 31 | 3.4 |
| 3 | Polymer 1 (100) | PAG 2 (20) | Quencher 1 (4.0) | Comparative Sensitizer 2 (5.0) | PGMEA (400) CyH (2,000) PGME (100) | 100 | 26 | 3.6 |
| 4 | Polymer 1 (100) | PAG 2 (20) | Quencher 1 (4.0) | Comparative Sensitizer 3 (4.7) | PGMEA (400) CyH (2,000) PGME (100) | 100 | 24 | 3.6 |
| 5 | Polymer 1 (100) | PAG 2 (20) | Quencher 1 (4.0) | Comparative Sensitizer 4 (8.2) | PGMEA (400) CyH (2,000) PGME (100) | 100 | 22 | 3.6 |
| 6 | Polymer 1 (100) | PAG 2 (20) | Quencher 1 (4.0) | Comparative Sensitizer 5 (8.6) | PGMEA (400) CyH (2,000) PGME (100) | 100 | 22 | 3.9 |
| 7 | Polymer 1 (100) | PAG 2 (20) | Quencher 1 (4.0) | Comparative Sensitizer 6 (8.4) | PGMEA (400) CyH (2,000) PGME (100) | 100 | 25 | 3.5 |
| 8 | Polymer 2 (100) | — | Quencher 1 (4.0) | — | PGMEA (400) CyH (2,000) PGME (100) | 100 | 32 | 2.2 |
| 9 | Polymer 2 (100) | — | Quencher 1 (4.0) | Comparative Sensitizer 1 (2.1) | PGMEA (400) CyH (2,000) PGME (100) | 100 | 28 | 3.2 |
| 10 | Polymer 1 (100) | PAG 1 (20) | Quencher 1 (4.0) | Comparative Sensitizer 1 (2.1) | PGMEA (400) CyH (2,000) PGME (100) | 100 | 35 | 3.5 |

It is demonstrated in Tables 1 and 2 that resist compositions comprising a compound containing an iodized benzene ring and an aromatic ring-containing group having a phenolic hydroxyl group exhibit high sensitivity and improved CDU.

Japanese Patent Application No. 2018-081515 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer, an acid generator, and a compound having the formula (A):

(A)

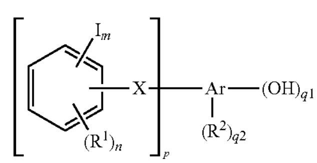

wherein $R^1$ is each independently a hydroxyl group, carboxyl group, fluorine atom, chlorine atom, bromine atom, $C_1$-$C_{20}$ alkyl group, $C_1$-$C_{20}$ alkoxy group, $C_2$-$C_{20}$ acyloxy group, $C_2$-$C_{20}$ alkoxycarbonyl group, —$NR^{1A}$—C(═O)—$R^{1B}$, or —$NR^{1A}$—C(═O)—O—$R^{1B}$, at least one hydrogen atom in the alkyl, alkoxy, acyloxy or alkoxycarbonyl group may be substituted by fluorine, chlorine, bromine, hydroxy or alkoxy, $R^{1A}$ is hydrogen or a $C_1$-$C_6$ alkyl group, at least one hydrogen atom in the alkyl group may be substituted by halogen, hydroxyl, $C_1$-$C_6$ alkoxy, $C_2$-$C_7$ acyl or $C_2$-$C_7$ acyloxy, $R^{1B}$ is a $C_1$-$C_{16}$ alkyl group, $C_2$-$C_{16}$ alkenyl group or $C_6$-$C_{12}$ aryl group, at least one hydrogen atom in the alkyl, alkenyl or aryl group may be substituted by halogen, hydroxyl, $C_1$-$C_6$ alkoxy, $C_2$-$C_7$ acyl or $C_2$-$C_7$ acyloxy, $R^2$ is a $C_1$-$C_{10}$ alkyl group, $C_1$-$C_{10}$ alkoxy group, $C_2$-$C_{10}$ alkoxycarbonyl group, $C_2$-$C_{10}$ acyl group, $C_2$-$C_{10}$ acyloxy group, cyano group, fluorine atom, chlorine atom, or bromine atom, X is a single bond, ester bond, ether bond, sulfonic acid ester bond, or $C_1$-$C_{10}$ divalent saturated aliphatic hydrocarbon group, some carbon atom in the divalent saturated aliphatic hydrocarbon group may be replaced by an ether bond, thioether bond, ester bond, sulfonic acid ester bond, lactone ring-containing moiety or sultone ring-containing moiety, Ar is a $C_6$-$C_{20}$ aromatic ring-containing group having a valence of p+q1+q2, m and n are integers in the range: $1 \le m \le 5$, $0 \le n \le 4$ and $1 \le m+n \le 5$, p is 1 or 2, q1 and q2 are integers in the range: $1 \le q1 \le 5$, $0 \le q2 \le 4$ and $1 \le q1+q2 \le 5$.

2. The resist composition of claim 1 wherein the acid generator is capable of generating a sulfonic acid, imide acid or methide acid.

3. The resist composition of claim 1, further comprising an organic solvent, dissolution inhibitor and/or basic compound.

4. The resist composition of claim 1 wherein the base polymer comprises recurring units having the formula (a1) or recurring units having the formula (a2):

(a1)

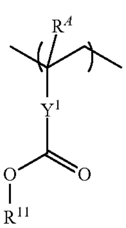

(a2)

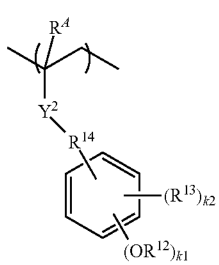

wherein $R^A$ is each independently hydrogen or methyl, $Y^1$ is a single bond, phenylene group, naphthylene group, or a $C_1$-$C_{12}$ linking group containing an ester bond, ether bond or lactone ring, $Y^2$ is a single bond, —C(═O)—O— or —C(═O)—NH—, $R^{11}$ and $R^{12}$ are each independently an acid labile group, $R^{13}$ is fluorine, trifluoromethyl, cyano, $C_1$-$C_6$ alkyl, $C_1$-$C_6$ alkoxy, $C_2$-$C_7$ acyl, $C_2$-$C_7$ acyloxy, or $C_2$-$C_7$ alkoxycarbonyl group, $R^{14}$ is a single bond or a straight or branched $C_1$-$C_6$ alkanediyl group in which at least one carbon atom may be replaced by an ether or ester bond, k1 is 1 or 2, and k2 is an integer of 0 to 4.

5. The resist composition of claim 1 which is a chemically amplified positive tone resist composition.

6. The resist composition of claim 1, further comprising a surfactant.

7. A resist composition comprising a base polymer comprising recurring units of at least one type selected from recurring units having the formulae (f1), (f2) and (f3), and a compound having the formula (A):

(A)

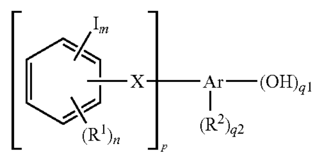

wherein $R^1$ is each independently a hydroxyl group, carboxyl group, fluorine atom, chlorine atom, bromine atom, $C_1$-$C_{20}$ alkyl group, $C_1$-$C_{20}$ alkoxy group, $C_2$-$C_{20}$ acyloxy group, $C_2$-$C_{20}$ alkoxycarbonyl group, —$NR^{1A}$—C(═O)—$R^{1B}$, or —$NR^{1A}$—C(═O)—O—$R^{1B}$, at least one hydrogen atom in the alkyl, alkoxy, acyloxy or alkoxycarbonyl group may be substituted by fluorine, chlorine, bromine, hydroxy or alkoxy, $R^{1A}$ is hydrogen or a $C_1$-$C_6$ alkyl group, at least one hydrogen atom in the alkyl group may be substituted by halogen, hydroxyl, $C_1$-$C_6$ alkoxy, $C_2$-$C_7$ acyl or $C_2$-$C_7$ acyloxy, $R^{1B}$ is a $C_1$-$C_{16}$ alkyl group, $C_2$-$C_{16}$ alkenyl group or $C_6$-$C_{12}$ aryl group, at least one hydrogen atom in the alkyl, alkenyl or aryl group may be substituted by halogen, hydroxyl, $C_1$-$C_6$ alkoxy, $C_2$-$C_7$ acyl or $C_2$-$C_7$ acyloxy, $R^2$ is a $C_1$-$C_{10}$ alkyl group, $C_1$-$C_{10}$ alkoxy group, $C_2$-$C_{10}$ alkoxycarbonyl group, $C_2$-$C_{10}$ acyl group, $C_2$-$C_{10}$ acyloxy group, cyano group, fluorine atom, chlorine atom, or bromine atom, X is a single bond, ester bond, ether bond, sulfonic acid ester bond, or $C_1$-$C_{10}$ divalent saturated aliphatic hydrocarbon group, some carbon atom in the divalent saturated aliphatic hydrocarbon group may be replaced by an ether bond, thioether bond, ester bond, sulfonic acid ester bond, lactone ring-containing moiety or sultone ring-containing moiety, Ar is a $C_6$-$C_{20}$ aromatic ring-containing group having a valence of p+q1+q2, m and n are integers in the range: $1 \le m \le 5$, $0 \le n \le 4$ and $1 \le m+n \le 5$, p is 1 or 2, q1 and q2 are integers in the range: 1≤q1≤5, 0≤q2≤4 and 1≤q1+q2≤5, (f1)

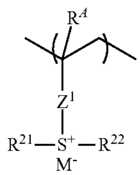

(f2)

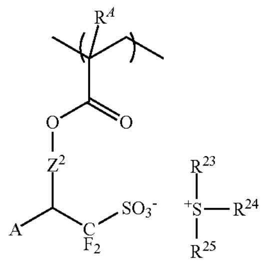

(f3)

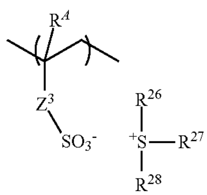

wherein $R^A$ is each independently hydrogen or methyl, $Z^1$ is a single bond, phenylene group, —O—$Z^{11}$—, —C(═O)—O—$Z^{11}$—, or —C(═O)—NH—$Z^{11}$—, $Z^{11}$ is a $C_1$-$C_6$ alkanediyl group, $C_2$-$C_6$ alkenediyl group or phenylene group, which may contain a carbonyl moiety, ester bond, ether bond or hydroxyl moiety, $Z^2$ is a single bond, —$Z^{21}$—C(═O)—O—, —$Z^{21}$—O—, or —$Z^{21}$—O—C(═O)—, $Z^{21}$ is a $C_1$-$C_{12}$ alkanediyl group which may contain a carbonyl moiety, ester bond or ether bond, A is hydrogen or trifluoromethyl, $Z^3$ is a single bond, methylene, ethylene, phenylene or fluorinated phenylene group, —O—$Z^{31}$—, —C(═O)—O—$Z^{31}$—, or —C(═O)—NH—$Z^{31}$—, $Z^{31}$ is a $C_1$-$C_6$ alkanediyl group, phenylene group, fluorinated phenylene group, trifluoromethyl-substituted phenylene group, or $C_2$-$C_6$ alkenediyl group, which may contain a carbonyl moiety, ester bond, ether bond or hydroxyl moiety, $R^{21}$ to $R^{28}$ are each independently a $C_1$-$C_{20}$ monovalent hydrocarbon group which may contain a heteroatom, any two of $R^{23}$, $R^{24}$ and $R^{25}$ or any two of $R^{26}$, $R^{27}$ and $R^{28}$ may bond together to form a ring with the sulfur atom to which they are attached, and $M^-$ is a non-nucleophilic counter ion.

8. A pattern forming process comprising the steps of coating the resist composition of claim 1 onto a substrate, baking to form a resist film, exposing the resist film to high-energy radiation, and developing the exposed resist film in a developer.

9. The process of claim 8 wherein the high-energy radiation is ArF excimer laser of wavelength 193 nm or KrF excimer laser of wavelength 248 nm.

10. The process of claim 8 wherein the high-energy radiation is EB or EUV of wavelength 3 to 15 nm.

* * * * *